United States Patent
Ma et al.

(10) Patent No.: US 11,795,389 B2
(45) Date of Patent: Oct. 24, 2023

(54) NITROGEN-CONTAINING COMPOUND, ELECTRONIC COMPONENT, AND ELECTRONIC DEVICE

(71) Applicant: Shaanxi Lighte Optoelectronics Material Co., Ltd., Shaanxi (CN)

(72) Inventors: Tiantian Ma, Shaanxi (CN); Lei Yang, Shaanxi (CN)

(73) Assignee: Shaanxi Lighte Optoelectronics Material Co., Ltd., Shaanxi (CN)

( * ) Notice: Subject to any disclaimer, the term of this patent is extended or adjusted under 35 U.S.C. 154(b) by 0 days.

(21) Appl. No.: 18/246,973

(22) PCT Filed: Mar. 15, 2022

(86) PCT No.: PCT/CN2022/080939
§ 371 (c)(1),
(2) Date: Mar. 28, 2023

(87) PCT Pub. No.: WO2022/222646
PCT Pub. Date: Oct. 27, 2022

(65) Prior Publication Data
US 2023/0272273 A1    Aug. 31, 2023

(30) Foreign Application Priority Data
Apr. 21, 2021 (CN) .................. 202110432288.X

(51) Int. Cl.
*C07C 211/54* (2006.01)
*C07C 211/60* (2006.01)
(Continued)

(52) U.S. Cl.
CPC ............ *C09K 11/06* (2013.01); *H10K 85/633* (2023.02); *H10K 85/636* (2023.02);
(Continued)

(58) Field of Classification Search
CPC ... C07C 211/54; C07C 211/60; H10K 85/633; H10K 85/636
See application file for complete search history.

(56) References Cited

U.S. PATENT DOCUMENTS 10,217,945 B2   2/2019   Kashiwamura et al.
11,098,022 B2   8/2021   Ma et al.
(Continued)

FOREIGN PATENT DOCUMENTS

CN   105593216 A   5/2016
CN   107641116 A   1/2018
(Continued)

OTHER PUBLICATIONS

NPL 1, International Search Report with English Translation, Int. Serial No. PCT/CN2022/080939, Int. Filing Date: Mar. 15, 2022, Applicant: Shaanxi LTMS Optoelectronics Material Co., Ltd., dated Apr. 28, 2022.
(Continued)

*Primary Examiner* — Vu A Nguyen
(74) *Attorney, Agent, or Firm* — Reising Ethington P.C.

(57) ABSTRACT

The present application belongs to the technical field of organic materials and provides a nitrogen-containing compound, an electronic component, and an electronic device. The nitrogen-containing compound has a structure shown in Chemical formula 1:
(Continued)

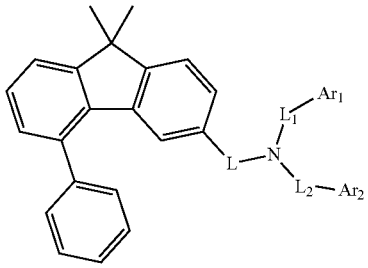

Chemical formula 1

19 Claims, 2 Drawing Sheets

(51) Int. Cl.
*H01L 51/00* (2006.01)
*H01L 51/50* (2006.01)
*C09K 11/06* (2006.01)
*H10K 85/60* (2023.01)

(52) U.S. Cl.
CPC .......... *C09K 2211/1014* (2013.01); *C09K 2211/1022* (2013.01); *C09K 2211/1033* (2013.01); *C09K 2211/1037* (2013.01); *C09K 2211/1088* (2013.01); *C09K 2211/1092* (2013.01)

(56) References Cited

U.S. PATENT DOCUMENTS

| 11,563,187 B2 | 1/2023 | Yamatani |
| 2012/0066595 A1 | 3/2012 | Sung et al. |
| 2020/0308129 A1 | 10/2020 | Montenegro et al. |
| 2021/0066595 A1 | 3/2021 | Zhao et al. |
| 2022/0388944 A1 | 12/2022 | Yang et al. |

FOREIGN PATENT DOCUMENTS

| CN | 107963973 A | | 4/2018 | |
| CN | 109776594 A | | 5/2019 | |
| CN | 110229071 A | * | 9/2019 | ............ C07C 15/28 |
| CN | 110229071 A | | 9/2019 | |
| CN | 111138297 A | | 5/2020 | |
| CN | 111465599 A | | 7/2020 | |
| CN | 111533736 A | | 8/2020 | |
| CN | 11662317 A | | 9/2020 | |
| CN | 111635323 A | | 9/2020 | |
| CN | 111747893 A | | 10/2020 | |
| CN | 111777517 A | | 10/2020 | |
| CN | 111875505 A | | 11/2020 | |
| CN | 111909043 A | | 11/2020 | |
| CN | 111995533 A | | 11/2020 | |
| CN | 112110849 A | | 12/2020 | |
| CN | 112266371 A | | 1/2021 | |
| CN | 112300055 A | | 2/2021 | |
| CN | 12430225 A | | 3/2021 | |
| CN | 112552286 A | | 3/2021 | |
| CN | 113173858 A | | 7/2021 | |
| KR | 20200076003 A | | 6/2020 | |
| KR | 20210025501 A | | 3/2021 | |
| WO | 2019147077 A1 | | 8/2019 | |

OTHER PUBLICATIONS

NPL 2, Chinese Office Action, Serial No. 202110432288.X, Filing Date: Apr. 21, 2021, Applicant: Shaanxi Lighte Optoelectronics Material Co., Ltd., dated Dec. 8, 2021.

NPL 3, International Written Opinion, Serial No. PCT/CN2022/080939, Int. Filing Date: Mar. 15, 2022, Applicant: Shaanxi LTMS Optoelectronics Material Co., Ltd., dated Apr. 28, 2022.

NPL 4, Chinese granted claims with English translation.

NPL 5, Notification to Grant Patent Right for Invention with English Translation, Application No. 202110432288.X, Applicant: Shaanxi LTMS Optoelectronics Mat Co., Ltd., dated Jan. 26, 2022.

NPL 6, Supplemental Search of the Priority Application with English Translation, Application No. 202110432288.X, Filing Date: Apr. 21, 2021, Applicant: Shaanxi LTMS Optoelectronics Mat Co., Ltd., dated Dec. 28, 2021.

NPL 7, Chinese First Office Action of the Priority Application with English Translation, Application No. 202110432288.X, Filing Date: Apr. 21, 2021, Applicant: Shaanxi LTMS Optoelectronics Mat Co., Ltd., dated Dec. 8, 2021.

NPL 8, Chinese Search Report of the Priority Application with English Translation, Application No. 202110432288.X, Filing Date: Apr. 21, 2021, Applicant: Shaanxi LTMS Optoelectronics Mat Co., Ltd., dated Dec. 3, 2021.

NPL 9, Korean Office Action with English Translation, Application No. 10-2023-7011088, Applicant: Shaanxi Lighte Optoelectronics Material Co., Ltd., dated Jun. 26, 2023.

* cited by examiner

NITROGEN-CONTAINING COMPOUND, ELECTRONIC COMPONENT, AND ELECTRONIC DEVICE

CROSS-REFERENCE TO RELATED APPLICATIONS

The present application claims priority to Chinese Patent Application CN202110432288.X filed to the China National Intellectual Property Administration on Apr. 21, 2021 and entitled "NITROGEN-CONTAINING COMPOUND, ELECTRONIC COMPONENT, AND ELECTRONIC DEVICE", which is incorporated herein by reference in its entirety.

TECHNICAL FIELD

The present application relates to the technical field of organic materials, and in particular to a nitrogen-containing compound, an electronic component using the nitrogen-containing compound, and an electronic device using the electronic component.

BACKGROUND

Organic electroluminescence devices, also known as organic light-emitting diodes (OLEDs), refer to the phenomenon that organic light-emitting materials are excited by a current to emit light under the action of an electric field. The phenomenon refers to a process of converting electrical energy into optical energy. Compared with inorganic light-emitting materials, organic electroluminescence devices (OLEDs) have the advantages of active light emission, large optical path range, low driving voltage, high luminance, high efficiency, low energy consumption, simple production process, and the like. Due to these advantages, organic light-emitting materials and devices have become one of the most popular research subjects in the scientific and industrial circles.

An organic electroluminescence device generally includes an anode, a hole transport layer, an electroluminescent layer as an energy conversion layer, an electron transport layer, and a cathode which are successively stacked. When a voltage is applied to the cathode and the anode, the two electrodes generate an electric field; and under the action of the electric field, electrons at a cathode side and holes at an anode side move towards the electroluminescent layer and are combined in the electroluminescent layer to form excitons, and the excitons in an excited state release energy outwards to make the electroluminescent layer emit light.

In the prior art, CN107963973A, CN107915648A, and the like disclose materials that can be used to fabricate a hole transport layer in an organic electroluminescence device. However, in order to further improve the performance of electronic components, it is still necessary to continue the development of new materials.

SUMMARY

The present application is intended to provide a nitrogen-containing compound, an electronic component, and an electronic device, to improve the performance of the electronic component and the electronic device.

To achieve the above objective, the present application adopts the following technical solution:

A first aspect of the present application provides a nitrogen-containing compound having a structure shown in Chemical formula 1:

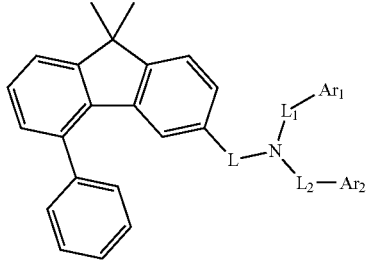

Chemical formula 1 where L, $L_1$, and $L_2$ are each independently selected from a single bond, a substituted or unsubstituted arylene with 6 to 30 carbon atoms, or a substituted or unsubstituted heteroarylene with 3 to 30 carbon atoms;

$Ar_1$ and $Ar_2$ are each independently selected from a substituted or unsubstituted aryl with 6 to 30 carbon atoms, or a substituted or unsubstituted heteroaryl with 3 to 30 carbon atoms;

substituents of L, $L_1$, $L_2$, $Ar_1$, and $Ar_2$ are the same or different, and are each independently selected from deuterium, a halogen, a cyano, a heteroaryl with 3 to 20 carbon atoms, an aryl with 6 to 20 carbon atoms, a trialkylsilyl with 3 to 12 carbon atoms, a triarylsilyl with 18 to 24 carbon atoms, an alkyl with 1 to 10 carbon atoms, a deuterated alkyl with 1 to 10 carbon atoms, a cycloalkyl with 3 to 10 carbon atoms, a heterocycloalkyl with 2 to 10 carbon atoms, an alkoxy with 1 to 10 carbon atoms, an alkylthio group with 1 to 10 carbon atoms, an aryloxy with 6 to 18 carbon atoms, an arylthio group with 6 to 18 carbon atoms, or a phosphonooxy with 6 to 18 carbon atoms; and optionally, in L, $L_1$, $L_2$, $Ar_1$, and $Ar_2$, any two adjacent substituents form a ring.

The nitrogen-containing compound provided in the present application includes 5-phenyl-9,9-dimethylfluorenyl-3-yl as a parent nucleus structure and arylamino linked to the position 3. The linkage of the arylamino to the position 3 of dimethylfluorenyl can produce a strong conjugation effect to increase a density of local electron cloud, such that a material can have both a deep highest occupied molecular orbital (HOMO) energy level and a high hole mobility. There is a large twist angle between the 5-substituted phenyl and the dimethylfluorenyl, such that an interaction between molecules can be effectively reduced while basically maintaining the morphology of molecules themselves, thereby enhancing an amorphous form of the material and improving the film-forming characteristics of the material. When used in an electron blocking layer of an organic electroluminescence device, the material can effectively reduce a working voltage of the device, enhance the efficiency of the device, and improve a life span of the device.

A second aspect of the present application provides an electronic component including an anode and a cathode arranged oppositely, and a functional layer arranged between the anode and the cathode, where the functional layer includes the nitrogen-containing compound described in the first aspect.

A third aspect of the present application provides an electronic device including the electronic component described in the second aspect.

BRIEF DESCRIPTION OF THE DRAWINGS

The accompanying drawings incorporated into the specification and constituting a part of the specification illustrate the embodiments of the present application, and are used together with the description to explain the principles of the present application. In these accompanying drawings, similar reference numerals represent similar elements. The accompanying drawings in the following description illustrate some rather than all of the embodiments of the present application. Other accompanying drawings can be derived by persons of ordinary skill in the art based on these accompanying drawings without creative efforts. The above and other features and advantages of the present application will become apparent by describing exemplary implementations in detail with reference to the accompanying drawings.

REFERENCE NUMERALS

Figure 1:
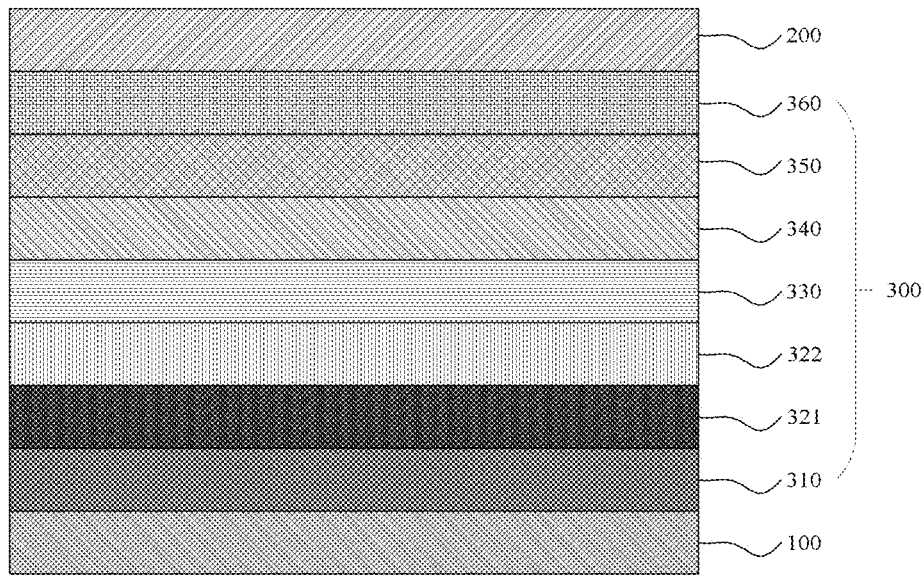
FIG. 1 is a schematic structural diagram of an organic electroluminescence device according to an embodiment of the present application.

100, anode; 200, cathode; 300, functional layer; 310, hole injection layer; 321, hole transporting layer; 322, electron blocking layer; 330, organic light-emitting layer; 340, hole blocking layer; 350, electron transporting layer; 360, electron injection layer; 370, photoelectric conversion layer; 400, first electronic device; and 500, second electronic device.

DETAILED DESCRIPTION OF THE EMBODIMENTS

Exemplary embodiments will be described below comprehensively with reference to the accompanying drawings. However, the exemplary embodiments can be implemented in a plurality of forms and should not be construed as being limited to examples described herein. On the contrary, these embodiments are provided such that the present application is more comprehensive and complete, and fully conveys the concept of the exemplary embodiments to persons skilled in the art. The described features, structures, or characteristics may be incorporated into one or more embodiments in any suitable manner. In the following description, many specific details are provided to give a full understanding of the embodiments of the present application.

In the figures, a thickness of each of regions and layers may be exaggerated for clarity. The same reference numerals in the figures indicate the same or similar structures, and thus their detailed descriptions will be omitted.

The described features, structures, or characteristics may be incorporated into one or more embodiments in any suitable manner. In the following description, many specific details are provided to give a full understanding of the embodiments of the present application.

The present application provides a nitrogen-containing compound having a structure shown in Chemical formula 1:

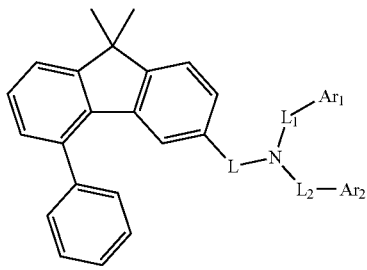

Chemical formula 1 where L, $L_1$, and $L_2$ are each independently selected from a single bond, a substituted or unsubstituted arylene with 6 to 30 carbon atoms, or a substituted or unsubstituted heteroarylene with 3 to 30 carbon atoms;

$Ar_1$ and $Ar_2$ are each independently selected from a substituted or unsubstituted aryl with 6 to 30 carbon atoms, or a substituted or unsubstituted heteroaryl with 3 to 30 carbon atoms;

substituents of L, $L_1$, $L_2$, $Ar_1$, and $Ar_2$ are the same or different, and are each independently selected from deuterium, a halogen, a cyano, a heteroaryl with 3 to 20 carbon atoms, an aryl with 6 to 20 carbon atoms, a trialkylsilyl with 3 to 12 carbon atoms, a triarylsilyl with 18 to 24 carbon atoms, an alkyl with 1 to 10 carbon atoms, a deuterated alkyl with 1 to 10 carbon atoms, a cycloalkyl with 3 to 10 carbon atoms, a heterocycloalkyl with 2 to 10 carbon atoms, an alkoxy with 1 to 10 carbon atoms, an alkylthio group with 1 to 10 carbon atoms, an aryloxy with 6 to 18 carbon atoms, an arylthio group with 6 to 18 carbon atoms, or a phosphonooxy with 6 to 18 carbon atoms; and optionally, in L, $L_1$, $L_2$, $Ar_1$, and $Ar_2$, any two adjacent substituents form a ring.

In the present application, the term "optional" or "optionally" means that the event or environment subsequently described may, but not necessarily, occur, and that the description includes situations where the event or environment occurs or does not occur. For example, "optionally, any two adjacent substituents form a ring" means that these two substituents can form a ring, but do not necessarily form a ring, including: a scenario where the two adjacent substituents form a ring and a scenario where the two adjacent substituents do not form a ring.

In the present application, the "any two adjacent substituents" in the phrase "any two adjacent substituents form a ring" may refer to two substituents on the same atom, and may also refer to two substituents respectively on two adjacent atoms. When it refers to two substituents on the same atom, the two substituents can form a saturated or unsaturated ring with the atom attached to the two; and when it refers to two substituents respectively on two adjacent atoms, the two substituents can be fused into a ring. For example, when $Ar_1$ has two or more substituents, any two adjacent substituents form a ring, form a saturated or unsaturated ring with 5 to 13 carbon atoms, such as a benzene ring, a naphthalene ring, a phenanthrene ring, an anthracene ring, a fluorene ring, a cyclopentane, a cyclohexane, a adamantane, and the like.

In the present application, the description manners such as " . . . each are independently" and "are respectively and independently" and " . . . are each independently selected from" can be used interchangeably, and should be understood in a broad sense, which can mean that, in different groups, specific options expressed by the same symbols do not affect each other, or in the same group, specific options expressed by the same symbols do not affect each other. For example, "

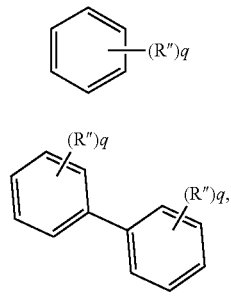

where each q is independently 0, 1, 2, or 3 and each R" are independently selected from hydrogen, deuterium, fluorine, and chlorine" means that, in formula Q-1, there are q substituents R" on the benzene ring, each R" can be the same or different, and options for each R" do not affect each other; and in formula Q-2, there are q substituents R" on each benzene ring of the biphenyl, the numbers q of substituents R" on the two benzene rings can be the same or different, each R" can be the same or different, and options for each R" do not affect each other.

In the present application, a non-positional bond refers to a single bond "$-\xi-$" extending from a ring system, which means that one end of the bond can be attached to any position in the ring system through which the bond penetrates, and the other end is attached to the remaining part in the compound molecule.

For example, as shown in the following formula (f), the naphthyl represented by the formula (f) is attached to the remaining part in the molecule through two non-positional bonds that penetrate through the bicyclic ring, which indicates any possible attachment modes shown in formula (f-1) to formula (f-10):

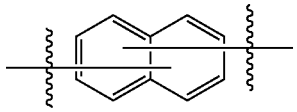 (f)

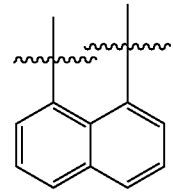 (f-1)

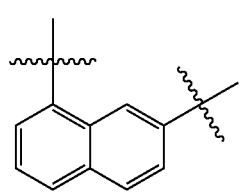 (f-2)

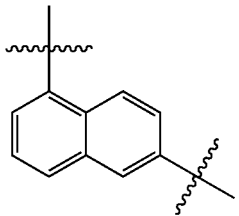 (f-3)

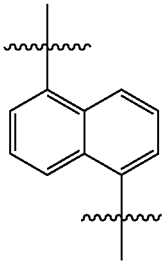 (f-4)

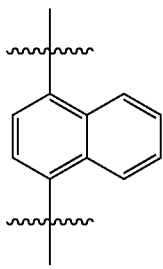 (f-5)

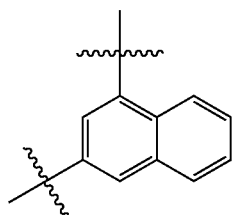 (f-6)

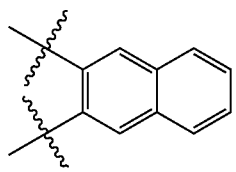 (f-7)

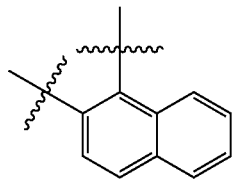 (f-8)

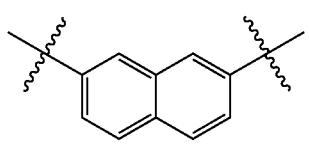 (f-9)

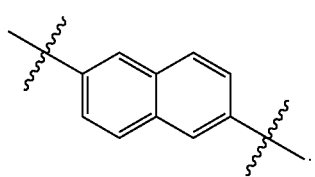
(f-10)

For example, as shown in the following formula (X'), the phenanthrenyl represented by the formula (X') is attached to the remaining part in the molecule through a non-positional bond extending from the middle of a benzene ring at a side, which indicates any possible attachment modes shown in formula (X'-1) to formula (X'-4):

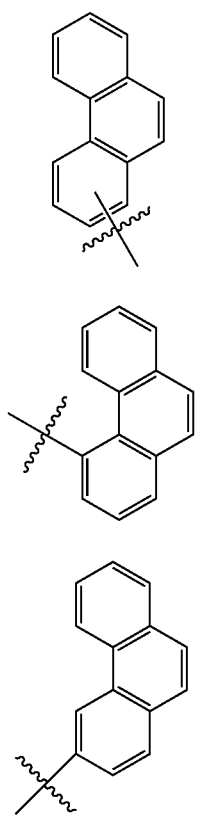

(X')

(X'-1)

(X'-2)

(X'-3)

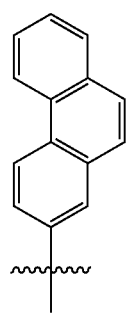

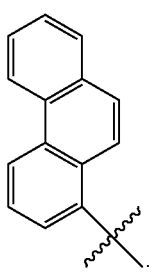
(X'-4)

In the present application, a non-positional substituent refers to a substituent linked through a single bond extending from the center of a ring system, which means that the substituent can be attached to any possible position in the ring system. For example, as shown in the following formula (Y), the substituent R' represented by the formula (Y) is attached to a quinoline ring through a non-positional bond, which indicates any possible attachment modes shown in formula (Y-1) to formula (Y-7):

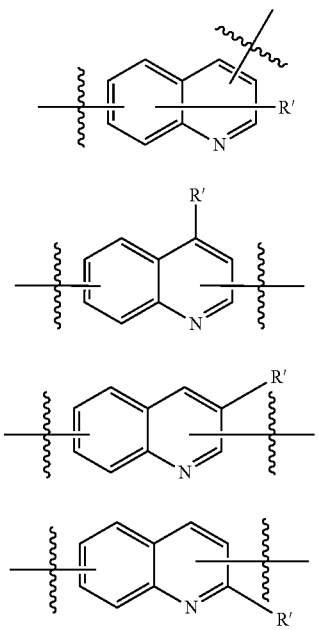

(Y)

(Y-1)

(Y-2)

(Y-3)

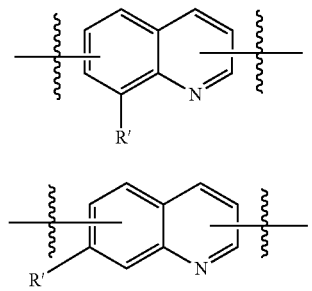

(Y-4)

(Y-5)

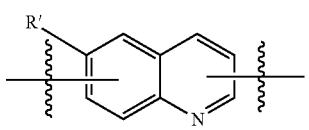

(Y-6)

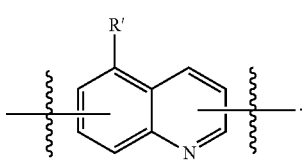

(Y-7)

In the present application, a number of carbon atoms in each of L, $L_1$, $L_2$, $Ar_1$, and $Ar_2$ refers to a number of all carbon atoms. For example, if L is a substituted arylene with 12 carbon atoms, then a number of all carbon atoms in the arylene and substituents of the arylene is 12. For example, if $Ar_1$ is

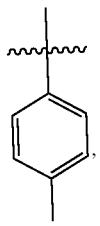 [SMILES: *c1ccc(C)cc1]

a number of carbon atoms of $Ar_1$ is 7; and if L is

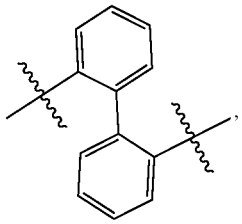 [SMILES: *c1ccccc1-c1ccccc1*]

a number of carbon atoms of L is 12.

In the present application, unless otherwise specifically defined, the term "hetero" means that a functional group includes at least one heteroatom selected from the group consisting of B, N, O, S, Se, Si, and P, and the rest atoms are carbon and hydrogen.

In the present application, the alkyl may include a linear alkyl or a branched alkyl. The alkyl may have 1 to 10 carbon atoms. In the present application, a numerical range such as "1 to 10" refers to any integer in the range, for example, "alkyl with 1 to 10 carbon atoms" refers to alkyl that may include 1, 2, 3, 4, 5, 6, 7, 8, 9, or 10 carbon atoms. The alkyl may also be lower alkyl with 1 to 5 carbon atoms. In addition, the alkyl may be substituted or unsubstituted.

Optionally, the alkyl may be an alkyl with 1 to 5 carbon atoms, and specific examples of the alkyl may include, but are not limited to, a methyl, an ethyl, an n-propyl, an isopropyl, a n-butyl, an isobutyl, a sec-butyl, a tert-butyl, a pentyl, and a hexyl.

In the present application, the cycloalkyl refers to a group derived from a saturated cyclic carbon chain structure. The cycloalkyl may have 3 to 10 carbon atoms. In the present application, a numerical range such as "3 to 10" refers to each integer in the range, for example, "cycloalkyl with 3 to 10 carbon atoms" refers to cycloalkyl with 3, 4, 5, 6, 7, 8, 9, or 10 carbon atoms. The cycloalkyl may be substituted or unsubstituted.

Optionally, specific examples of the cycloalkyl include, but are not limited to, a cyclopentyl, a cyclohexyl, and the like.

In the present application, the aryl refers to any functional group or substituent derived from an aromatic carbocyclic ring. The aryl may refer to a monocyclic aryl group (such as phenyl) or a polycyclic aryl group. In other words, the aryl may refer a monocyclic aryl group, a fused-ring aryl group, two or more monocyclic aryl groups conjugated through carbon-carbon bonds, a monocyclic aryl group and a fused-ring aryl group conjugated through carbon-carbon bonds, and two or more fused-ring aryl groups conjugated through carbon-carbon bonds. That is, unless otherwise specified, two or more aromatic groups conjugated through carbon-carbon bonds can also be regarded as the aryl of the present application. For example, the fused-ring aryl group may include a bicyclic fused aryl group (such as naphthyl) and a tricyclic fused aryl group (such as phenanthrenyl, fluorenyl, and anthracenyl). The aryl does not include heteroatoms such as B, N, O, S, P, Se, and Si. For example, in the present application, biphenyl, terphenyl, and the like are aryl. Examples of the aryl may include, but are not limited to, phenyl, naphthyl, fluorenyl, anthracenyl, phenanthrenyl, biphenyl, terphenyl, tetraphenyl, pentaphenyl, benzo[9,10]phenanthrenyl, pyrenyl, benzofluoranthenyl, chrysenyl, and the like. The substituted or unsubstituted aryl of the present application may include 6 to 30 carbon atoms. In some embodiments, the substituted or unsubstituted aryl may include 6 to 25 carbon atoms; in other embodiments, the substituted or unsubstituted aryl may include 6 to 18 carbon atoms; and in still other embodiments, the substituted or unsubstituted aryl may include 6 to 13 carbon atoms. For example, in the present application, the substituted or unsubstituted aryl may include 6, 10, 12, 13, 14, 15, 18, 20, 24, 25, or 30 carbon atoms, and of course, the substituted or unsubstituted aryl may include any other number of carbon atoms, which will not be listed here. In the present application, the biphenyl can be construed as phenyl-substituted aryl, and can also be construed as unsubstituted aryl.

The arylene involved in the present application refers to a divalent group obtained after one hydrogen atom is further removed from aryl.

In the present application, the substituted aryl may refer to aryl in which one or more hydrogen atoms are substituted by a group such as deuterium atom, halogen group, cyano, aryl, heteroaryl, trialkylsilyl, alkyl, cycloalkyl, alkoxy, alkylthio group, and the like. Specific examples of heteroaryl-substituted aryl include, but are not limited to, dibenzofuranyl-substituted phenyl, dibenzothienyl-substituted phenyl, and pyridyl-substituted phenyl. It should be understood that a number of carbon atoms in the substituted aryl refers to a total number of carbon atoms in the aryl and substituents of the aryl. For example, in substituted aryl with 18 carbon atoms, there are a total of 18 carbon atoms in the aryl and substituents of the aryl.

In the present application, specific examples of aryl as a substituent may include, but are not limited to, phenyl, naphthyl, anthracenyl, phenanthrenyl, dimethylfluorenyl, and biphenyl.

In the present application, the fluorenyl may be substituted, and two substituents may be combined to form a spiro structure. Specific examples of substituted fluorenyl may include, but are not limited to, the following structures:

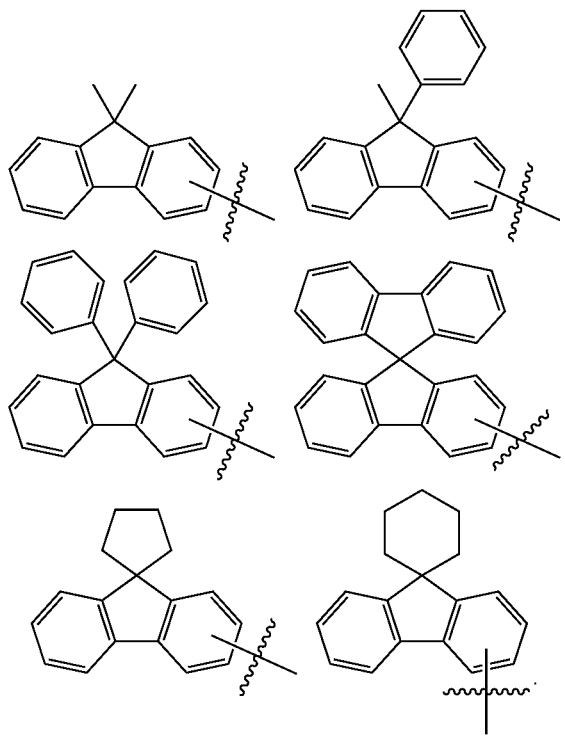

In the present application, the heteroaryl refers to a monovalent aromatic ring with 1, 2, 3, 4, 5, or 6 heteroatoms or a derivative thereof. The heteroatoms may be at least one selected from the group consisting of B, O, N, P, Si, Se, and S. The heteroaryl can be monocyclic heteroaryl or polycyclic heteroaryl. In other words, the heteroaryl may refer to a single aromatic ring system or multiple aromatic ring systems conjugated through carbon-carbon bonds, where each aromatic ring system is an aromatic monocyclic ring or an aromatic fused ring. For example, the heteroaryl may include, but is not limited to, thienyl, furyl, pyrrolyl, imidazolyl, thiazolyl, oxazolyl, oxadiazolyl, triazolyl, pyridyl, bipyridyl, pyrimidinyl, triazinyl, acridinyl, pyridazinyl, pyrazinyl, quinolinyl, quinazolinyl, quinoxalinyl, phenoxazinyl, phthalazinyl, pyridopyrimidinyl, pyridopyrazinyl, pyrazinopyrazinyl, isoquinolinyl, indolyl, carbazolyl, benzoxazolyl, benzimidazolyl, benzothiazolyl, benzocarbazolyl, benzothienyl, dibenzothienyl, thienothienyl, benzofuranyl, phenanthrolinyl, isoxazolyl, thiadiazolyl, benzothiazolyl, phenothiazinyl, silylfluorenyl, dibenzofuranyl, N-arylcarbazolyl (such as N-phenylcarbazolyl), N-heteroarylcarbazolyl (such as N-pyridylcarbazolyl), and N-alkylcarbazolyl (such as N-methylcarbazolyl). The thienyl, furyl, phenanthrolinyl, and the like are heteroaryl with a single aromatic ring system; and the N-arylcarbazolyl, N-heteroarylcarbazolyl, and the like are heteroaryl with multiple ring systems conjugated through carbon-carbon bonds. The substituted or unsubstituted heteroaryl of the present application may include 3 to 30 carbon atoms. In some embodiments, the substituted or unsubstituted heteroaryl may include 3 to 25 carbon atoms; in other embodiments, the substituted or unsubstituted heteroaryl may include 3 to 20 carbon atoms; and in still other embodiments, the substituted or unsubstituted heteroaryl may include 12 to 20 carbon atoms. For example, the substituted or unsubstituted heteroaryl may include 3, 4, 5, 7, 12, 13, 18, or 20 carbon atoms, and of course, the substituted or unsubstituted heteroaryl may include any other number of carbon atoms, which will not be listed here.

The heteroarylene involved in the present application refers to a divalent group obtained after one hydrogen atom is further removed from heteroaryl.

In the present application, the substituted heteroaryl may refer to heteroaryl in which one or more hydrogen atoms are substituted by a group such as deuterium, halogen, cyano, aryl, heteroaryl, trialkylsilyl, alkyl, cycloalkyl, alkoxy, alkylthio group and the like. Specific examples of aryl-substituted heteroaryl include, but are not limited to, phenyl-substituted dibenzofuranyl, phenyl-substituted dibenzothienyl, and N-phenylcarbazolyl. It should be understood that a number of carbon atoms in substituted heteroaryl refers to a total number of carbon atoms in the heteroaryl and substituents of the heteroaryl.

In the present application, specific examples of heteroaryl as a substituent may include, but are not limited to, dibenzofuranyl, dibenzothiophenyl, carbazolyl, N-phenylcarbazolyl, phenanthrolinyl and the like.

In the present application, the halogen group may include fluorine, iodine, bromine, chlorine, and the like.

In the present application, specific examples of trialkylsilyl with 3 to 12 carbon atoms may include, but are not limited to, trimethylsilyl, triethylsilyl, and the like.

In the present application, specific examples of triarylsilyl with 18 to 24 carbon atoms may include, but are not limited to, triphenylsilyl, and the like.

In the present application, specific examples of deuterated alkyl with 1 to 10 carbon atoms include, but are not limited to, trideuteromethyl, and the like.

According to an embodiment of the present application, L, $L_1$, and $L_2$ are each independently selected from a single bond, a substituted or unsubstituted arylene with 6 to 20 carbon atoms, or a substituted or unsubstituted heteroarylene with 5 to 20 carbon atoms.

Optionally, substituents of L, $L_1$, and $L_2$ are the same or different, and are each independently selected from deuterium, a halogen, a cyano, an alkyl with 1 to 5 carbon atoms, or an aryl with 6 to 12 carbon atoms.

In particular, specific examples of the substituents of L, $L_1$, and $L_2$ include, but are not limited to: deuterium, a fluorine, a cyano, a methyl, an ethyl, an n-propyl, an isopropyl, a tert-butyl, a phenyl, a naphthyl, or a biphenyl.

According to an embodiment of the present application, L is selected from a single bond, or a substituted or unsubstituted arylene with 6 to 12 carbon atoms.

Optionally, a substituent of L is selected from deuterium, a halogen, a cyano, an alkyl with 1 to 5 carbon atoms, or a phenyl.

According to an embodiment of the present application, L is selected from a single bond, a substituted or unsubstituted phenylene, a substituted or unsubstituted naphthylene, or a substituted or unsubstituted biphenylene.

Optionally, a substituent of L is selected from deuterium, a fluorine, a cyano, a methyl, an ethyl, an n-propyl, an isopropyl, a tert-butyl, or a phenyl.

Further optionally, L is selected from a single bond, an unsubstituted phenylene, an unsubstituted naphthylene, or an unsubstituted biphenylene.

Specifically, L is selected from a single bond or the following groups:

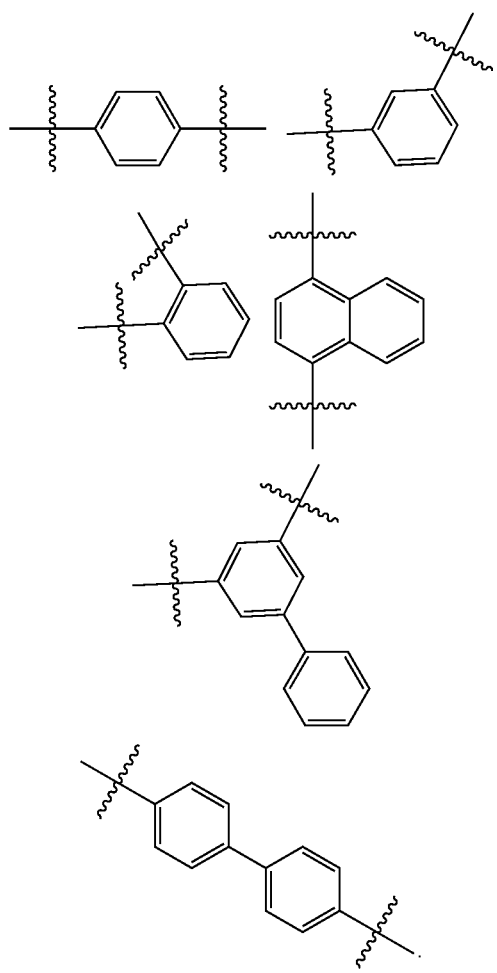

According to an embodiment of the present application, $L_1$ and $L_2$ are each independently selected from a single bond, a substituted or unsubstituted phenylene, a substituted or unsubstituted naphthylene, a substituted or unsubstituted anthracenylene, a substituted or unsubstituted phenanthrenylene, a substituted or unsubstituted biphenylene, a substituted or unsubstituted fluorenylene, a substituted or unsubstituted dibenzofuranylene, a substituted or unsubstituted dibenzothiophenylene, or a substituted or unsubstituted carbazolylene.

Optionally, specific examples of the substituents of $L_1$ and $L_2$ include, but are not limited to: deuterium, a halogen group, a cyano, a methyl, an ethyl, an n-propyl, an isopropyl, a tert-butyl, a phenyl, a naphthyl, or a biphenyl.

According to an embodiment of the present application, $L_1$ and $L_2$ are each independently selected from a single bond or a substituted or unsubstituted group V; the unsubstituted group V is selected from the group consisting of the following groups:

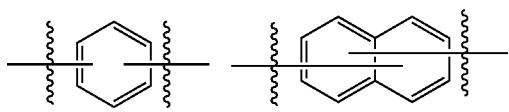

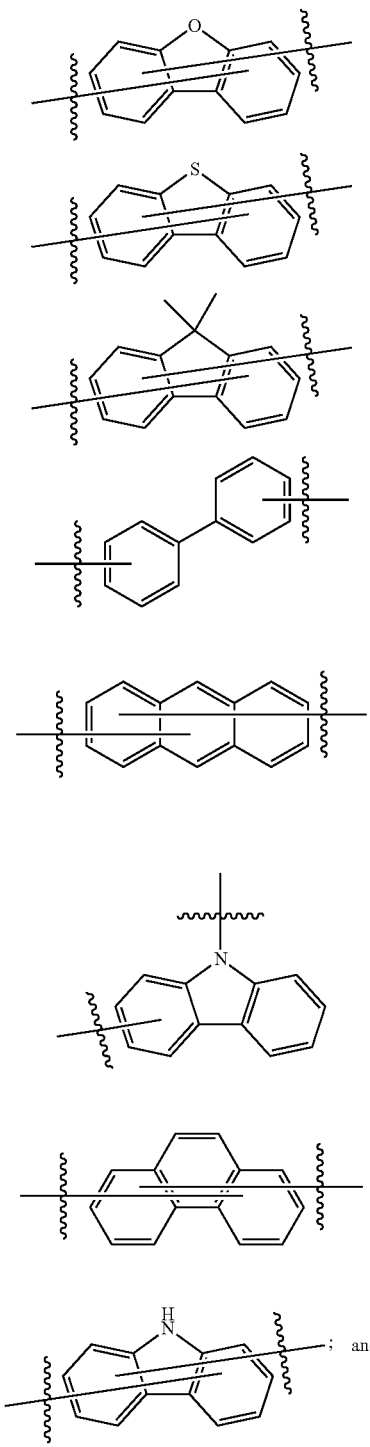

the substituted group V has one or more substituents, the substituents are each independently selected from deuterium, a fluorine, a cyano, a methyl, an ethyl, an n-propyl, an isopropyl, a tert-butyl, a phenyl, a naphthyl, or a biphenyl, and when the number of the substituents in the group V is greater than 1, the substituents are the same or different.

Optionally, $L_1$ and $L_2$ are each independently selected from the group consisting of a single bond and the following groups:

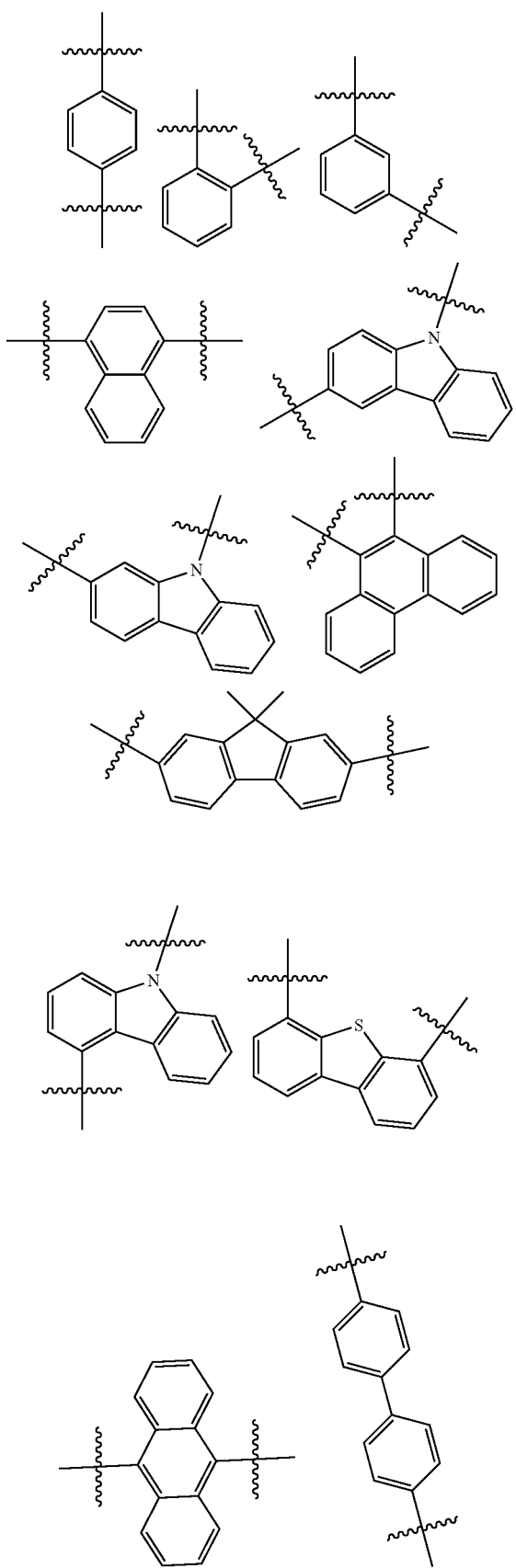

According to an embodiment of the present application, $Ar_1$ and $Ar_2$ are the same or different, and are each independently selected from a substituted or unsubstituted aryl with 6 to 25 carbon atoms, or a substituted or unsubstituted heteroaryl with 5 to 20 carbon atoms.

Optionally, substituents of $Ar_1$ and $Ar_2$ are the same or different, and are each independently selected from deuterium, a halogen, a cyano, an alkyl with 1 to 5 carbon atoms, an aryl with 6 to 20 carbon atoms, a deuterated alkyl with 1 to 5 carbon atoms, a cycloalkyl with 5 to 10 carbon atoms, or a triphenylsilyl; and optionally, among the substituents of $Ar_1$ and $Ar_2$, any two adjacent substituents form a saturated or unsaturated ring with 5 to 13 carbon atoms. For example, among substituents of $Ar_1$ or $Ar_2$, any two adjacent substituents form a fluorene ring

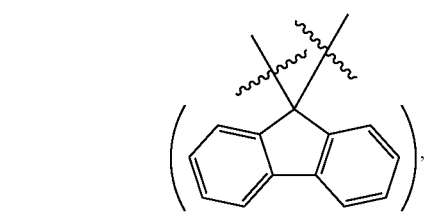

a cyclohexane

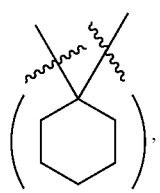

or a cyclopentane

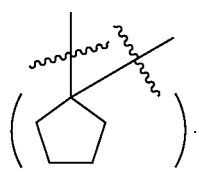

In particular, specific examples of the substituents of Ar$_1$ and Ar$_2$ include, but are not limited to: deuterium, a fluorine, a cyano, an n-propyl, an isopropyl, a tert-butyl, a phenyl, a naphthyl, a biphenyl, a phenanthrenyl, an anthracenyl, a fluorenyl, a terphenyl, a trideuteromethyl, a cyclohexyl, or a cyclopentyl.

According to an embodiment of the present application, Ar$_1$ and Ar$_2$ are the same or different, and are each independently selected from a substituted or unsubstituted phenyl, a substituted or unsubstituted naphthyl, a substituted or unsubstituted biphenyl, a substituted or unsubstituted phenanthrenyl, a substituted or unsubstituted terphenyl, a substituted or unsubstituted fluorenyl, a substituted or unsubstituted carbazolyl, a substituted or unsubstituted triphenylene group, a substituted or unsubstituted dibenzofuranyl, or a substituted or unsubstituted dibenzothiophenyl.

Optionally, the substituents of Ar$_1$ and Ar$_2$ are the same or different, and are each independently selected from deuterium, a fluorine, a cyano, a methyl, an ethyl, an n-propyl, an isopropyl, a tert-butyl, a phenyl, a naphthyl, a biphenyl, a cyclopentyl, a cyclohexyl, a trideuteromethyl, or a triphenylsilyl; and optionally, any two adjacent substituents of Ar$_1$ and Ar$_2$ form a saturated or unsaturated ring with 5 to 13 carbon atoms.

According to an embodiment of the present application, Ar$_1$ and Ar$_2$ are selected from a substituted or unsubstituted group W; the unsubstituted group W is selected from the group consisting of the following groups:

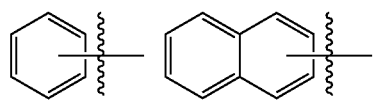

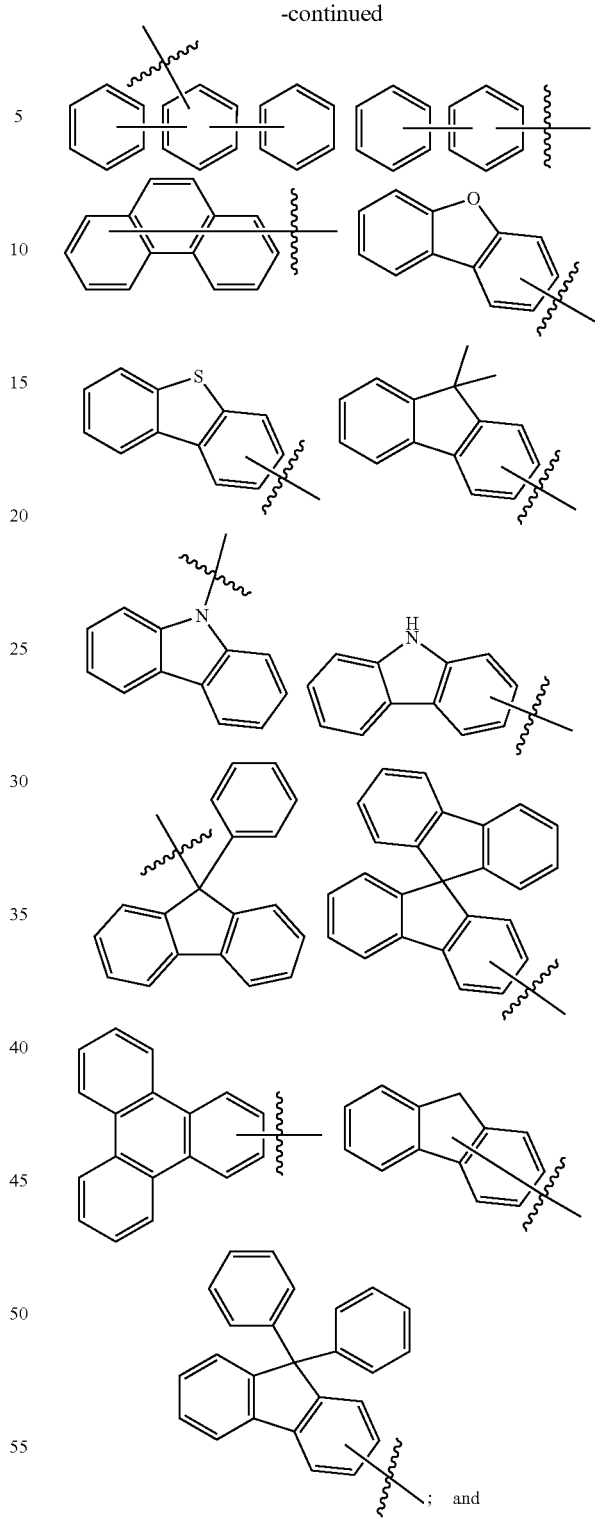

the substituted group W has one or more substituents, the substituents are each independently selected from deuterium, a fluorine, a cyano, a methyl, an ethyl, an n-propyl, an isopropyl, a tert-butyl, a phenyl, a naphthyl, a biphenyl, a cyclopentyl, a cyclohexyl, a trideuteromethyl, or a triphenylsilyl, and when the number of the substituents in the group W is greater than 1, the substituents are the same or different.

In particular, $Ar_1$ and $Ar_2$ are each selected from the group consisting of the following groups:
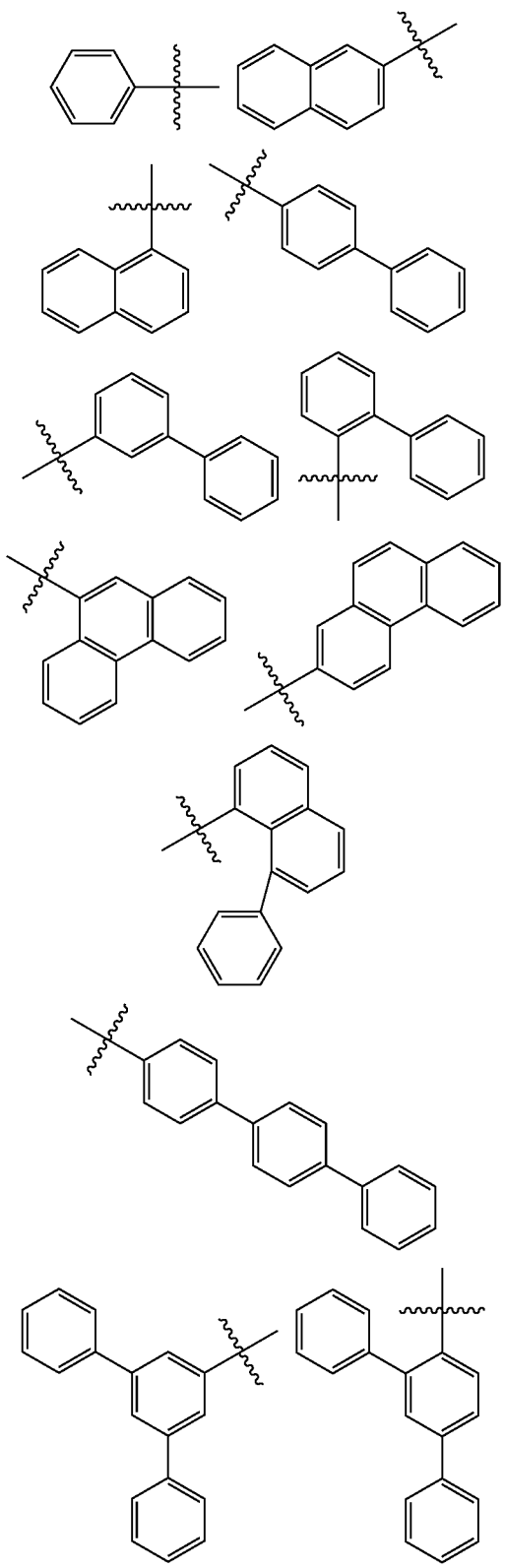
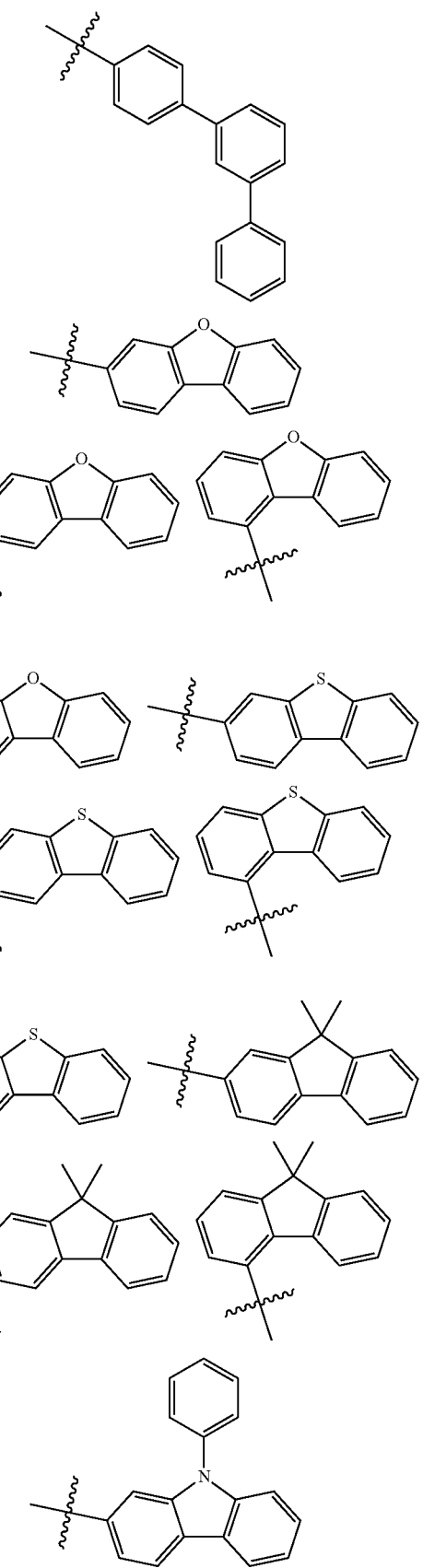

-continued
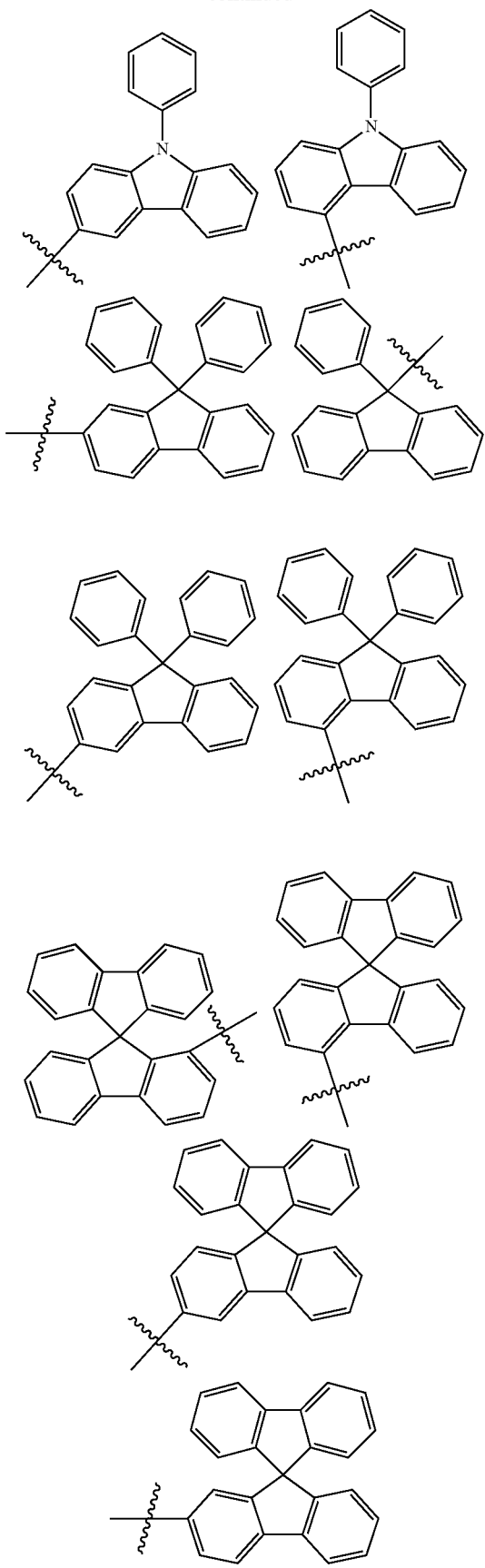
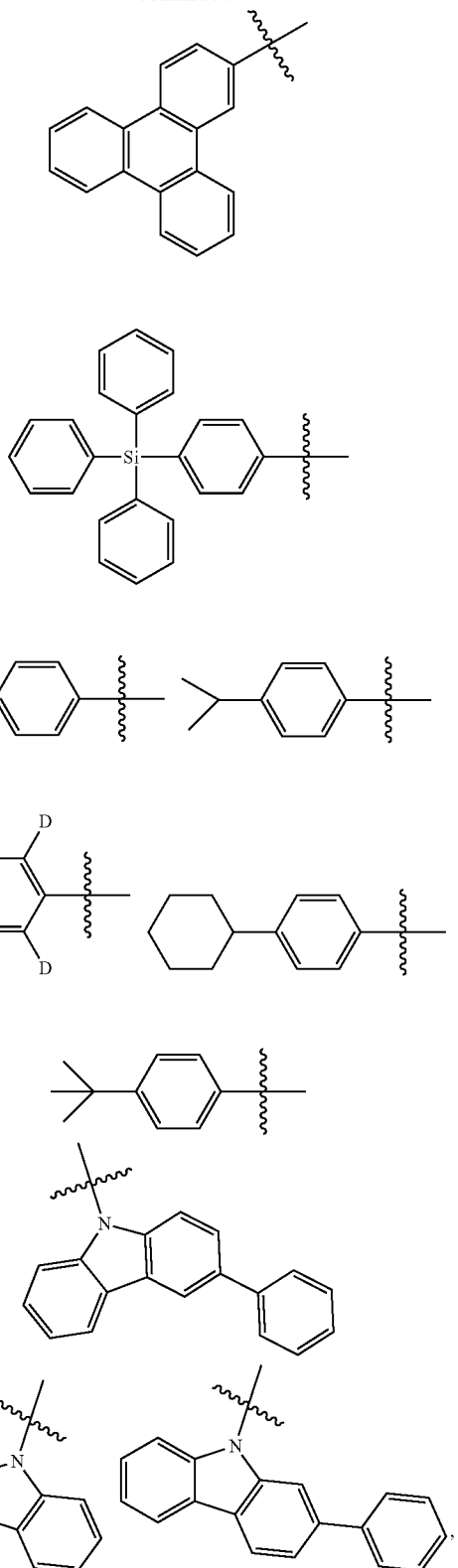
but are not limited thereto.
Optionally, the nitrogen-containing compound is selected from the group consisting of the following compounds, but is not limited thereto:

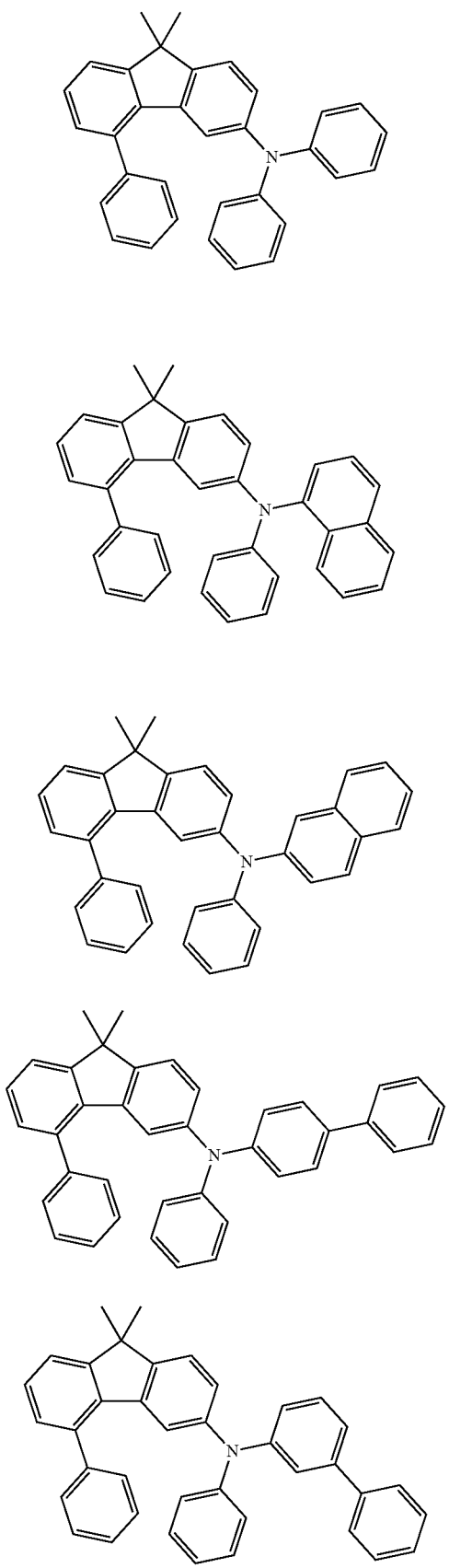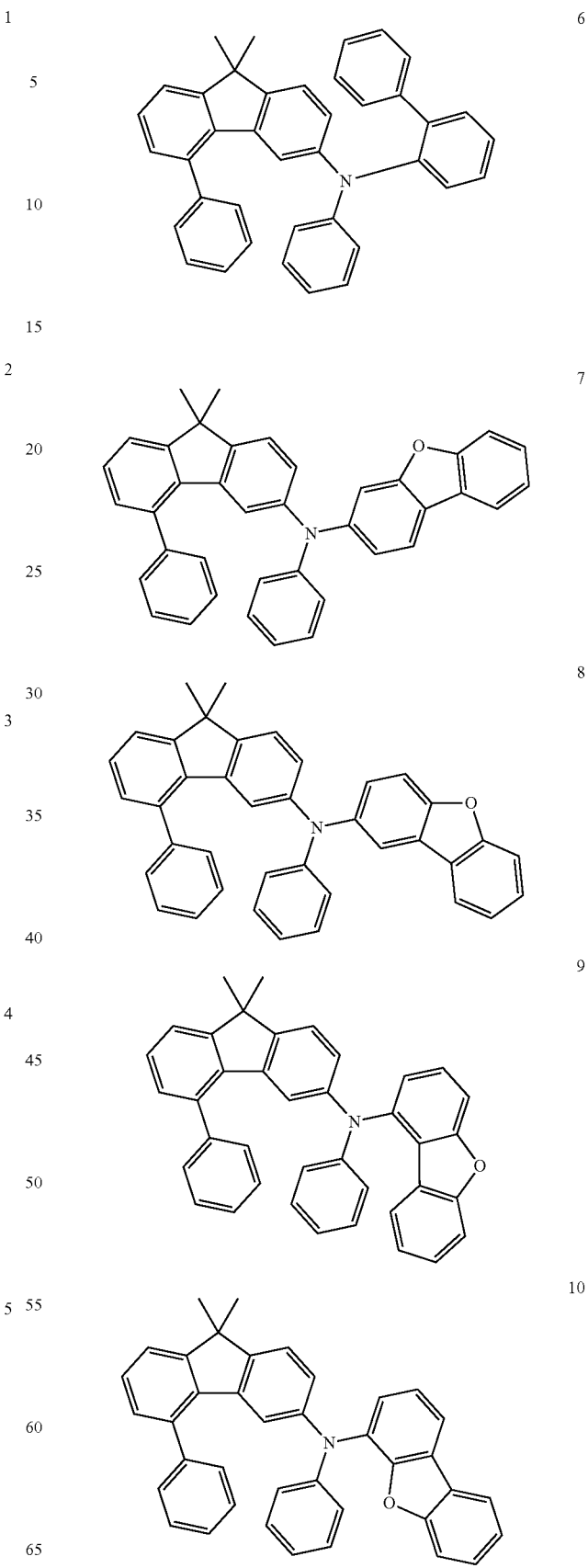

11
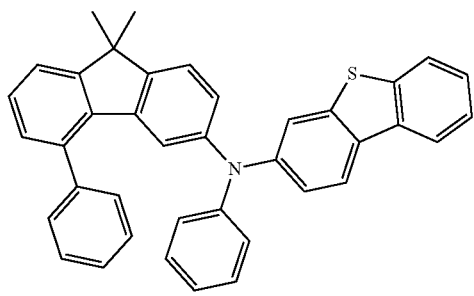 [SMILES: CC1(C)c2ccc(N(c3ccccc3)c3ccc4c(c3)sc3ccccc34)cc2-c2c(-c3ccccc3)cccc21]
12
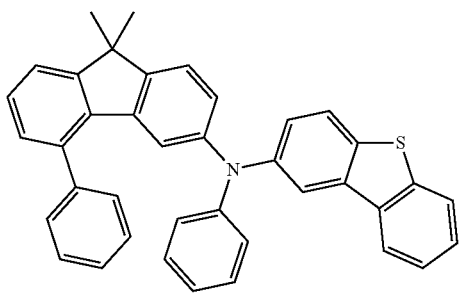
13
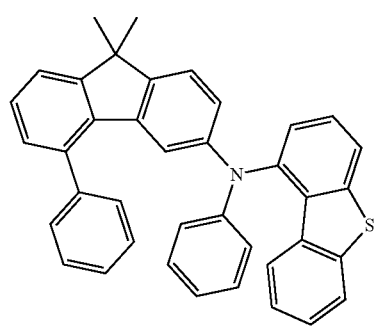
14
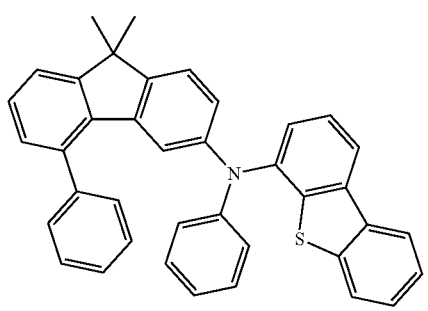
15
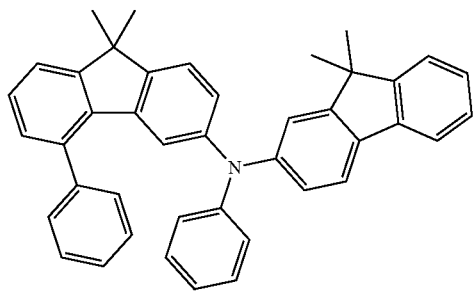
16
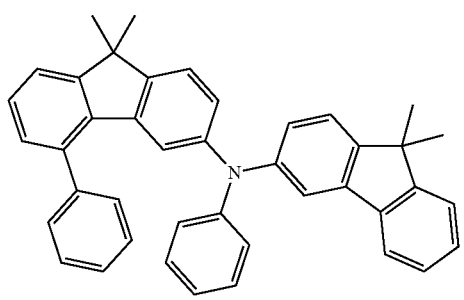
17
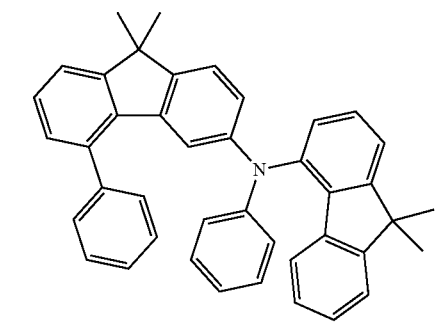
18
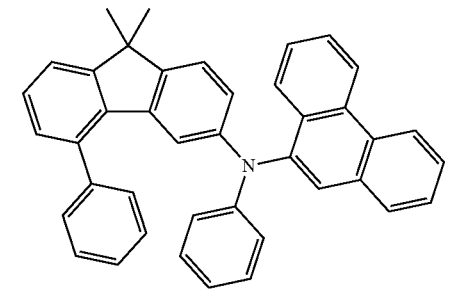
19
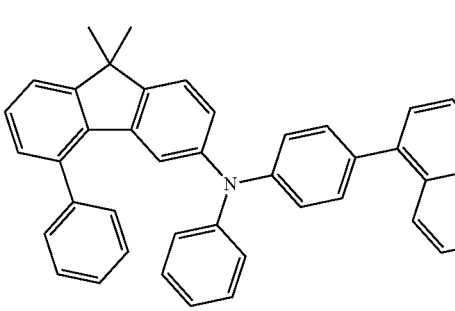
20
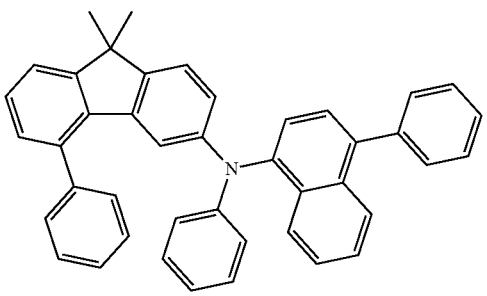

-continued
21
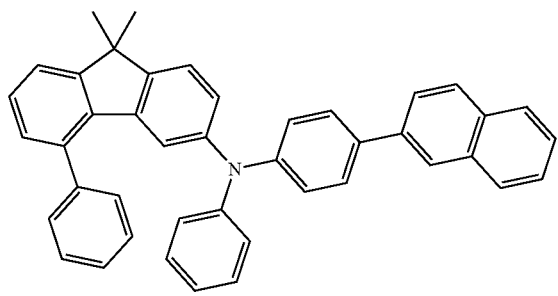
22
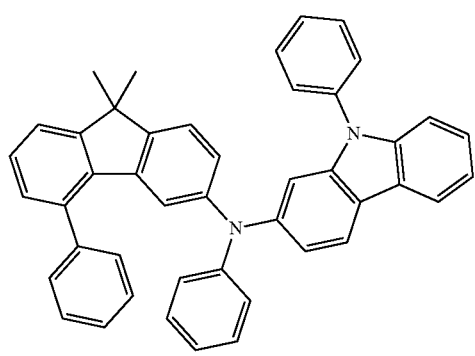
23
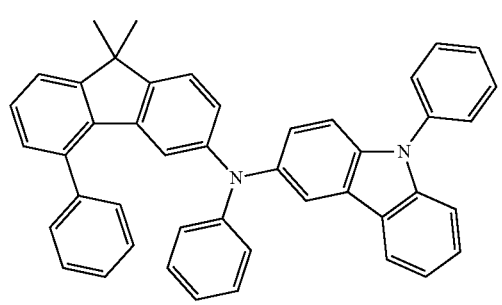
24
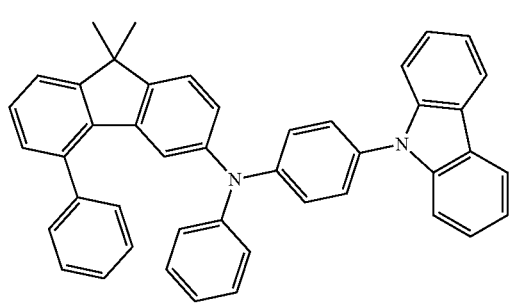
25
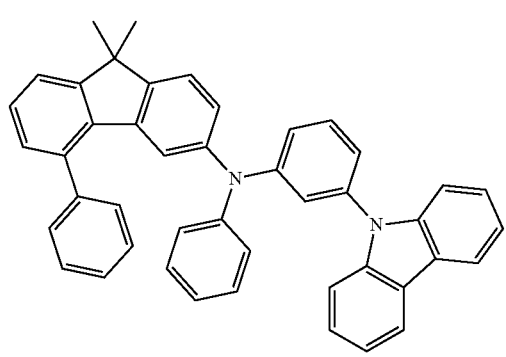
-continued
26
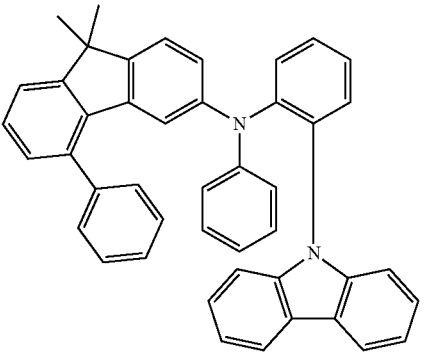
27
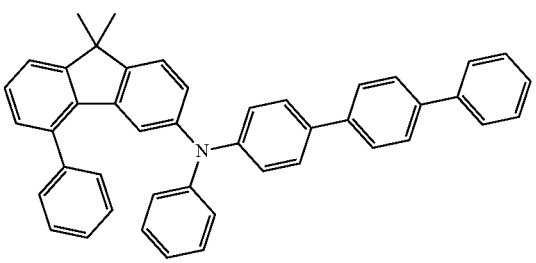
28
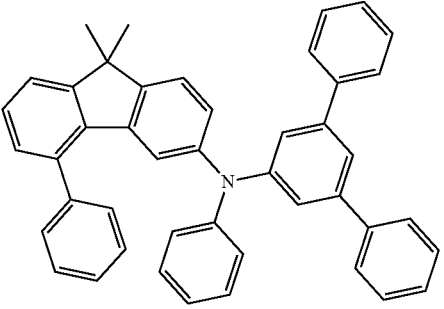
29
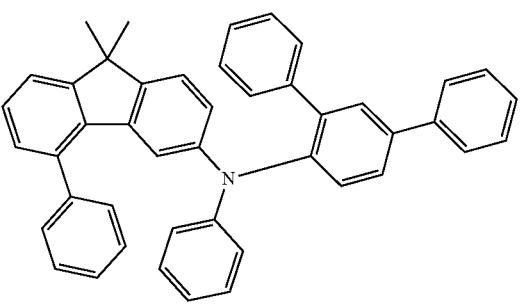

30
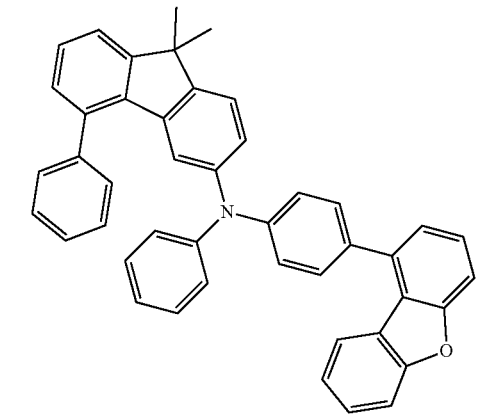
31
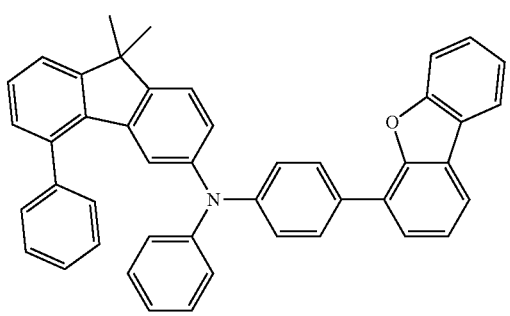
32
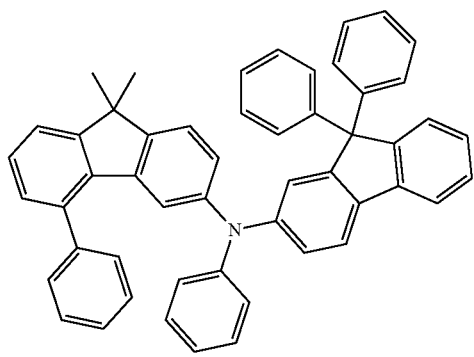
33
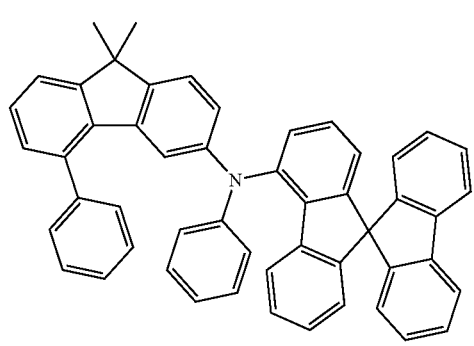
34
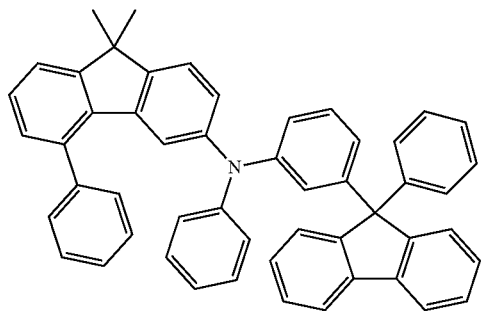
35
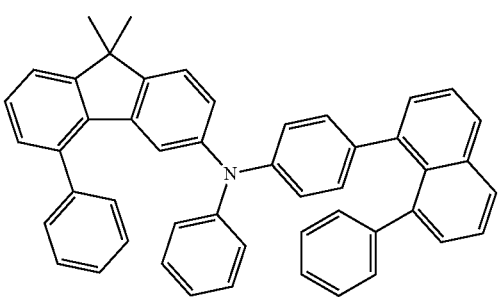
36
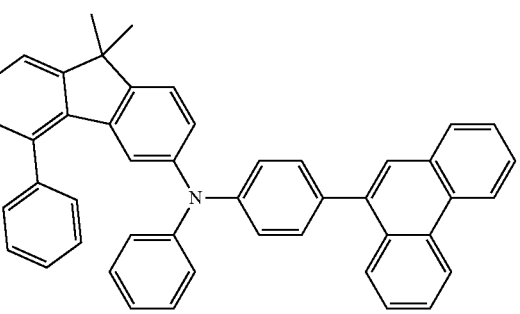
37
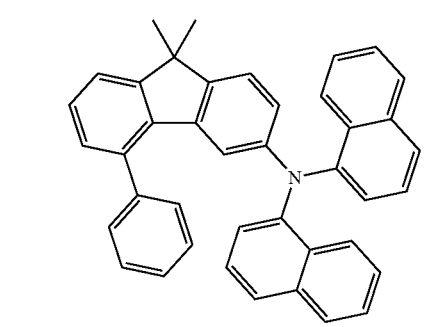
38
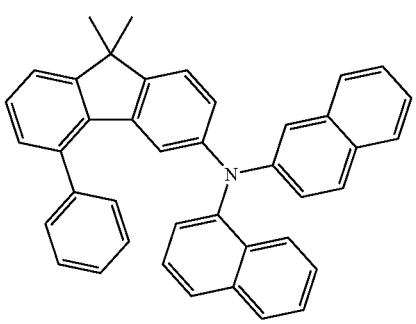

39
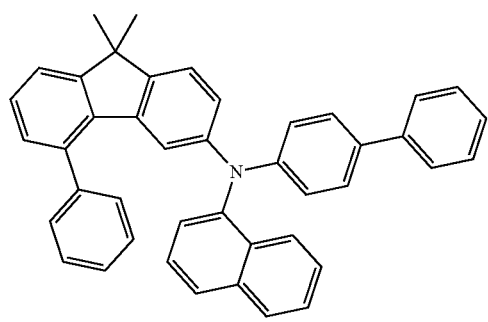 [SMILES: CC1(C)c2ccc(N(c3ccc(-c4ccccc4)cc3)c3cccc4ccccc34)cc2-c2c(-c3ccccc3)cccc21]
40
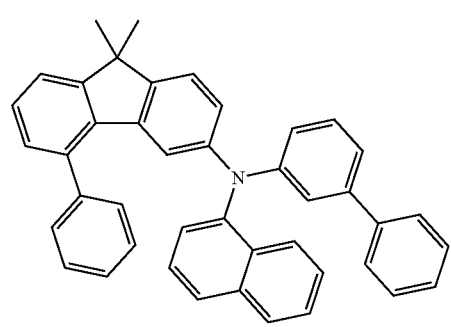
41
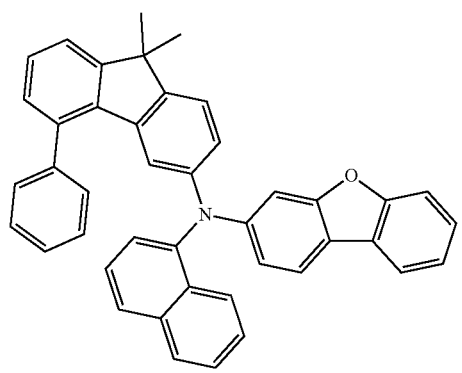
42
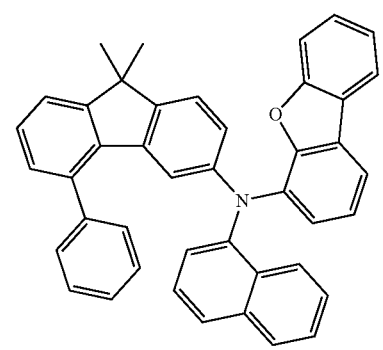
43
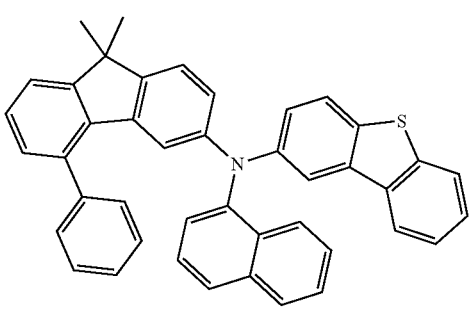
44
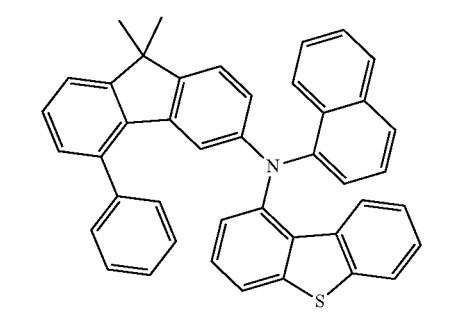
45
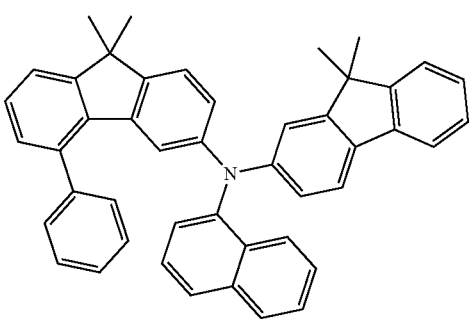
46
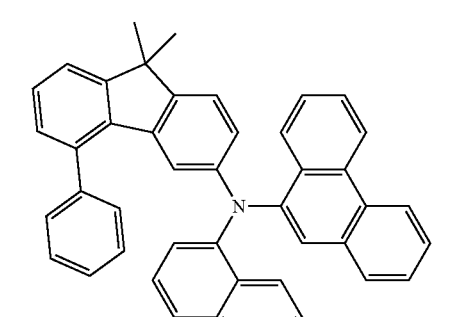
47
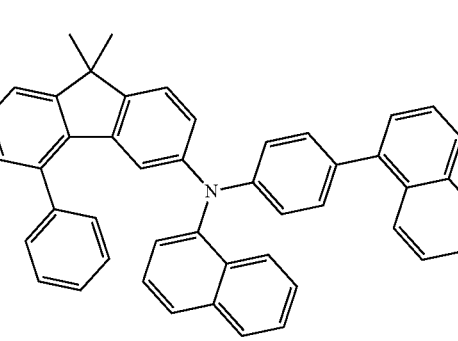

48
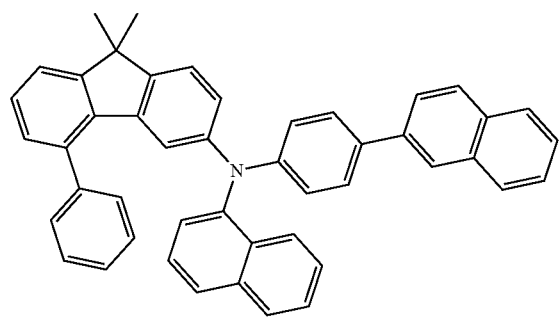
49
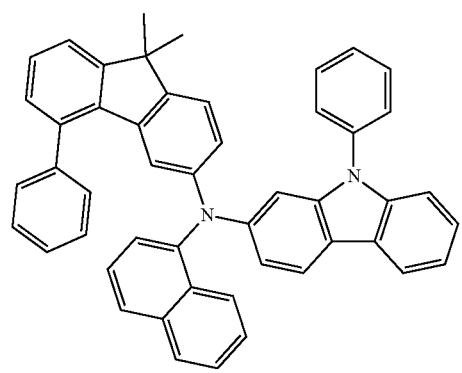 [SMILES: CC1(C)c2ccc(N(c3ccc4c5ccccc5n(-c5ccccc5)c4c3)c3cccc4ccccc34)cc2-c2c(-c3ccccc3)cccc21]
50
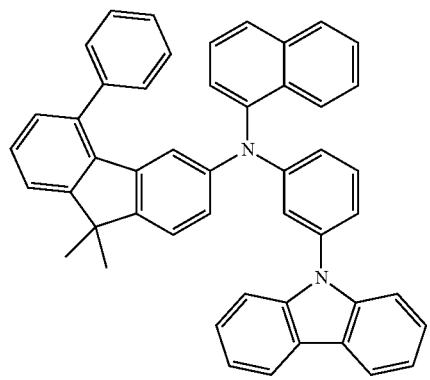
51
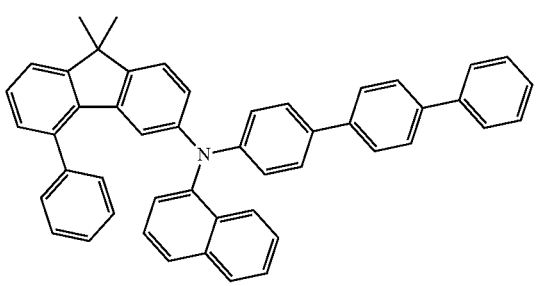
52
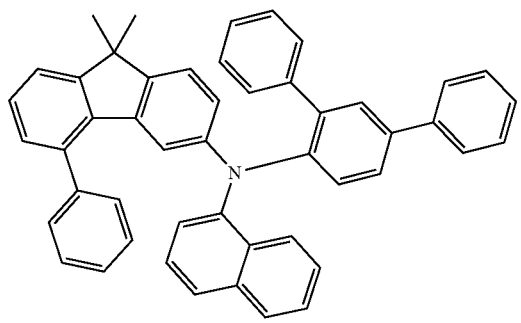
53
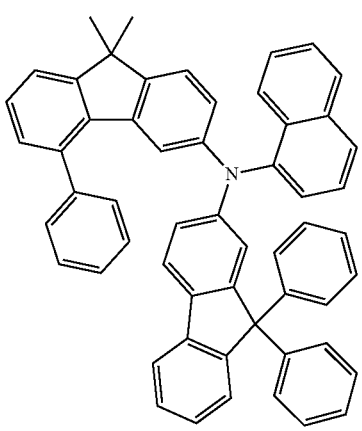
54
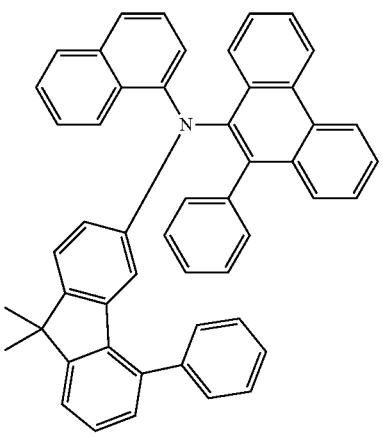
55
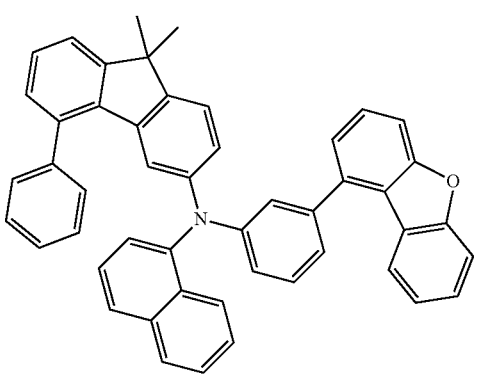

-continued
56
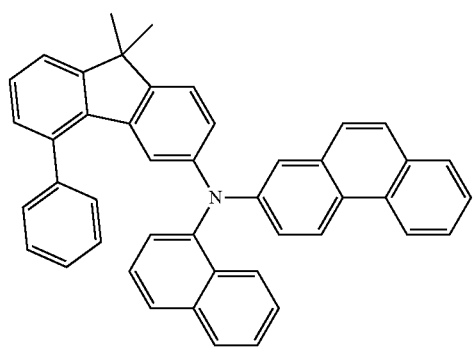
57
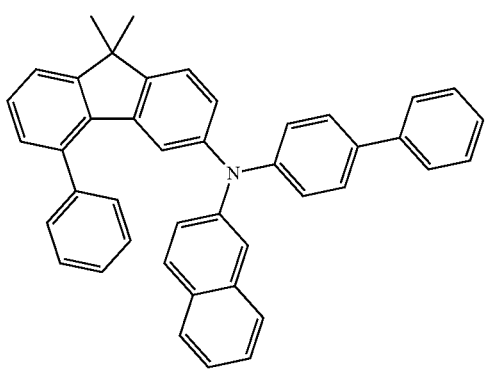
58
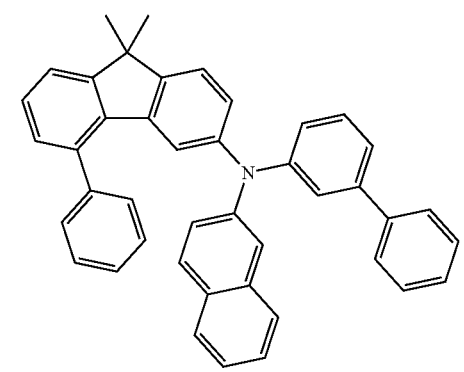 [SMILES: CC1(C)c2ccc(N(c3cccc(-c4ccccc4)c3)c3ccc4ccccc4c3)cc2-c2c(-c3ccccc3)cccc21]
59
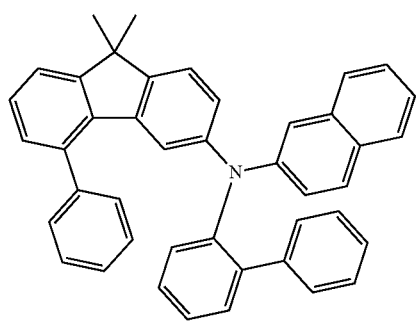
-continued
60
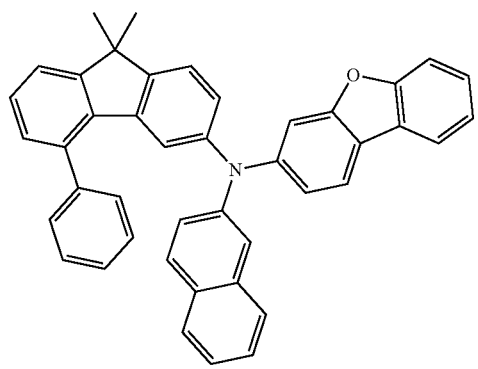
61
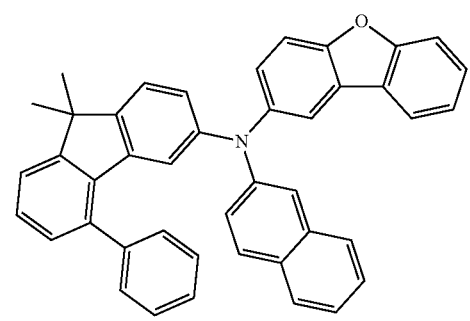
62
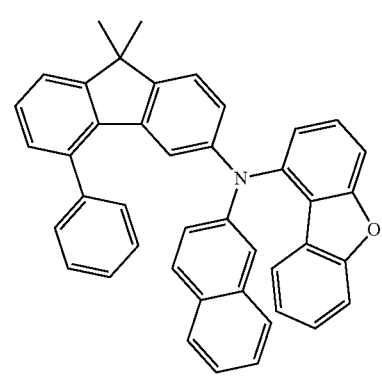
63
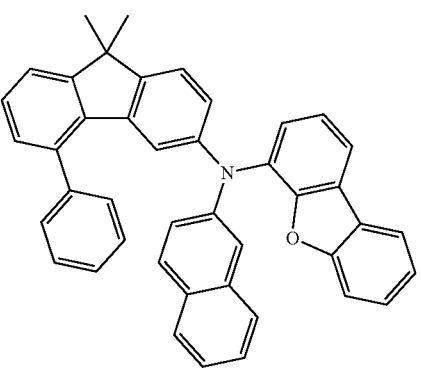

64
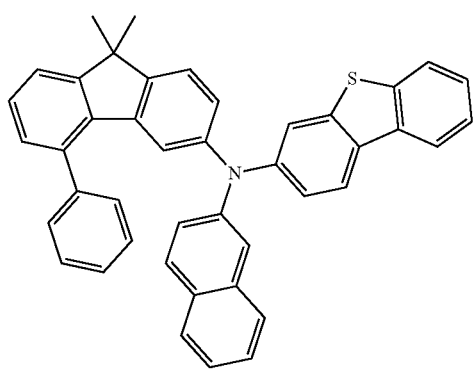
65
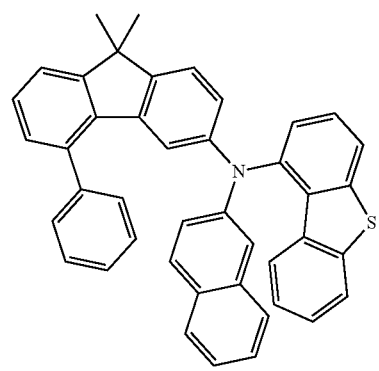
66
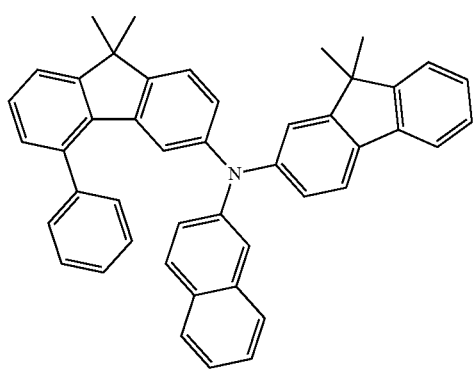
67
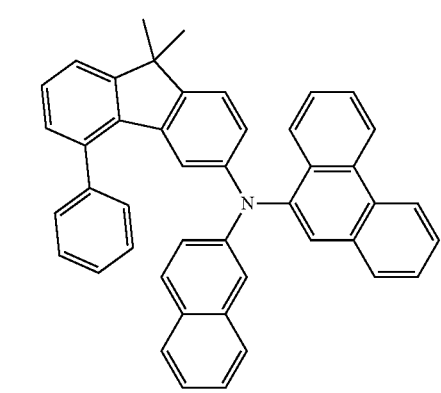
68
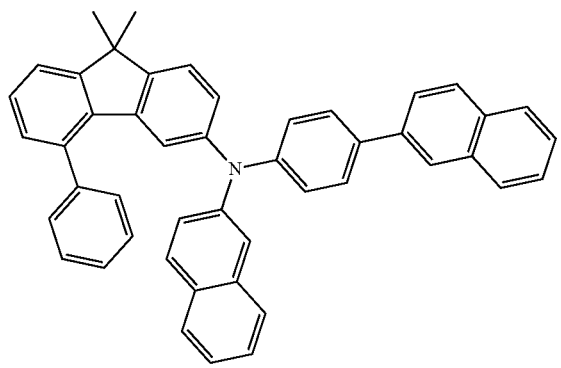 [SMILES: CC1(C)c2ccc(N(c3ccc(-c4ccc5ccccc5c4)cc3)c3ccc4ccccc4c3)cc2-c2c(-c3ccccc3)cccc21]
69
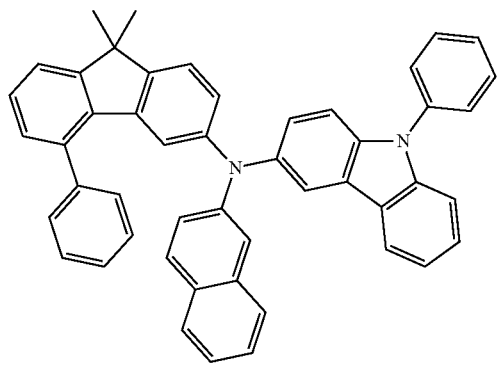
70
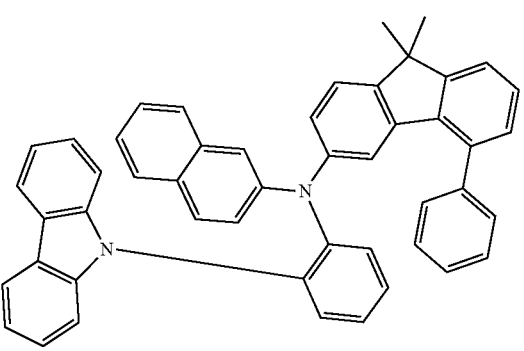
71
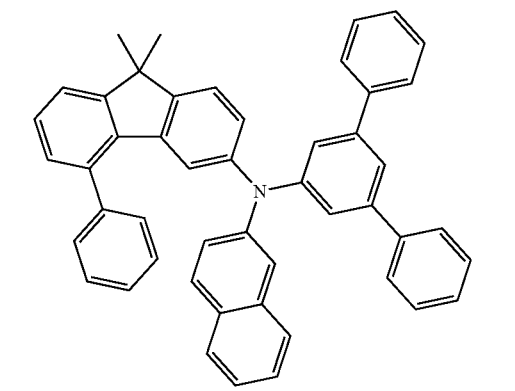

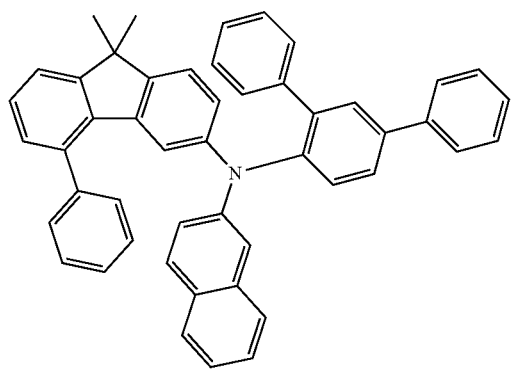
72
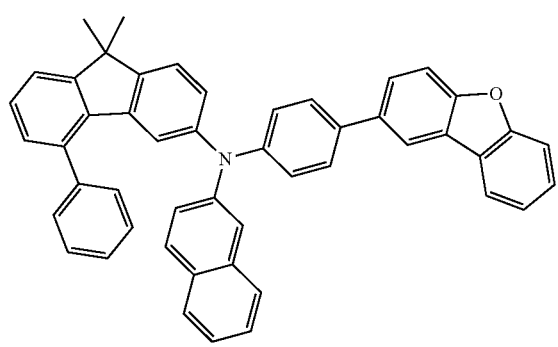
73
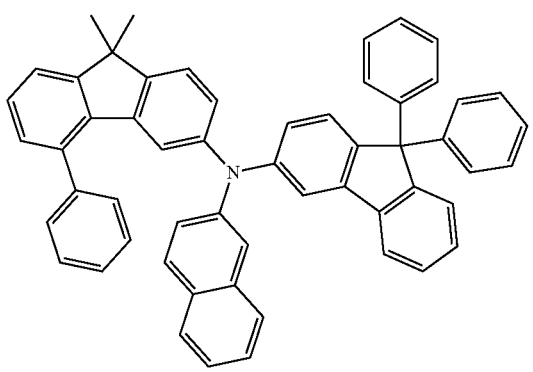
74
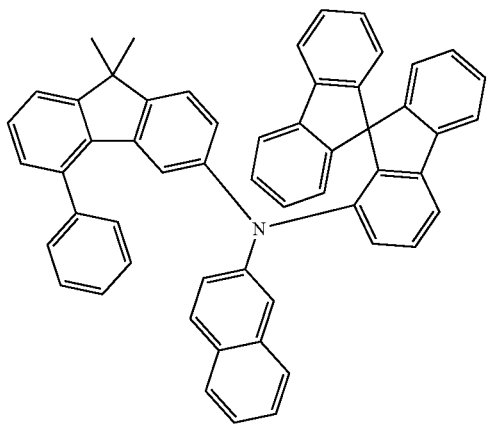
76
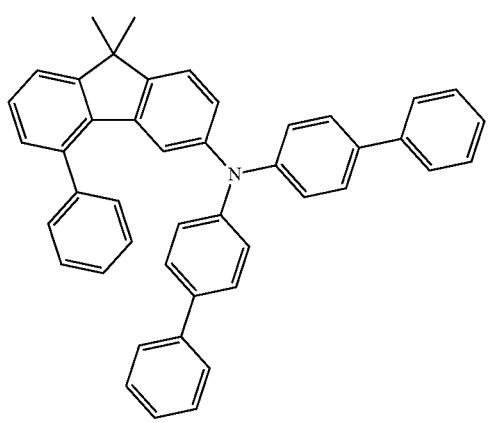 [SMILES: CC1(C)c2ccc(N(c3ccc(-c4ccccc4)cc3)c3ccc(-c4ccccc4)cc3)cc2-c2c(-c3ccccc3)cccc21]
77
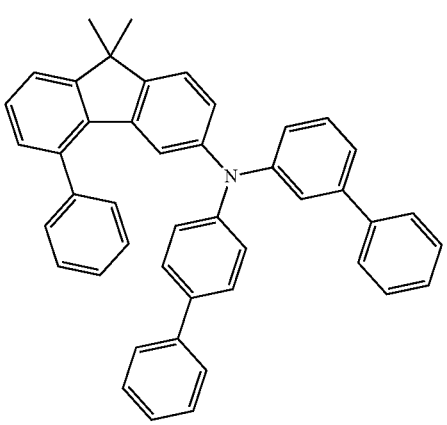
78

79
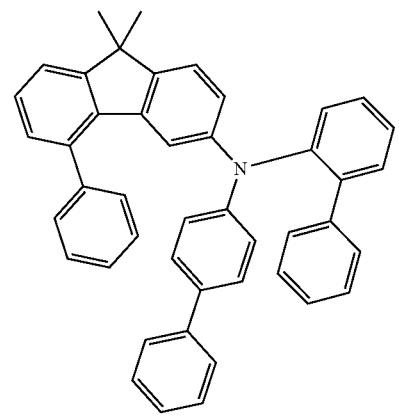
80
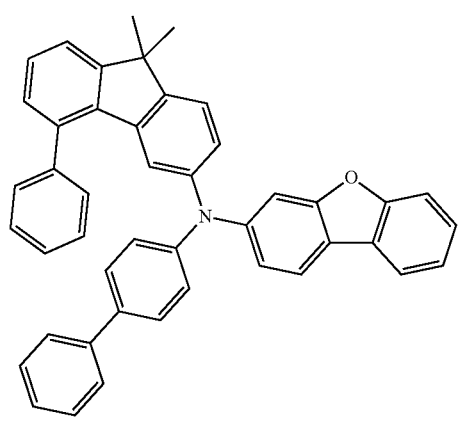
81
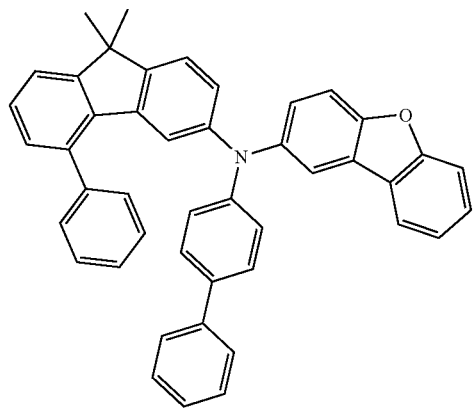
82
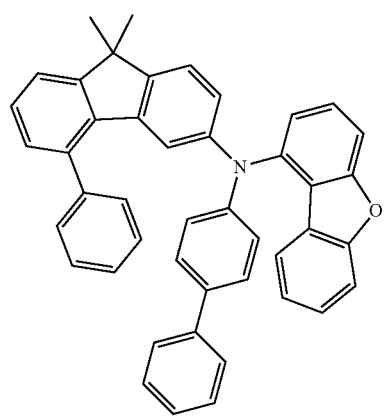
83
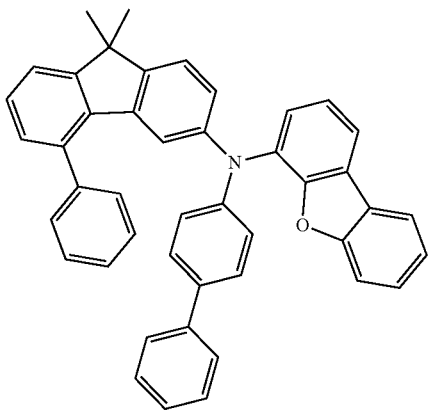
84
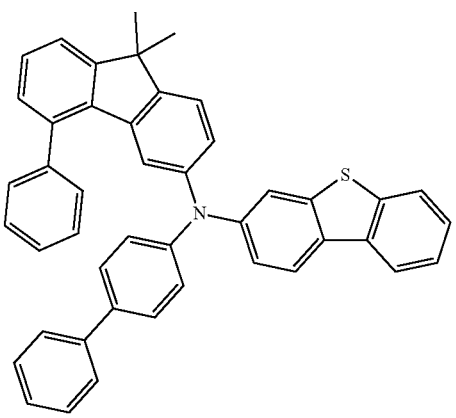
85
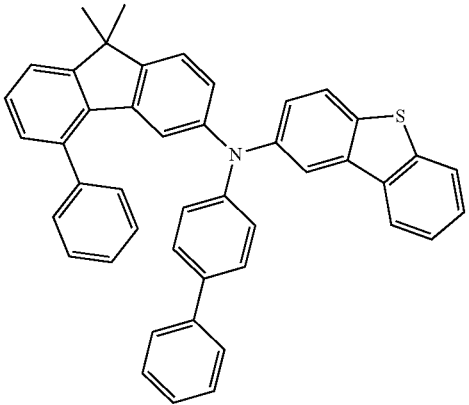
86
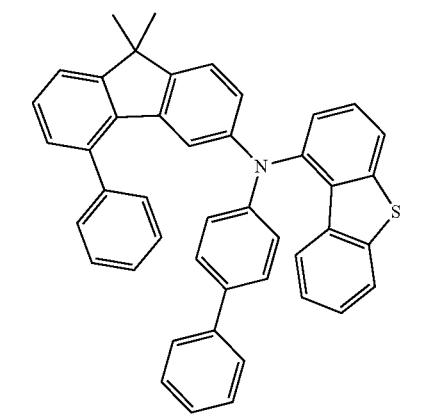

87
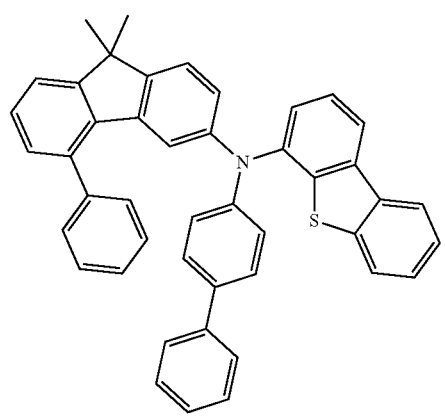
90
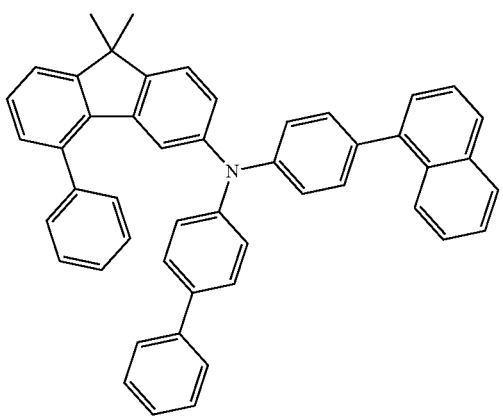
88
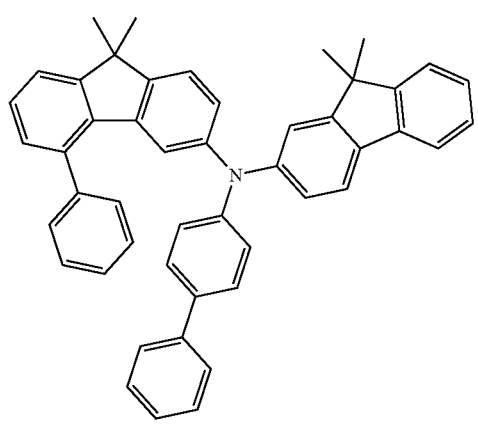
91
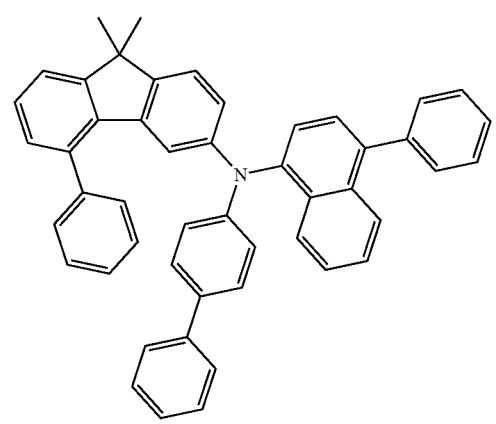
89
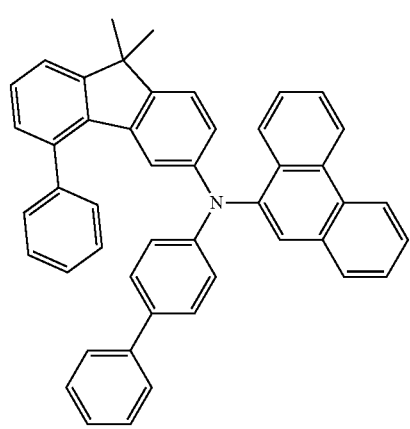
92
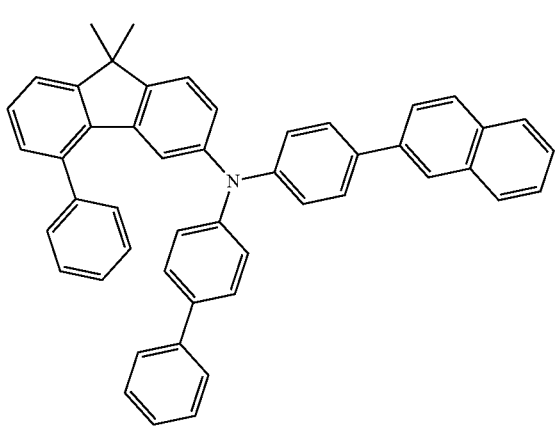

93
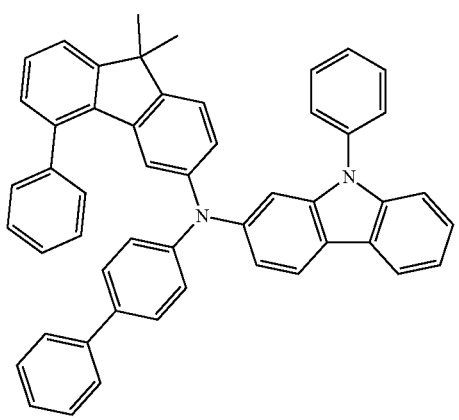
94
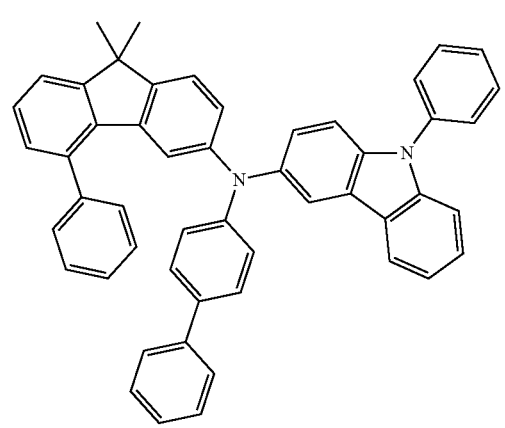
95
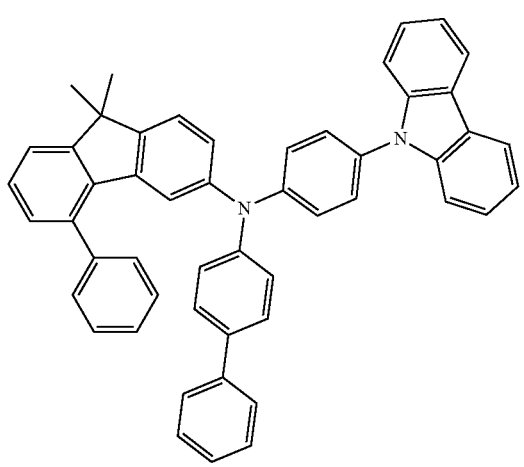
96
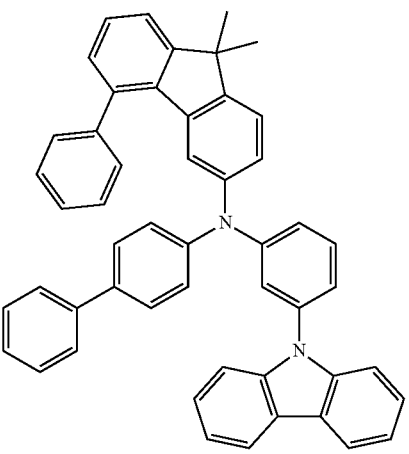
97
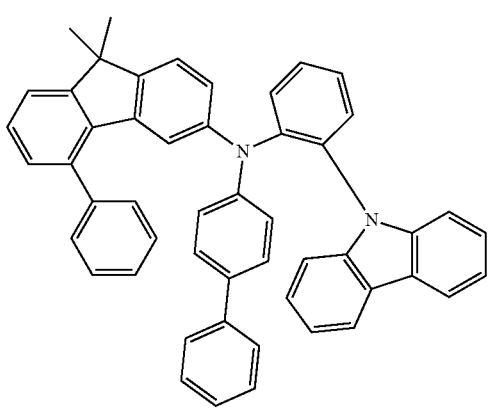
98
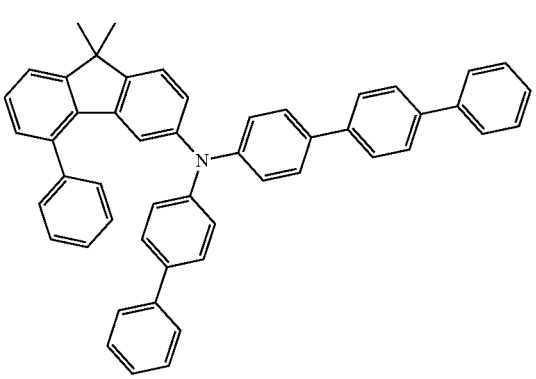

99
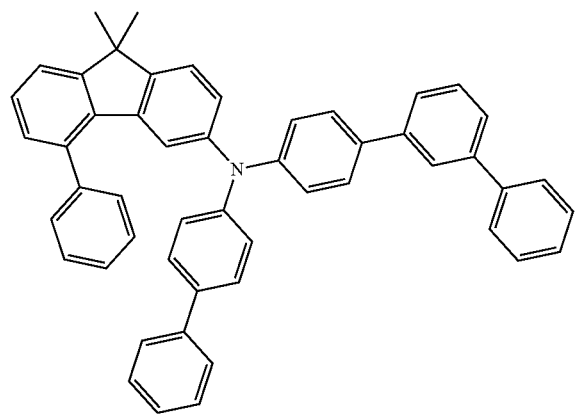
100
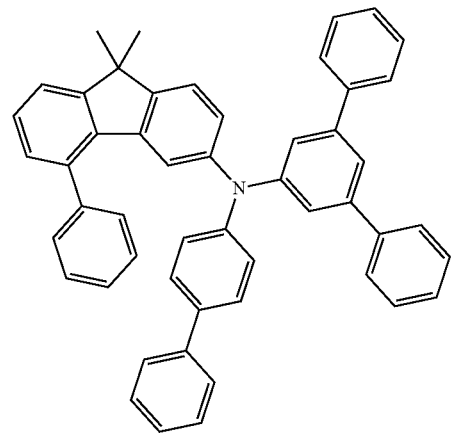
101
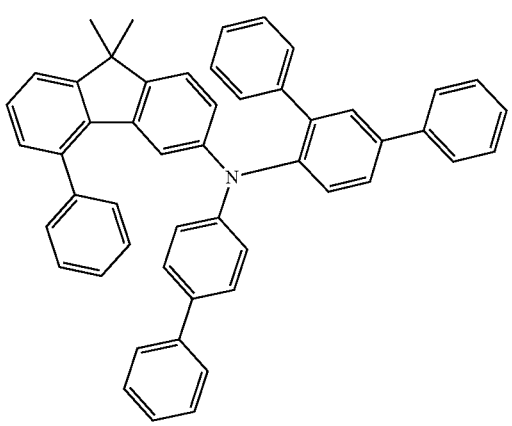
102
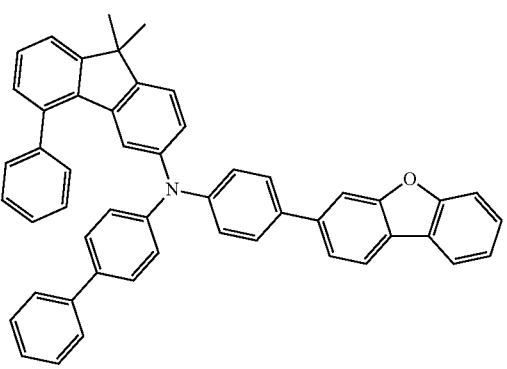
103
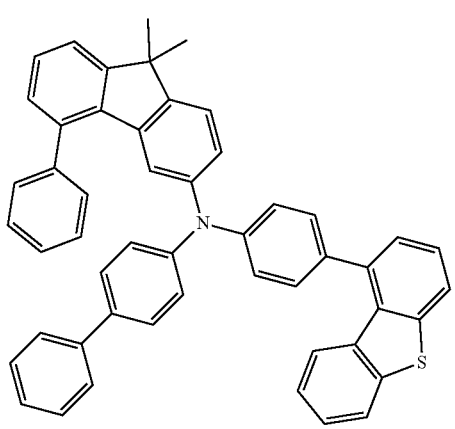
104
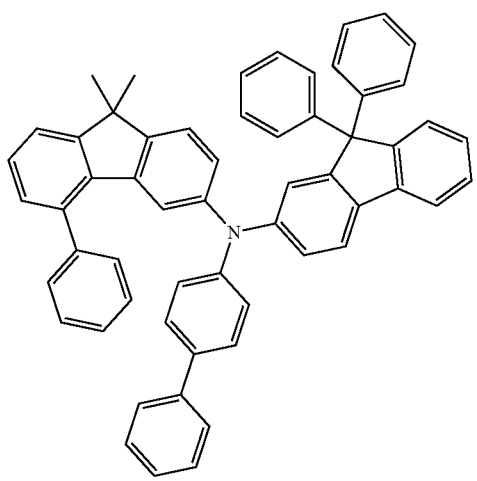

105
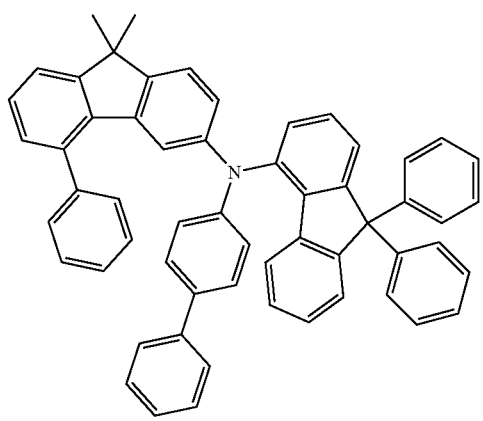
106
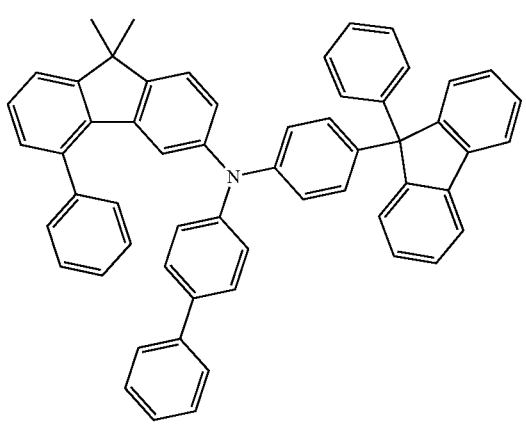
107
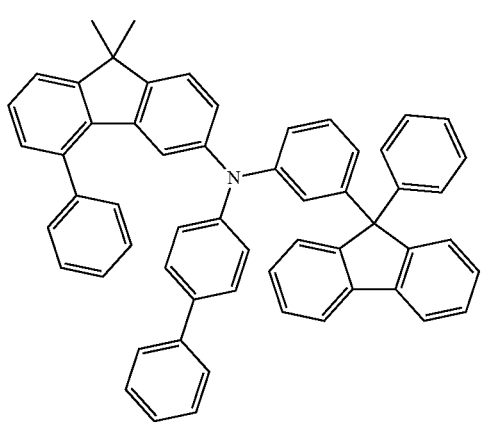
108
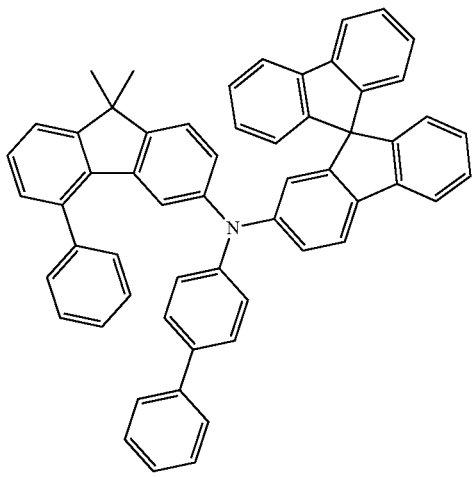 [SMILES: CC1(C)c2ccc(N(c3ccc(-c4ccccc4)cc3)c3ccc4c(c3)C3(c5ccccc5-c5ccccc53)c3ccccc3-4)cc2-c2c(-c3ccccc3)cccc21]
109
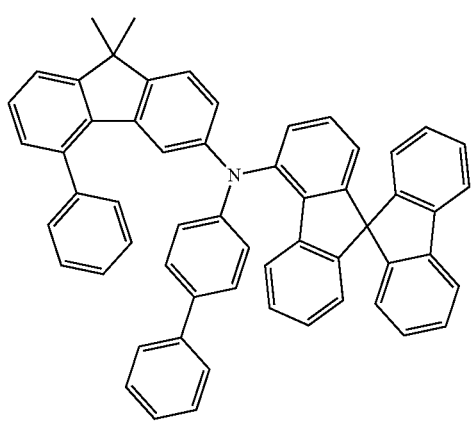
110
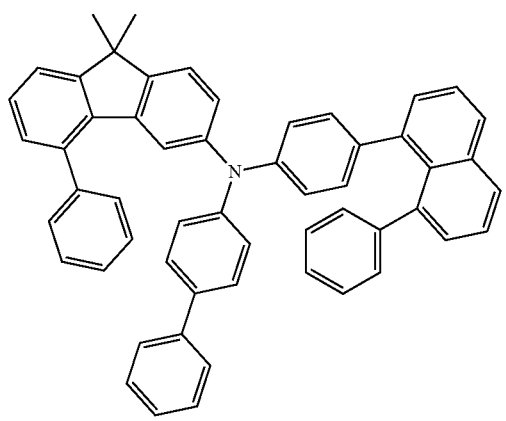

111
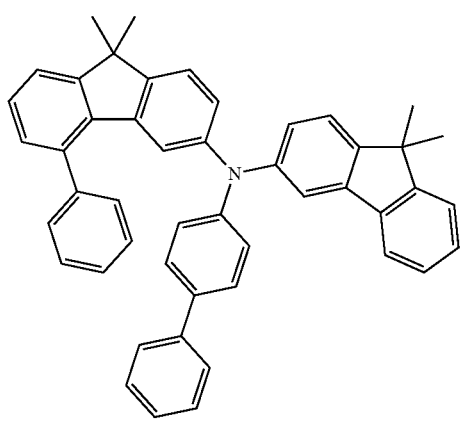
112
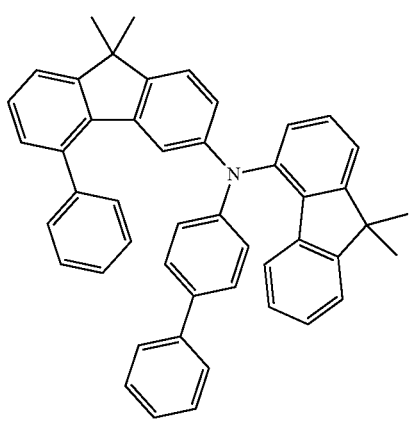
113
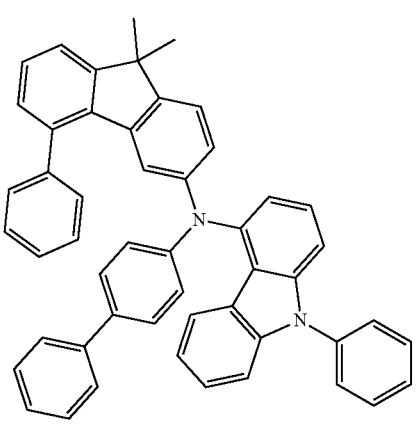
114
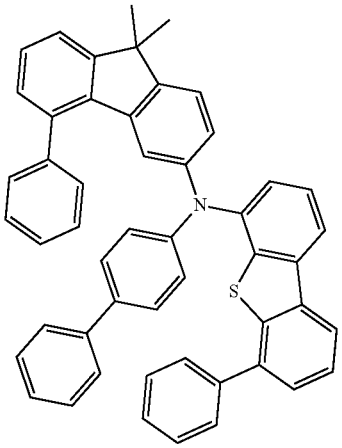
115
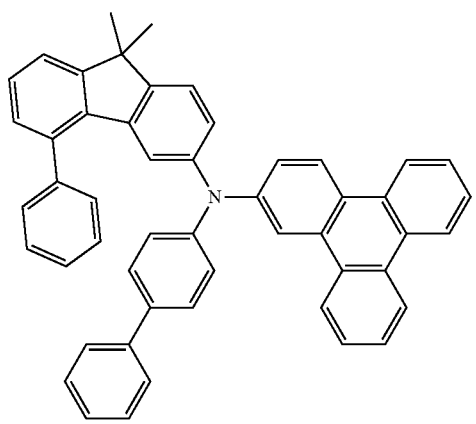
116
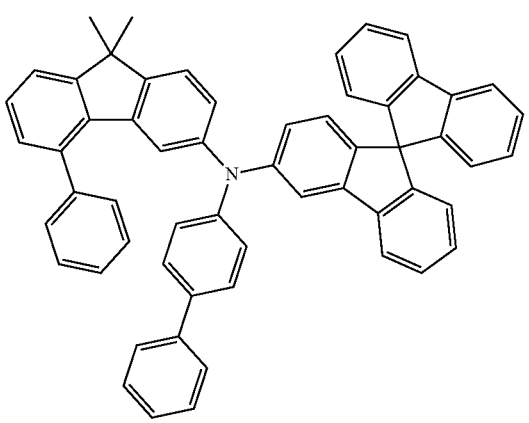

117
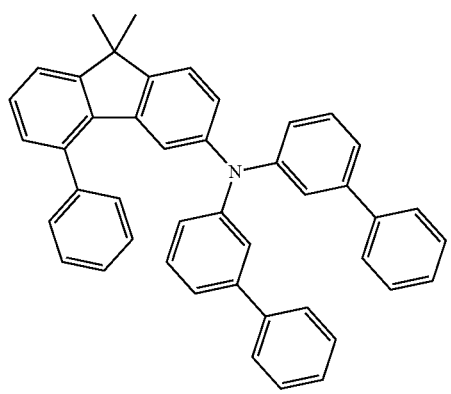
118
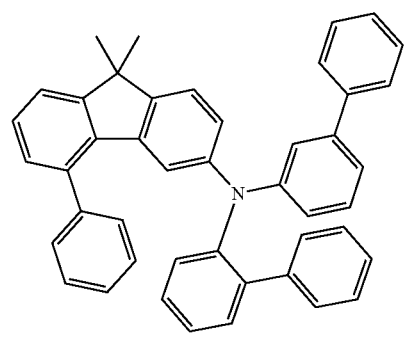
119
120
121
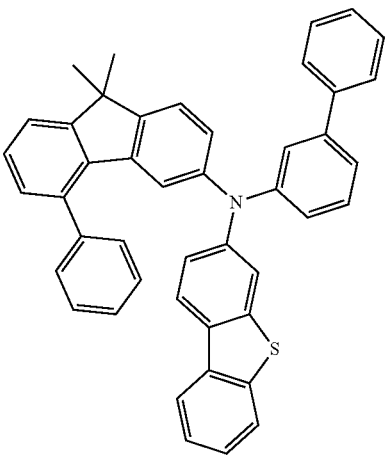
122
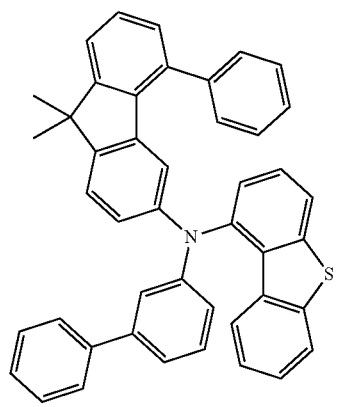
123
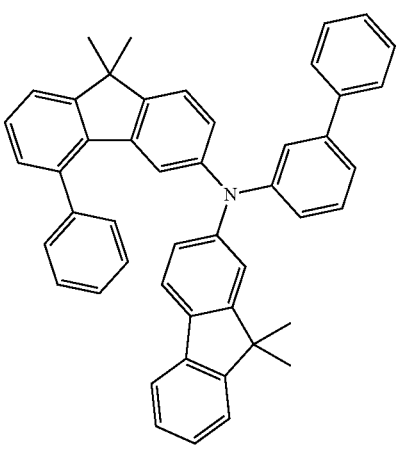 [SMILES: CC1(C)c2ccccc2-c2ccc(N(c3cccc(-c4ccccc4)c3)c3ccc4c(c3)-c3c(-c5ccccc5)cccc3C4(C)C)cc21]

124
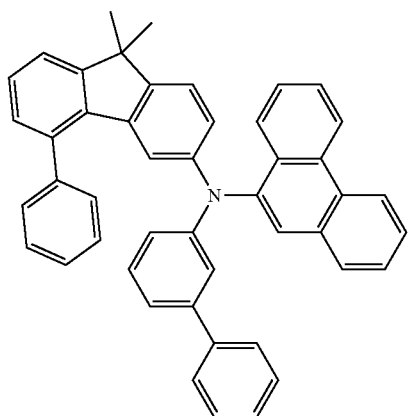
125
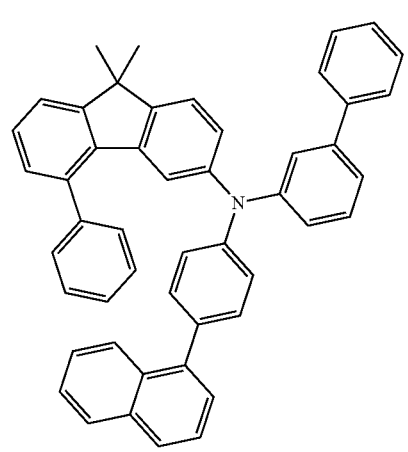
126
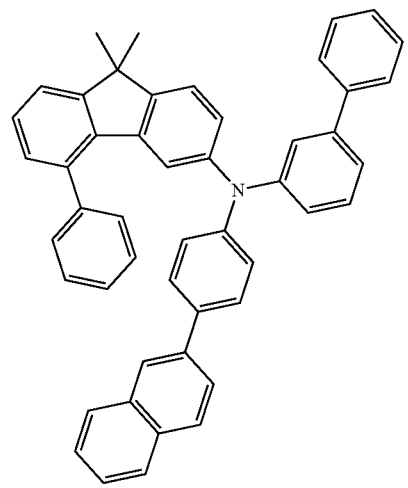
127
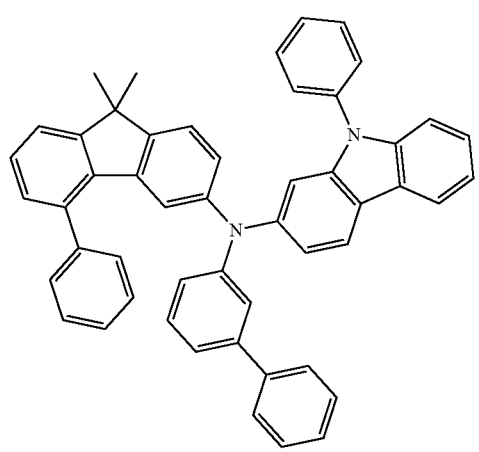
128
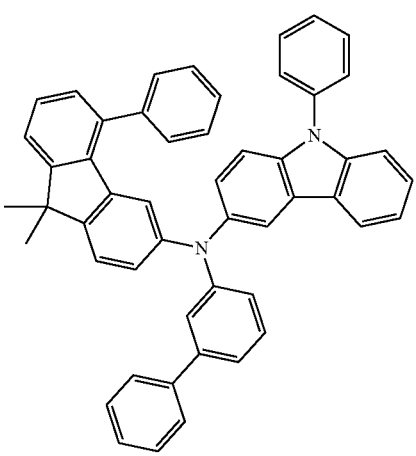
129
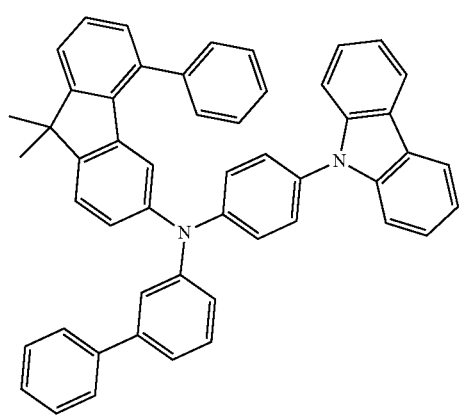

130
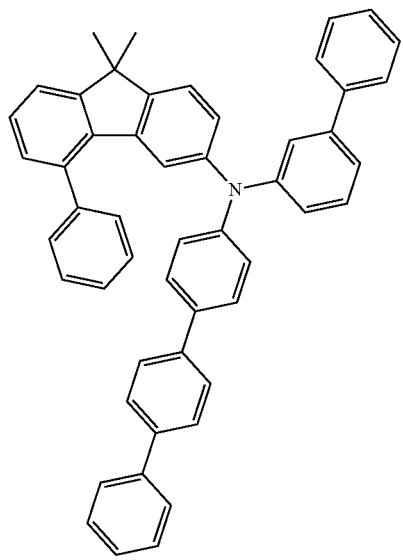
131
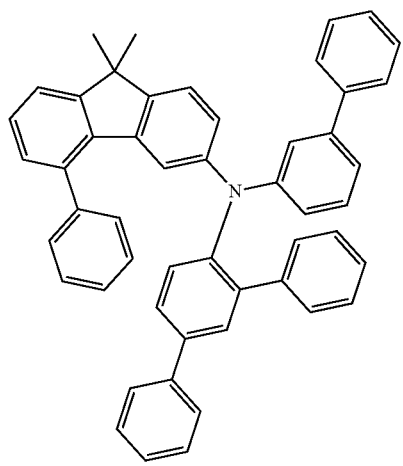 [SMILES: CC1(C)c2ccc(N(c3cccc(-c4ccccc4)c3)c3ccc(-c4ccccc4)cc3-c3ccccc3)cc2-c2c(-c3ccccc3)cccc21]
132
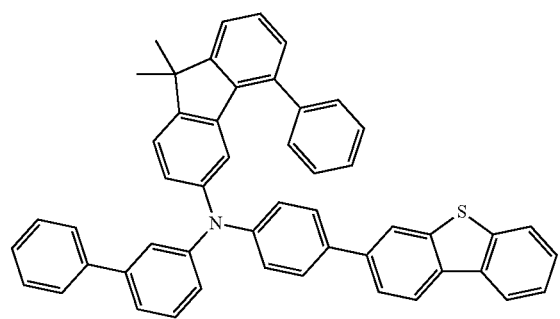
133
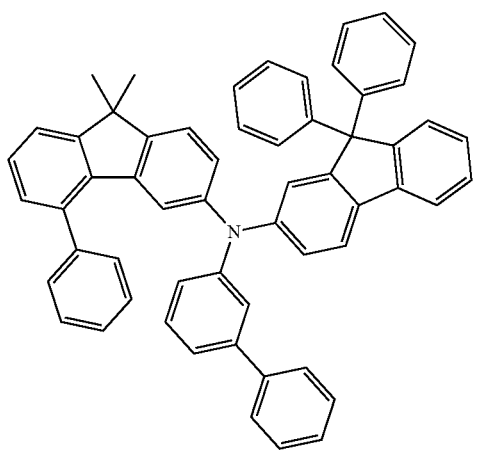
134
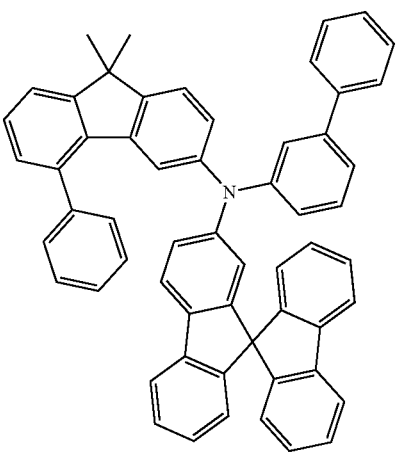
135
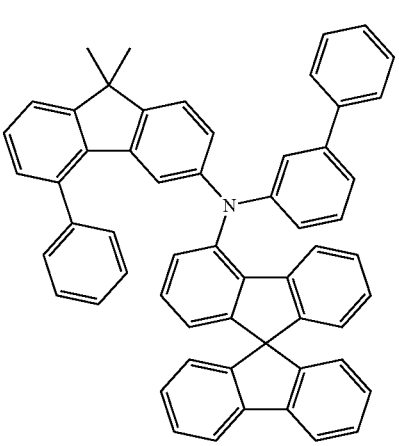

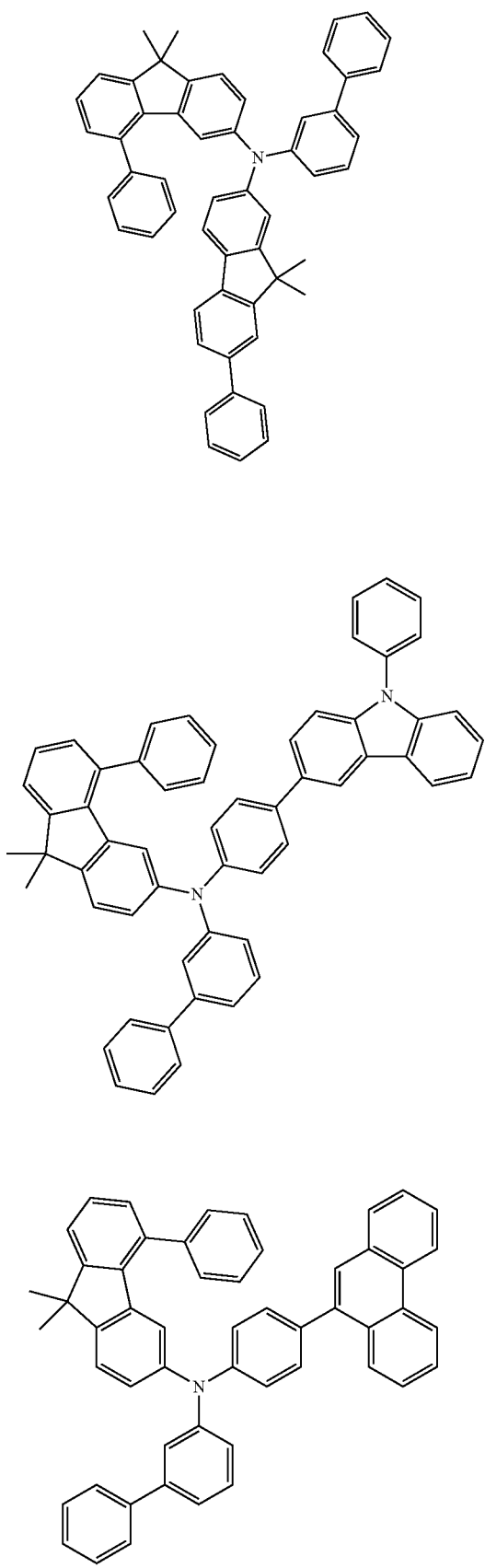
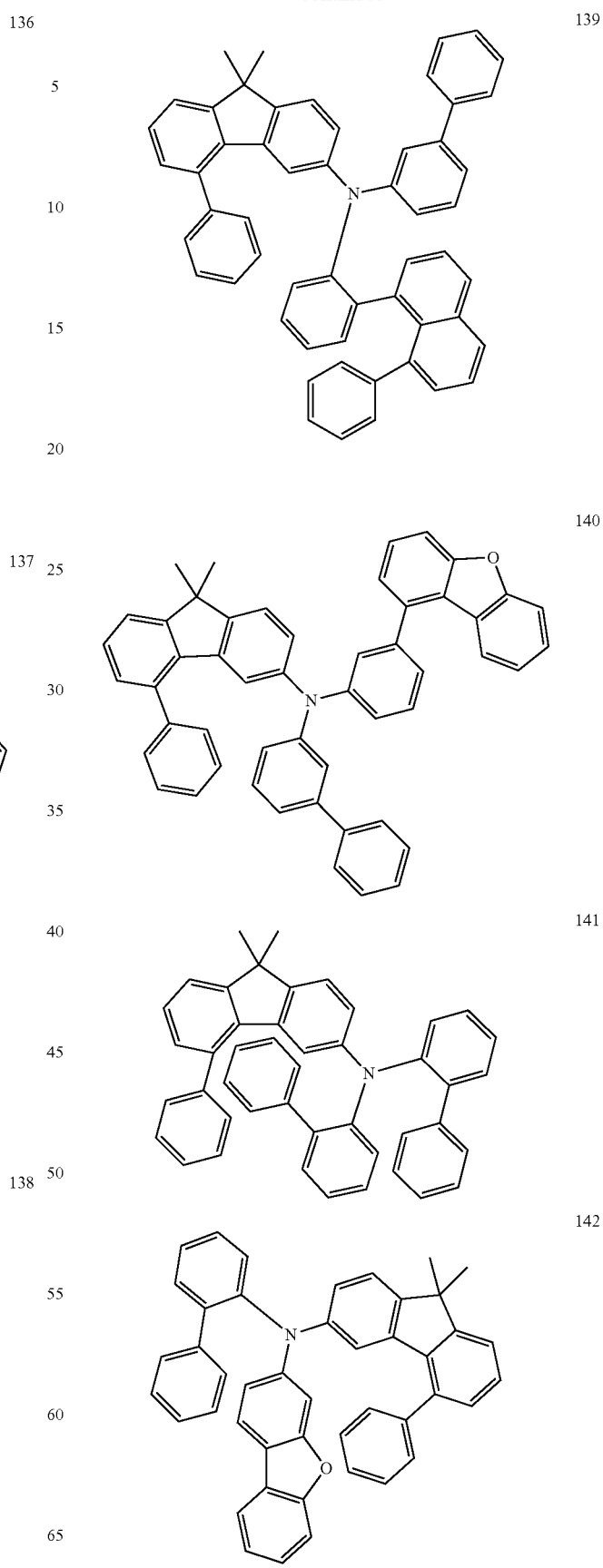

143
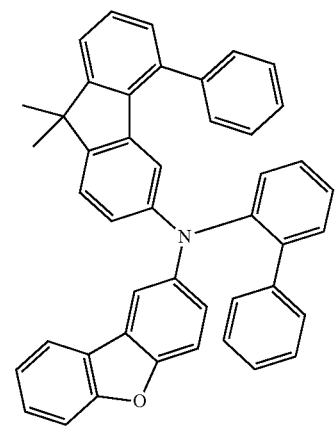
144
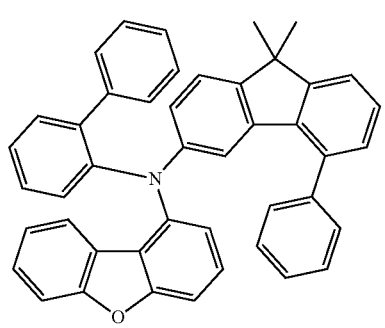
145
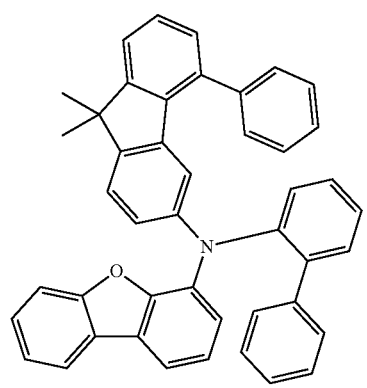
146
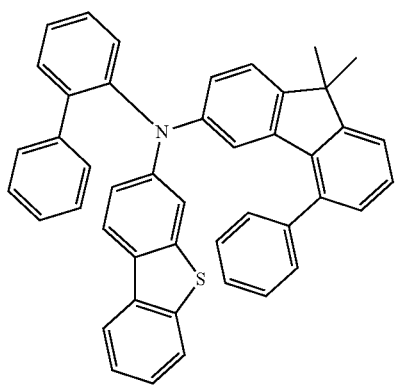
147
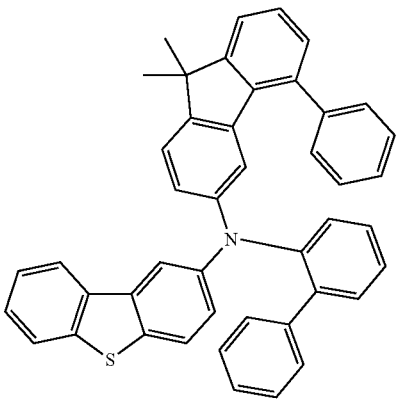
148
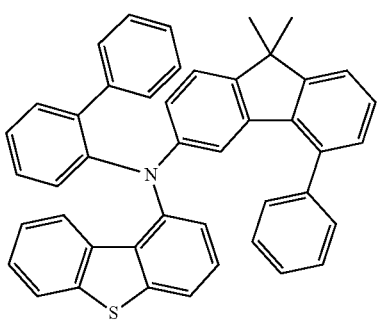
149
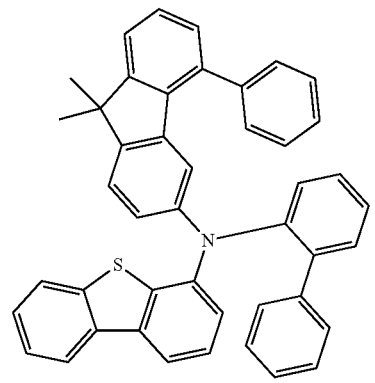
150
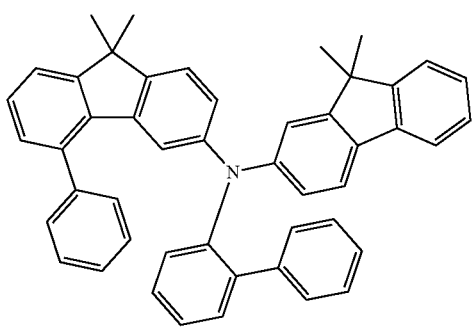

151
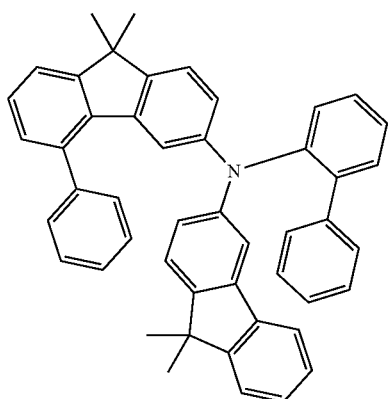
152
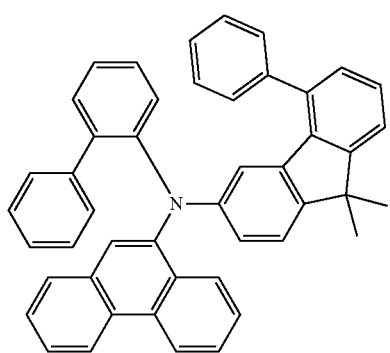
153
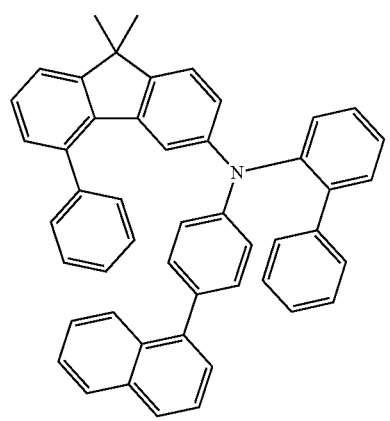
154
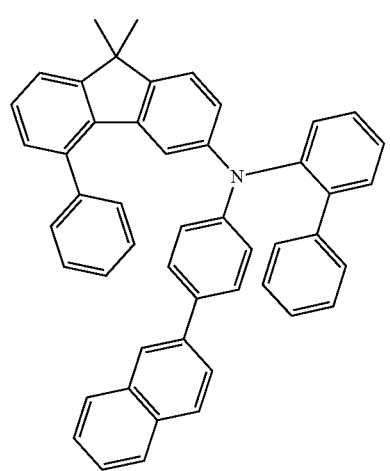
155
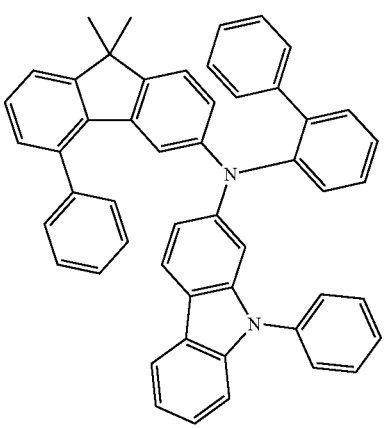
156
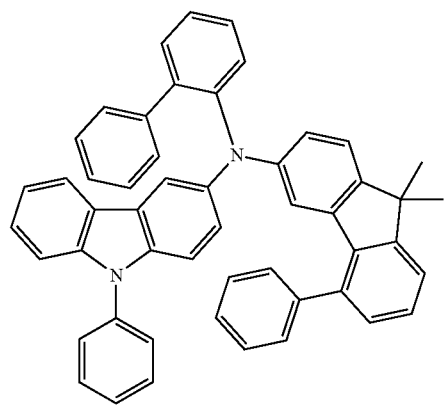
157
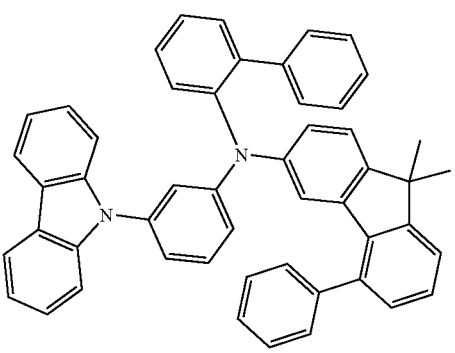

158
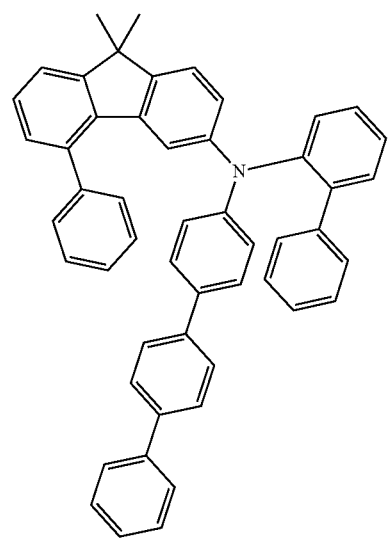
159
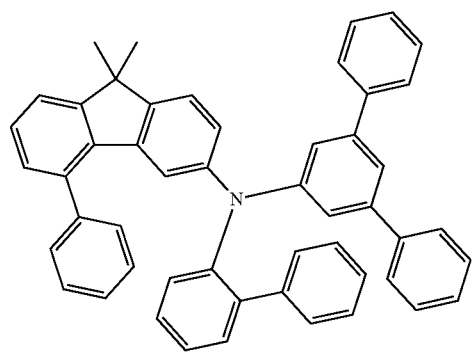
160
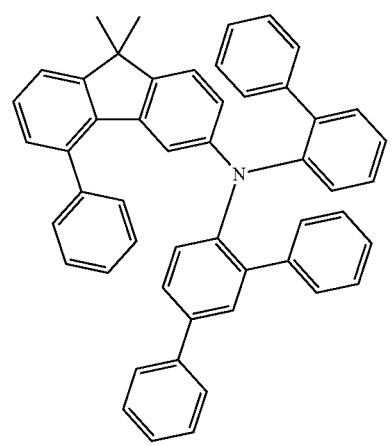
161
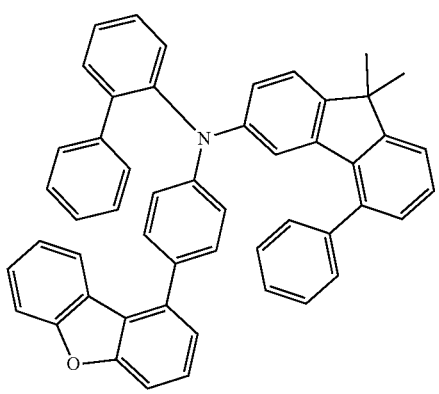
162
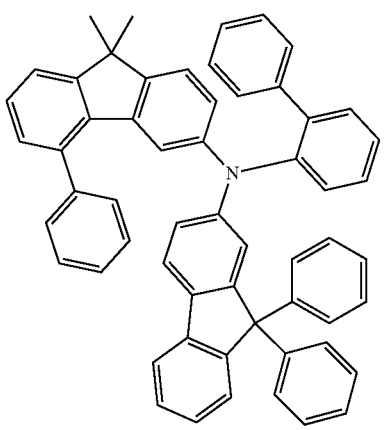
163
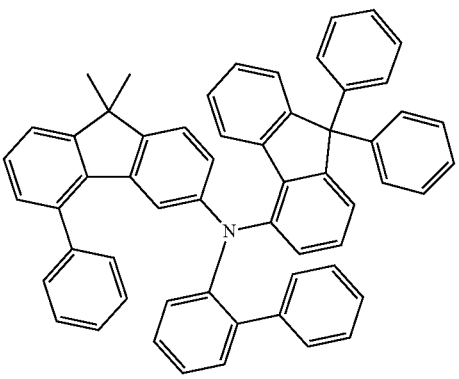
164
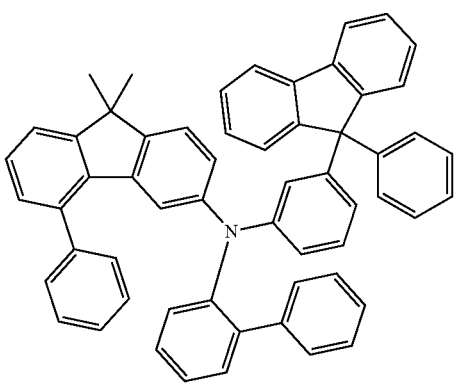 [SMILES: CC1(C)c2ccc(N(c3cccc(C4(c5ccccc5)c5ccccc5-c5ccccc54)c3)c3ccccc3-c3ccccc3)cc2-c2c(-c3ccccc3)cccc21]

165
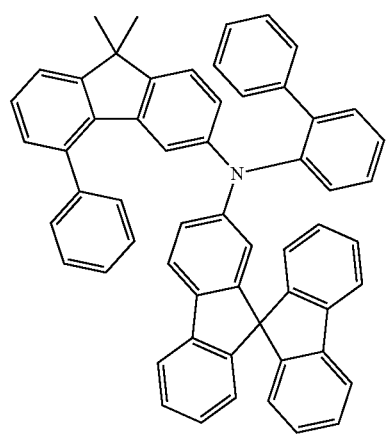
166
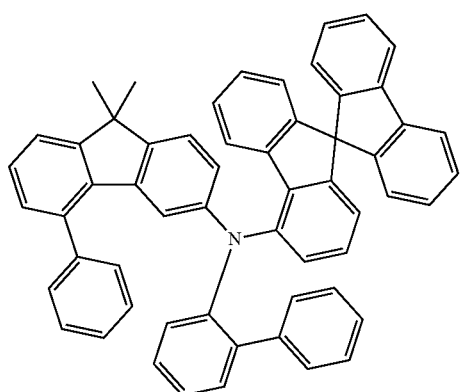
167
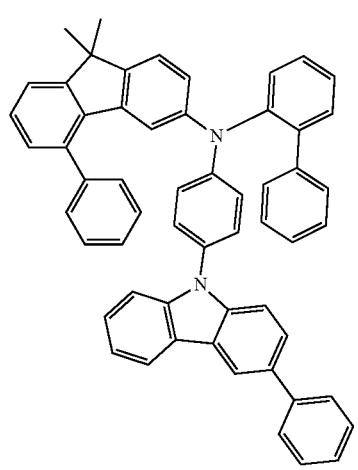
168
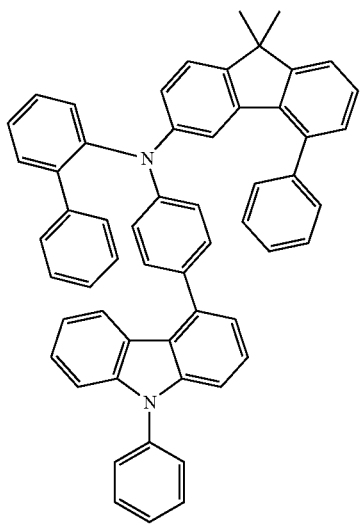
169
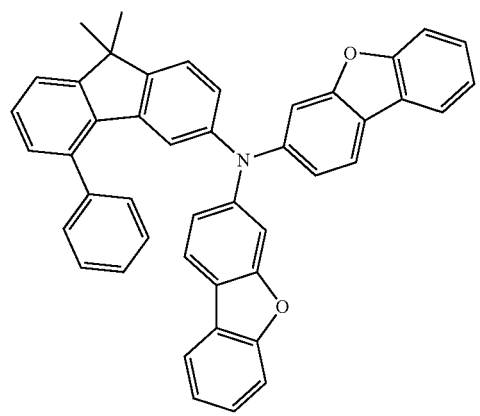 [SMILES: CC1(C)c2ccccc2-c2ccc(N(c3ccc4c(c3)-c3c(-c5ccccc5)cccc3C4(C)C)c3ccc4c(c3)oc3ccccc34)cc21]
170
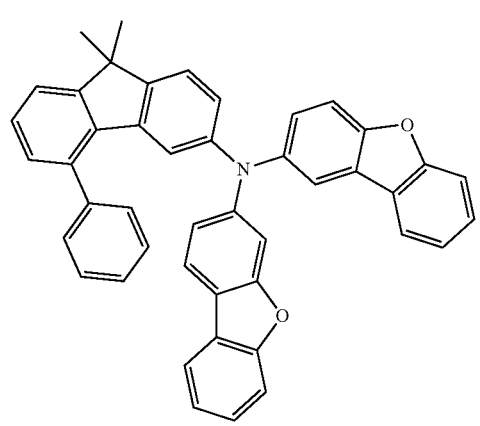

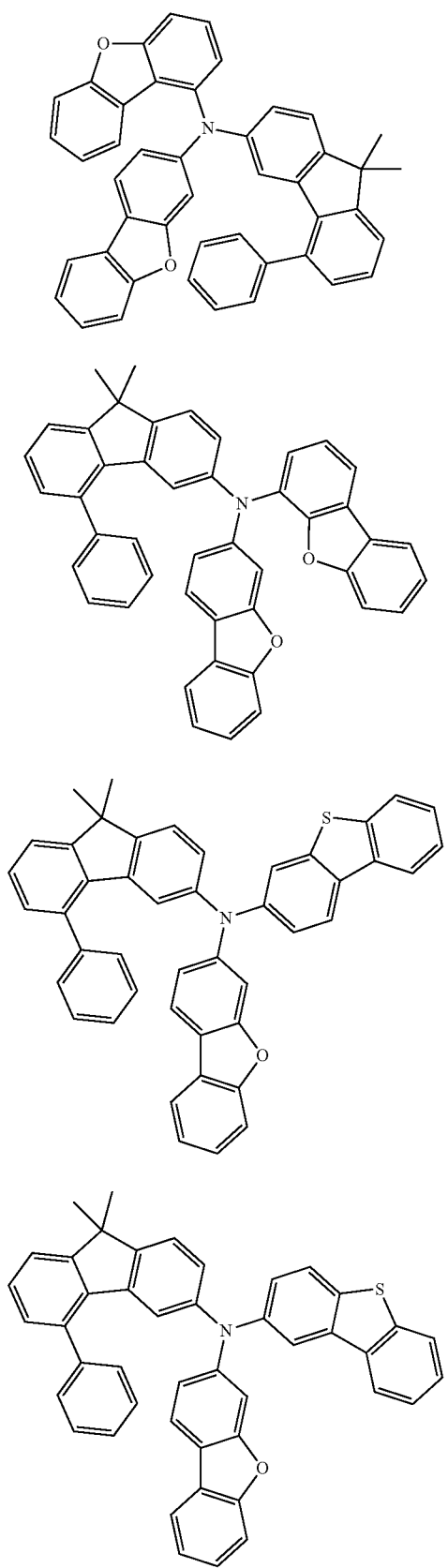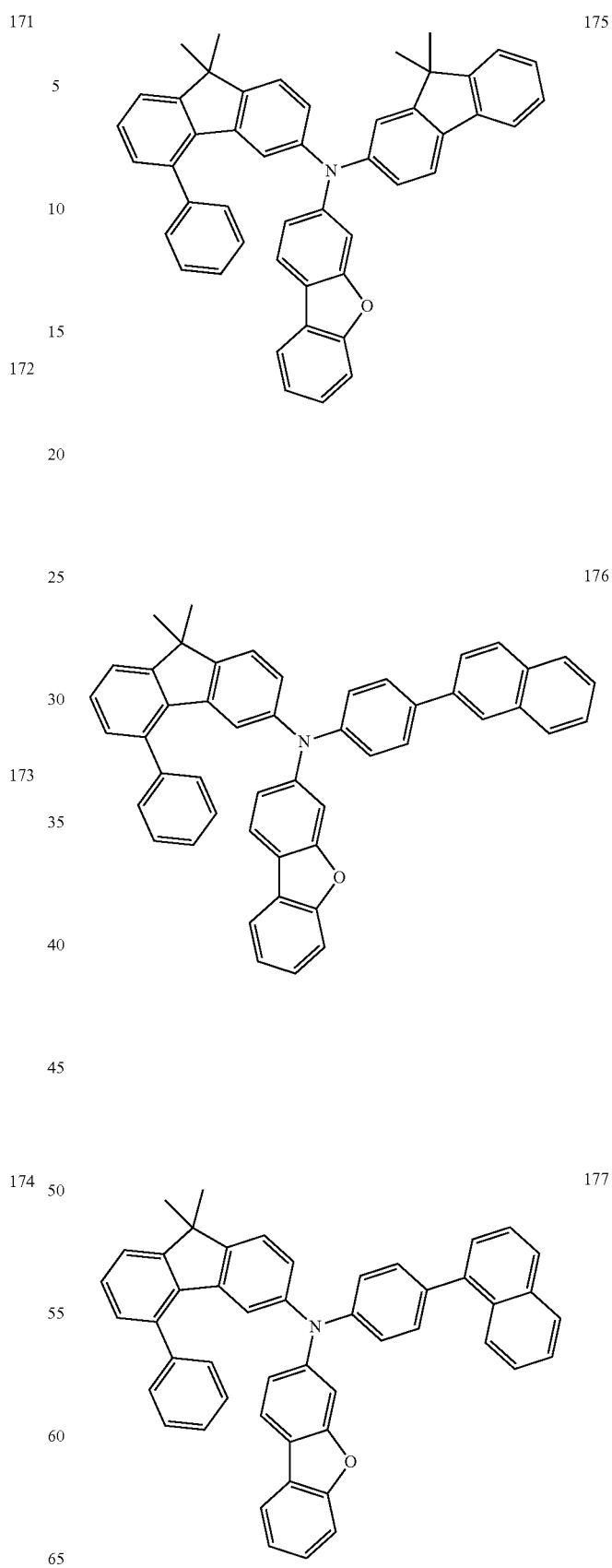

178
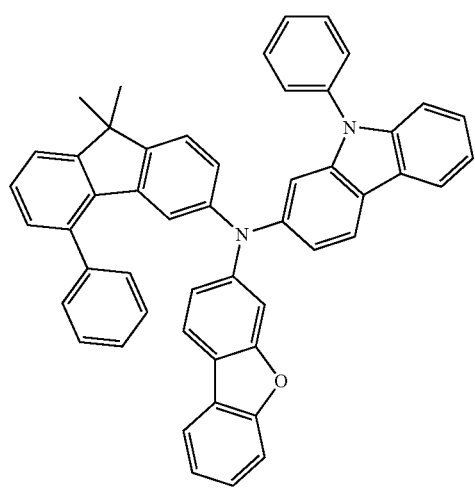
179
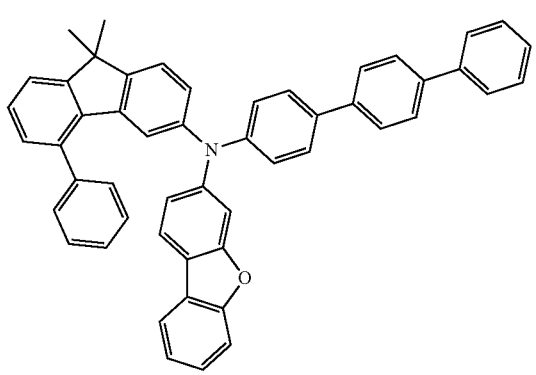
180
181
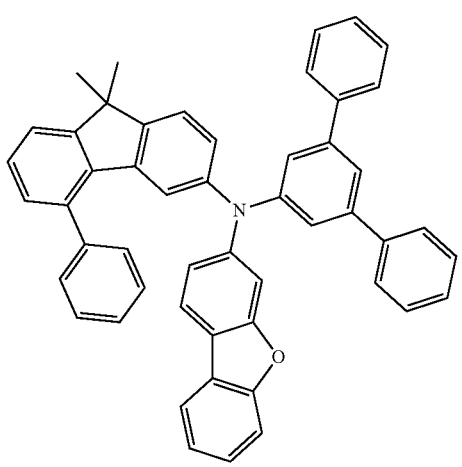 [SMILES: CC1(C)c2ccc(N(c3cc(-c4ccccc4)cc(-c4ccccc4)c3)c3ccc4c(c3)oc3ccccc34)cc2-c2c(-c3ccccc3)cccc21]
182
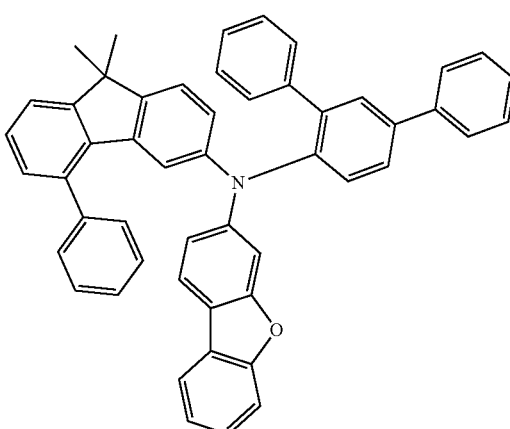
183
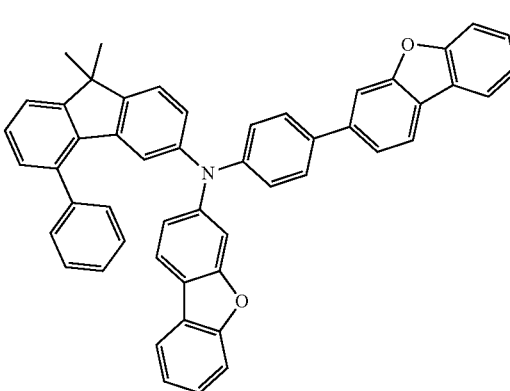

184
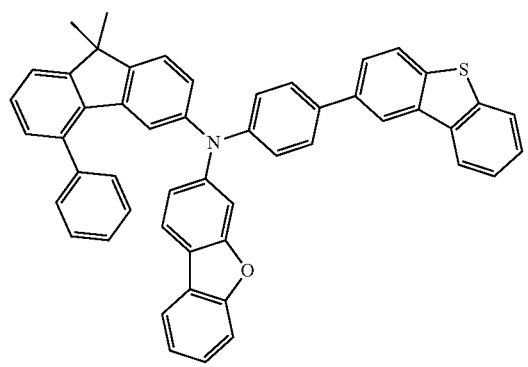
187
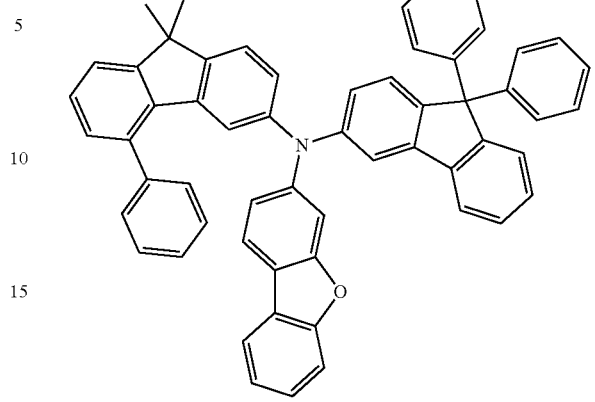
185
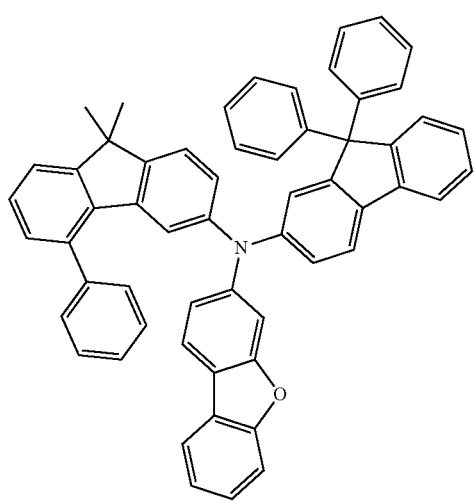
188
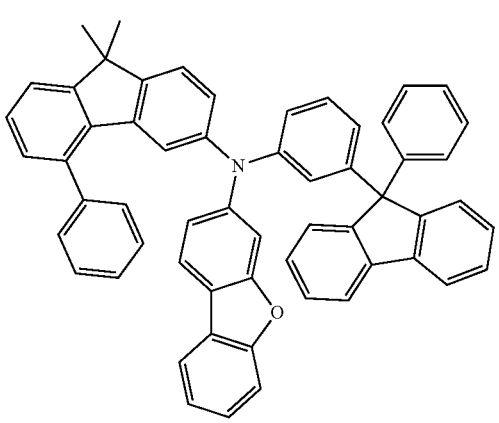
186
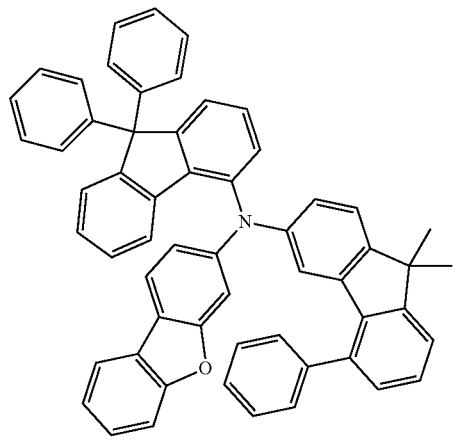
189
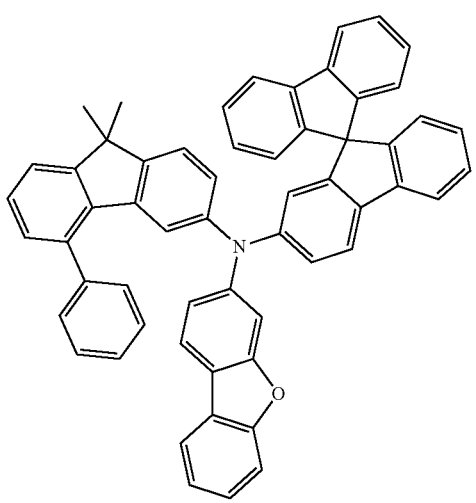

190
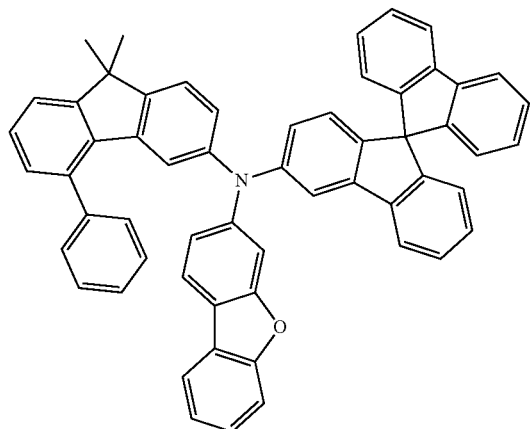
191
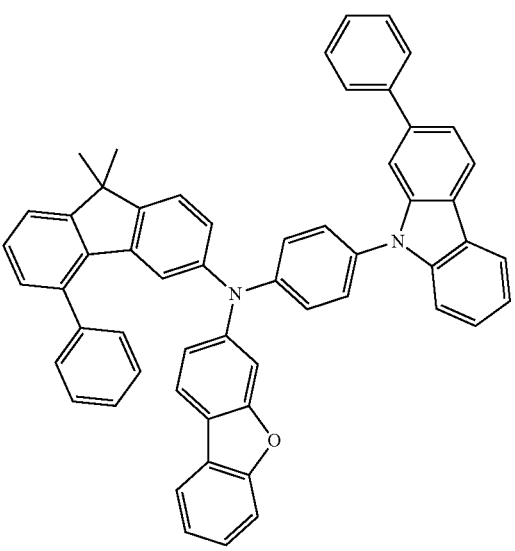
192
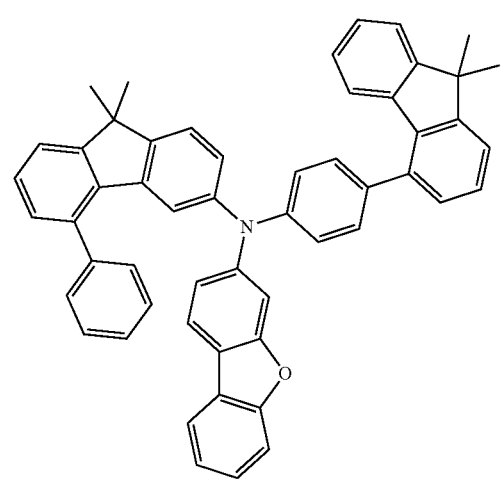
193
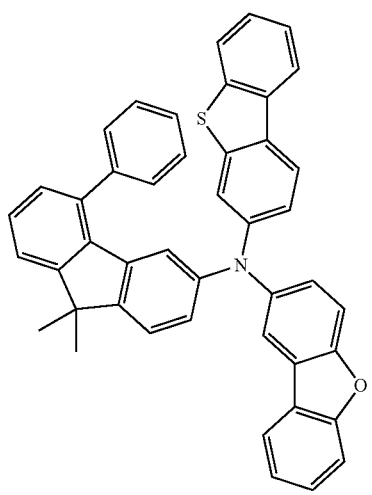
194
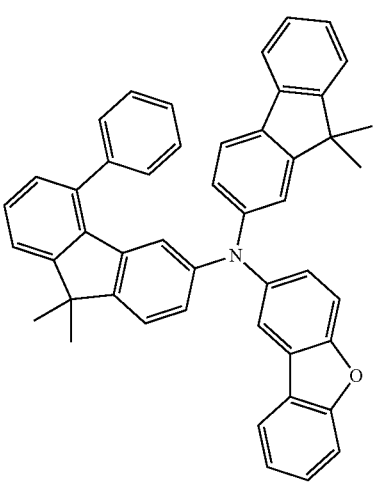
195
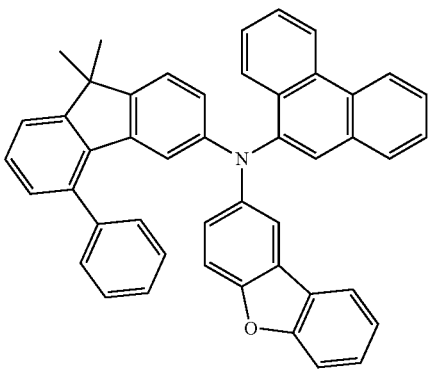 [SMILES: CC1(C)c2ccc(N(c3ccc4oc5ccccc5c4c3)c3cc4ccccc4c4ccccc34)cc2-c2c(-c3ccccc3)cccc21]

-continued
196
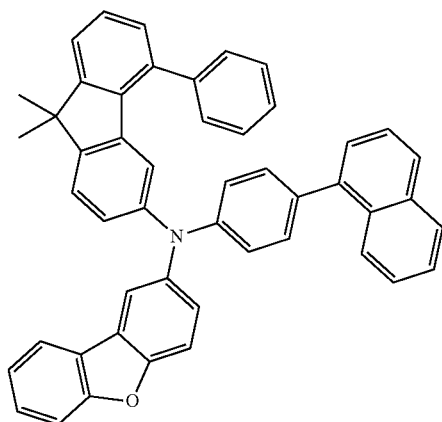
197
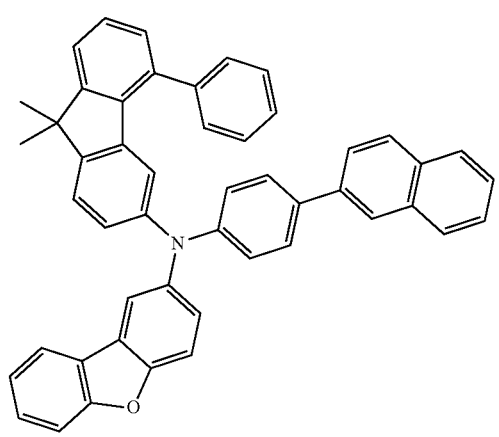
198
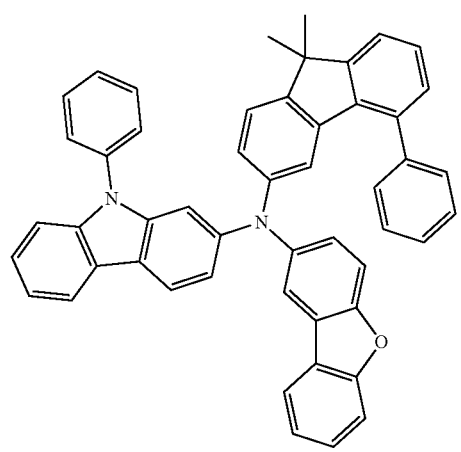
-continued
199
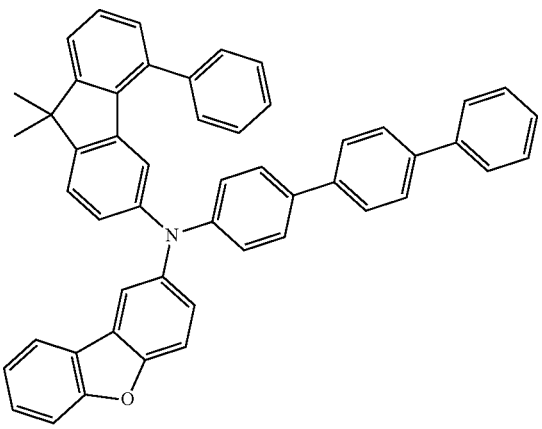
200
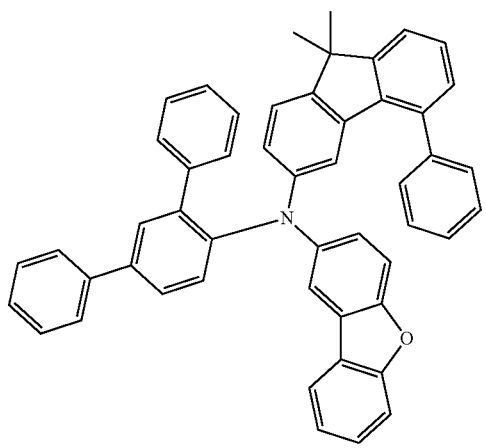
201
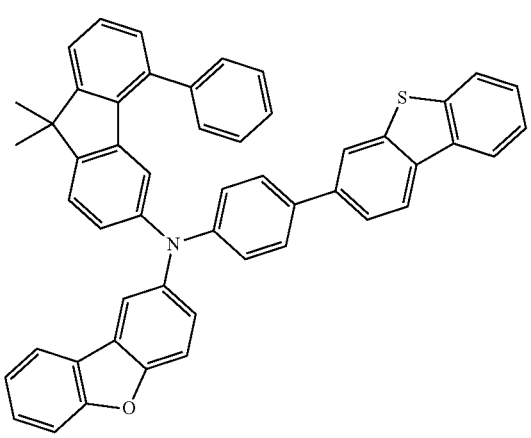

202
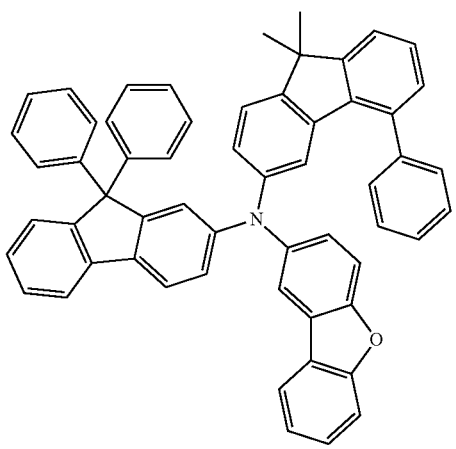
203
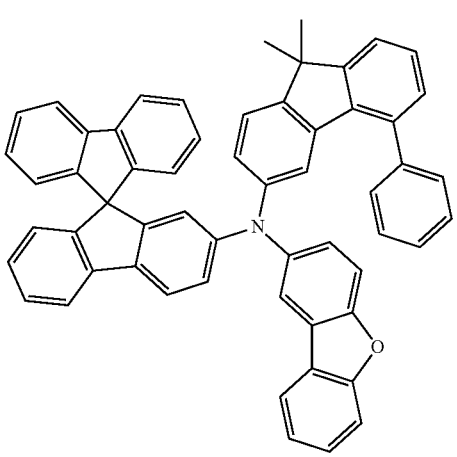
204
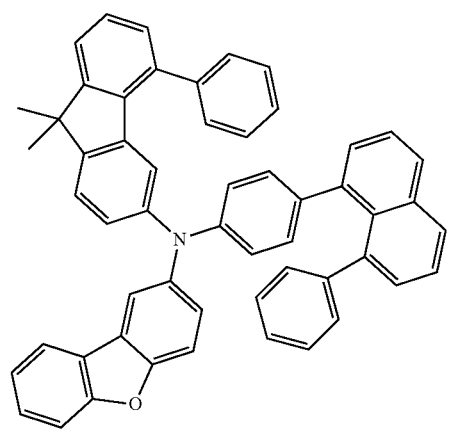
205
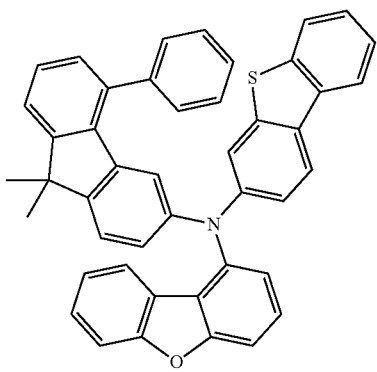
206
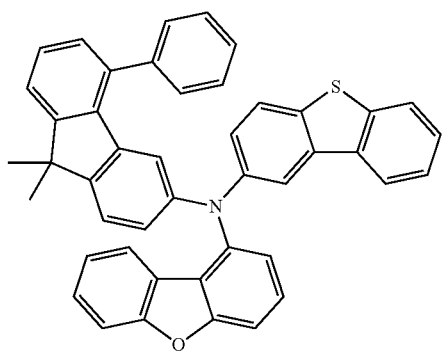
207
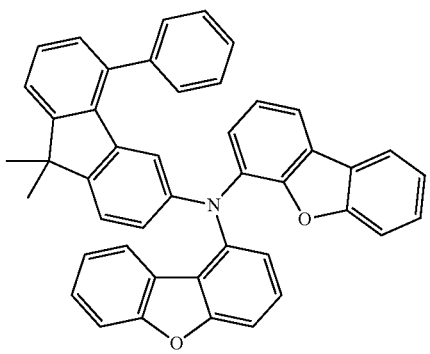
208
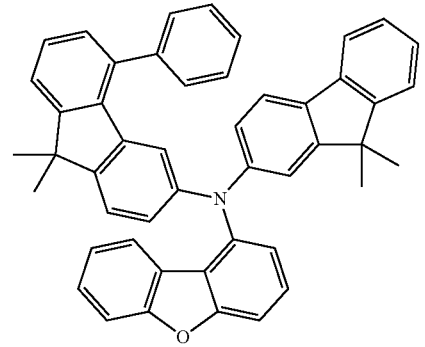

209
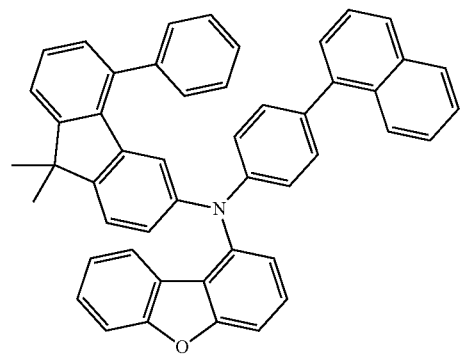
210
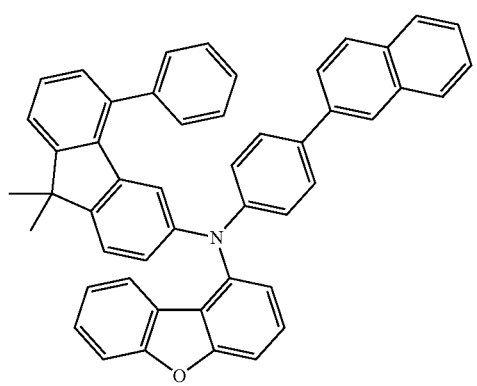
211
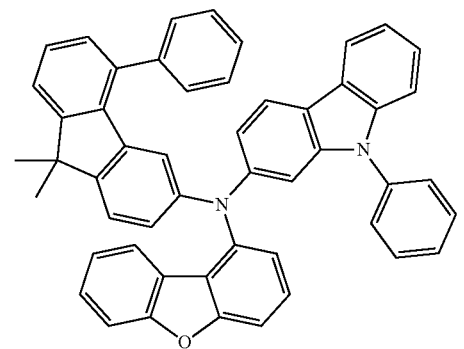
212
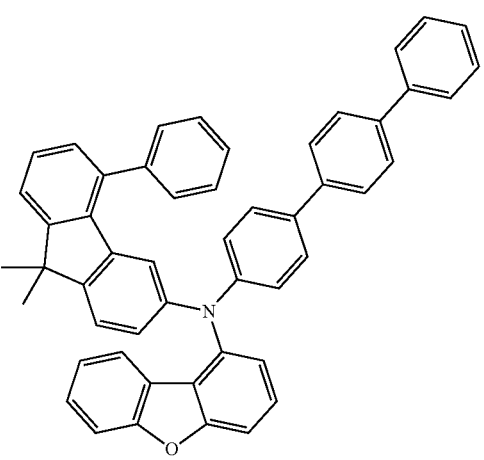
213
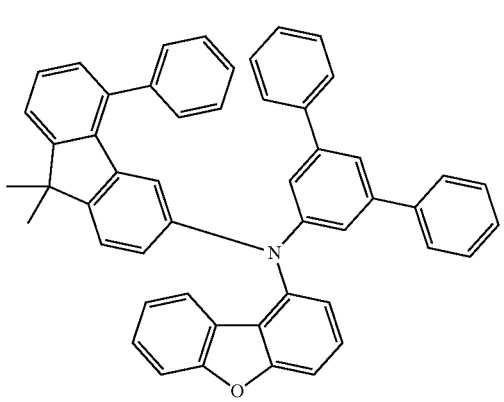
214
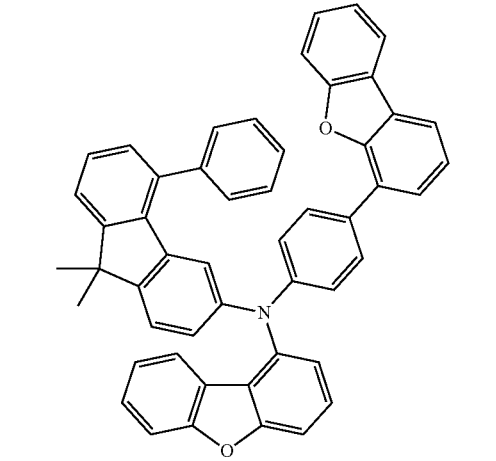
215
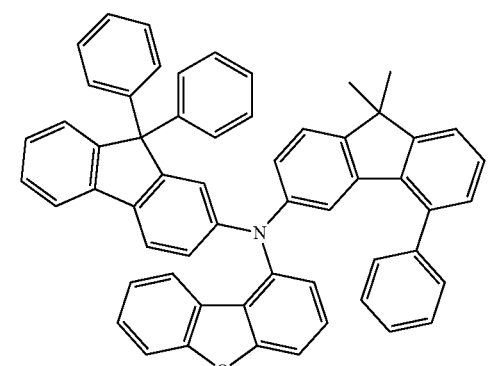
216
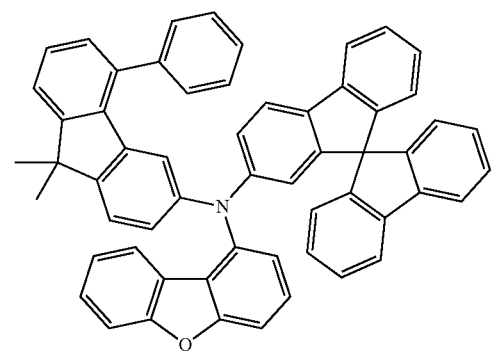

217
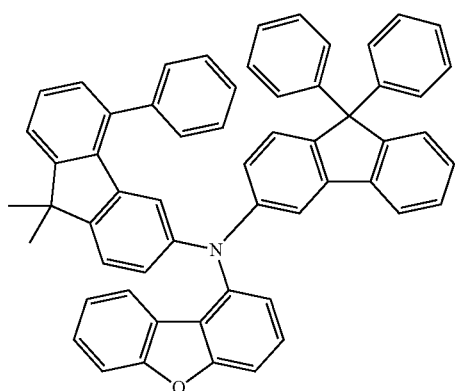
218
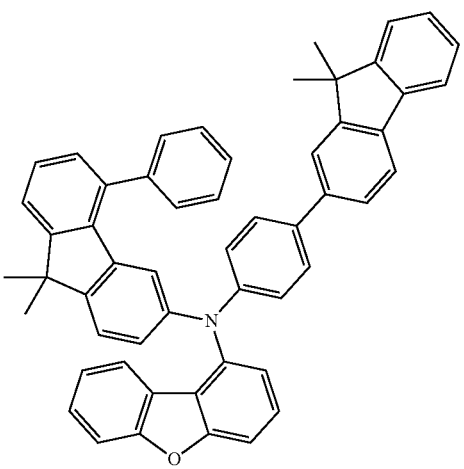
219
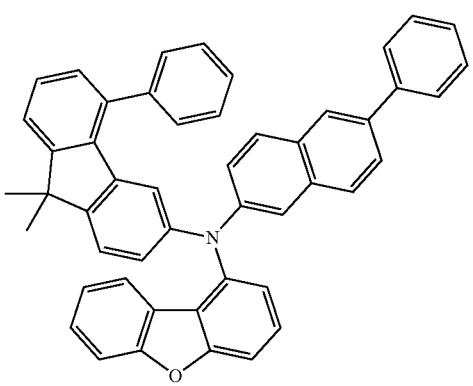
220
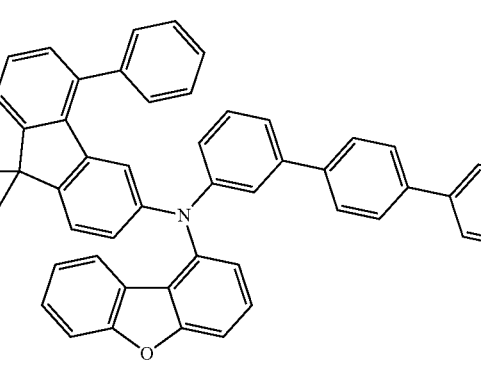
221
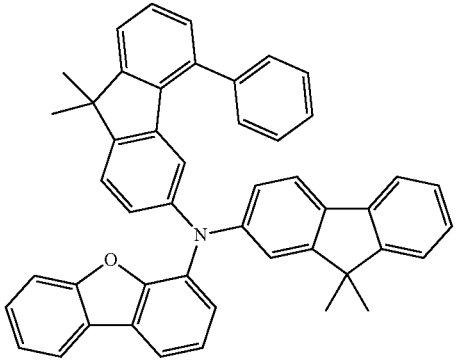
222
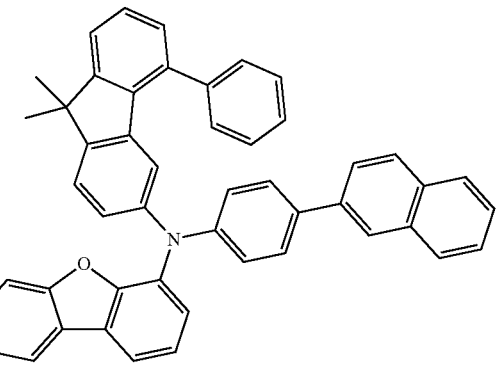
223
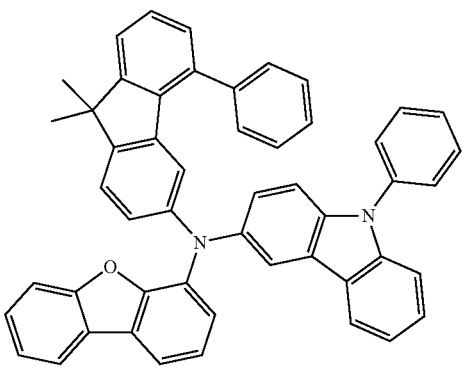
224
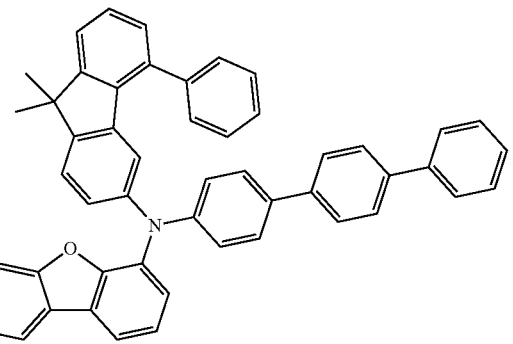

225
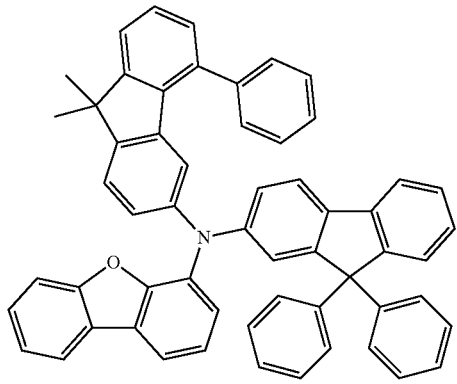
226
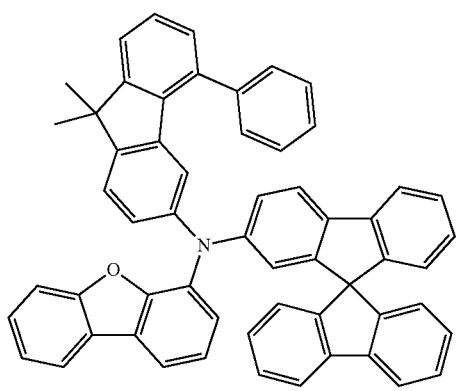
227
229
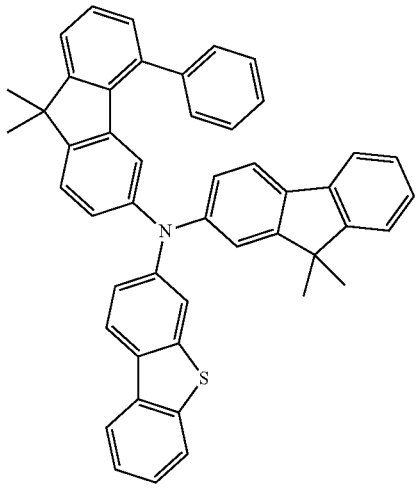
230
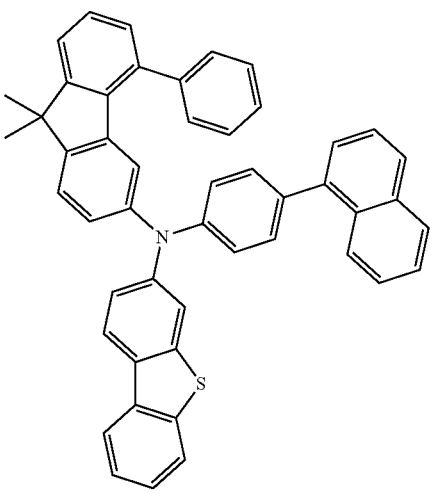
228
231
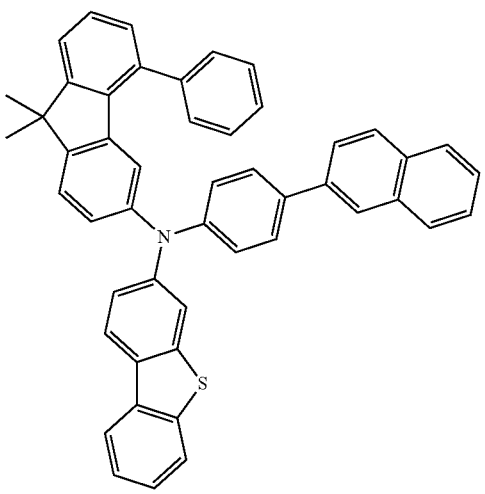

232
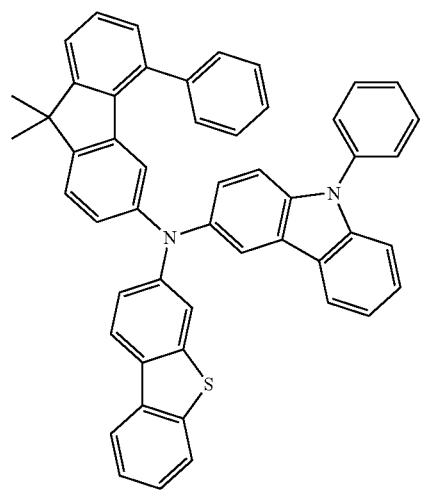
233
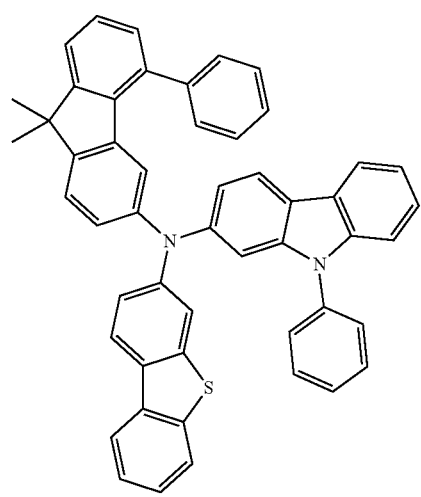
234
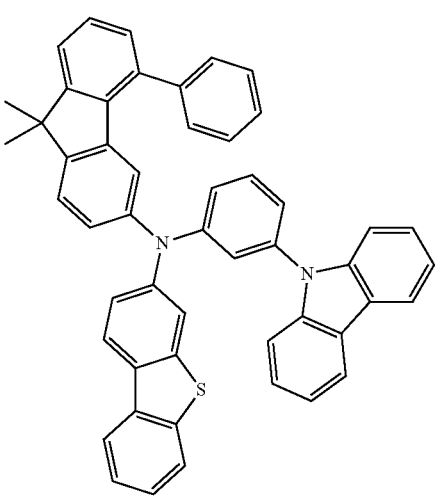
235
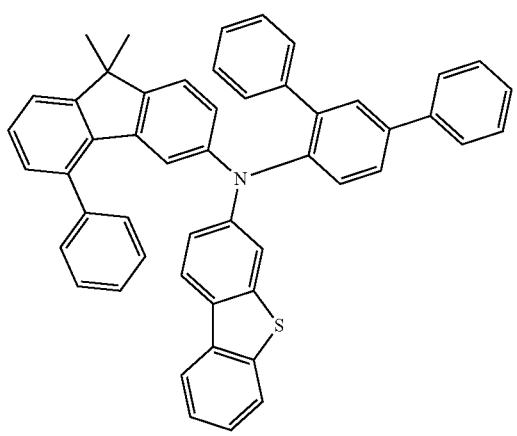
236
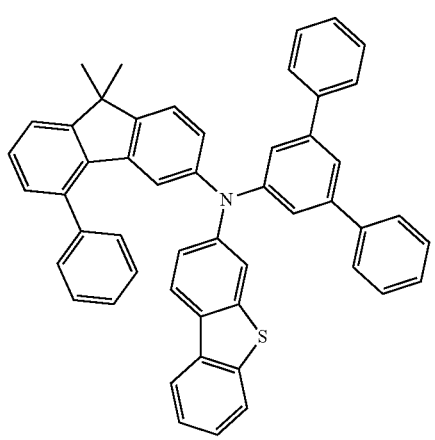
237
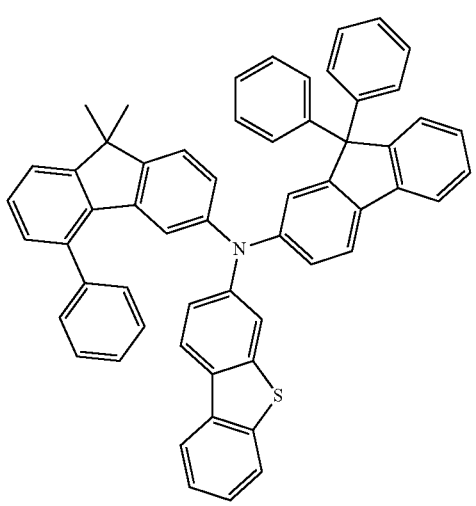

238
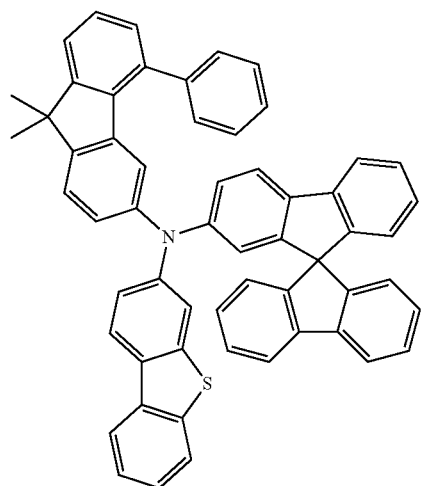
239
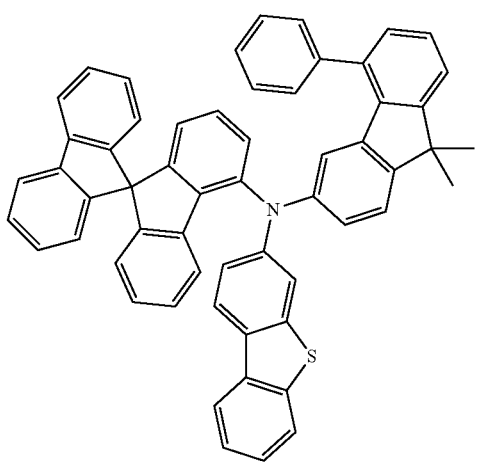
240
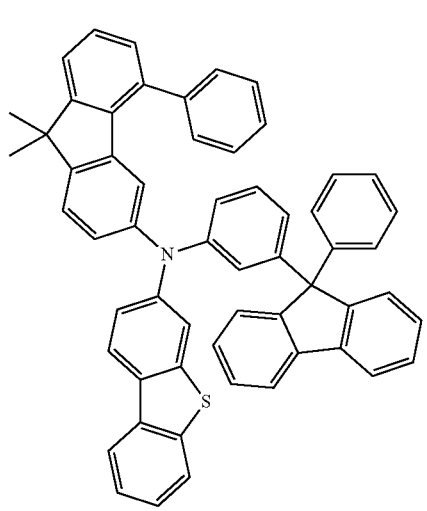
241
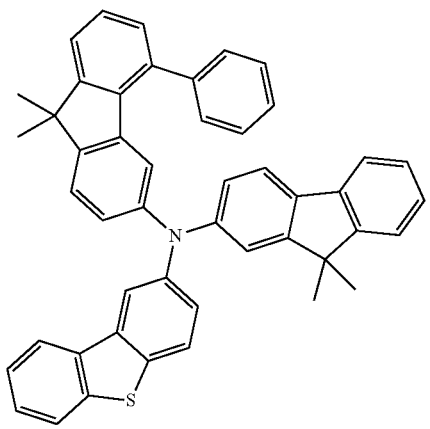
242
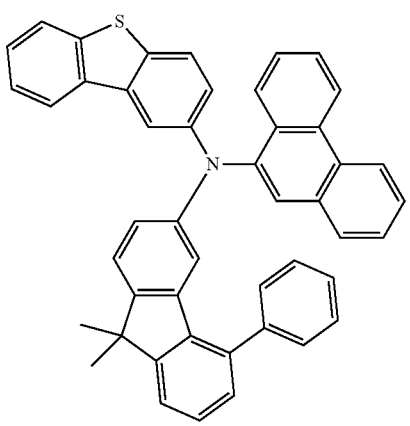
243
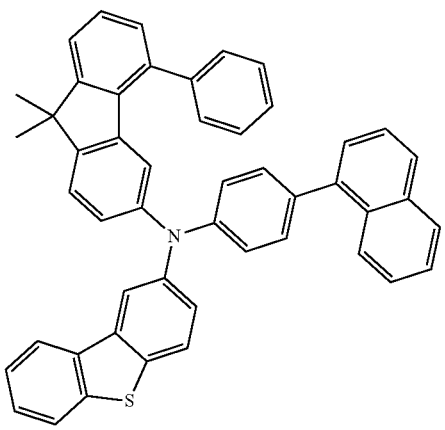

91
-continued
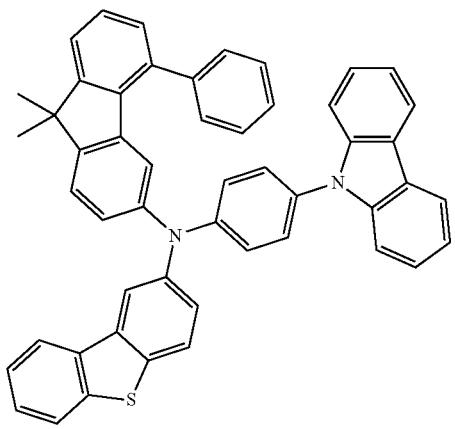
244
245
246
92
-continued
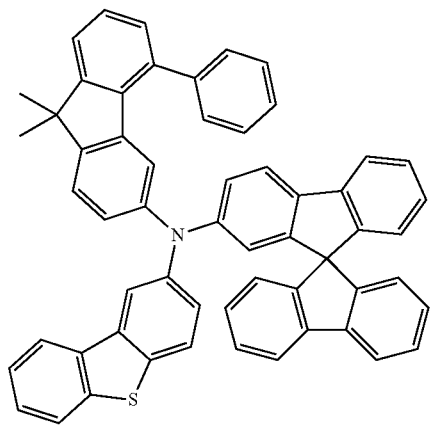
247
248
249
250
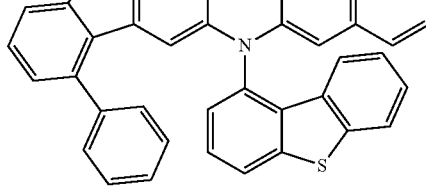

251
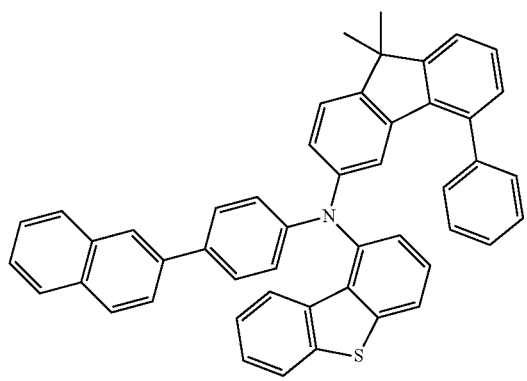
252
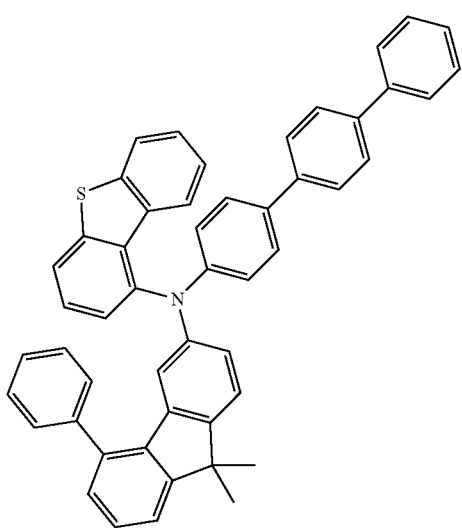
253
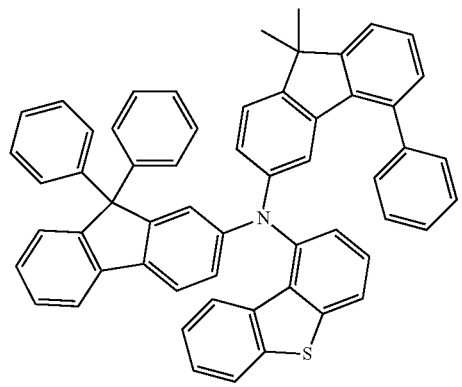
254
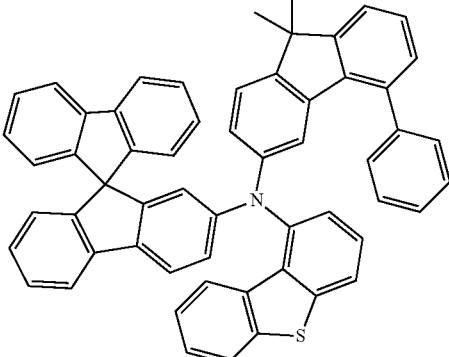
255
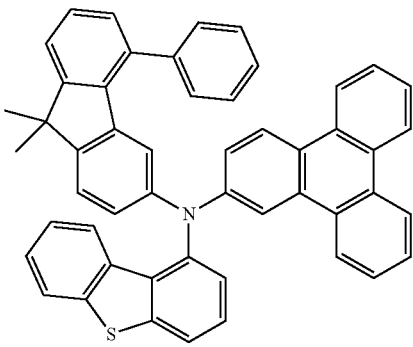
256
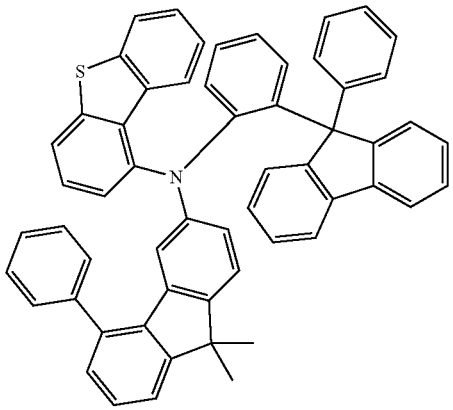
257
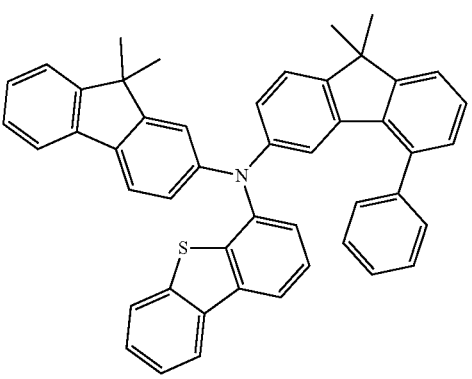

258
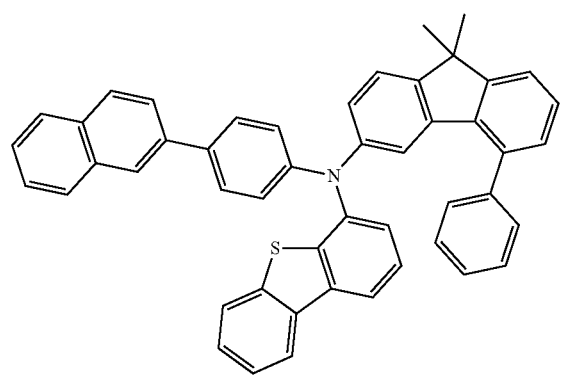
259
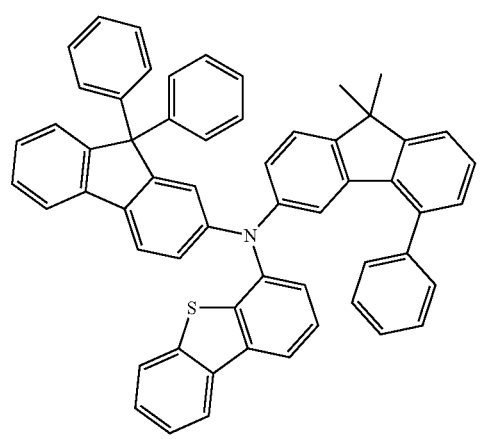
260
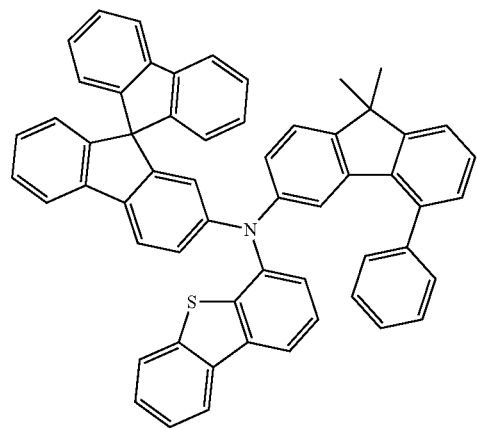
261
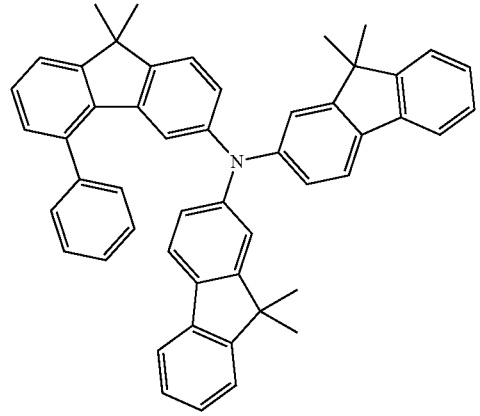
262
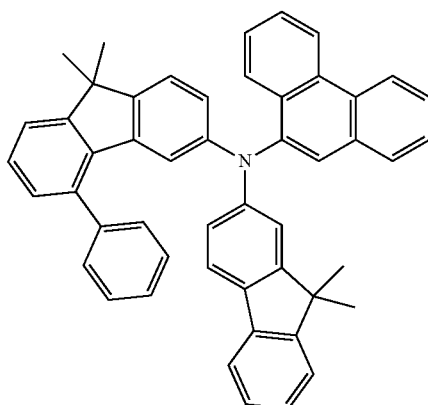
263
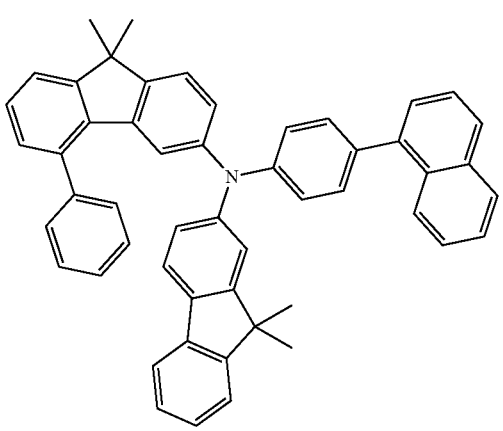

264
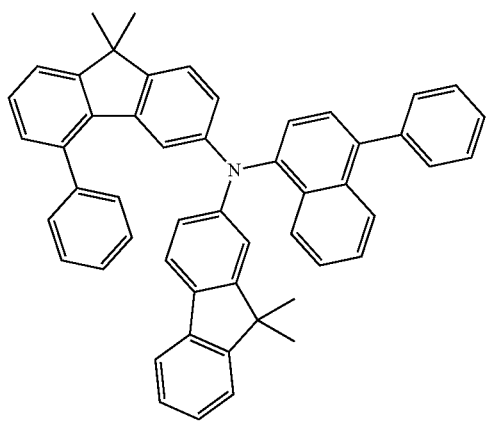
265
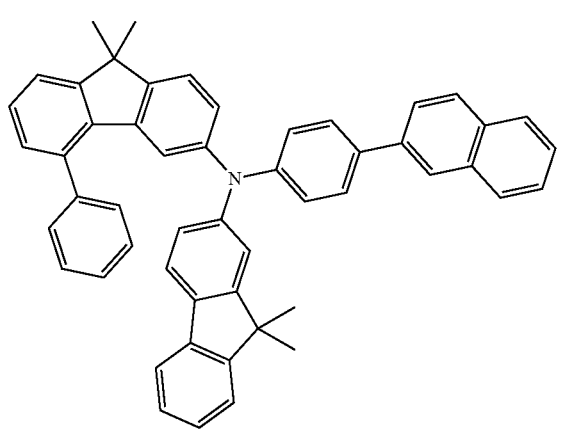
266
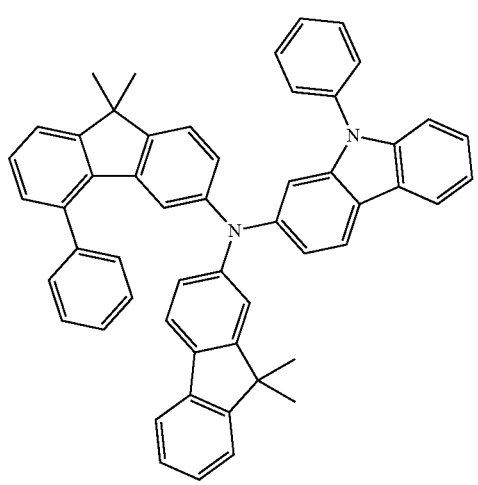
267
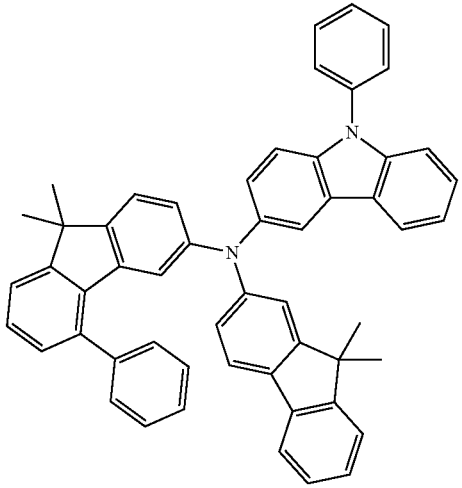
268
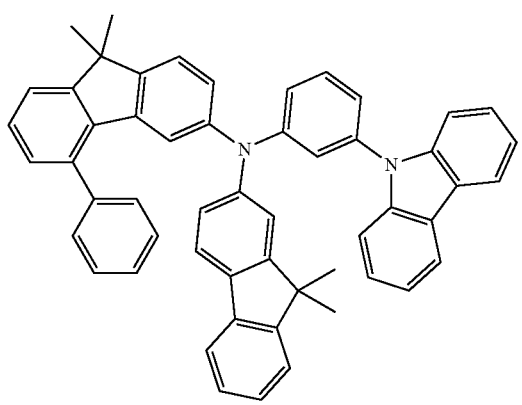 [SMILES: CC1(C)c2ccccc2-c2ccc(N(c3cccc(-n4c5ccccc5c5ccccc54)c3)c3ccc4c(c3)-c3c(-c5ccccc5)cccc3C4(C)C)cc21]
269
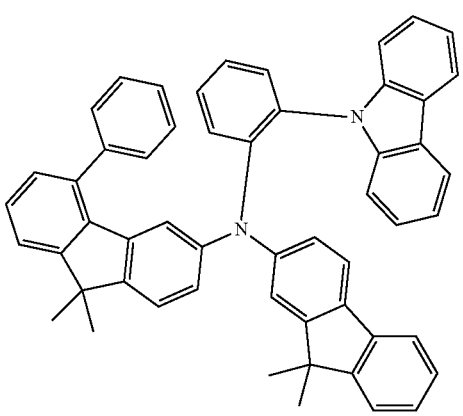

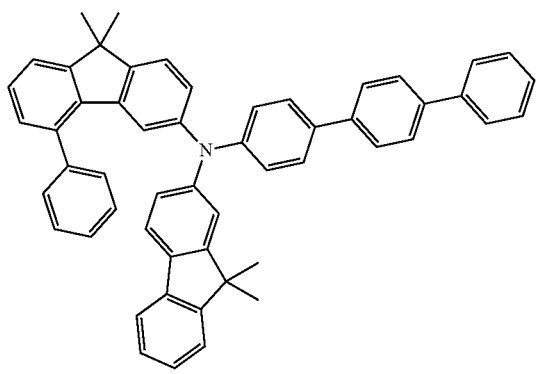
270
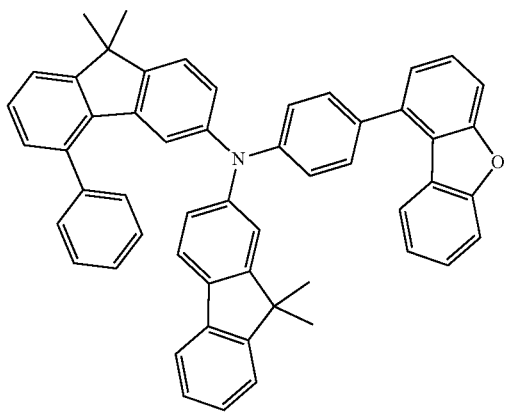
273
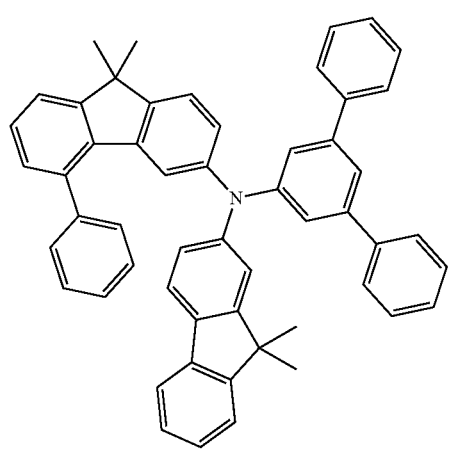
271
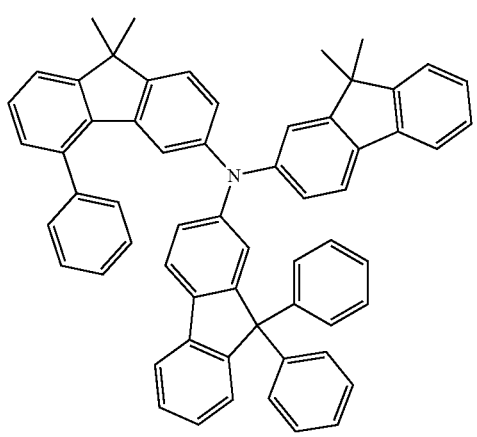
274
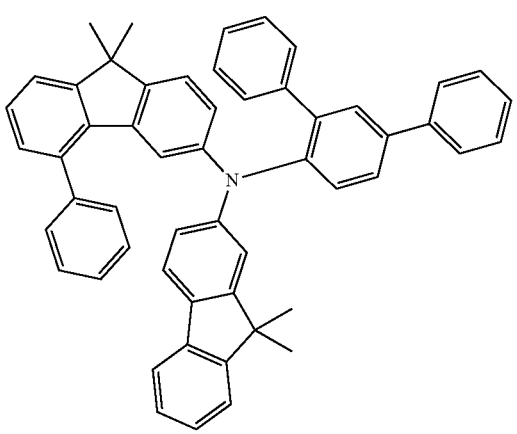
272
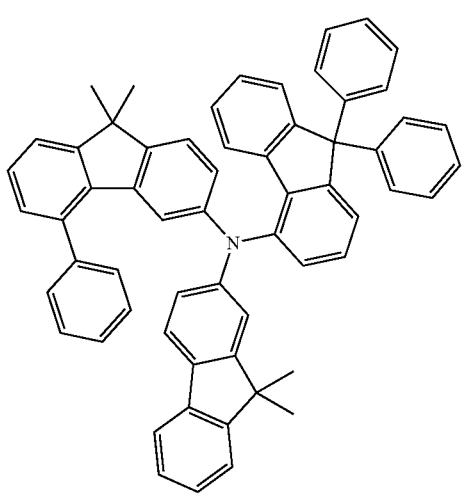
275

276
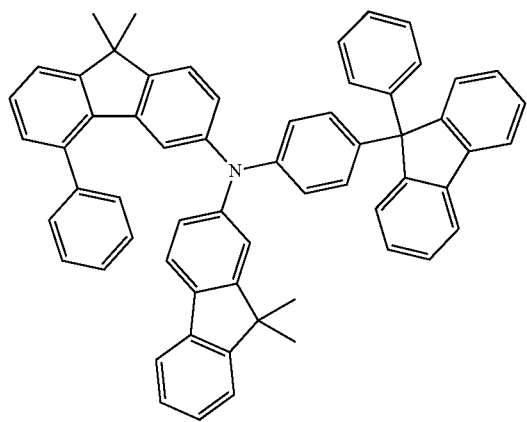
279
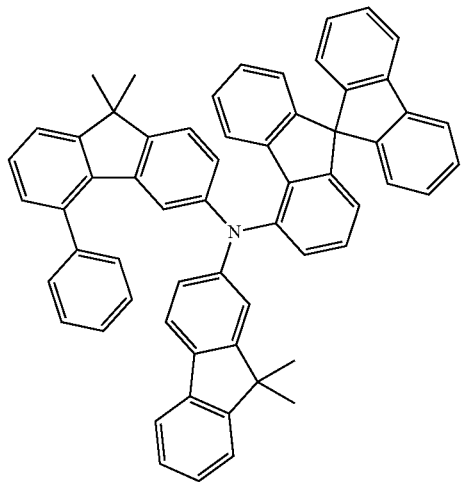
277
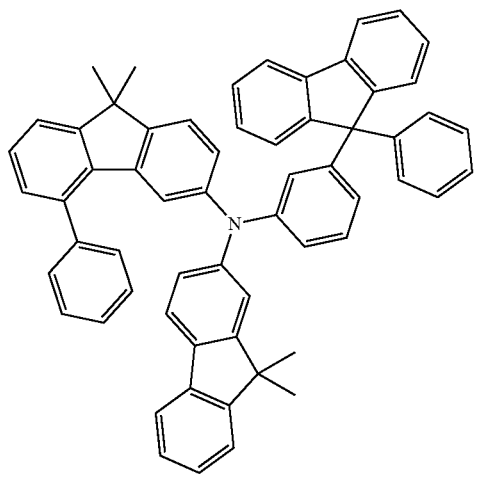
280
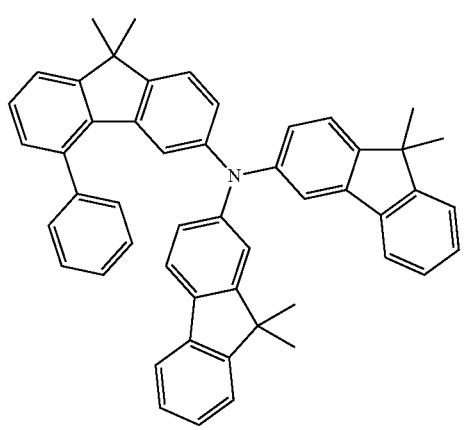
278
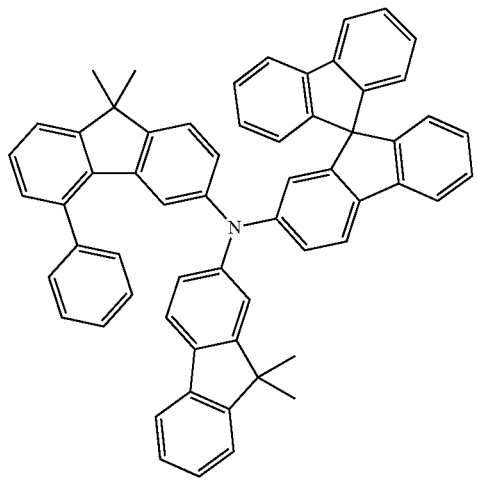
281
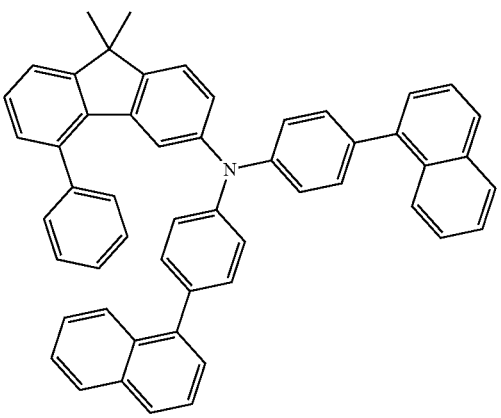 [SMILES: CC1(C)c2ccc(N(c3ccc(-c4cccc5ccccc45)cc3)c3ccc(-c4cccc5ccccc45)cc3)cc2-c2c(-c3ccccc3)cccc21]

282
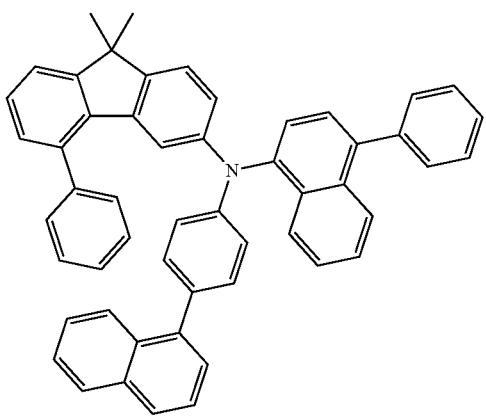
283
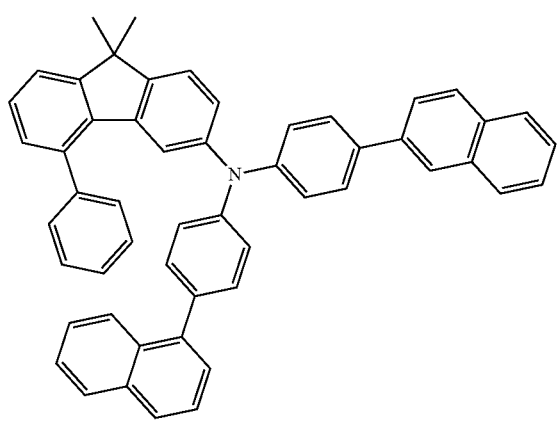
284
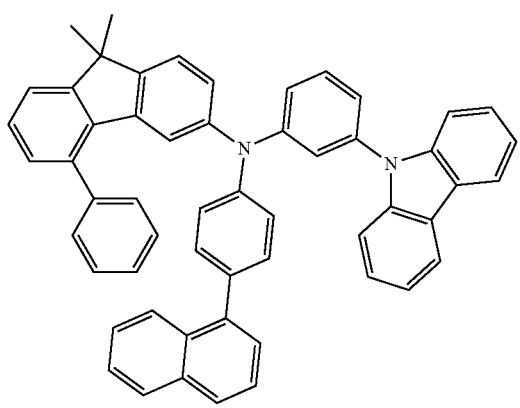
285
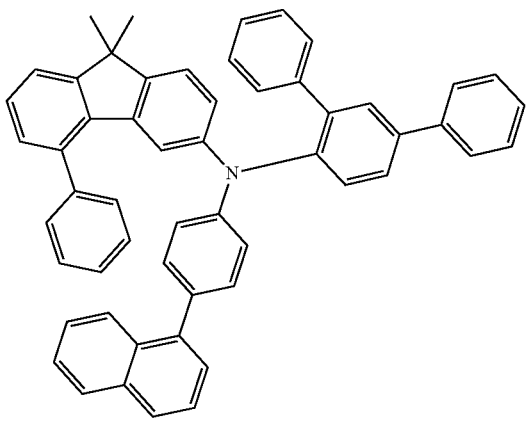
286
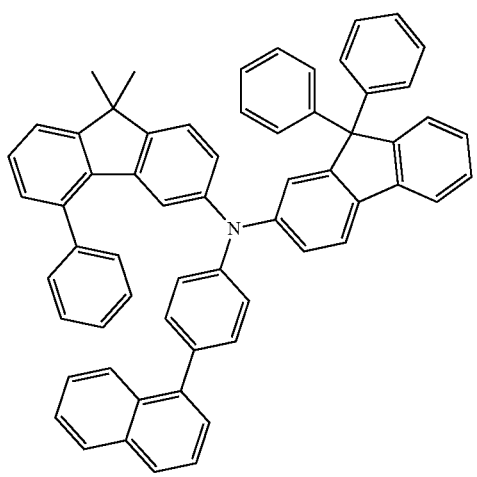
287
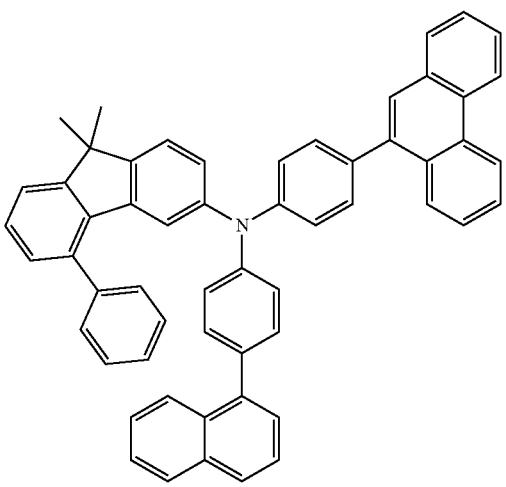

288
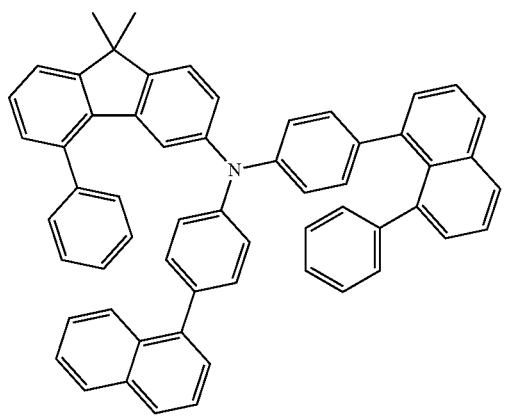
289
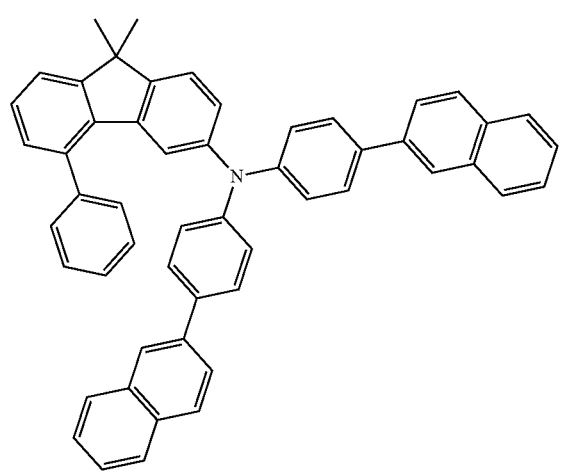 [SMILES: CC1(C)c2ccc(N(c3ccc(-c4ccc5ccccc5c4)cc3)c3ccc(-c4ccc5ccccc5c4)cc3)cc2-c2c(-c3ccccc3)cccc21]
290
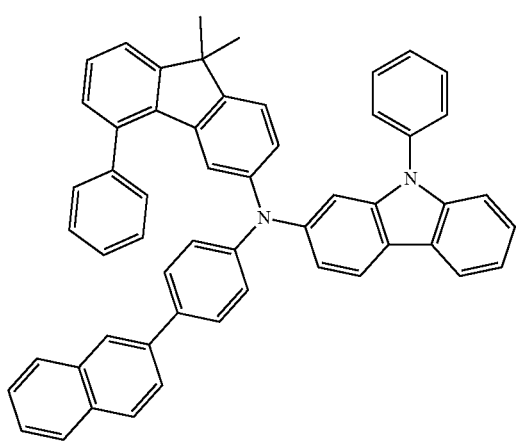
291
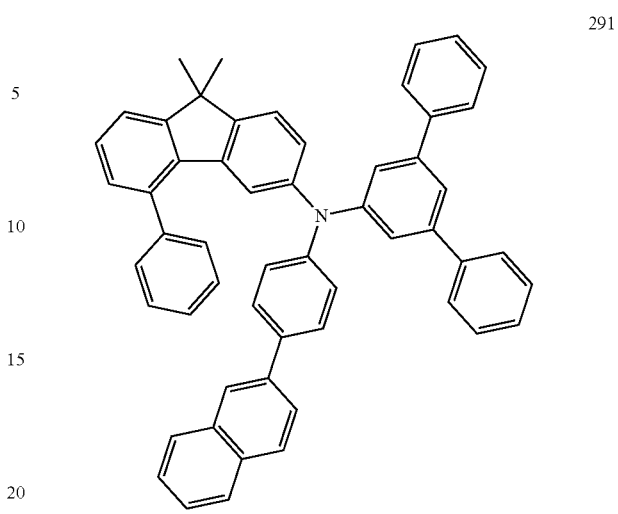
292
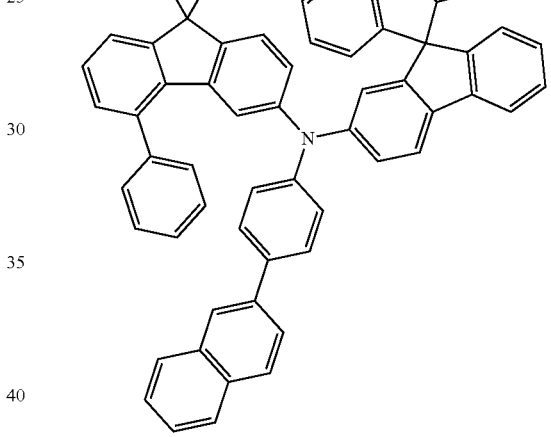
293
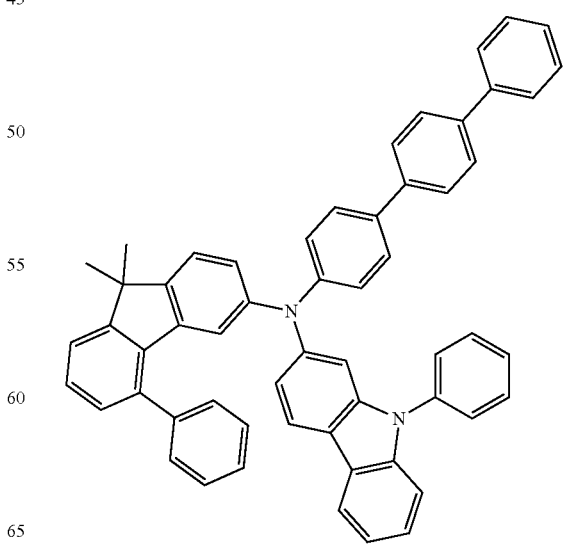

294
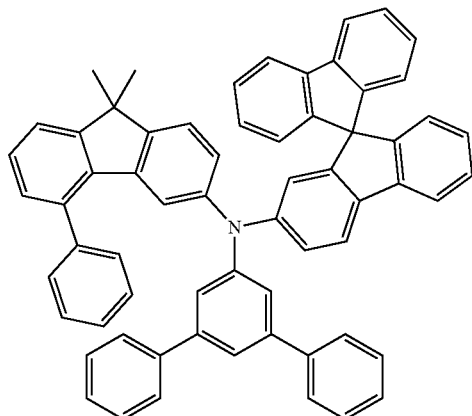
297
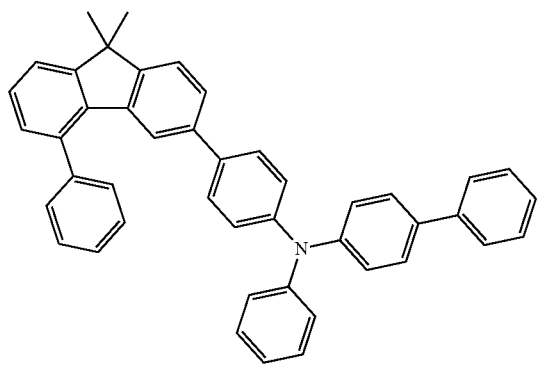
298
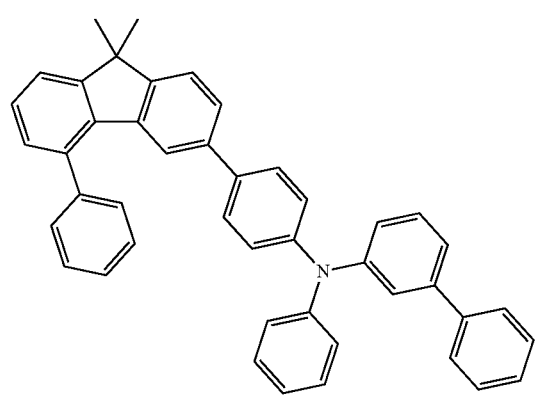
295
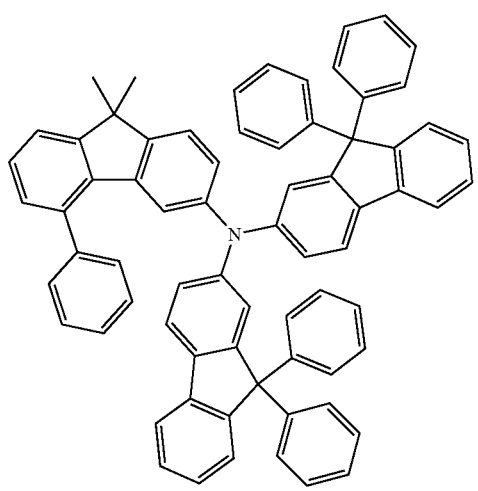 [SMILES: CC1(C)c2ccc(N(c3ccc4c(c3)C(c3ccccc3)(c3ccccc3)c3ccccc3-4)c3ccc4c(c3)C(c3ccccc3)(c3ccccc3)c3ccccc3-4)cc2-c2c(-c3ccccc3)cccc21]
299
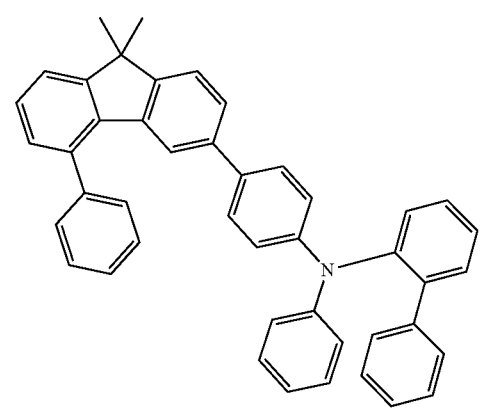
296
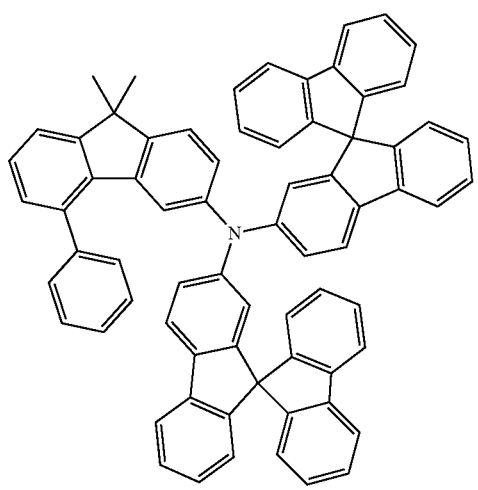
300
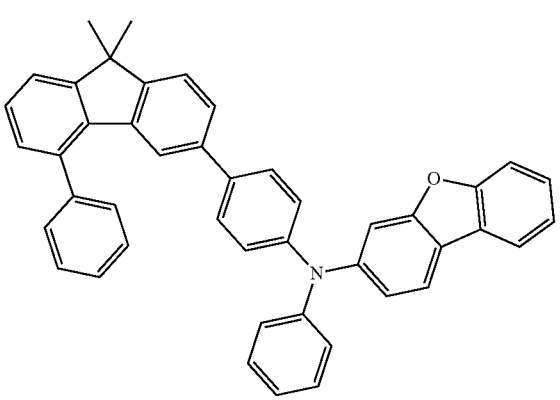

-continued
301
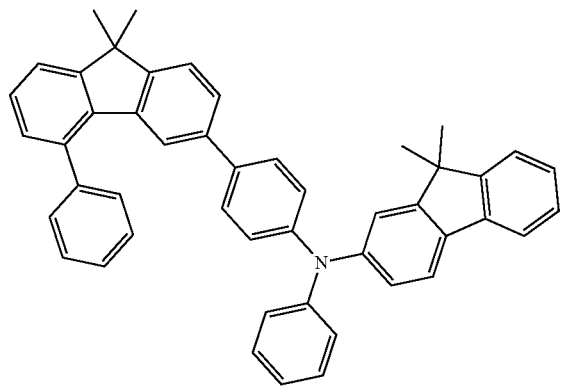
302
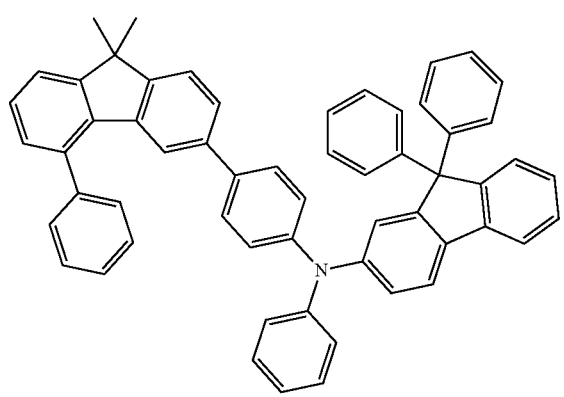
303
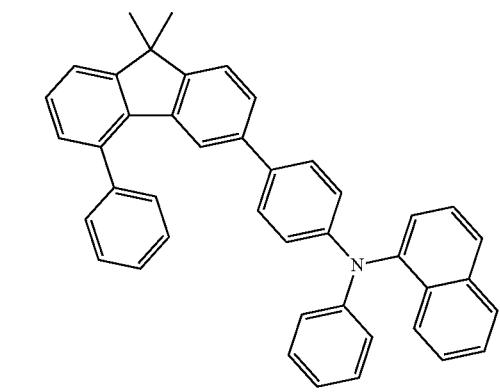
304
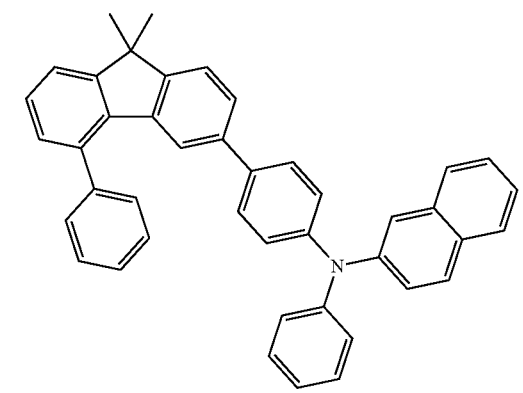
-continued
305
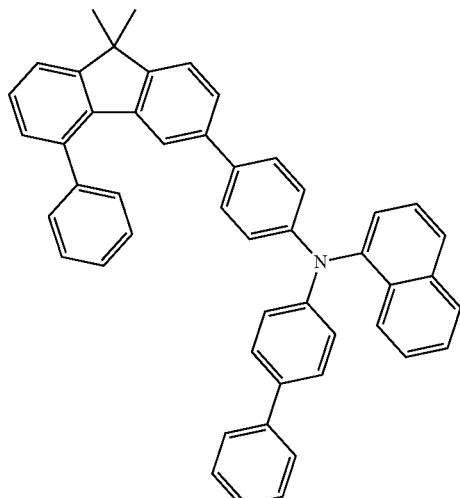
306
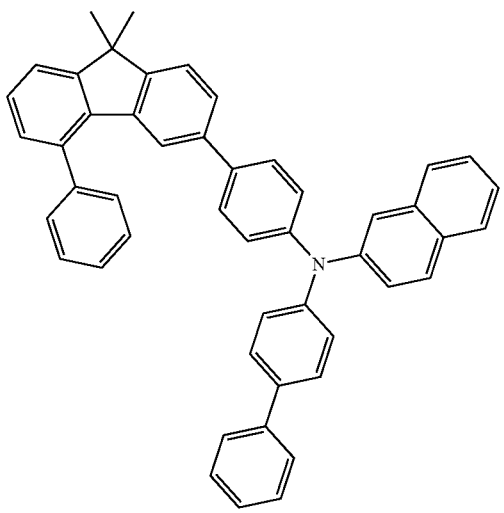
307
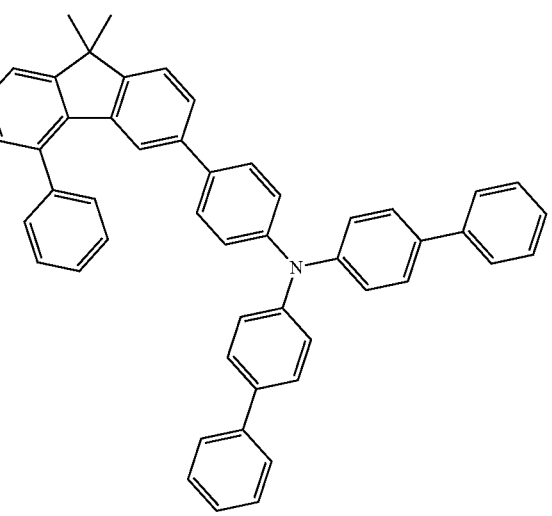

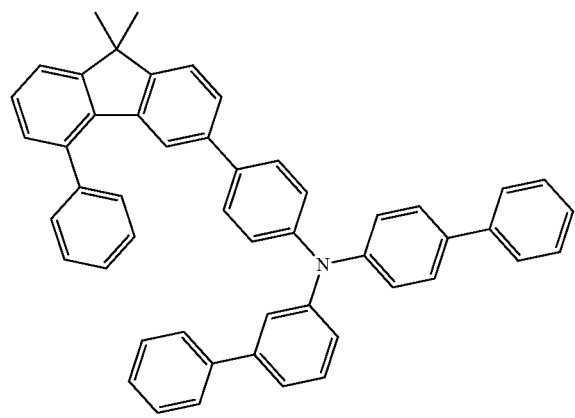
308
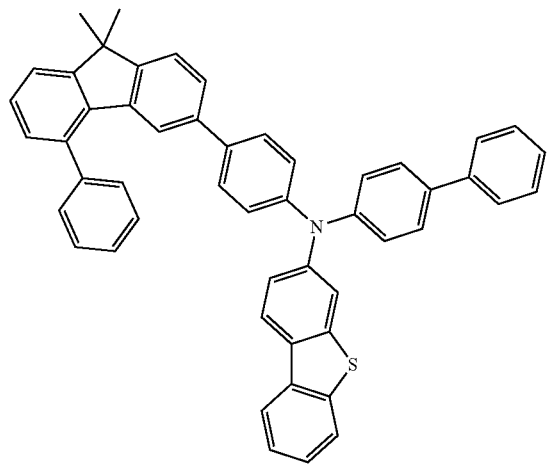
341
309
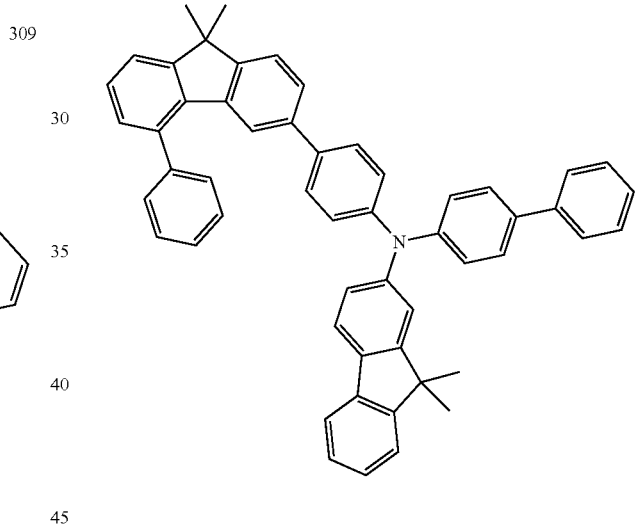
342
340
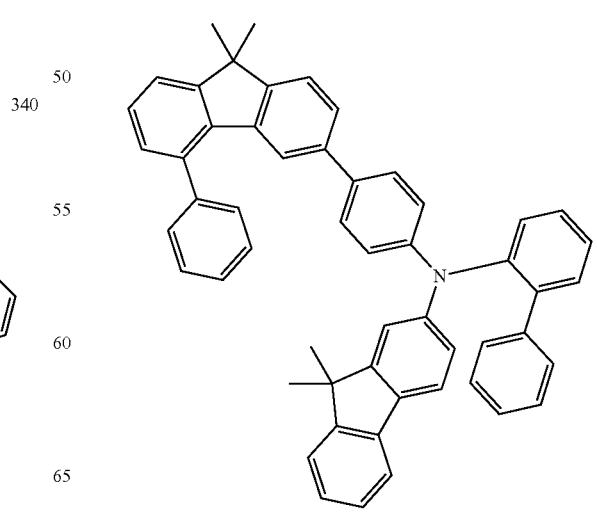
343

344
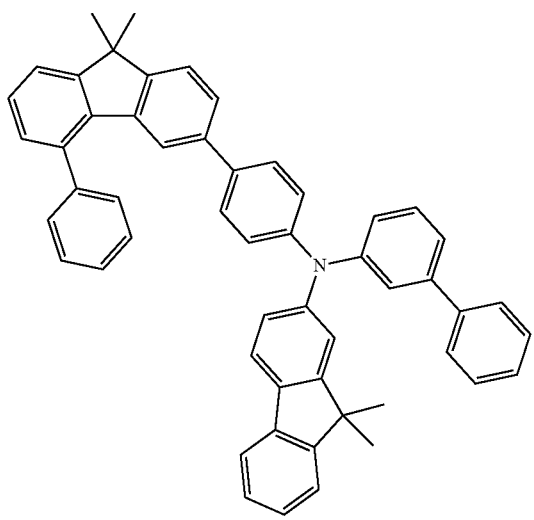
345
347
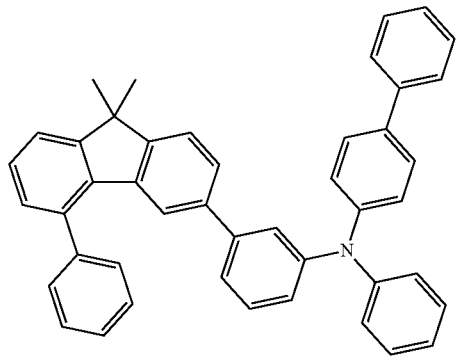
348
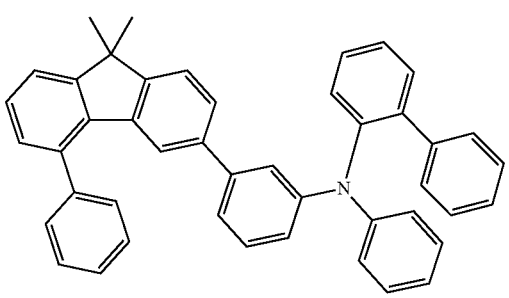
349
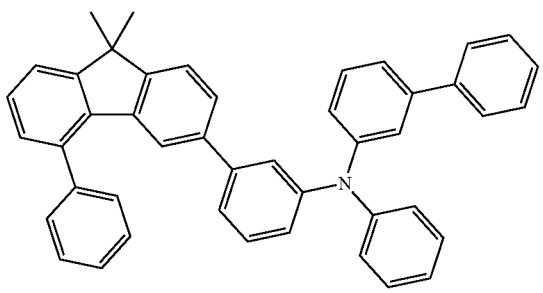
346
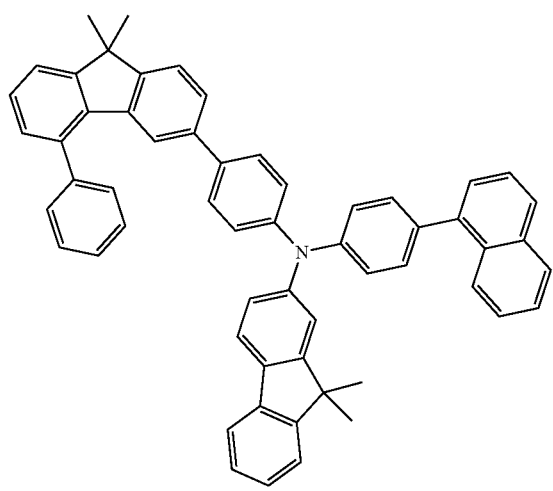
350
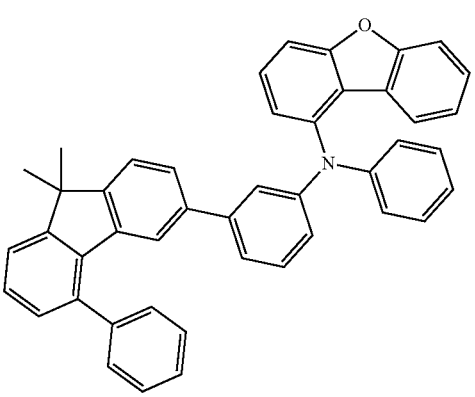

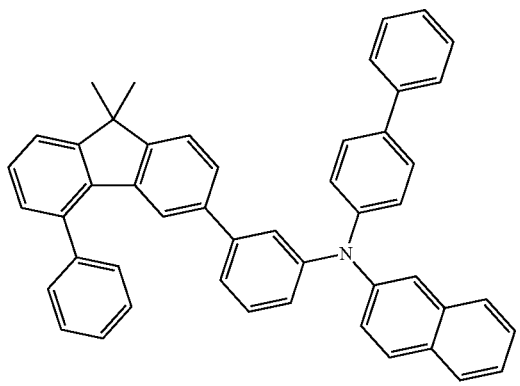
351
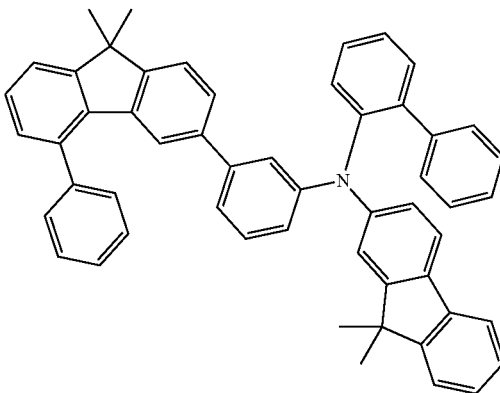
354
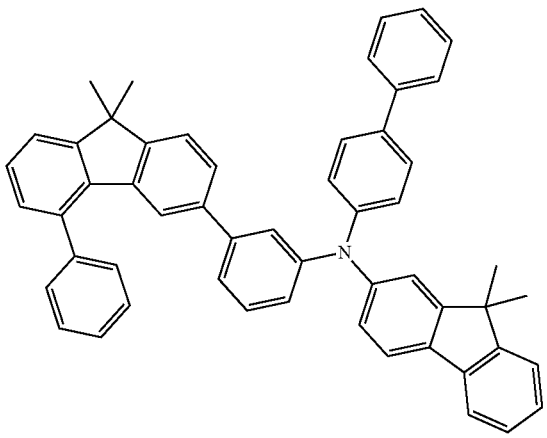
352
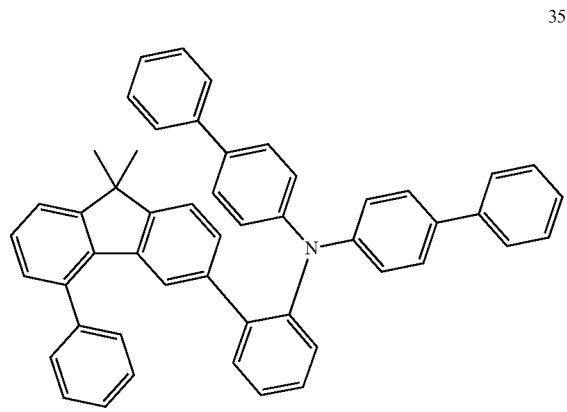
355
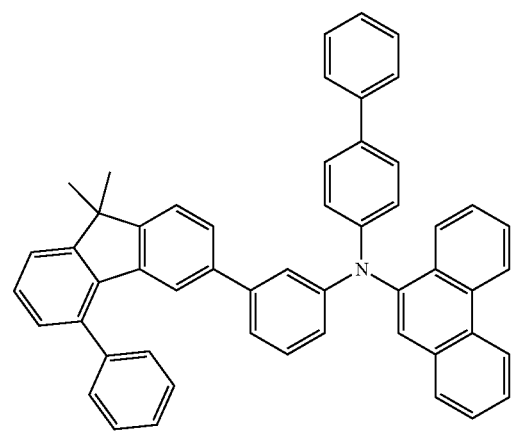
353
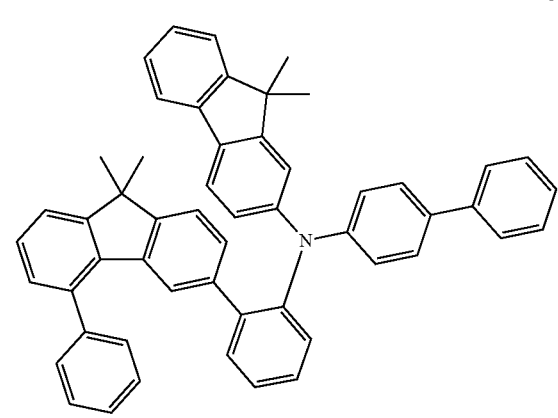
356

357
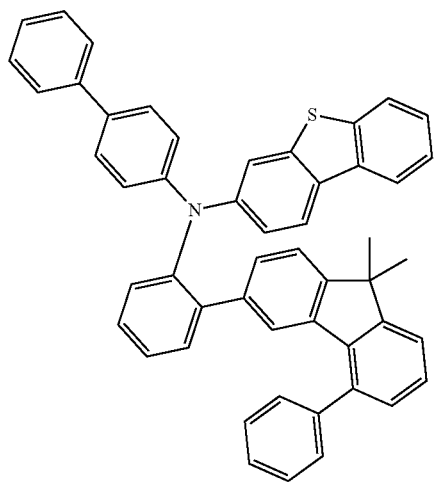
358
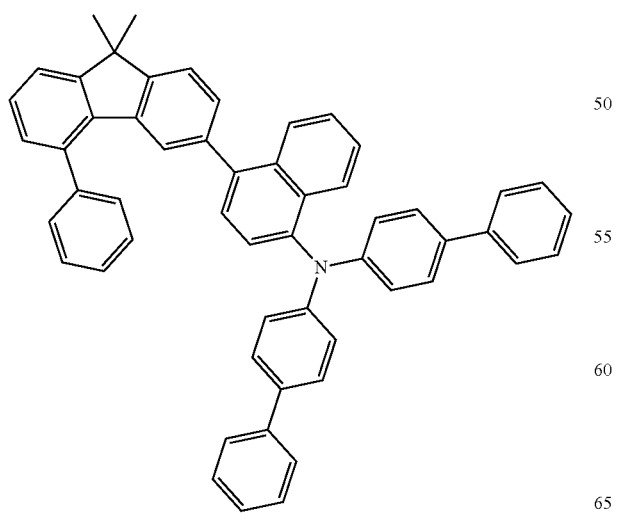
359
360
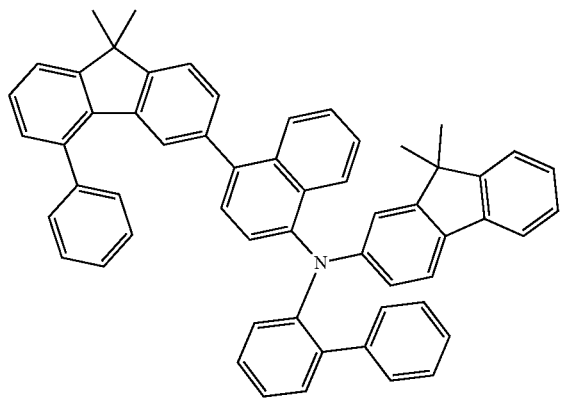
361
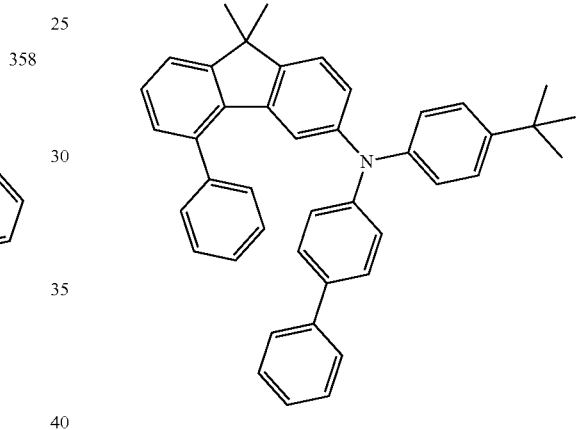
362
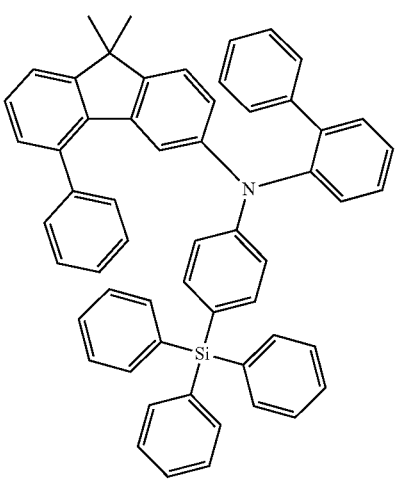

363
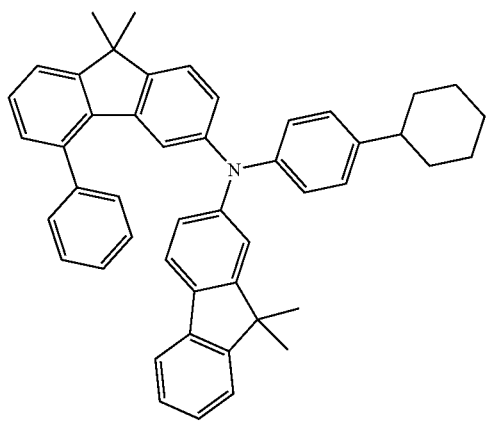
364
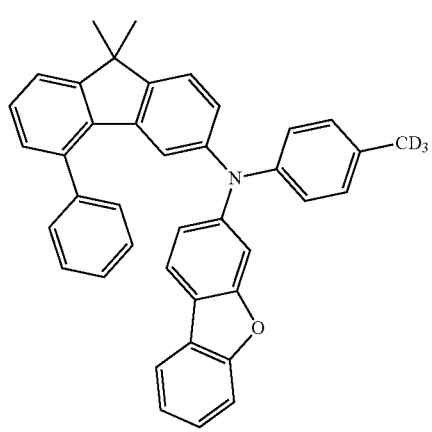
365
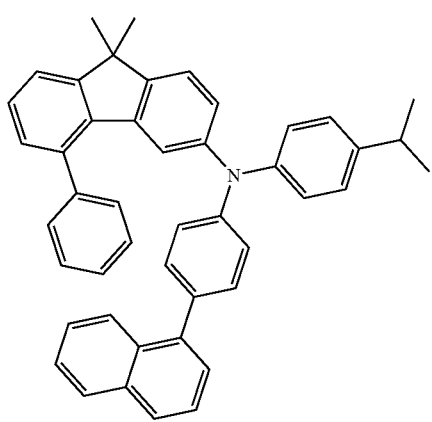
366
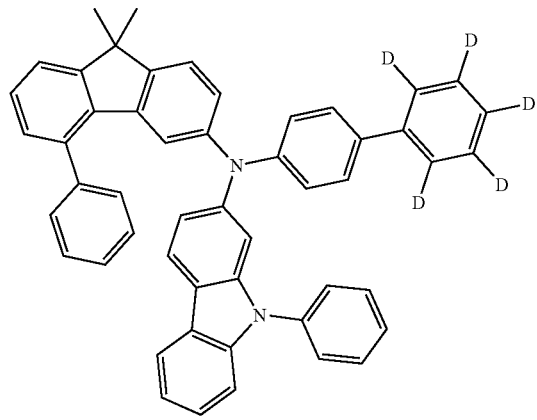
367
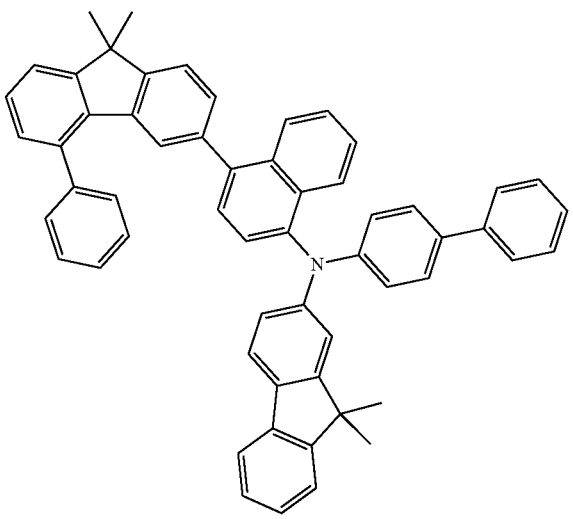
368
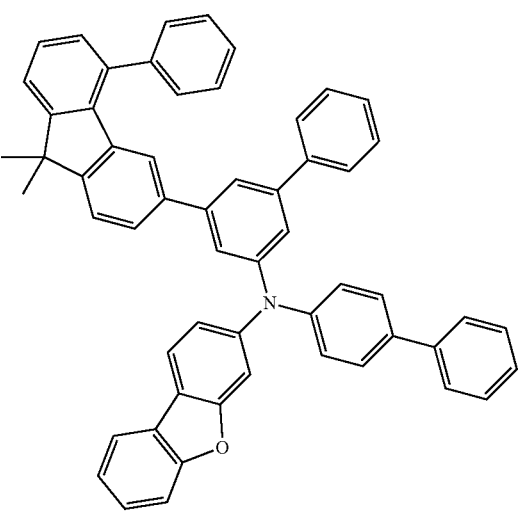

369
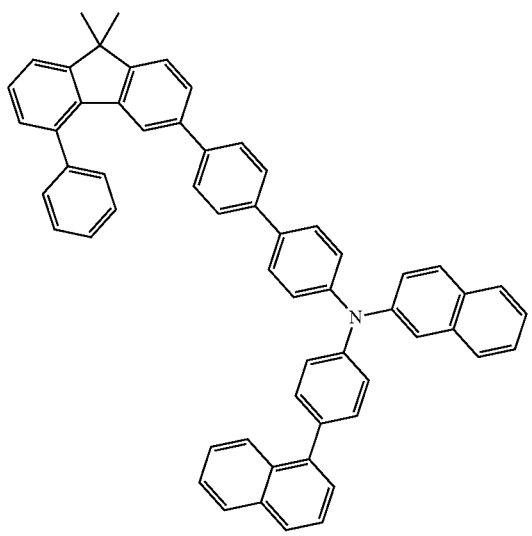
370
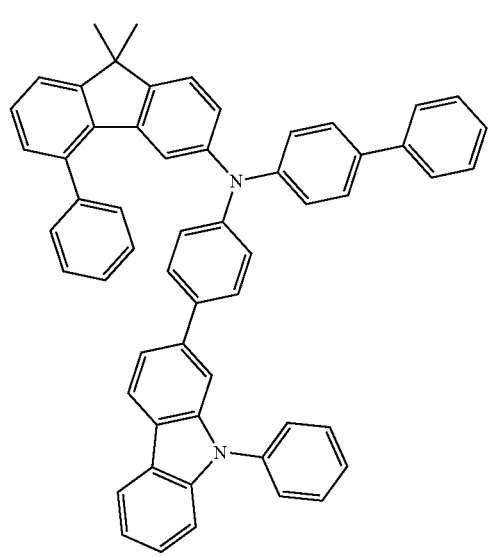
371
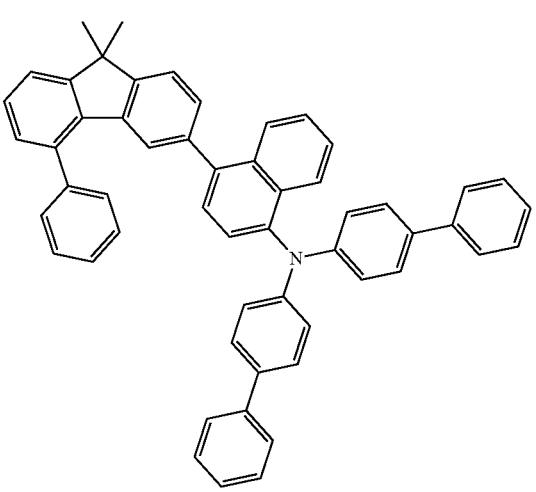
372
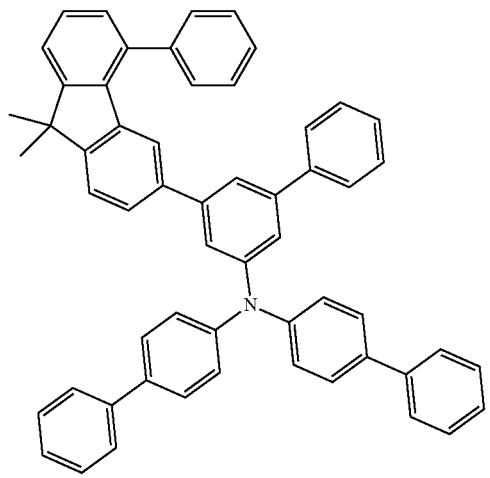
373
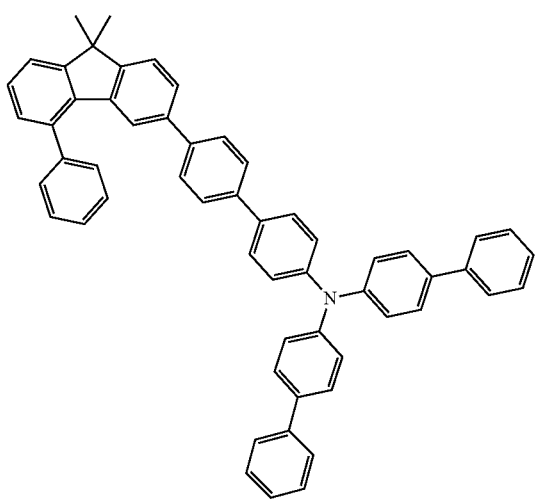
374
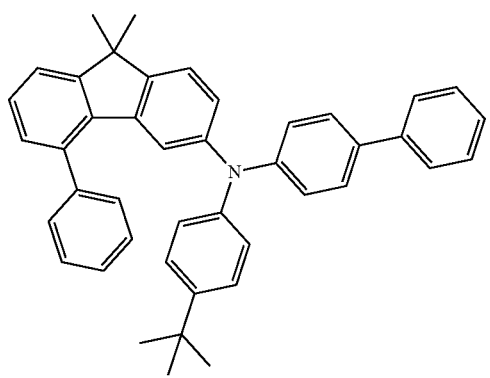

-continued

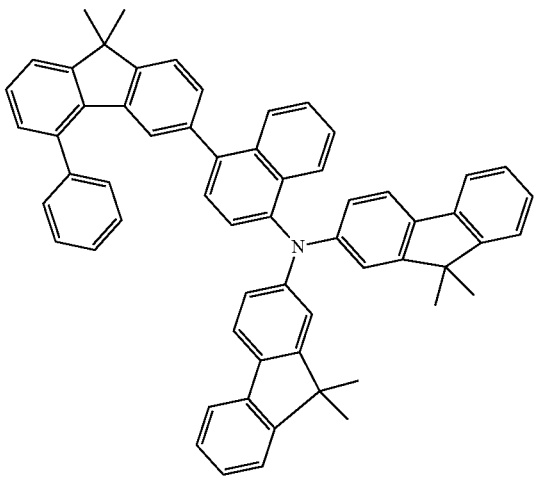

375

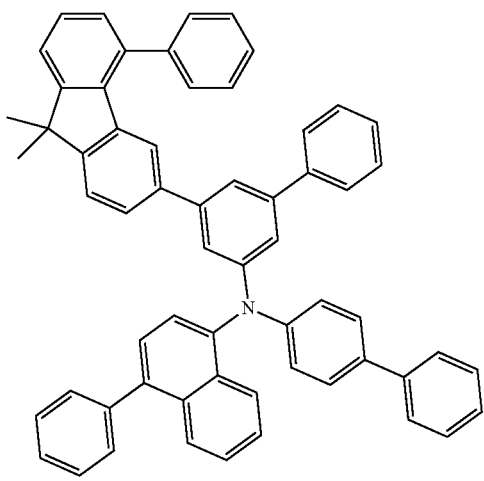

376

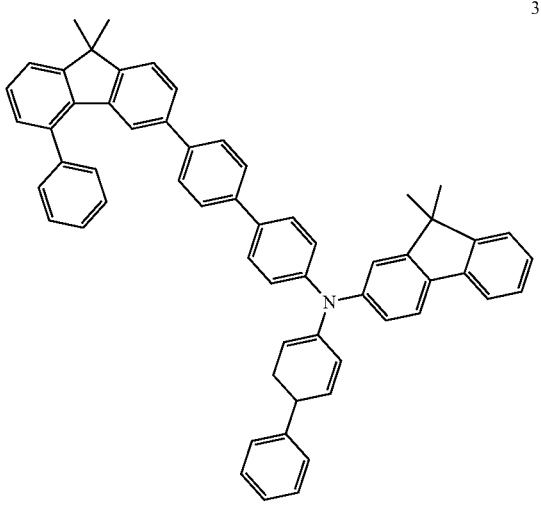

378

-continued

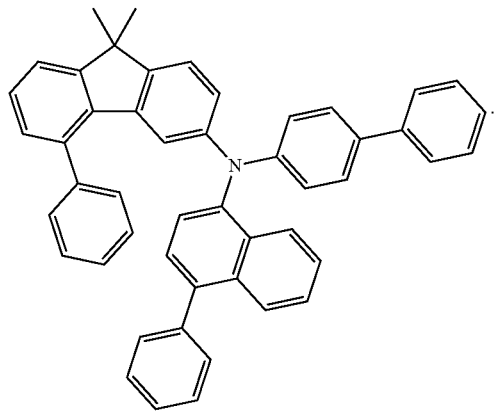

379

The present application also provides an electronic component including an anode and a cathode arranged oppositely, and a functional layer arranged between the anode and the cathode, where the functional layer includes the nitrogen-containing compound of the present application.

According to an embodiment, the electronic component may be an organic electroluminescence device. As shown in FIG. 1, the organic electroluminescence device includes an anode 100 and a cathode 200 arranged oppositely, and a functional layer 300 arranged between the anode 100 and the cathode 200, where the functional layer 300 includes the nitrogen-containing compound of the present application.

Optionally, the functional layer 300 includes an electron blocking layer 322, and the electron blocking layer 322 includes the nitrogen-containing compound provided in the present application. The electron blocking layer 322 may be composed only of the nitrogen-containing compound provided in the present application, or may be composed of the nitrogen-containing compound provided in the present application and other materials.

Optionally, the functional layer 300 includes a hole transporting layer 321 or a hole injection layer 310, and the hole transporting layer 321 or the hole injection layer 310 may include the nitrogen-containing compound provided in the present application to enhance the transport capacity of holes in the electronic component.

In a specific embodiment of the present application, the organic electroluminescence device may include an anode 100, a hole transporting layer 321, an electron blocking layer 322, an organic light-emitting layer 330 as an energy conversion layer, an electron transporting layer 350, and a cathode 200 that are successively stacked. The nitrogen-containing compound provided in the present application can be used for the electron blocking layer 322 of the organic electroluminescence device, which can effectively improve the luminous efficiency and life span of the organic electroluminescence device and reduce the driving voltage of the organic electroluminescence device.

Optionally, the anode 100 may be preferably made of a material with a large work function that facilitates the injection of holes into the functional layer. Specific examples of the anode material may include, but are not limited to: metals such as nickel, platinum, vanadium, chromium, copper, zinc, and gold or alloys thereof; metal oxides such as zinc oxide, indium oxide, indium tin oxide (ITO), and indium zinc oxide (IZO); a combination of a metal and an oxide such as ZnO: Al or SnO$_2$: Sb; or conductive polymers such as poly(3-methylthiophene), poly

[3,4-(ethylene-1,2-dioxy)thiophene](PEDT), polypyrrole, and polyaniline. Preferably, a transparent electrode comprising indium tin oxide (ITO) is adopted as the anode.

Optionally, the hole transporting layer 321 may include one or more hole transport materials, and the hole transport materials may be selected from carbazole polymers, carbazole-linked triarylamine compounds, or other compounds, which are not particularly limited in the present application. For example, the hole transporting layer 321 is composed of a compound HT-01.

Optionally, the organic light-emitting layer 330 may be composed of a single light-emitting material, or may include a host material and a guest material. Optionally, the organic light-emitting layer 330 is composed of a host material and a guest material, where holes injected into the organic light-emitting layer 330 and electrons injected into the organic light-emitting layer 330 can recombine in the organic light-emitting layer 330 to form excitons, the excitons transfer energy to the host material, and then the host material transfers energy to the guest material, such that the guest material can emit light.

The host material of the organic light-emitting layer 330 may be a metal chelate compound, a bisstyryl derivative, an aromatic amine derivative, a dibenzofuran derivative, or other types of materials, which is not particularly limited in the present application. For example, the host material of the organic light-emitting layer 330 is RH-01.

The guest material of the organic light-emitting layer 330 may be a compound with a condensed aryl ring or a derivative thereof, a compound with a heteroaryl ring or a derivative thereof, an aromatic amine derivative, or the like, which is not particularly limited in the present application. For example, the guest material of the organic light-emitting layer 330 is $Ir(Piq)_2(acac)$.

The electron transporting layer 350 may be a single-layer structure or a multi-layer structure, which may include one or more electron transport materials. The electron transport materials may be selected from benzimidazole derivatives, oxadiazole derivatives, quinoxaline derivatives, and other electron transport materials, which is not particularly limited in the present application. For example, the electron transporting layer 350 is composed of ET-01 and LiQ.

Optionally, the cathode 200 may include a material with a small work function that facilitates the injection of electrons into the functional layer. Specific examples of the cathode material include, but are not limited to: metals such as magnesium, calcium, sodium, potassium, titanium, indium, yttrium, lithium, gadolinium, aluminum, silver, tin, and lead or alloys thereof; or multi-layer materials such as LiF/Al, Liq/Al, $LiO_2$/Al, LiF/Ca, LiF/Al, and $BaF_2$/Ca. Preferably, a metal electrode comprising silver and magnesium is adopted as the cathode.

Optionally, as shown in FIG. 1, a hole injection layer 310 may be further provided between the anode 100 and the hole transporting layer 321 to enhance the ability to inject holes into the hole transporting layer 321. The hole injection layer 310 can be made of a benzidine derivative, a starburst arylamine compound, a phthalocyanine derivative, or other materials, which is not particularly limited in the present application. For example, the hole injection layer 310 is composed of F4-TCNQ.

Optionally, as shown in FIG. 1, an electron injection layer 360 may be further provided between the cathode 200 and the electron transporting layer 350 to enhance the ability to inject electrons into the electron transporting layer 350. The electron injection layer 360 may include an inorganic material such as an alkali metal sulfide and an alkali metal halide, or may include a complex of an alkali metal and an organic substance. For example, the electron injection layer 360 is composed of LiQ.

Optionally, a hole blocking layer 340 may be further provided between the organic light-emitting layer 330 and the electron transporting layer 350.

Optionally, the organic electroluminescence device is a red electroluminescence device.

Figure 2:
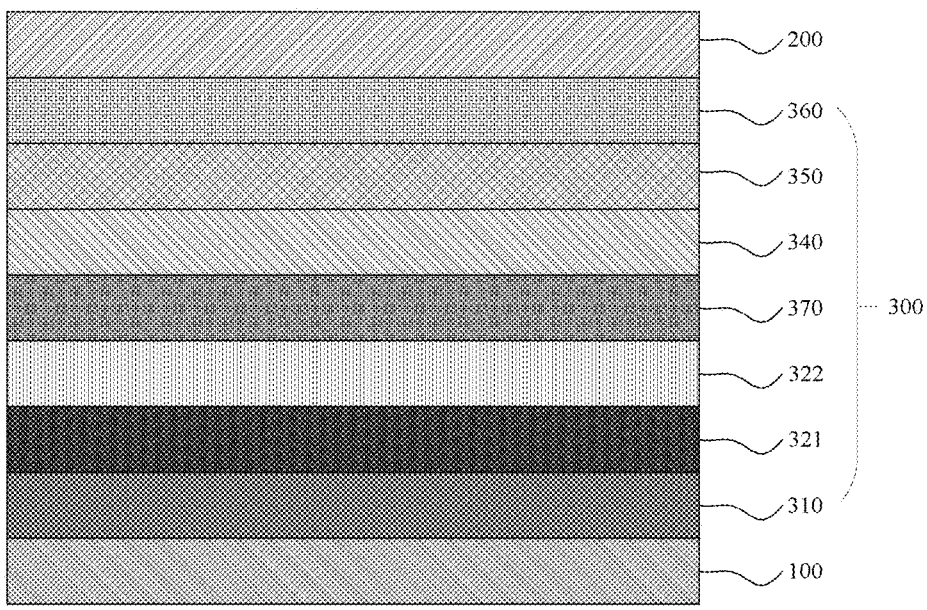
FIG. 2 is a schematic structural diagram of a photoelectric conversion device according to an embodiment of the present application.

According to another embodiment, the electronic component is a photoelectric conversion device. As shown in FIG. 2, the photoelectric conversion device may include an anode 100 and a cathode 200 arranged oppositely, and a functional layer 300 arranged between the anode 100 and the cathode 200, where the functional layer 300 includes the nitrogen-containing compound provided in the present application.

Optionally, the functional layer 300 includes an electron blocking layer 322, and the electron blocking layer 322 includes the nitrogen-containing compound provided in the present application. The electron blocking layer 322 may be composed only of the nitrogen-containing compound provided in the present application, or may be composed of the nitrogen-containing compound provided in the present application and other materials.

Optionally, as shown in FIG. 2, the photoelectric conversion device includes an anode 100, a hole transporting layer 321, an electron blocking layer 322, a photoelectric conversion layer 370 as energy conversion layer, an electron transporting layer 350, and a cathode 200 that are successively stacked. The nitrogen-containing compound provided in the present application can be used for the electron blocking layer 322 of the photoelectric conversion device, which can effectively improve the luminous efficiency, life span, and open-circuit voltage of the photoelectric conversion device.

Optionally, a hole injection layer 310 may be further provided between the anode 100 and the hole transporting layer 321.

Optionally, an electron injection layer 360 may be further provided between the cathode 200 and the electron transporting layer 350.

Optionally, a hole blocking layer 340 may be further provided between the photoelectric conversion layer 370 and the electron transporting layer 350.

Optionally, the photoelectric conversion device may be a solar cell, especially an organic thin-film solar cell. According to a specific embodiment, as shown in FIG. 2, the solar cell includes an anode 100, a hole transporting layer 321, an electron blocking layer 322, a photoelectric conversion layer 370, a hole blocking layer 340, an electron transporting layer 350, an electron injection layer 360, and a cathode 200 that are successively stacked, where the electron blocking layer 322 includes the nitrogen-containing compound of the present application.

The present application also provides an electronic device including the electronic component described in the second aspect of the present application.

Figure 3:
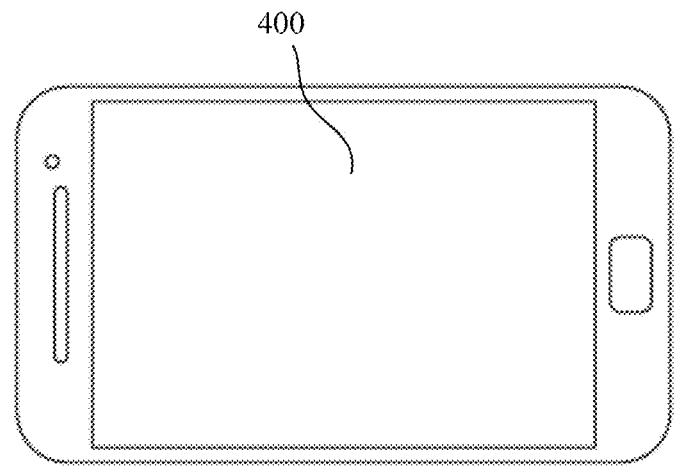
FIG. 3 is a schematic structural diagram of an electronic device according to an embodiment of the present application.

According to an embodiment, as shown in FIG. 3, the electronic device is a first electronic device 400, and the first electronic device 400 includes the organic electroluminescence device. The first electronic device 400 may be a display device, a lighting device, an optical communication device, or another electronic device, including but not limited to computer screen, mobile phone screen, television set, electronic paper, emergency light, and optical module.

Figure 4:
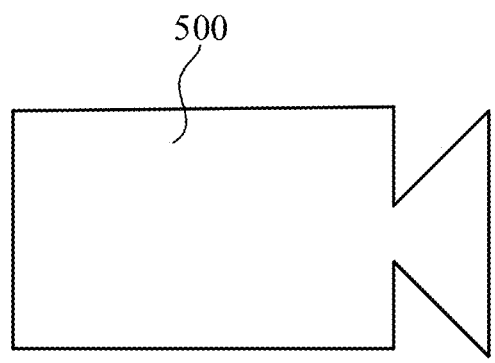
FIG. 4 is a schematic structural diagram of an electronic device according to another embodiment of the present application.

According to another embodiment, as shown in FIG. 4, the electronic device is a second electronic device 500, and the second electronic device 500 includes the photoelectric conversion device. The second electronic device 500 may be a solar power generation device, a light detector, a fingerprint identification device, an optical module, a charged-coupled device (CCD) camera, or another electronic device.

The nitrogen-containing compound and a use thereof of the present application will be illustrated below in conjunction with synthesis examples and examples. Unless otherwise indicated, the raw materials and materials used may be purchased commercially or may be prepared by a method well known in the art.

Synthesis Examples: Compound Synthesis

Synthesis of Intermediates

The following general method 1 or 2 was used to synthesize secondary amine intermediates required in the experimental examples:

Method 1

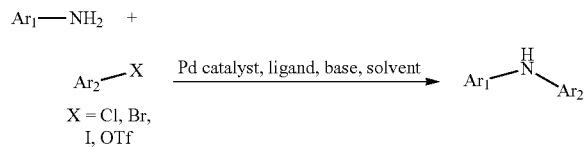

Method 2

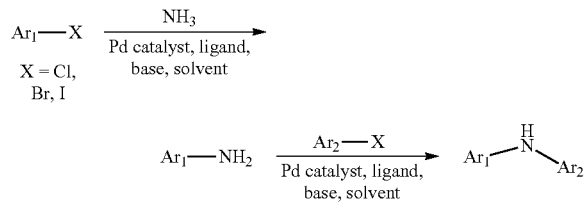

The above methods can refer to the literature CN107004770A in the prior art.

Synthesis of Intermediate i

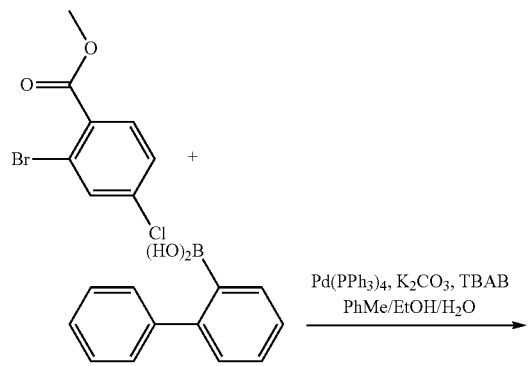

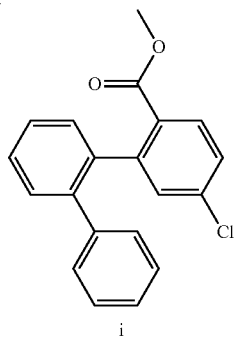

Methyl 2-bromo-4-chlorobenzoate (50.0 g; 200.4 mmol), 2-biphenylboronic acid (41.7 g; 210.4 mmol), tetrakis(triphenylphosphine)palladium (4.6 g; 4.0 mmol), potassium carbonate (55.4 g; 400.8 mmol), tetrabutylammonium bromide (12.9 g; 40.1 mmol), toluene (400 mL), ethanol (100 mL), and deionized water (100 mL) were added to a round-bottom flask, and under nitrogen protection, a resulting mixture was stirred and heated to 75° C. to 80° C. to allow a reaction for 16 h; a resulting reaction mixture was cooled to room temperature and washed with water, and a resulting organic phase was separated, dried with anhydrous magnesium sulfate, and subjected to vacuum distillation to remove the solvent; and a crude product was purified through silica gel column chromatography with dichloromethane/n-heptane as an eluent to obtain an Intermediate i as oily substance (44.0 g; yield: 68%).

Synthesis of Intermediate ii

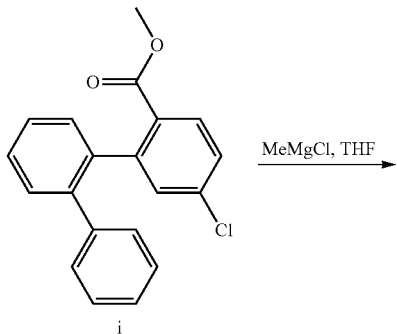

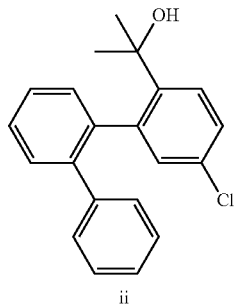

Intermediate i (35.0 g; 108.4 mmol) and dried tetrahydrofuran (THF) (350 mL) were added to a round-bottom flask, and under nitrogen protection, a resulting mixture was stirred and cooled to −15° C. to 10° C.; a solution of methylmagnesium chloride (64.9 g; 867.4 mmol) in THF was slowly added dropwise, and a resulting mixture was stirred at −15° C. to 10° C. for 1 h, then heated to 20° C. to 25° C., and further stirred to allow a reaction for 12 h; a saturated aqueous solution of ammonium chloride was added to a resulting reaction system, extraction was conducted with dichloromethane, and a resulting organic phase was separated, dried with anhydrous magnesium sulfate, and subjected to vacuum distillation to remove the solvent; and a crude product was purified through silica gel column chromatography with a dichloromethane/n-heptane system to obtain a Intermediate ii as colorless oily substance (20.5 g; yield: 59%).

Synthesis of Intermediate a

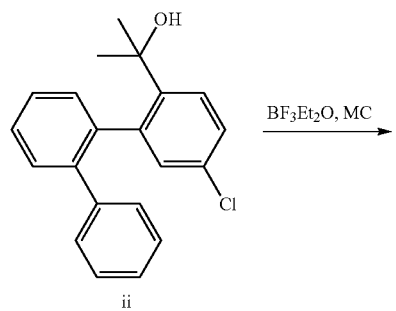

ii

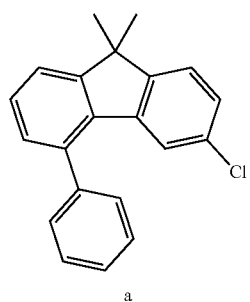

a

Intermediate ii (20.0 g; 62.0 mmol) and dichloromethane (300 mL) were added to a round-bottom flask, and under nitrogen protection, a resulting mixture was stirred and cooled to −5° C. to 0° C.; boron trifluoride diethyl etherate (13.2 g; 92.9 mmol) was slowly added dropwise, and a resulting mixture was stirred at −5° C. to 0° C. for 30 min, heated to 20° C. to 25° C., and stirred to allow a reaction for 2 h; a sodium bicarbonate aqueous solution and dichloromethane were added to a resulting reaction system, and a resulting organic phase was separated, dried with anhydrous magnesium sulfate, and subjected to vacuum distillation to remove the solvent; and a crude product was purified through silica gel column chromatography with a dichloromethane/n-heptane system to obtain a Intermediate a as white solid (13.3 g; yield: 70%). Mass spectrometry (MS) data: m/z=305.1 [M+H]⁺.

Synthesis of Intermediate a0

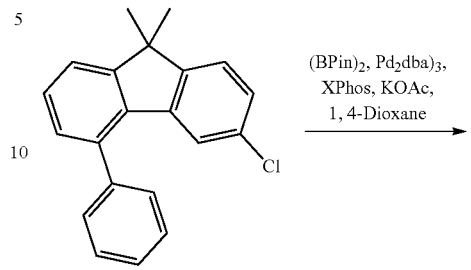

a

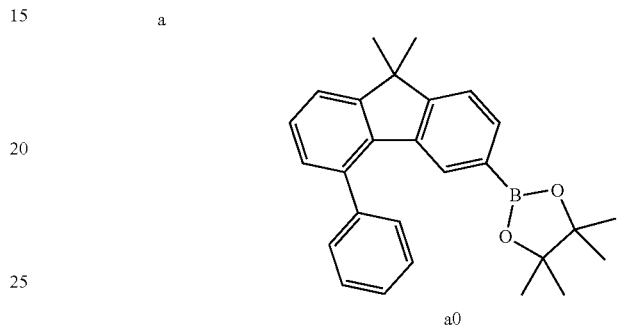

a0

Intermediate a (10.0 g, 32.8 mmol), bis(pinacolato)diboron (10.0 g, 39.4 mmol), tris(dibenzylideneacetone)dipalladium (0.3 g, 0.3 mmol), 2-dicyclohexylphosphino-2′,4′,6′-triisopropylbiphenyl (0.3 g, 0.7 mmol), potassium acetate (6.4 g, 65.6 mmol), and 1,4-dioxane (80 mL) were added to a flask, and under nitrogen protection, a reaction mixture was heated to 100° C. to 105° C. and stirred to allow a reaction under reflux for 16 h; a resulting reaction solution was cooled to room temperature, then dichloromethane and water were added, and a resulting mixture was allowed to be separated into layers; a resulting organic phase was washed with water, dried with anhydrous magnesium sulfate, and then subjected to vacuum distillation to remove the solvent to obtain a crude product; and the crude product was purified through silica gel column chromatography with a dichloromethane/n-heptane system to obtain a Intermediate a0 as white solid (10.4 g, 80%).

Synthesis of Intermediate a1

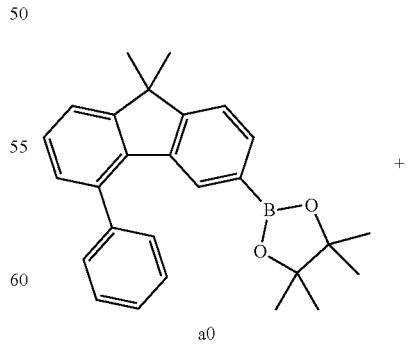

a0

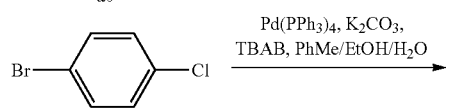

-continued

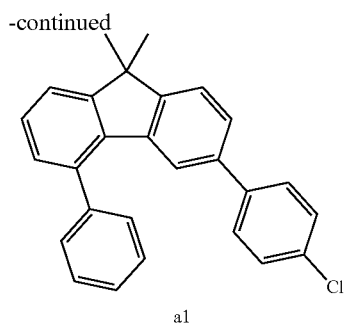

a1

Intermediate a0 (10.0 g; 25.2 mmol), 4-bromochlorobenzene (5.3 g; 27.8 mmol), tetrakis(triphenylphosphine)palladium (0.6 g; 0.5 mmol), potassium carbonate (7.0 g; 50.4 mmol), tetrabutylammonium bromide (1.6 g; 50. mmol), toluene (80 mL), ethanol (20 mL), and deionized water (20 mL) were added to a round-bottom flask, and under nitrogen protection, a resulting mixture was stirred and heated to 75° C. to 80° C. to allow a reaction for 12 h; a resulting reaction mixture was cooled to room temperature and washed with water, and a resulting organic phase was separated, dried with anhydrous magnesium sulfate, and subjected to vacuum distillation to remove the solvent; and a crude product was purified through silica gel column chromatography with dichloromethane/n-heptane as an eluent to obtain a Intermediate a1 as white solid (7.8 g; yield: 81%).

The reactant A in Table 1 was used instead of 4-bromochlorobenzene to synthesize the intermediates shown in Table 1 by the same method as that for Intermediate a1.

TABLE 1

| Intermediate | Reactant A | Structure | Yield (%) |
|---|---|---|---|
| a2 | (structure) | (structure) | 77 |
| a3 | (structure) | (structure) | 60 |
| a4 | (structure) | (structure) | 72 |

Synthesis Example 1: Synthesis of Compound 2

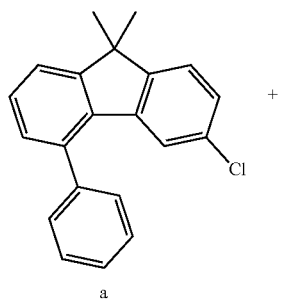

a

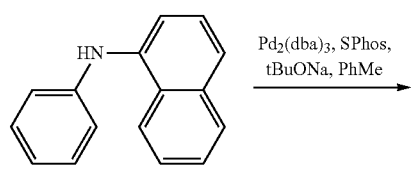

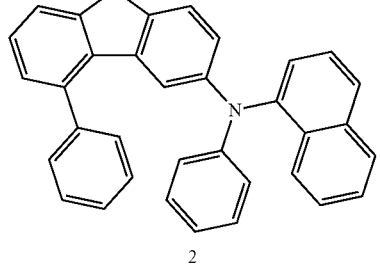

2

Intermediate a (4.0 g, 13.1 mmol), N-phenyl-1-naphthylamine (2.9 g; 13.1 mmol), tris(dibenzylideneacetone)dipalladium (0.2 g; 0.3 mmol), 2-dicyclohexylphosphino-2,6-dimethoxybiphenyl (0.2 g; 0.5 mmol), sodium tert-butoxide (1.9 g; 19.7 mmol), and toluene (50 mL) were added to a nitrogen-protected round-bottom flask, heated to 105° C.-110° C. under stirring, and subjected to a reaction for 16 h; a resulting reaction solution was cooled to room temperature and washed with water, and a resulting organic phase was separated, dried with anhydrous magnesium sulfate, and subjected to vacuum distillation to remove the solvent; and a crude product was purified through silica gel columnm chromatography with dichloromethane/n-heptane and then purified through recrystallization with toluene/n-heptane to obtain a compound 2 as white solid (3.6 g; yield: 56%).

Synthesis Examples 2 to 35

The reactant B in Table 2 was used instead of N-phenyl-1-naphthylamine to synthesize the compounds in Table 2 with reference to the synthesis method of compound 2.

TABLE 2

| Synthesis Example | Compound | Reactant B | Structure | Yield (%) |
|---|---|---|---|---|
| 2 | 11 | 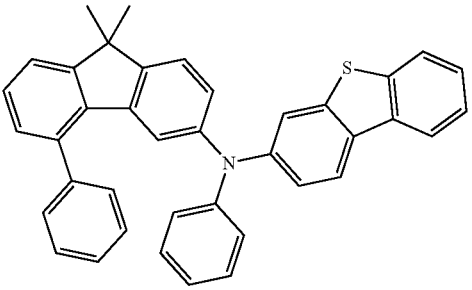 | 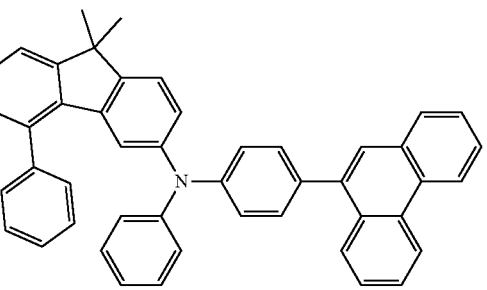 | 62 |
| 3 | 36 | 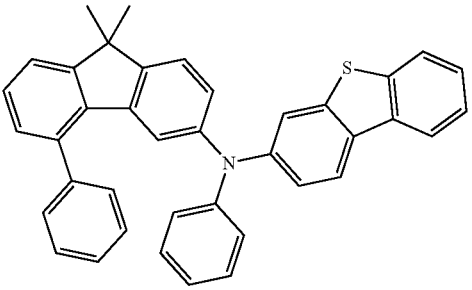 | 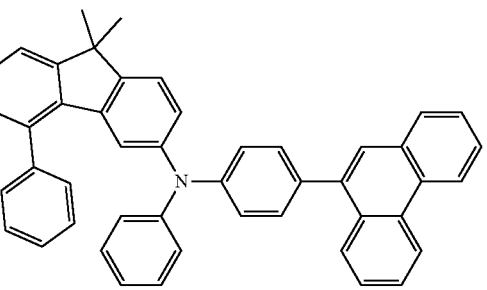 | 47 |

TABLE 2-continued
| Synthesis Example | Compound | Reactant B | Structure | Yield (%) |
|---|---|---|---|---|
| 4 | 39 | 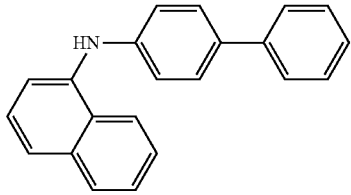 | 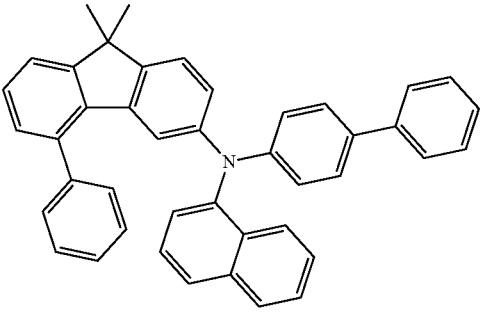 | 46 |
| 5 | 49 | 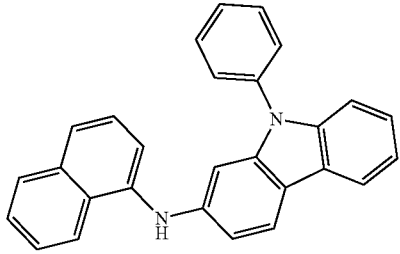 | 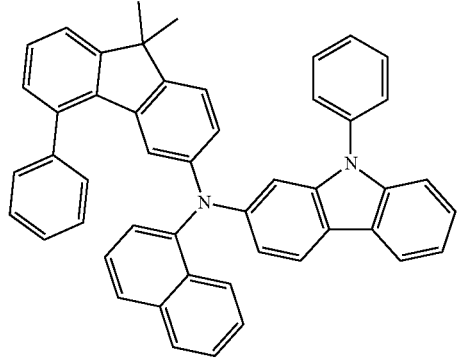 | 39 |
| 6 | 58 | 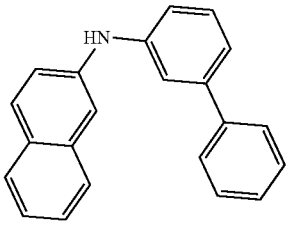 | 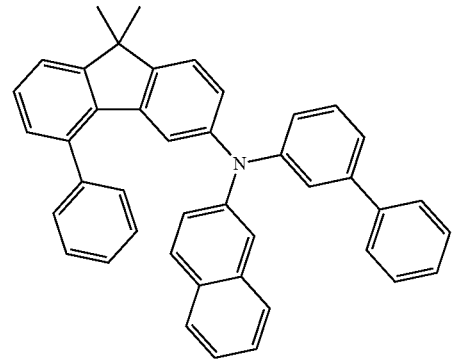 | 68 |
| 7 | 68 | 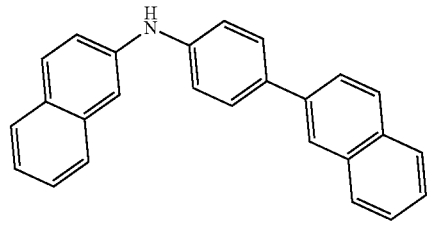 | 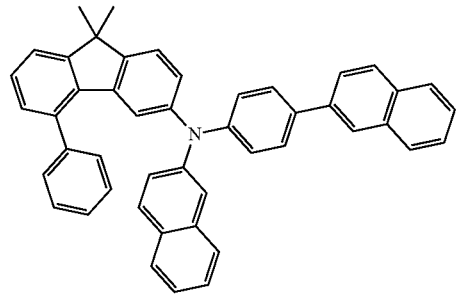 | 62 |

TABLE 2-continued

| Synthesis Example | Compound | Reactant B | Structure | Yield (%) |
|---|---|---|---|---|
| 8 | 77 | | | 57 |
| 9 | 101 | | | 48 |
| 10 | 108 | | | 54 |

TABLE 2-continued

| Synthesis Example | Compound | Reactant B | Structure | Yield (%) |
|---|---|---|---|---|
| 11 | 123 | | | 65 |
| 12 | 131 | | | 52 |
| 13 | 134 | | | 57 |

TABLE 2-continued

| Synthesis Example | Compound | Reactant B | Structure | Yield (%) |
|---|---|---|---|---|
| 14 | 146 | | | 49 |
| 15 | 150 | | | 48 |
| 16 | 164 | | | 37 |
| 17 | 175 | | | 50 |

TABLE 2-continued

| Synthesis Example | Compound | Reactant B | Structure | Yield (%) |
|---|---|---|---|---|
| 18 | 181 | | | 64 |
| 19 | 195 | | | 61 |
| 20 | 204 | | | 50 |
| 21 | 216 | | | 38 |

TABLE 2-continued

| Synthesis Example | Compound | Reactant B | Structure | Yield (%) |
|---|---|---|---|---|
| 22 | 224 | | | 35 |
| 23 | 234 | | | 38 |
| 24 | 249 | | | 41 |
| 25 | 268 | | | 65 |

TABLE 2-continued

| Synthesis Example | Compound | Reactant B | Structure | Yield (%) |
|---|---|---|---|---|
| 26 | 273 | | | 63 |
| 27 | 281 | | | 53 |
| 28 | 289 | | | 50 |
| 29 | 295 | | | 34 |

TABLE 2-continued

| Synthesis Example | Compound | Reactant B | Structure | Yield (%) |
|---|---|---|---|---|
| 30 | 362 | 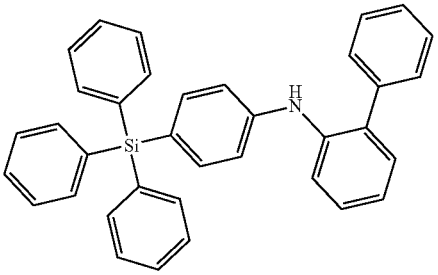 [SMILES: c1ccc(-c2ccccc2Nc2ccc([Si](c3ccccc3)(c3ccccc3)c3ccccc3)cc2)cc1] | 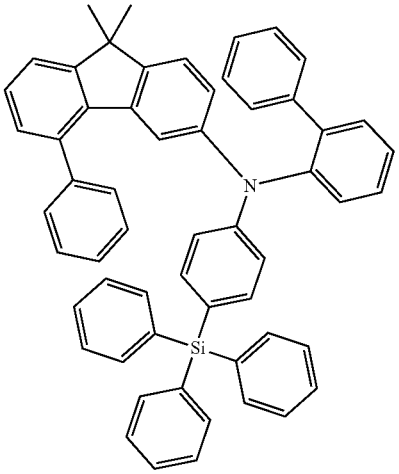 [SMILES: CC1(C)c2ccc(N(c3ccc([Si](c4ccccc4)(c4ccccc4)c4ccccc4)cc3)c3ccccc3-c3ccccc3)cc2-c2c(-c3ccccc3)cccc21] | 42 |

The reactant C in Table 3 was used instead of the intermediate a and the reactant D was used instead of N-phenyl-1-naphthylamine to synthesize the compounds in Table 3 with reference to the synthesis method of compound 2.

TABLE 3

| Synthesis Example | Compound | Reactant C | Reactant D | Structure | Yield (%) |
|---|---|---|---|---|---|
| 31 | 307 | 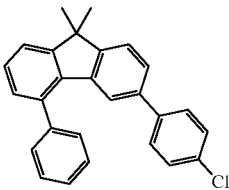 [SMILES: CC1(C)c2ccc(-c3ccc(Cl)cc3)cc2-c2c(-c3ccccc3)cccc21] | 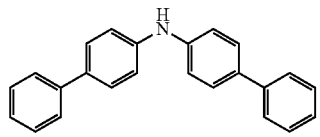 [SMILES: c1ccc(-c2ccc(Nc3ccc(-c4ccccc4)cc3)cc2)cc1] | 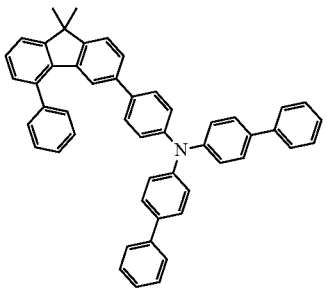 [SMILES: CC1(C)c2ccc(-c3ccc(N(c4ccc(-c5ccccc5)cc4)c4ccc(-c5ccccc5)cc4)cc3)cc2-c2c(-c3ccccc3)cccc21] | 63 |
| 32 | 343 | 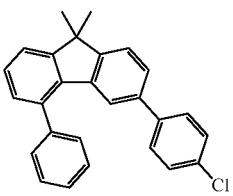 [SMILES: CC1(C)c2ccc(-c3ccc(Cl)cc3)cc2-c2c(-c3ccccc3)cccc21] | 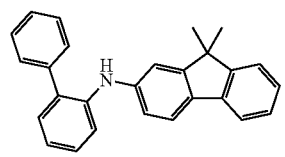 [SMILES: CC1(C)c2ccccc2-c2ccc(Nc3ccccc3-c3ccccc3)cc21] | 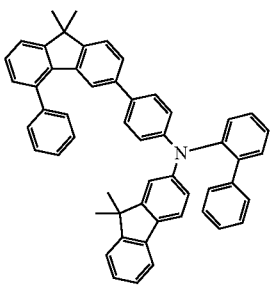 [SMILES: CC1(C)c2ccccc2-c2ccc(N(c3ccc(-c4ccc5c(c4)-c4c(-c6ccccc6)cccc4C5(C)C)cc3)c3ccccc3-c3ccccc3)cc21] | 54 |

TABLE 3-continued

| Synthesis Example | Compound | Reactant C | Reactant D | Structure | Yield (%) |
|---|---|---|---|---|---|
| 33 | 353 | 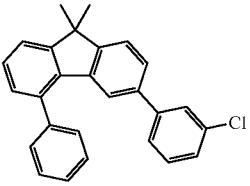 [SMILES: CC1(C)c2ccc(-c3cccc(Cl)c3)cc2-c2c(-c3ccccc3)cccc21] | 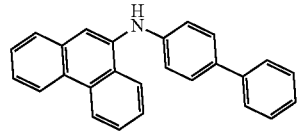 [SMILES: c1ccc(-c2ccc(Nc3cc4ccccc4c4ccccc34)cc2)cc1] | 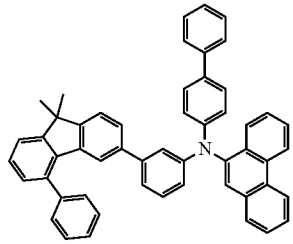 [SMILES: CC1(C)c2ccc(-c3cccc(N(c4ccc(-c5ccccc5)cc4)c4cc5ccccc5c5ccccc45)c3)cc2-c2c(-c3ccccc3)cccc21] | 60 |
| 34 | 356 | 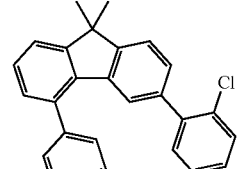 | 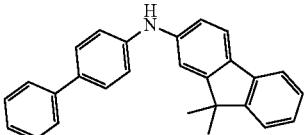 | 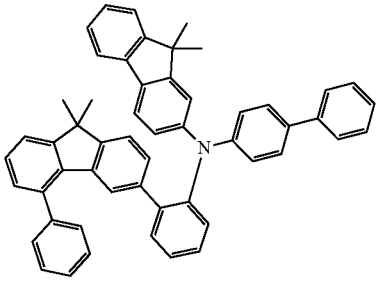 [SMILES: CC1(C)c2ccccc2-c2ccc(N(c3ccc(-c4ccccc4)cc3)c3ccccc3-c3ccc4c(c3)-c3c(-c5ccccc5)cccc3C4(C)C)cc21] | 42 |
| 35 | 378 | 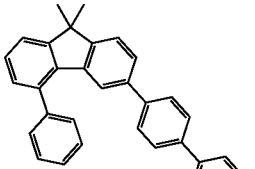 | 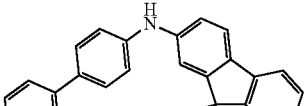 | 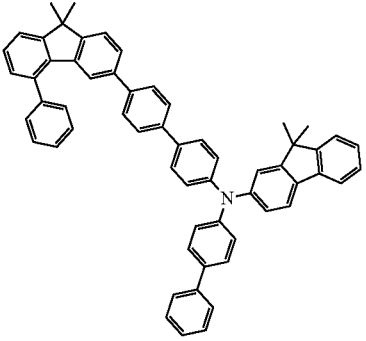 [SMILES: CC1(C)c2ccccc2-c2ccc(N(c3ccc(-c4ccccc4)cc3)c3ccc(-c4ccc(-c5ccc6c(c5)-c5c(-c7ccccc7)cccc5C6(C)C)cc4)cc3)cc21] | 51 |

MS data for the compounds in the synthesis examples were shown in Table 4.

TABLE 4

| | | | |
|---|---|---|---|
| Compound 2 | m/z = 488.2[M + H]$^+$ | Compound 181 | m/z = 680.3[M + H]$^+$ |
| Compound 11 | m/z = 544.2[M + H]$^+$ | Compound 195 | m/z = 628.3[M + H]$^+$ |
| Compound 36 | m/z = 614.3[M + H]$^+$ | Compound 204 | m/z = 730.3[M + H]$^+$ |
| Compound 39 | m/z = 564.3[M + H]$^+$ | Compound 216 | m/z = 766.3[M + H]$^+$ |
| Compound 49 | m/z = 653.3[M + H]$^+$ | Compound 224 | m/z = 680.3[M + H]$^+$ |
| Compound 58 | m/z = 564.3[M + H]$^+$ | Compound 234 | m/z = 709.3[M + H]$^+$ |
| Compound 68 | m/z = 614.3[M + H]$^+$ | Compound 249 | m/z = 660.3[M + H]$^+$ |
| Compound 77 | m/z = 590.3[M + H]$^+$ | Compound 268 | m/z = 719.3[M + H]$^+$ |
| Compound 101 | m/z = 666.3[M + H]$^+$ | Compound 273 | m/z = 720.3[M + H]$^+$ |
| Compound 108 | m/z = 752.3[M + H]$^+$ | Compound 281 | m/z = 690.3[M + H]$^+$ |
| Compound 123 | m/z = 630.3[M + H]$^+$ | Compound 289 | m/z = 690.3[M + H]$^+$ |
| Compound 131 | m/z = 666.3[M + H]$^+$ | Compound 295 | m/z = 918.4[M + H]$^+$ |
| Compound 134 | m/z = 752.3[M + H]$^+$ | Compound 362 | m/z = 772.3[M + H]$^+$ |
| Compound 146 | m/z = 620.2[M + H]$^+$ | Compound 307 | m/z = 666.3[M + H]$^+$ |
| Compound 150 | m/z = 630.3[M + H]$^+$ | Compound 343 | m/z = 706.3[M + H]$^+$ |
| Compound 164 | m/z = 754.3[M + H]$^+$ | Compound 353 | m/z = 690.3[M + H]$^+$ |
| Compound 175 | m/z = 644.3[M + H]$^+$ | Compound 356 | m/z = 706.3[M + H]$^+$ |
| Compound 378 | m/z = 782.[M + H]$^+$ | | |

Nuclear magnetic resonance (NMR) data of some intermediates and compounds were shown in Table 5 below.

TABLE 5

| Compound | NMR data |
|---|---|
| Intermediate a | $^1$H NMR (CD$_2$Cl$_2$, 400 MHz): 7.55-7.52 (m, 4H), 7.50 (t, 1H), 7.42 (d, 1H), 7.36 (t, 1H), 7.32 (d, 1H), 7.27 (d, 1H), 7.12 (d, 1H), 6.95 (s, 1H), 1.45 (s, 6H). |
| Compound 77 | $^1$H NMR (CD$_2$Cl$_2$, 400 MHz): 7.62 (d, 4H), 7.45-7.43 (m, 5H), 7.40-7.32 (m, 12H), 7.21-7.19 (m, 2H), 7.10 (d, 1H), 7.06 (d, 4H), 6.85 (s, 1H), 1.40 (s, 6H). |

Fabrication and Evaluation of Organic Electroluminescence Device

Example 1

An anode was produced by the following process: An ITO substrate (manufactured by Coming) with a thickness of 1,500 Å was cut into a size of 40 mm×40 mm×0.7 mm, then the substrate was processed through photolithography into an experimental substrate with cathode, anode, and insulating layer patterns, and the experimental substrate was subjected to a surface treatment with ultraviolet-ozone and O$_2$: N$_2$ plasma to increase a work function of the anode (experimental substrate) and remove scums.

F4-TCNQ was vacuum-deposited on the experimental substrate (anode) to form a hole injection layer (HIL) with a thickness of 100 Å. HT-01 was vapor-deposited on the hole injection layer to form a hole transporting layer with a thickness of 800 Å.

The compound 2 was vacuum-deposited on the hole transporting layer to form an electron blocking layer with a thickness of 850 Å.

RH-01 and Ir(Piq)$_2$(acac) were co-deposited on the electron blocking layer in a ratio of 95%:5% to form an organic light-emitting layer (red light-emitting layer, R-EML) with a thickness of 350 Å.

ET-01 and LiQ were mixed in a weight ratio of 1:1 and then vapor-deposited to form an electron transporting layer (ETL) with a thickness of 300 Å, then LiQ was vapor-deposited on the electron transporting layer to form an electron injection layer (EIL) with a thickness of 10 Å, and magnesium (Mg) and silver (Ag) were mixed in a ratio of 1:9 and then vacuum-deposited on the electron injection layer to form a cathode with a thickness of 105 Å.

In addition, CP-1 was vapor-deposited on the cathode to form an organic capping layer (CPL) with a thickness of 650 Å, thereby completing the production of the organic electroluminescence device.

Examples 2 to 35

Organic electroluminescence devices were produced by the same method as in Example 1, except that Compounds shown in Table 7 below was used instead of Compound 2 in the formation of the electron blocking layer.

Comparative Examples 1 to 5

Organic electroluminescence devices were produced by the same method as in Example 1, except that Compounds A to E each were used instead of Compound 2 in the formation of the electron blocking layer.

Structures of the materials used in the examples and comparative examples were shown in Table 6 below.

TABLE 6

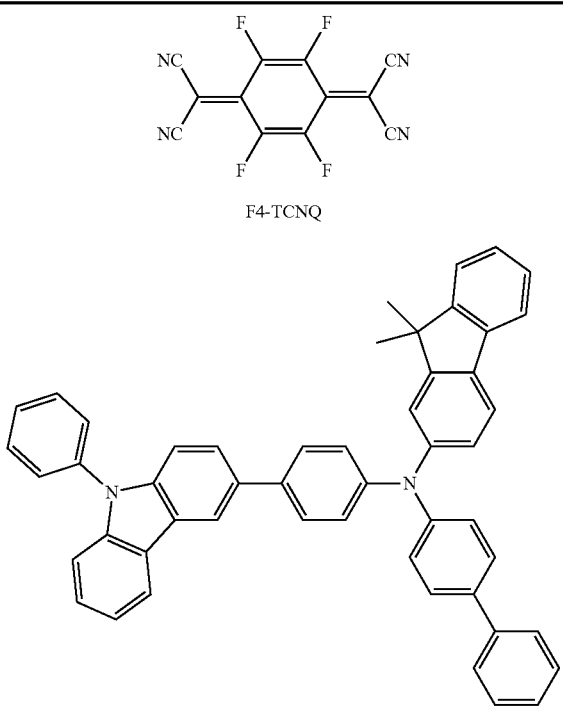

F4-TCNQ

TABLE 6-continued
HT-01
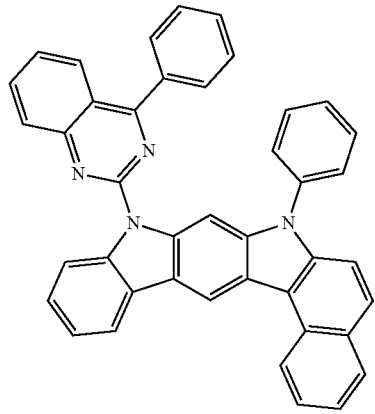 [SMILES: c1ccc(-c2nc(-n3c4ccccc4c4cc5c6c7ccccc7ccc6n(-c6ccccc6)c5cc43)nc3ccccc23)cc1]
RH-01
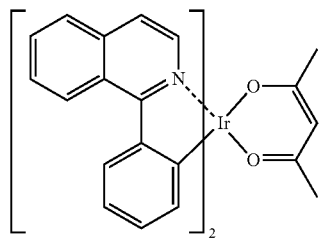
Ir(piq)$_2$(acac)
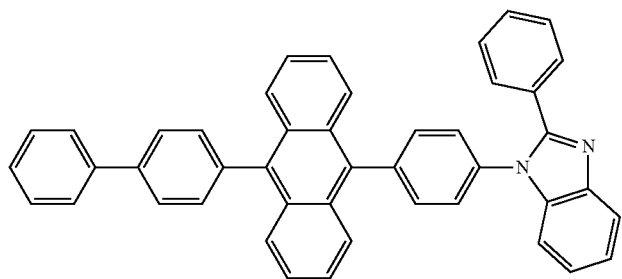 [SMILES: c1ccc(-c2ccc(-c3c4ccccc4c(-c4ccc(-n5c(-c6ccccc6)nc6ccccc65)cc4)c4ccccc34)cc2)cc1]
ET-01
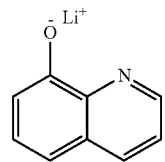
LiQ TABLE 6-continued
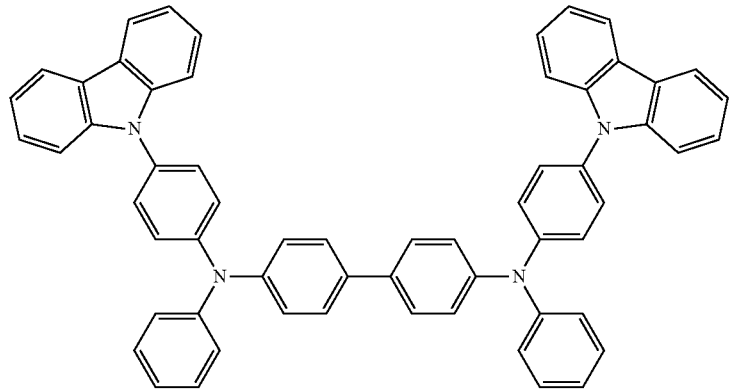 [SMILES: c1ccc(N(c2ccc(-c3ccc(N(c4ccccc4)c4ccc(-n5c6ccccc6c6ccccc65)cc4)cc3)cc2)c2ccc(-n3c4ccccc4c4ccccc43)cc2)cc1]
CP-1
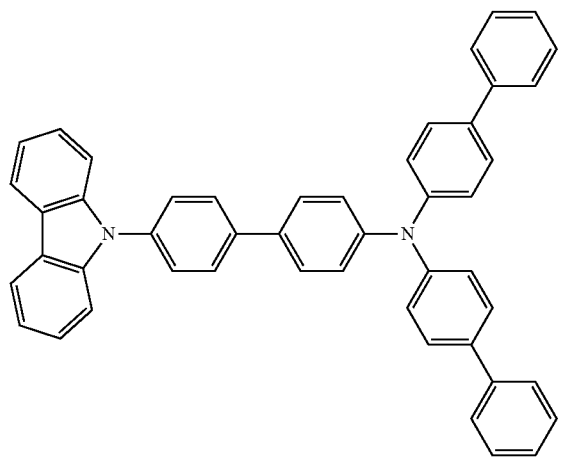 [SMILES: c1ccc(-c2ccc(N(c3ccc(-c4ccccc4)cc3)c3ccc(-c4ccc(-n5c6ccccc6c6ccccc65)cc4)cc3)cc2)cc1]
Compound A
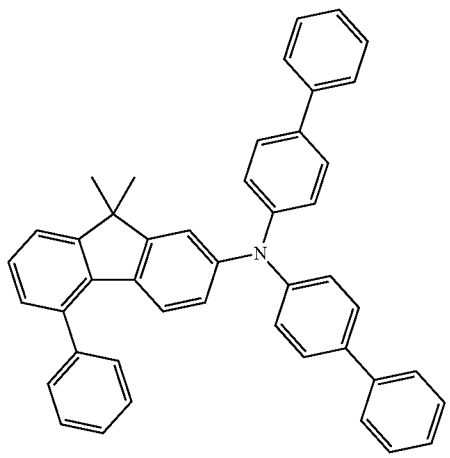 [SMILES: CC1(C)c2cc(N(c3ccc(-c4ccccc4)cc3)c3ccc(-c4ccccc4)cc3)ccc2-c2c(-c3ccccc3)cccc21]
Compound B TABLE 6-continued
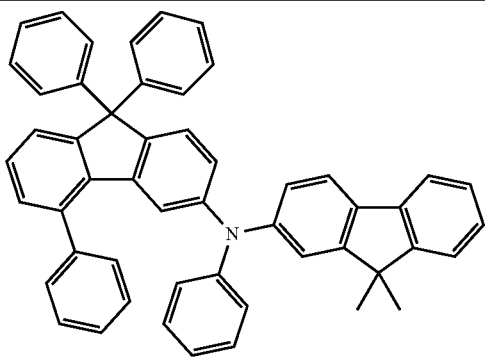
Compound C
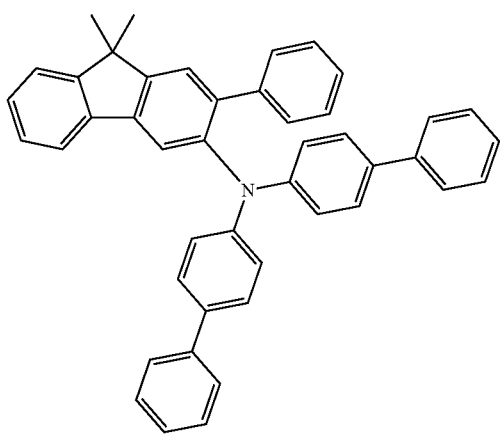 [SMILES: CC1(C)c2ccccc2-c2cc(N(c3ccc(-c4ccccc4)cc3)c3ccc(-c4ccccc4)cc3)c(-c3ccccc3)cc21]
Compound D
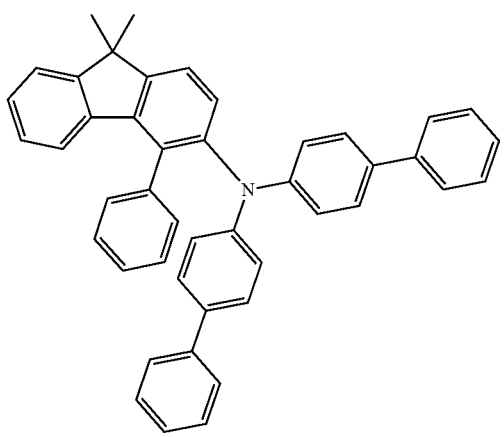 [SMILES: CC1(C)c2ccccc2-c2c1ccc(N(c1ccc(-c3ccccc3)cc1)c1ccc(-c3ccccc3)cc1)c2-c1ccccc1]
Compound E
The organic electroluminescence devices produced above were subjected to performance analysis at 20 mA/cm$^2$, and results were shown in Table 7 below.

TABLE 7

| Example No. | Electron blocking layer | Volt (V) | Cd/A | lm/W | CIE-x | CIE-y | EQE % | T95 (hrs)@ 20 mA/cm$^2$ |
|---|---|---|---|---|---|---|---|---|
| Example 1 | Compound 2 | 3.79 | 37.6 | 31.2 | 0.68 | 0.32 | 25.6 | 428 |
| Example 2 | Compound 11 | 3.81 | 37.5 | 30.9 | 0.68 | 0.32 | 25.5 | 422 |
| Example 3 | Compound 36 | 3.75 | 36.9 | 30.9 | 0.68 | 0.32 | 25.1 | 439 |
| Example 4 | Compound 39 | 3.81 | 35.1 | 28.9 | 0.68 | 0.32 | 23.9 | 405 |
| Example 5 | Compound 49 | 3.78 | 36.4 | 30.3 | 0.68 | 0.32 | 24.8 | 417 |
| Example 6 | Compound 58 | 3.76 | 36.0 | 30.1 | 0.68 | 0.32 | 24.5 | 413 |
| Example 7 | Compound 68 | 3.77 | 36.8 | 30.7 | 0.68 | 0.32 | 25.0 | 390 |
| Example 8 | Compound 77 | 3.77 | 35.2 | 29.3 | 0.68 | 0.32 | 23.9 | 448 |
| Example 9 | Compound 101 | 3.81 | 35.6 | 29.3 | 0.68 | 0.32 | 24.2 | 419 |
| Example 10 | Compound 108 | 3.83 | 36.1 | 29.6 | 0.68 | 0.32 | 24.5 | 439 |
| Example 11 | Compound 123 | 3.77 | 36.2 | 30.2 | 0.68 | 0.32 | 24.6 | 428 |
| Example 12 | Compound 131 | 3.79 | 35.1 | 29.1 | 0.68 | 0.32 | 23.8 | 412 |
| Example 13 | Compound 134 | 3.77 | 37.2 | 31.0 | 0.68 | 0.32 | 25.3 | 450 |
| Example 14 | Compound 146 | 3.81 | 36.4 | 30.0 | 0.68 | 0.32 | 24.8 | 408 |
| Example 15 | Compound 150 | 3.80 | 37.5 | 31.0 | 0.68 | 0.32 | 25.5 | 397 |
| Example 16 | Compound 164 | 3.78 | 36.9 | 30.6 | 0.68 | 0.32 | 25.1 | 400 |
| Example 17 | Compound 175 | 3.78 | 35.6 | 29.6 | 0.68 | 0.32 | 24.2 | 410 |
| Example 18 | Compound 181 | 3.76 | 37.2 | 31.1 | 0.68 | 0.32 | 25.3 | 406 |
| Example 19 | Compound 195 | 3.76 | 37.5 | 31.3 | 0.68 | 0.32 | 25.5 | 402 |
| Example 20 | Compound 204 | 3.80 | 37.1 | 30.7 | 0.68 | 0.32 | 25.2 | 421 |
| Example 21 | Compound 216 | 3.75 | 35.9 | 30.0 | 0.68 | 0.32 | 24.4 | 426 |
| Example 22 | Compound 224 | 3.79 | 36.8 | 30.5 | 0.68 | 0.32 | 25.0 | 440 |
| Example 23 | Compound 234 | 3.78 | 35.7 | 29.7 | 0.68 | 0.32 | 24.3 | 427 |
| Example 24 | Compound 249 | 3.76 | 36.5 | 30.5 | 0.68 | 0.32 | 24.8 | 395 |
| Example 25 | Compound 268 | 3.79 | 35.2 | 29.2 | 0.68 | 0.32 | 23.9 | 445 |
| Example 26 | Compound 273 | 3.80 | 37.5 | 31.0 | 0.68 | 0.32 | 25.5 | 418 |
| Example 27 | Compound 281 | 3.78 | 36.0 | 29.9 | 0.68 | 0.32 | 24.5 | 396 |
| Example 28 | Compound 289 | 3.78 | 36.7 | 30.5 | 0.68 | 0.32 | 24.9 | 426 |
| Example 29 | Compound 295 | 3.79 | 35.4 | 29.3 | 0.68 | 0.32 | 24.1 | 397 |
| Example 30 | Compound 362 | 3.75 | 36.7 | 30.8 | 0.68 | 0.32 | 25.0 | 427 |
| Example 31 | Compound 307 | 3.82 | 36.2 | 29.8 | 0.68 | 0.32 | 24.6 | 407 |
| Example 32 | Compound 343 | 3.83 | 35.8 | 29.3 | 0.68 | 0.32 | 24.3 | 447 |
| Example 33 | Compound 353 | 3.77 | 37.4 | 31.2 | 0.68 | 0.32 | 25.4 | 428 |
| Example 34 | Compound 356 | 3.78 | 35.8 | 29.8 | 0.68 | 0.32 | 24.4 | 417 |
| Example 35 | Compound 378 | 3.93 | 35.1 | 28.1 | 0.68 | 0.32 | 23.9 | 355 |
| Comparative Example 1 | Compound A | 4.35 | 25.3 | 18.3 | 0.68 | 0.32 | 17.2 | 208 |
| Comparative Example 2 | Compound B | 3.83 | 27.2 | 19.0 | 0.68 | 0.32 | 18.2 | 320 |
| Comparative Example 3 | Compound C | 4.17 | 30.2 | 21.1 | 0.68 | 0.32 | 20.2 | 317 |
| Comparative Example 4 | Compound D | 3.65 | 29.6 | 20.5 | 0.68 | 0.32 | 19.8 | 312 |
| Comparative Example 5 | Compound E | 3.67 | 29.8 | 20.8 | 0.68 | 0.32 | 19.5 | 300 |

It can be seen from the table that, when the nitrogen-containing compound of the present application is used as an electron blocking layer material for a red light-emitting device in Examples 1 to 35, the luminous efficiency is increased by at least 16.2%, the power efficiency is increased by at least 33.2%, the external quantum efficiency is increased by at least 17.8%, and the life span is increased by at least 10.9% compared with Comparative Examples 1 to 5.

It can be seen from Table 7 that, when the nitrogen-containing compound of the present application is used as an electron blocking layer material for a red light-emitting device, the driving voltage of the device is greatly reduced and the efficiency and life span of the device are greatly improved compared with Comparative Example 1. Compared with Comparative Example 2, the current efficiency and life span of the device are improved as a whole under a comparable voltage, which may be attributed to the following reason: amino is linked to fluorenyl at position 3 in the present application, such that the material has a deeper HOMO energy level than compound B, which enhances the hole injection characteristic. Compared with Comparative Example 3, the voltage is greatly reduced, and the efficiency and life span of the device are significantly improved, which is attributed to the following reason: compared with compound C, the dimethylfluorenyl in the present application has a stronger hole mobility than diphenylfluorenyl with high steric hindrance. Compared with Comparative Examples 4 and 5, the voltage, efficiency, and life span characteristics of the device are improved, which may be attributed to the following reason: compared with compounds D and E, the substitution of phenyl at position 5 of dimethylfluorenyl allows the material to have a deep HOMO energy level, thereby reducing the voltage and improving the efficiency; and the nitrogen-containing compound of the present application has a prominent space configuration, which can effectively avoid molecular stacking, make molecules uneasy to crystallize, and extend the life span of the device.

Therefore, when used to produce a red organic electroluminescence device, the nitrogen-containing compound of the present application can effectively reduce the voltage of the organic electroluminescence device, improve the efficiency of the organic electroluminescence device, and maintain a long life span of the organic electroluminescence device.

Those of ordinary skill in the art can understand that the above implementations are specific embodiments for implementing the present application. In practical applications, various changes may be made to the above embodiments in terms of form and details without departing from the spirit and scope of the present application.

INDUSTRIAL APPLICABILITY

The nitrogen-containing compound of the present application includes 5-phenyl-9,9-dimethylfluorenyl-3 as a parent nucleus structure and arylamino linked to the position 3. The linkage of the arylamino to the position 3 of dimethylfluorenyl can produce a strong conjugation effect to increase a density of local electron cloud, such that a material can have both a deep HOMO energy level and a high hole mobility. There is a large twist angle between the 5-substituted phenyl and the dimethylfluorenyl, such that an interaction between molecules can be effectively reduced while basically maintaining the morphology of molecules themselves, thereby enhancing an amorphous form of the material and improving the film-forming characteristics of the material. When used in an electron blocking layer of an organic electroluminescence device, the material can effectively reduce a working voltage of the device, enhance the efficiency of the device, and improve a life span of the device.

What is claimed is:

1. A nitrogen-containing compound having a structure shown in Chemical formula 1:

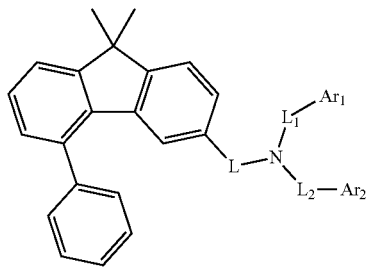

Chemical formula 1 wherein L, $L_1$, and $L_2$ are each independently selected from a single bond, a substituted or unsubstituted arylene with 6 to 30 carbon atoms, or a substituted or unsubstituted heteroarylene with 3 to 30 carbon atoms;

$Ar_1$ and $Ar_2$ are each independently selected from a substituted or unsubstituted aryl with 6 to 30 carbon atoms, or a substituted or unsubstituted heteroaryl with 3 to 30 carbon atoms;

substituents of L, $L_1$, $L_2$, $Ar_1$, and $Ar_2$ are the same or different, and are each independently selected from deuterium, a halogen, a cyano, a heteroaryl with 3 to 20 carbon atoms, an aryl with 6 to 20 carbon atoms, a trialkylsilyl with 3 to 12 carbon atoms, a triarylsilyl with 18 to 24 carbon atoms, an alkyl with 1 to 10 carbon atoms, a deuterated alkyl with 1 to 10 carbon atoms, a cycloalkyl with 3 to 10 carbon atoms, a heterocycloalkyl with 2 to 10 carbon atoms, an alkoxy with 1 to 10 carbon atoms, an alkylthio group with 1 to 10 carbon atoms, an aryloxy with 6 to 18 carbon atoms, an arylthio group with 6 to 18 carbon atoms, or a phosphonooxy with 6 to 18 carbon atoms; and optionally, in L, $L_1$, $L_2$, $Ar_1$, and $Ar_2$, any two adjacent substituents form a ring.

2. The nitrogen-containing compound according to claim 1, wherein L, $L_1$, and $L_2$ are each independently selected from a single bond, a substituted or unsubstituted arylene with 6 to 20 carbon atoms, or a substituted or unsubstituted heteroarylene with 5 to 20 carbon atoms; and substituents of L, $L_1$, and $L_2$ are the same or different, and are each independently selected from deuterium, a halogen, a cyano, an alkyl with 1 to 5 carbon atoms, or an aryl with 6 to 12 carbon atoms.

3. The nitrogen-containing compound according to claim 1, wherein L is selected from a single bond, or a substituted or unsubstituted arylene with 6 to 12 carbon atoms.

4. The nitrogen-containing compound according to claim 1, wherein L is selected from a single bond, a substituted or unsubstituted phenylene, a substituted or unsubstituted naphthylene, or a substituted or unsubstituted biphenylene.

5. The nitrogen-containing compound according to claim 1, wherein $L_1$ and $L_2$ are each independently selected from a single bond, a substituted or unsubstituted phenylene, a substituted or unsubstituted naphthylene, a substituted or unsubstituted anthracenylene, a substituted or unsubstituted phenanthrenylene, a substituted or unsubstituted biphenylene, a substituted or unsubstituted fluorenylene, a substituted or unsubstituted dibenzofuranylene, a substituted or unsubstituted dibenzothiophenylene, or a substituted or unsubstituted carbazolylene.

6. The nitrogen-containing compound according to claim 1, wherein $L_1$ and $L_2$ are each independently selected from a single bond or a substituted or unsubstituted group V; the unsubstituted group V is selected from the group consisting of the following groups:

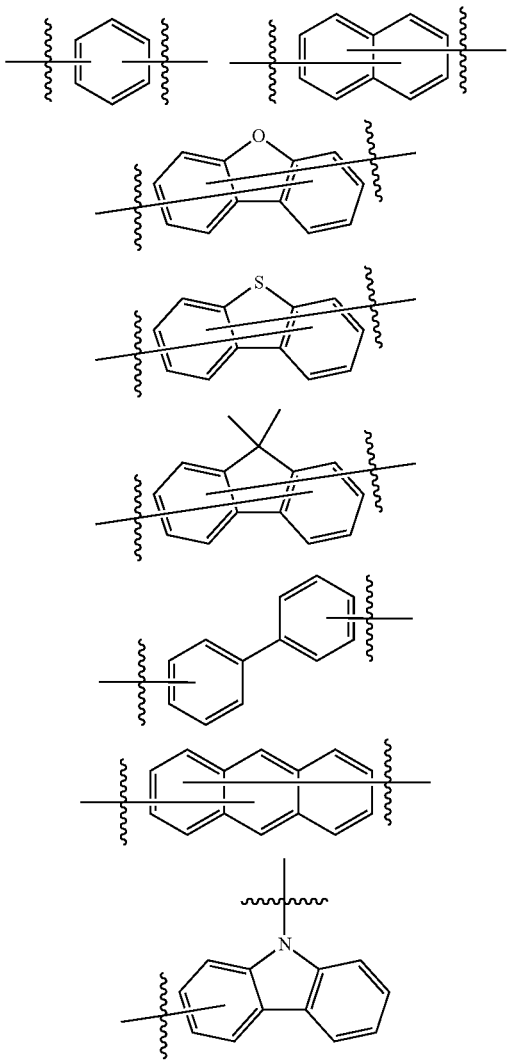

165
-continued

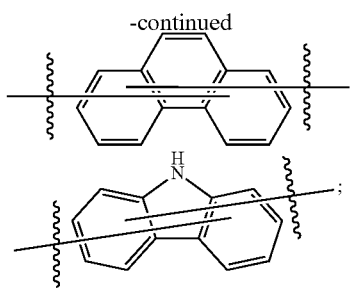

and the substituted group V has one or more substituents, the substituents are each independently selected from deuterium, a fluorine, a cyano, a methyl, an ethyl, an n-propyl, an isopropyl, a tert-butyl, a phenyl, a naphthyl, or a biphenyl, and when the number of the substituents in the group V is greater than 1, the substituents are the same or different.

7. The nitrogen-containing compound according to claim 1, wherein Ar$_1$ and Ar$_2$ are the same or different, and are each independently selected from a substituted or unsubstituted aryl with 6 to 25 carbon atoms, or a substituted or unsubstituted heteroaryl with 5 to 20 carbon atoms.

8. The nitrogen-containing compound according to claim 1, wherein Ar$_1$ and Ar$_2$ are the same or different, and are each independently selected from a substituted or unsubstituted phenyl, a substituted or unsubstituted naphthyl, a substituted or unsubstituted biphenyl, a substituted or unsubstituted phenanthrenyl, a substituted or unsubstituted terphenyl, a substituted or unsubstituted fluorenyl, a substituted or unsubstituted carbazolyl, a substituted or unsubstituted triphenylene group, a substituted or unsubstituted dibenzofuranyl, or a substituted or unsubstituted dibenzothiophenyl.

9. The nitrogen-containing compound according to claim 1, wherein Ar$_1$ and Ar$_2$ are a substituted or unsubstituted group W; the unsubstituted group W is selected from the group consisting of the following groups:

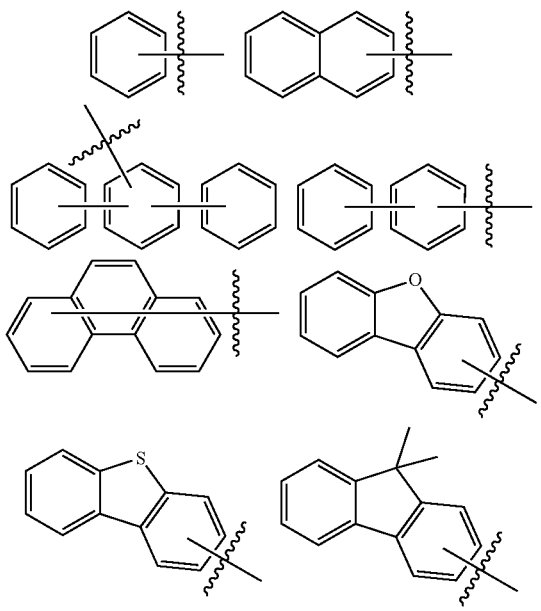

166
-continued

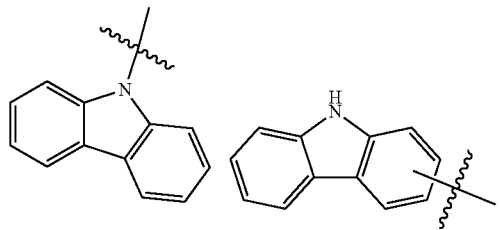

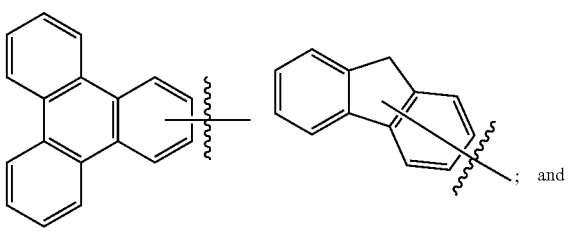

the substituted group W has one or more substituents, the substituents are each independently selected from deuterium, a fluorine, a cyano, a methyl, an ethyl, an n-propyl, an isopropyl, a tert-butyl, a phenyl, a naphthyl, a biphenyl, a cyclopentyl, a cyclohexyl, a trideuteromethyl, or a triphenylsilyl, and when the number of the substituents in the group W is greater than 1, the substituents are the same or different.

10. The nitrogen-containing compound according to claim 1, wherein the nitrogen-containing compound is selected from the group consisting of the following compounds:

1

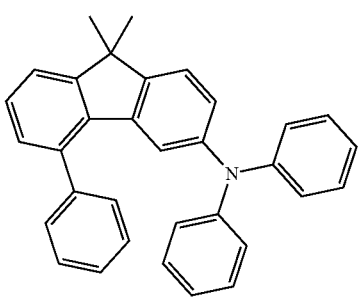

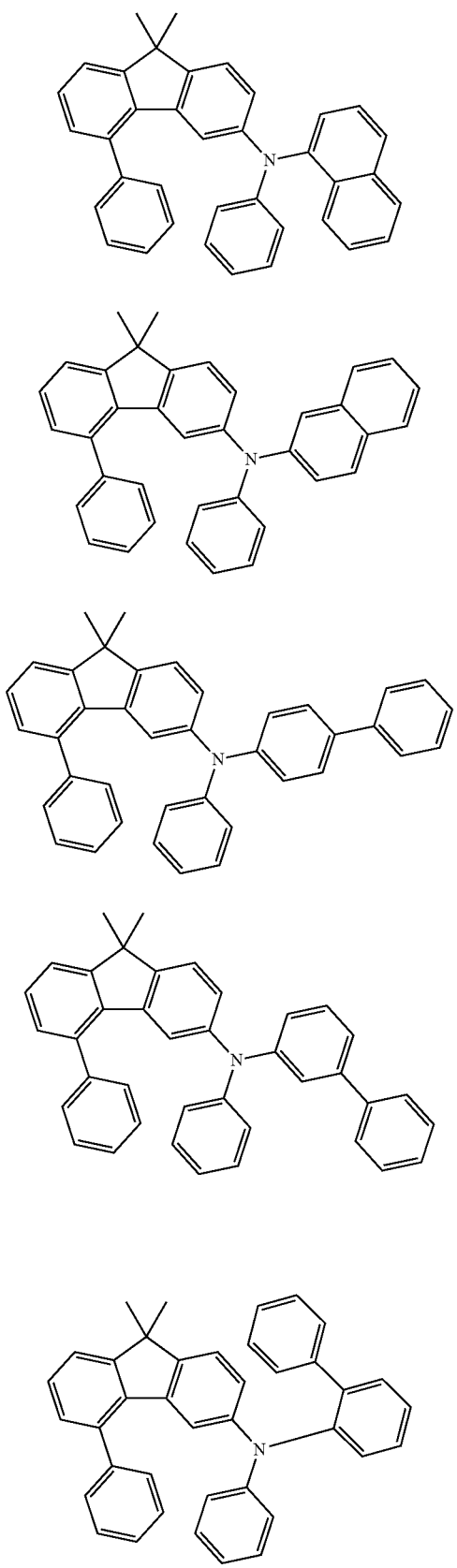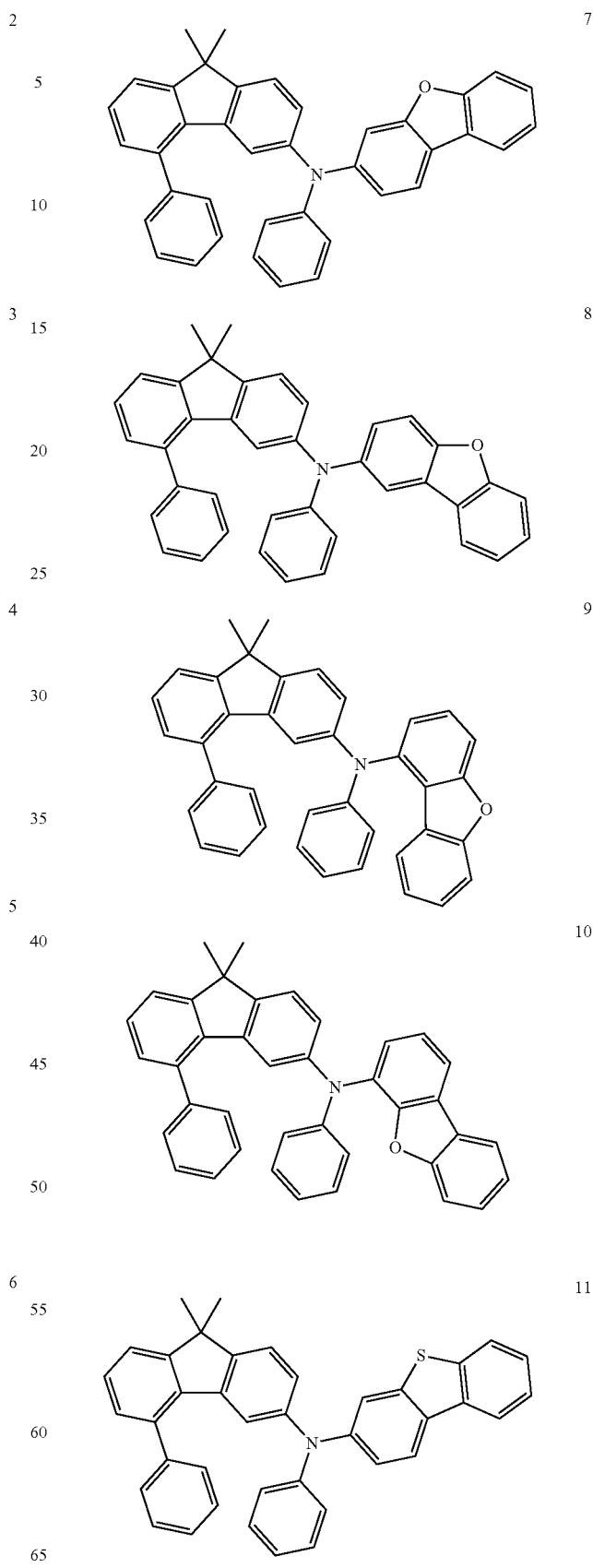

169
-continued
12
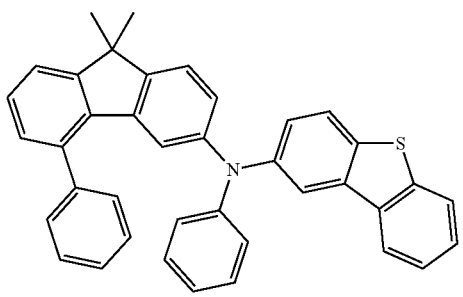
13
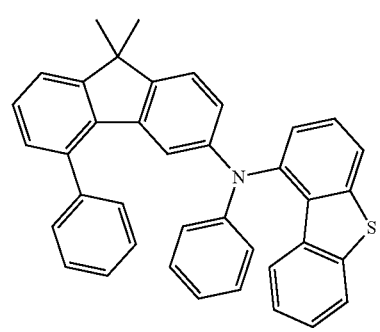
14
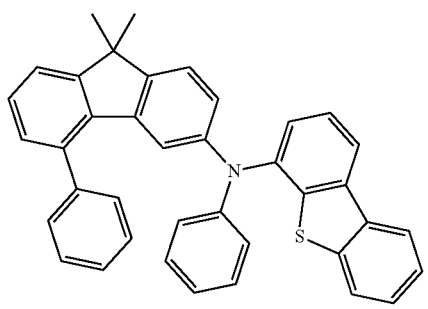
15
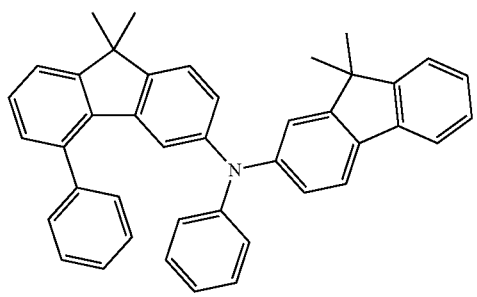
16
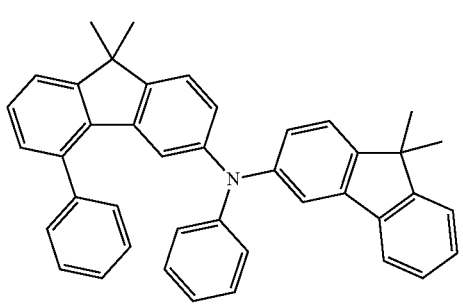
170
-continued
17
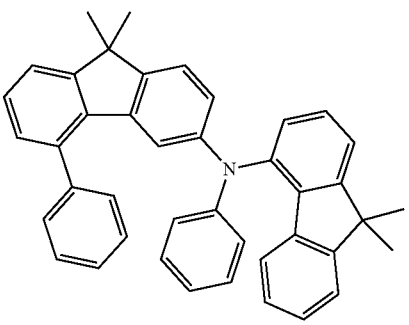
18
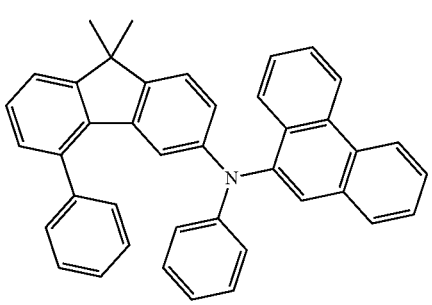
19
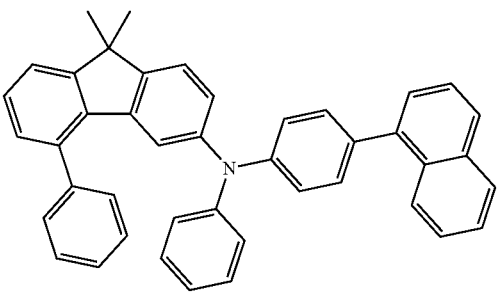
20
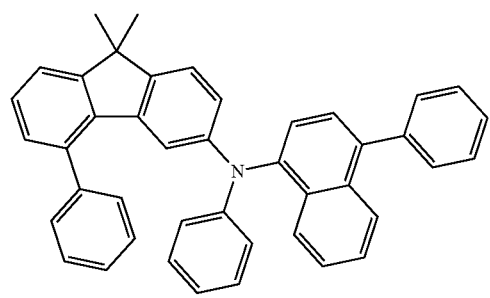
21
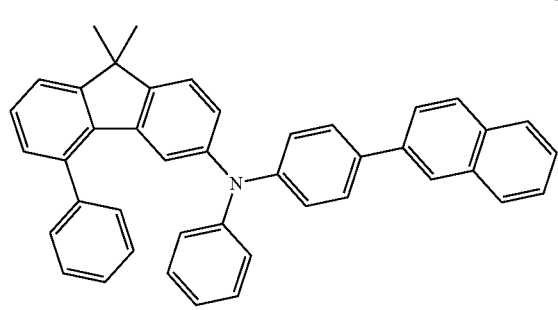

22
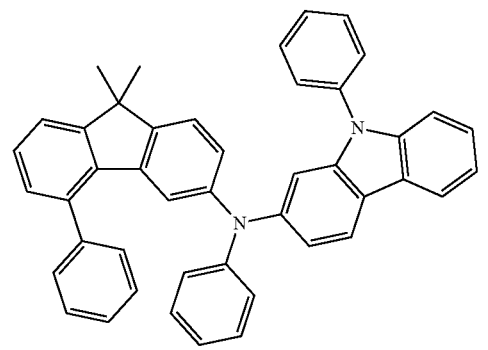
23
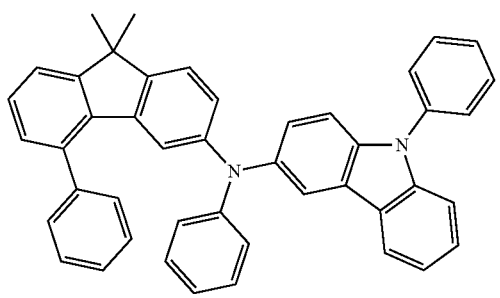
24
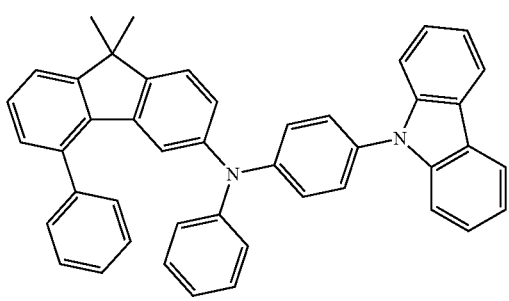
25
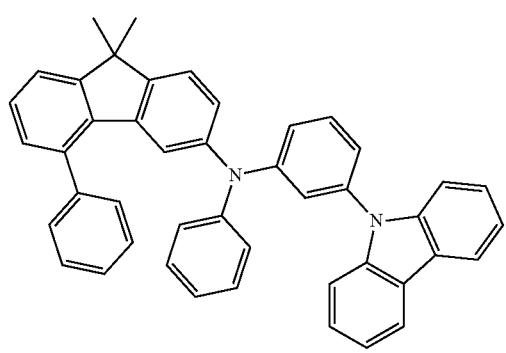
26
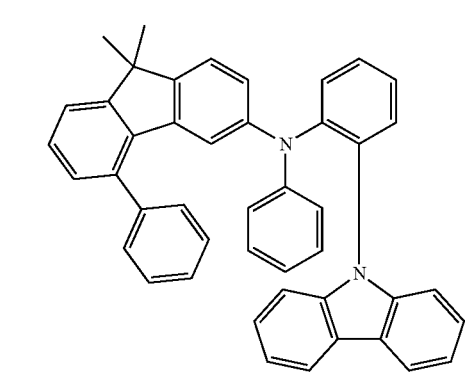
27
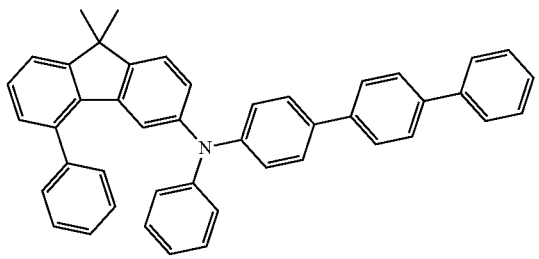
28
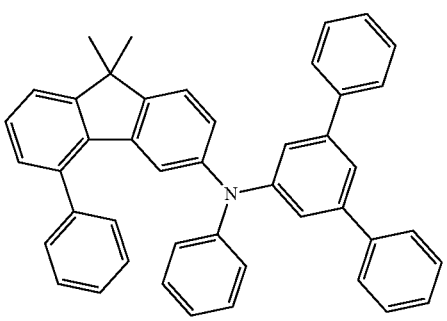
29
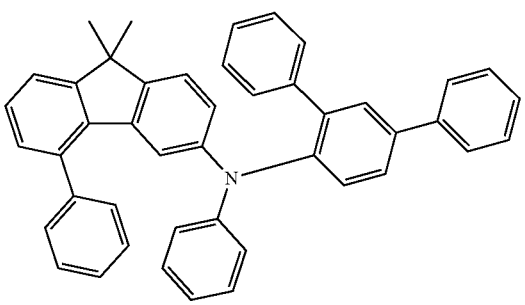
30
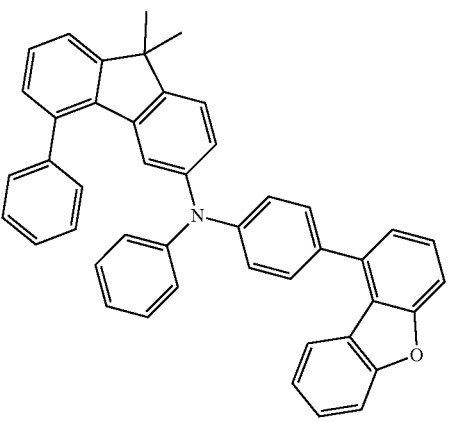
31
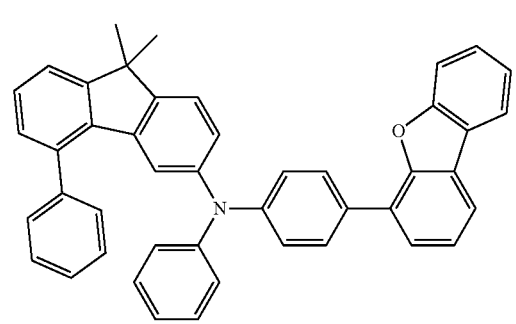

32
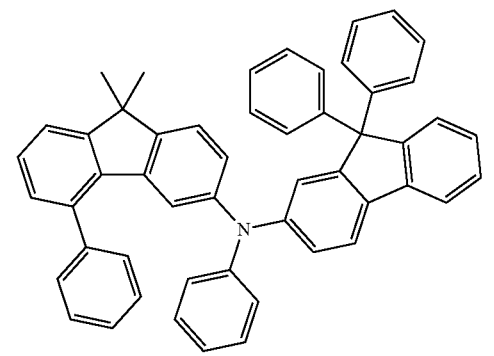
33
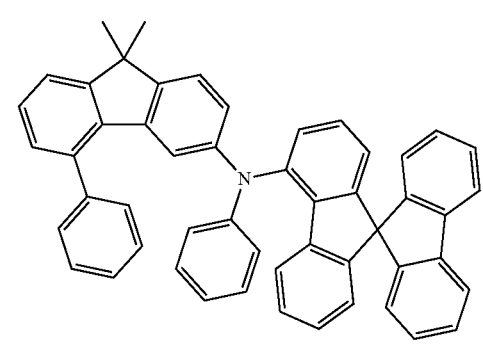
34
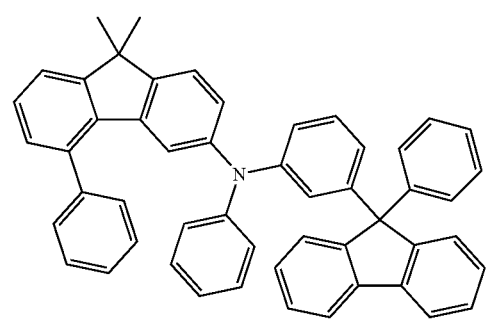
35
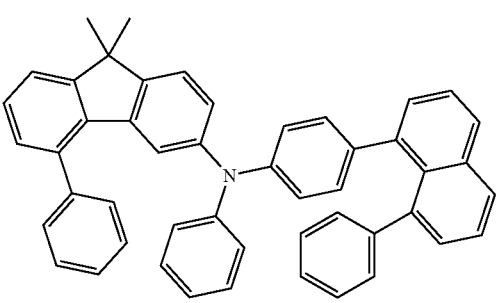
36
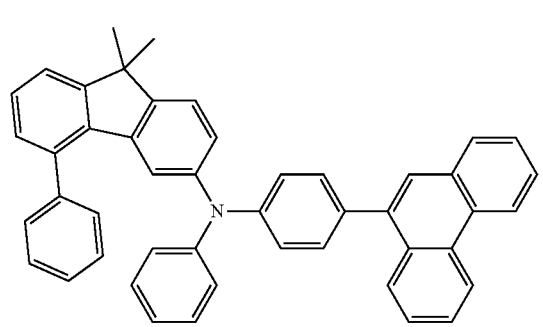
37
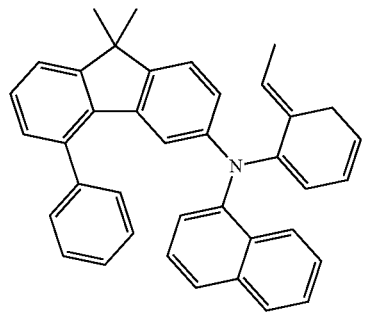
38
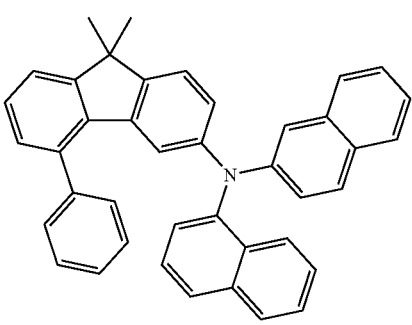
39
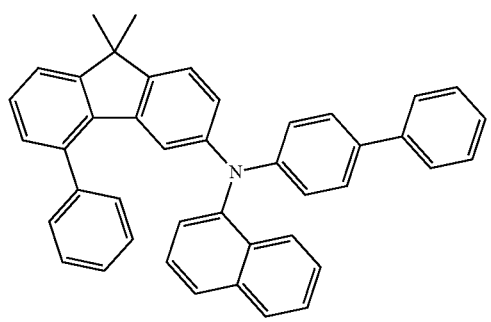
40
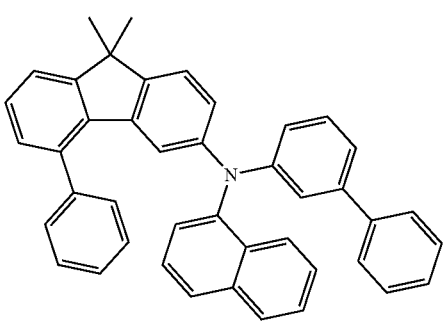
41
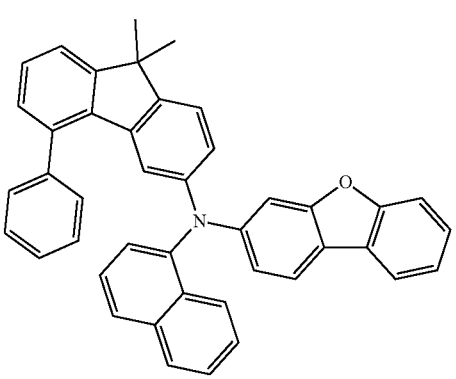

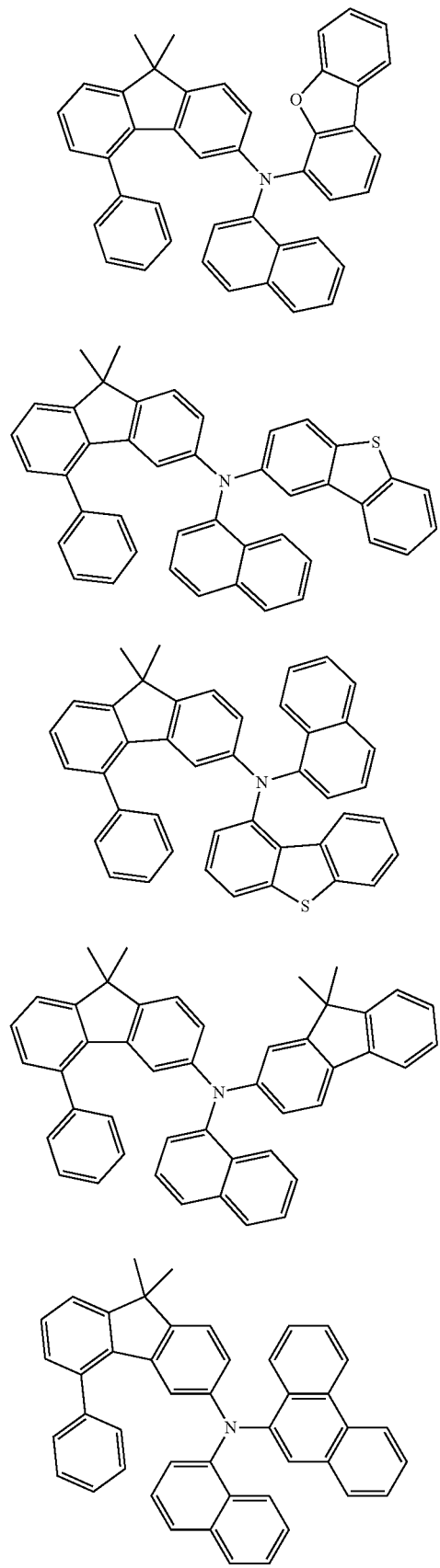
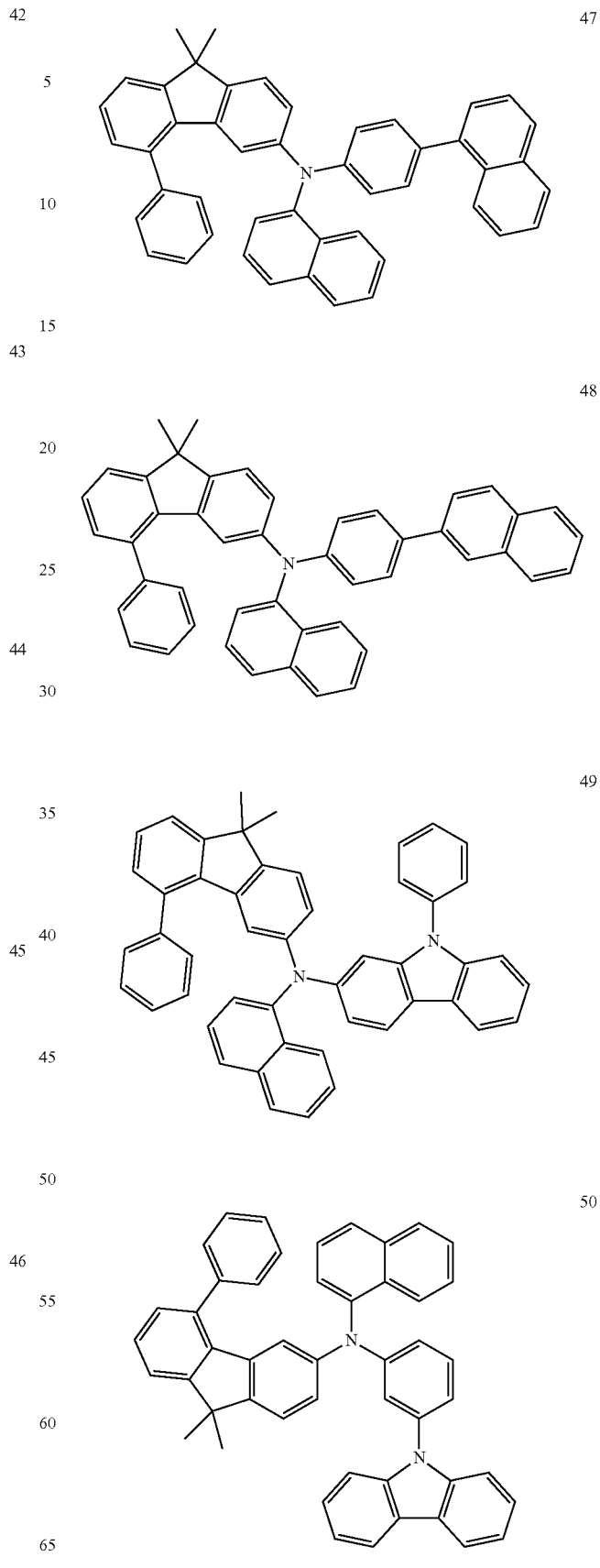

51
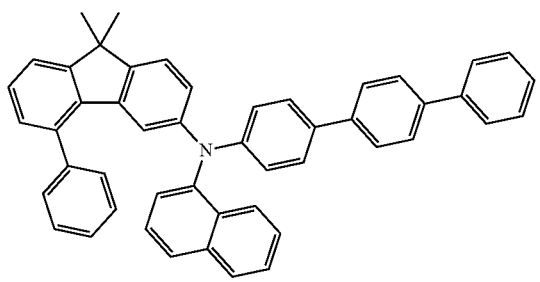
52
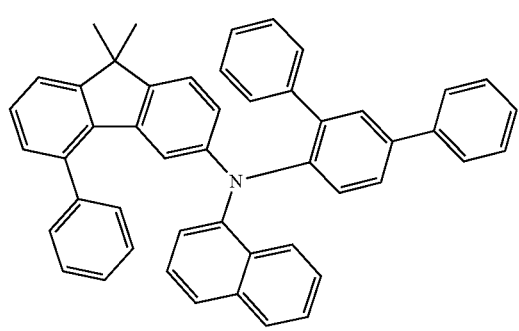
53
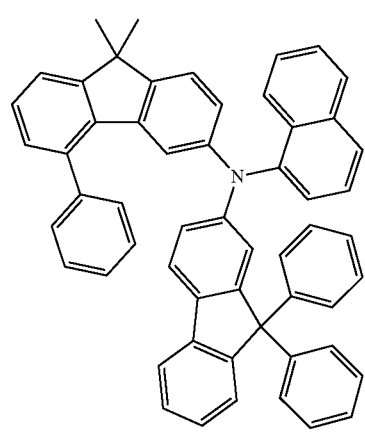
54
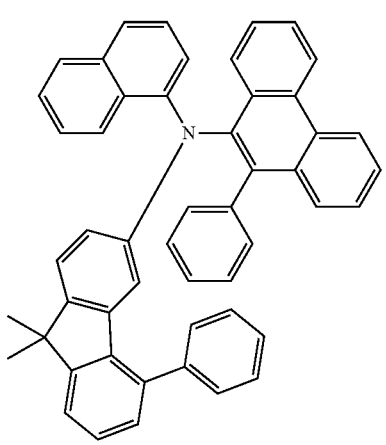
55
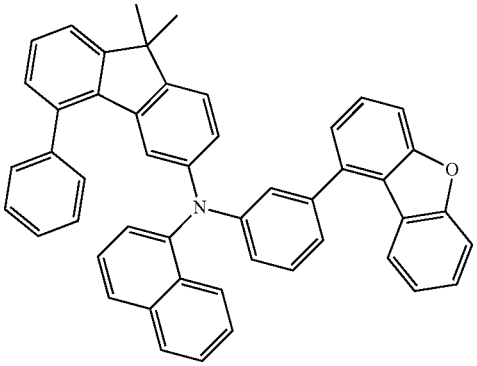
56
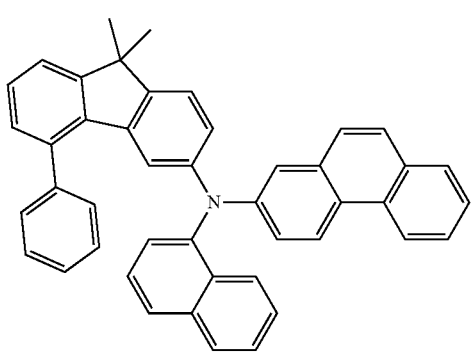
57
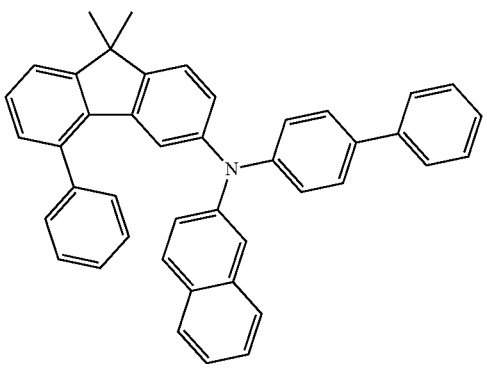
58
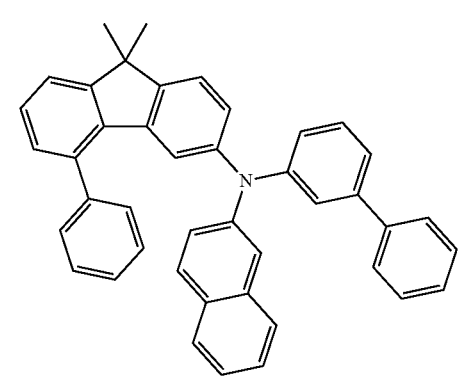

59
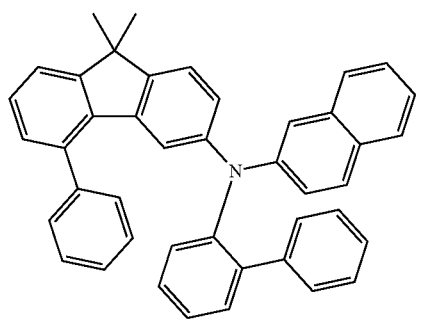
63
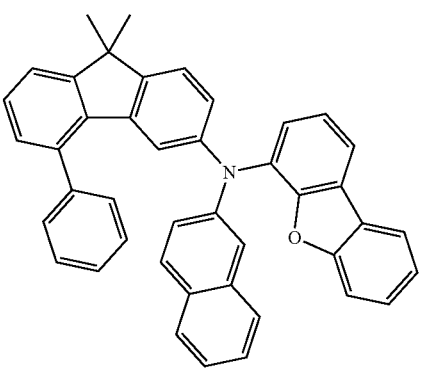
60
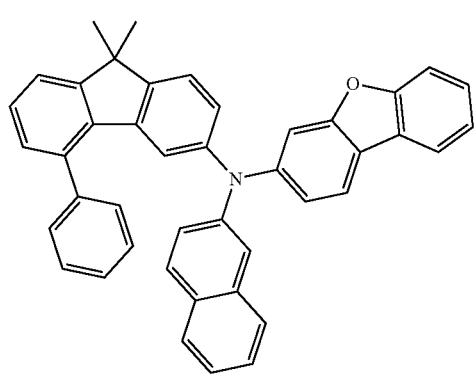
64
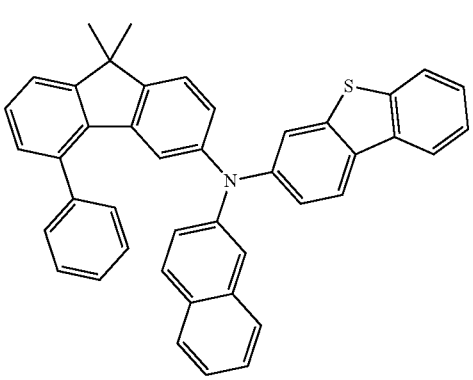
61
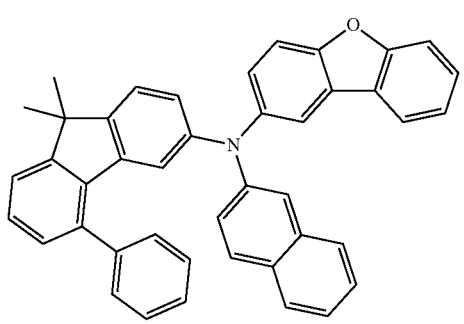
65
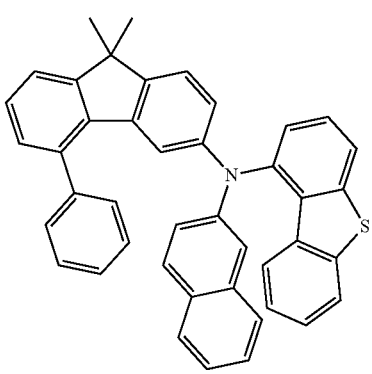
62
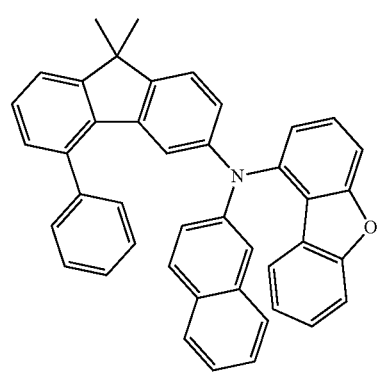
66
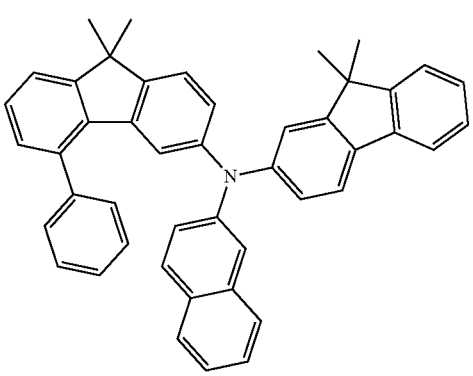

67
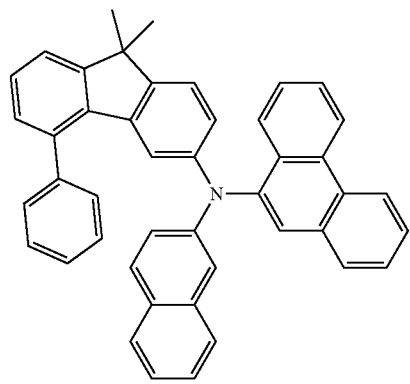
68
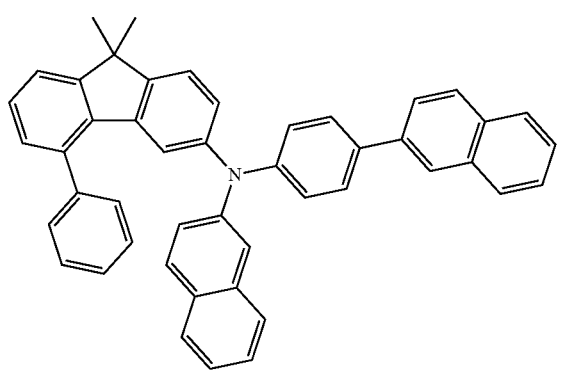
69
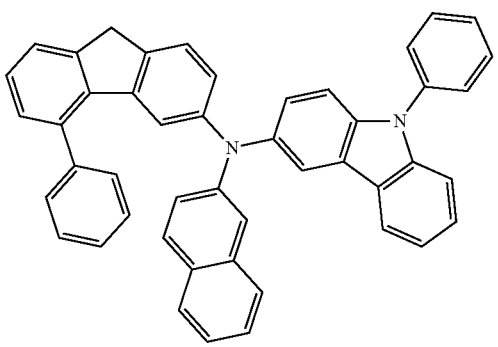
70
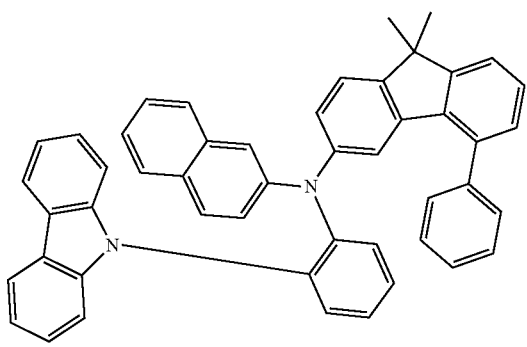
71
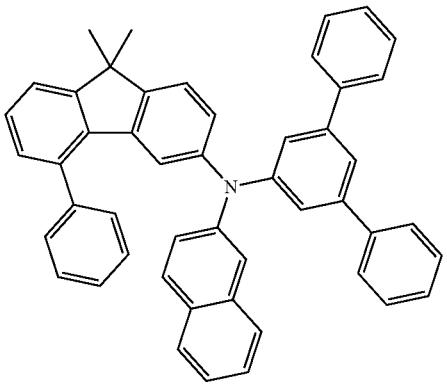
72
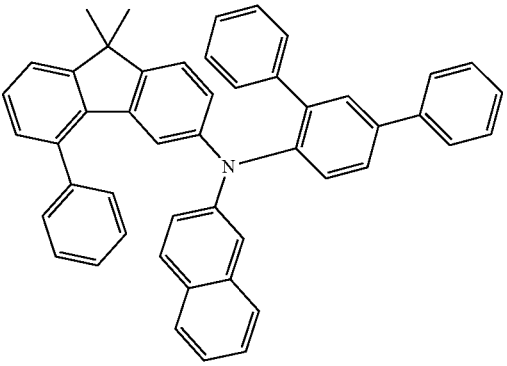
73
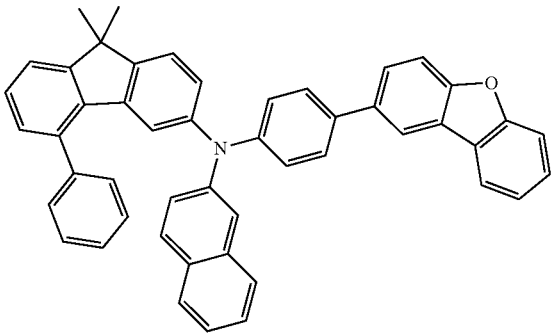
74
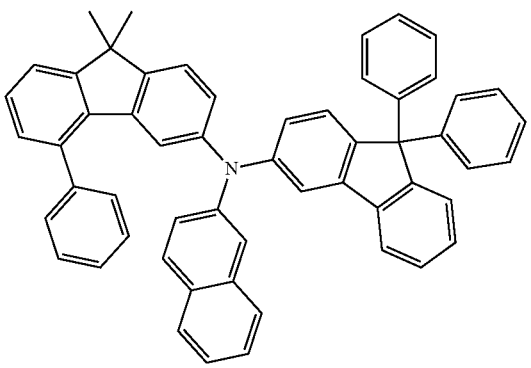

183
-continued
75
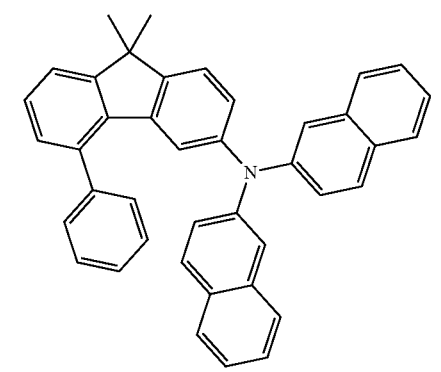
76
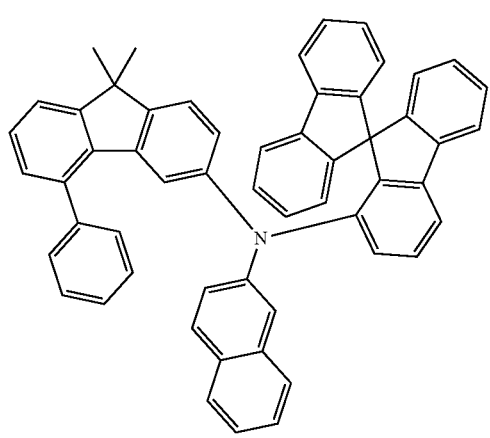
77
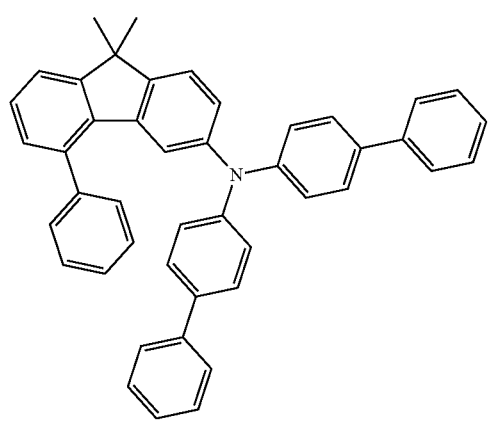
78
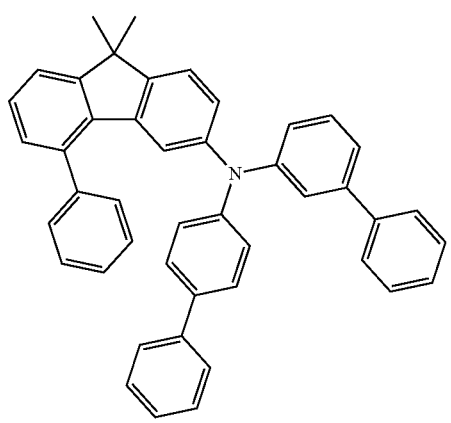
184
-continued
79
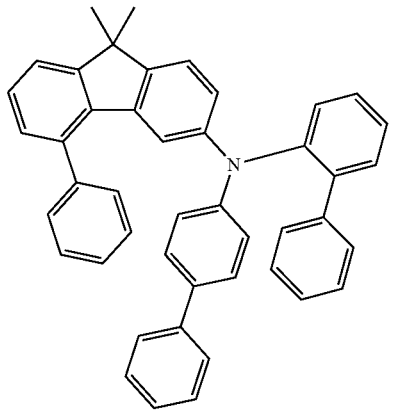
80
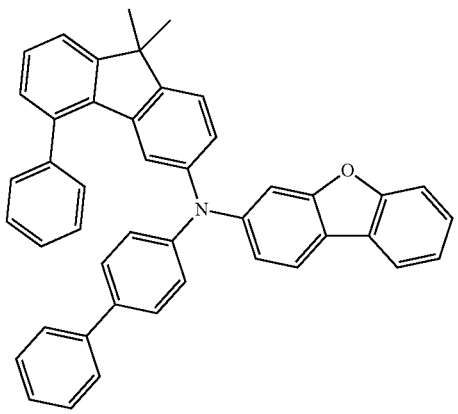
81
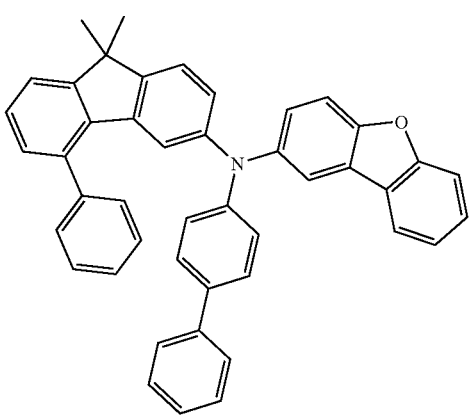
82
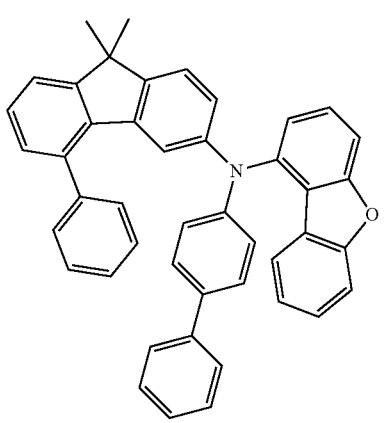

83
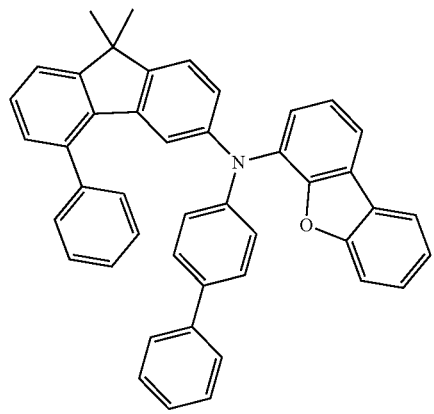
84
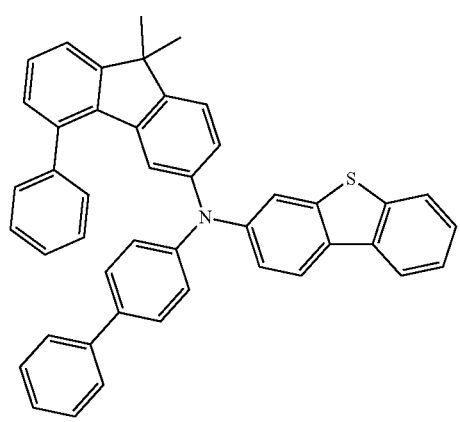
85
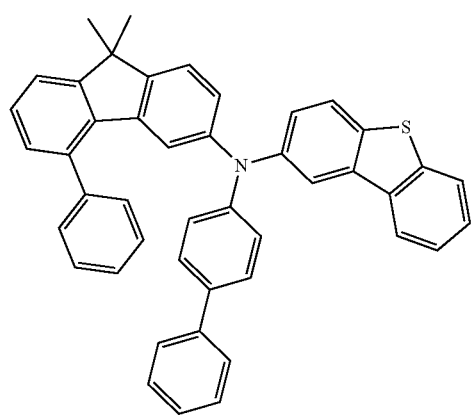
86
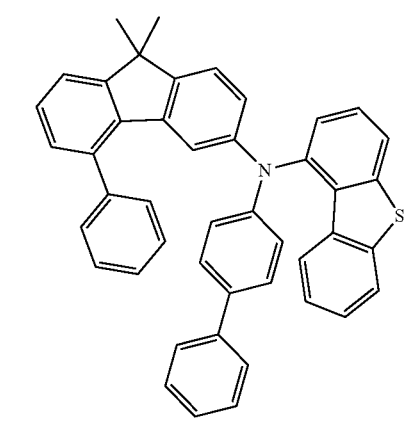
87
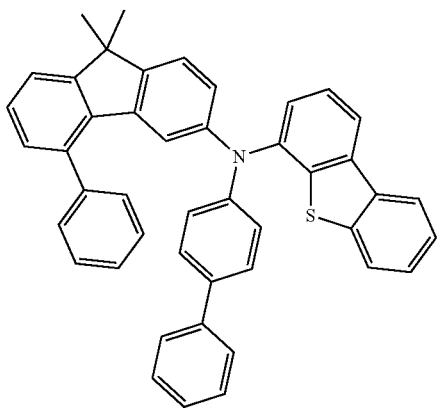
88
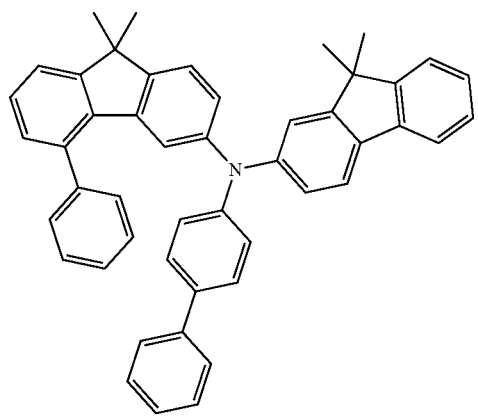
89
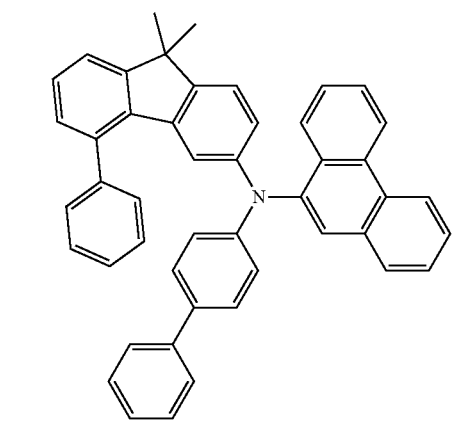
90
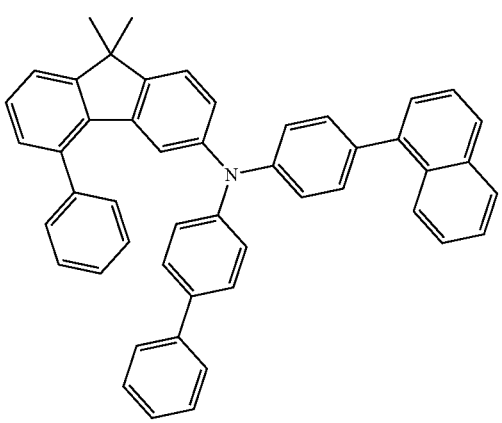

91
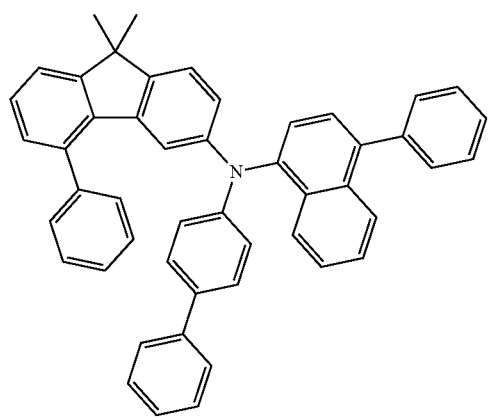
92
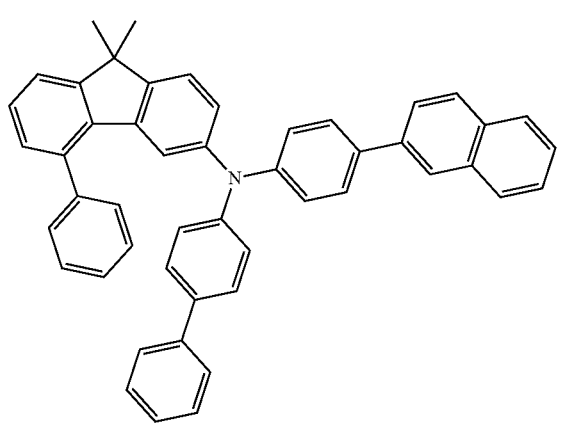
93
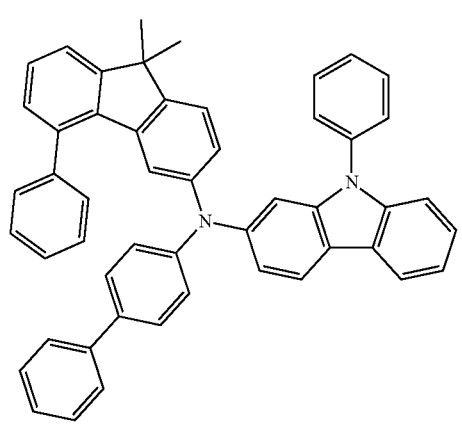
94
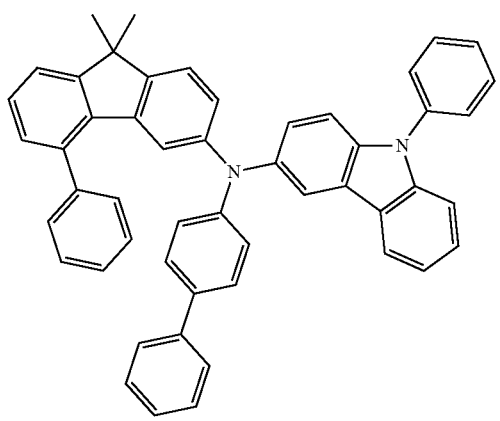
95
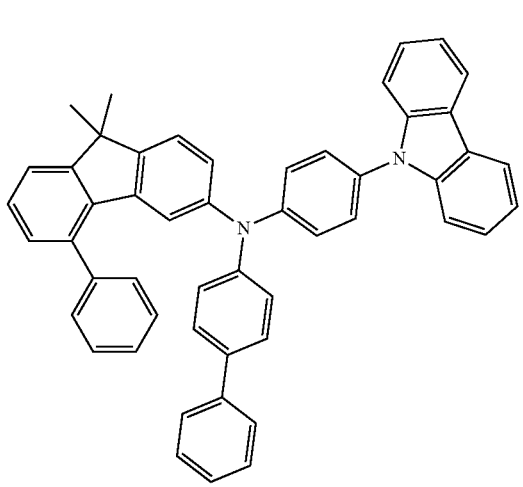
96
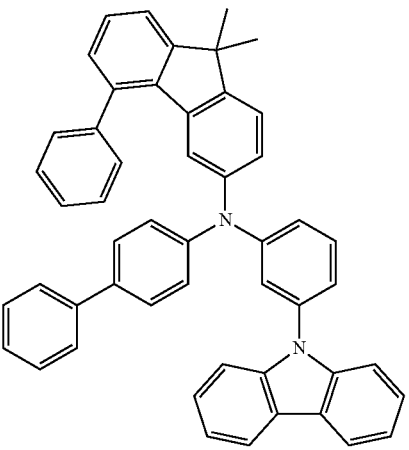

97
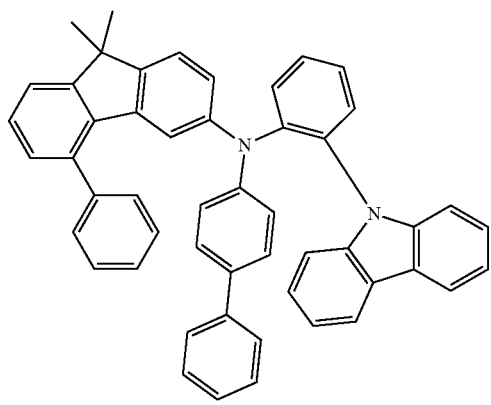
98
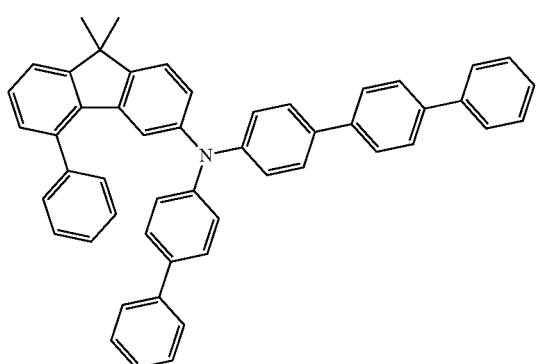
99
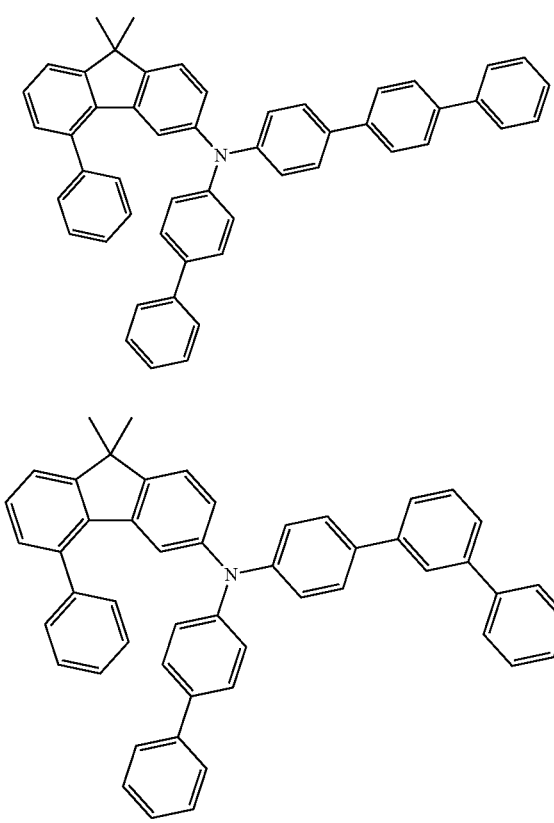
100
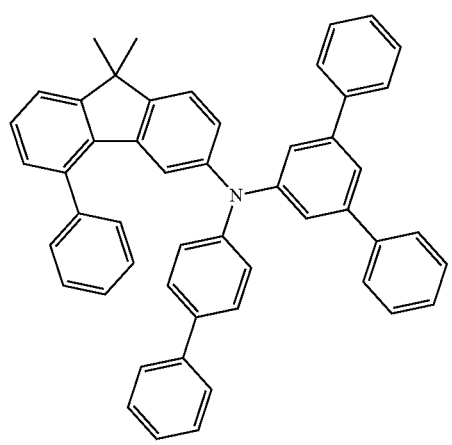
101
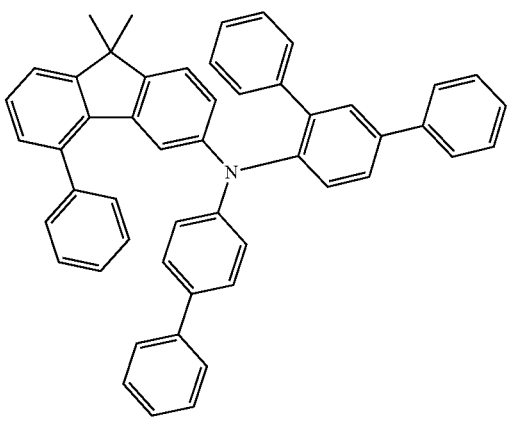
102
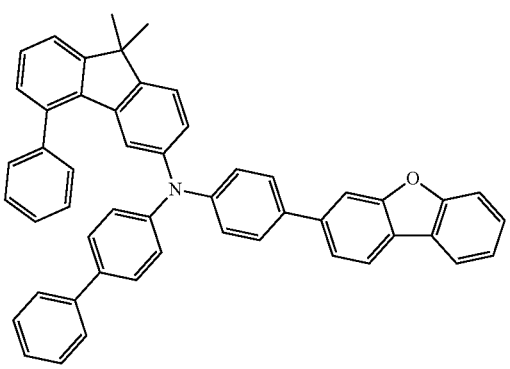
103
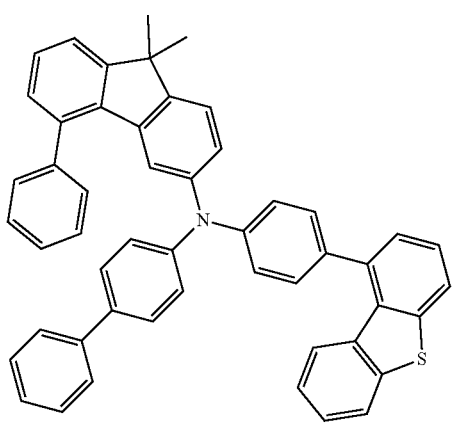

191
-continued
104
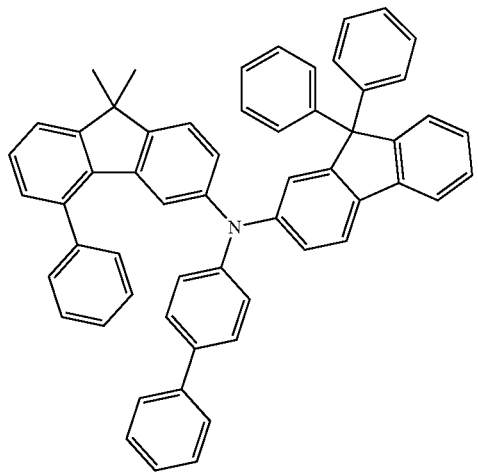
105
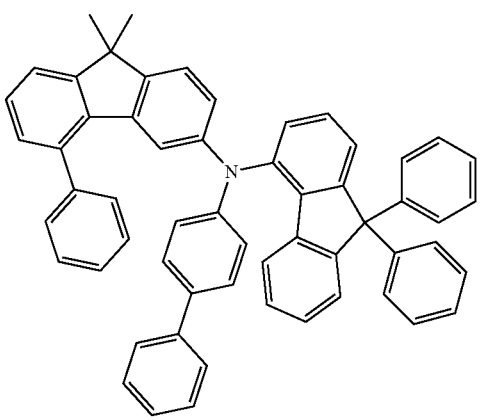
106
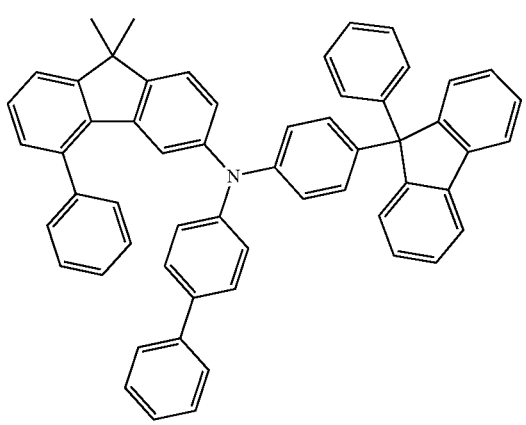
192
-continued
107
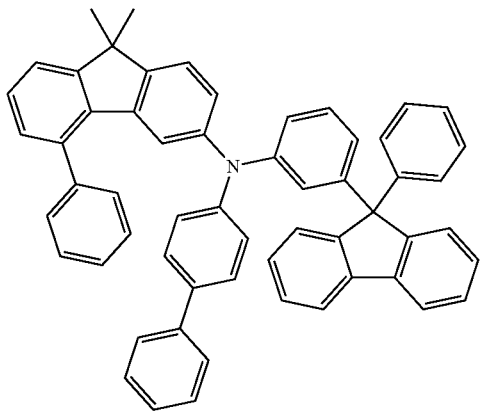
108
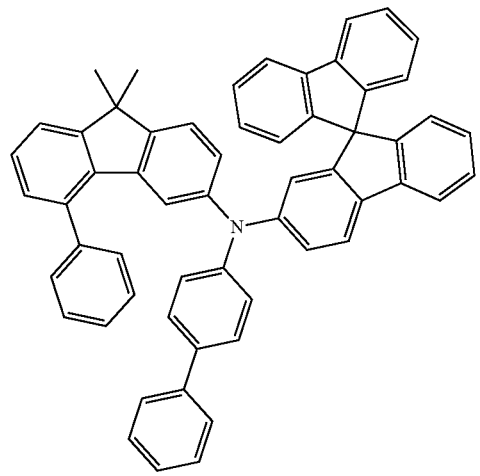
109
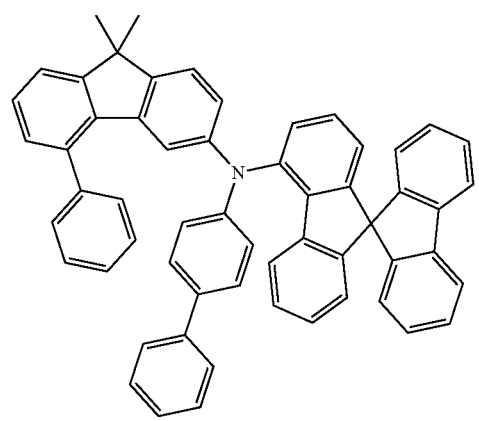

193
-continued
110
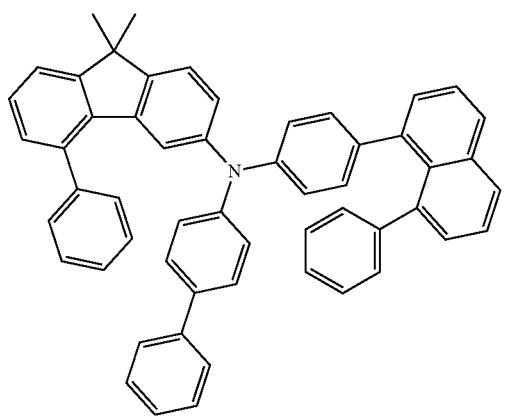
111
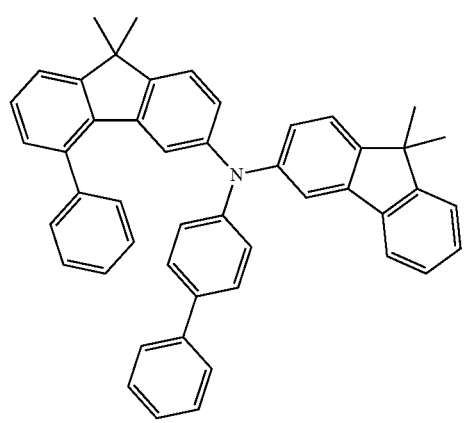
112
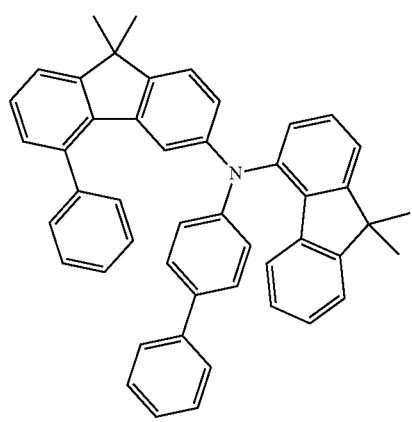
113
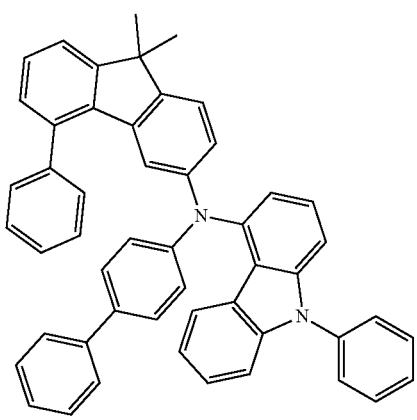
194
-continued
114
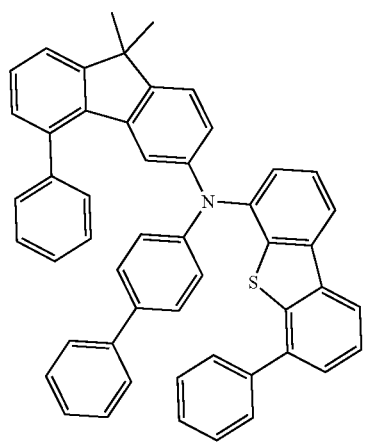
115
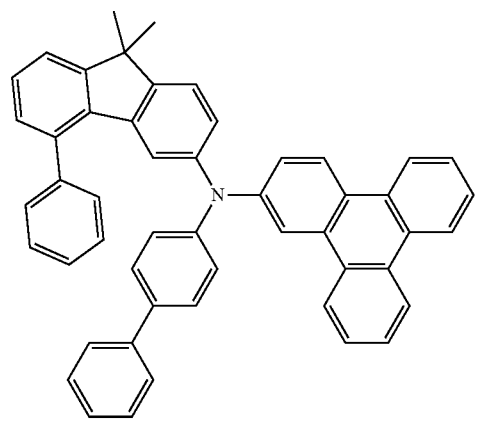
116
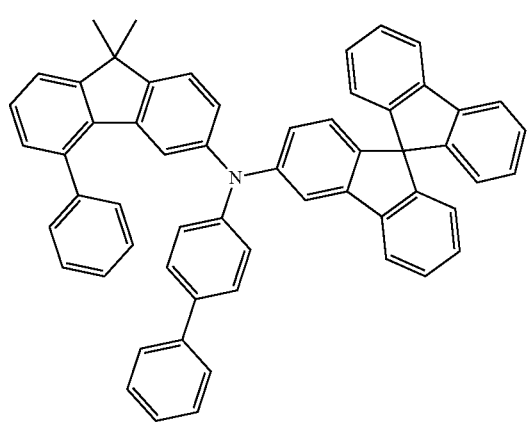

117
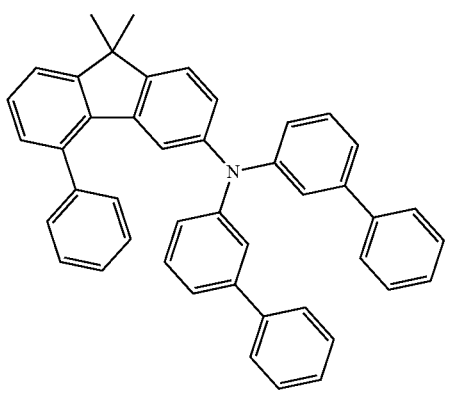
118
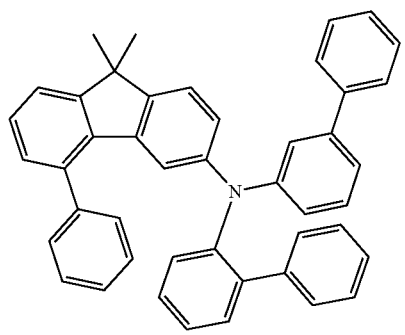
119
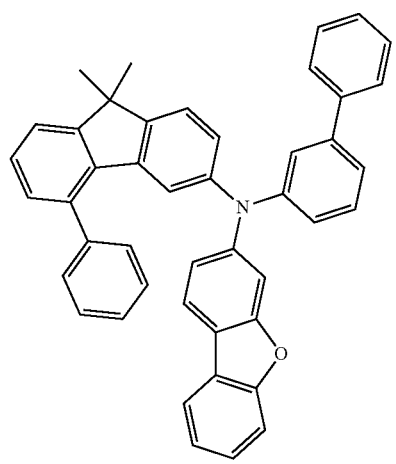
120
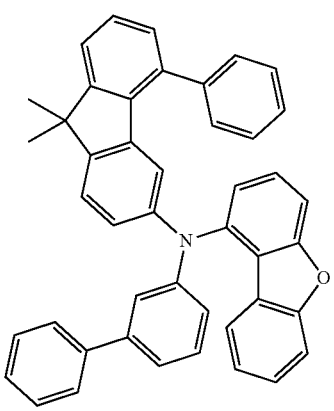
121
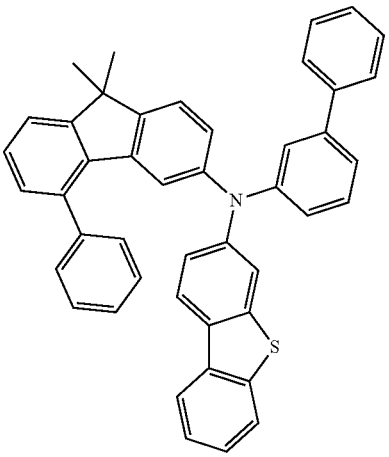
122
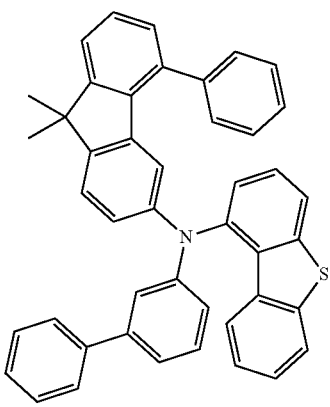
123
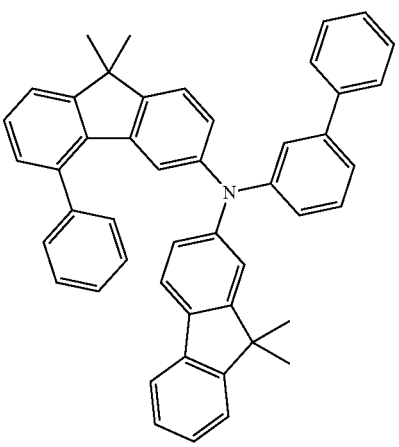

124
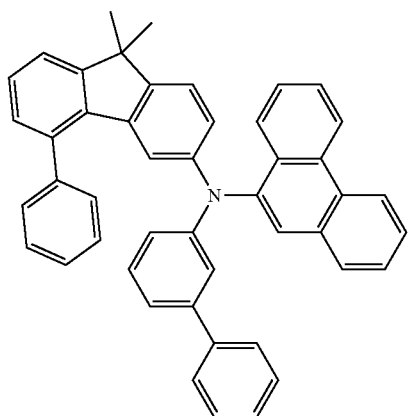
125
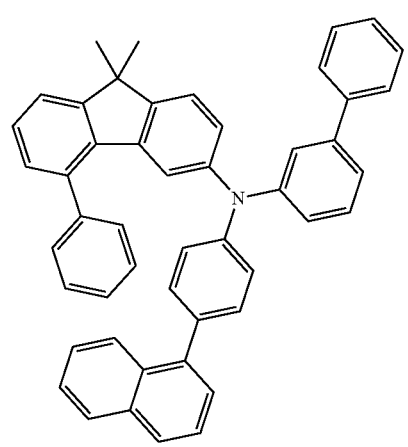
126
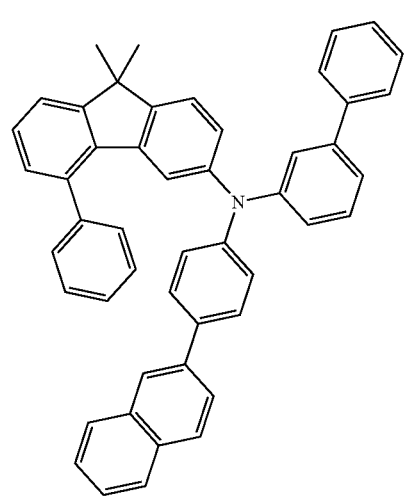
127
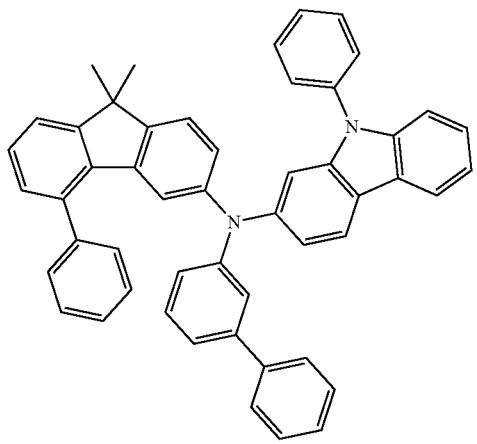
128
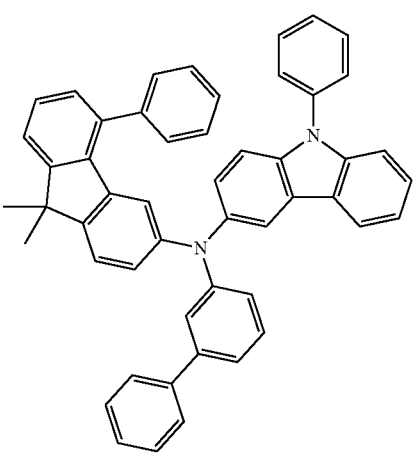
129
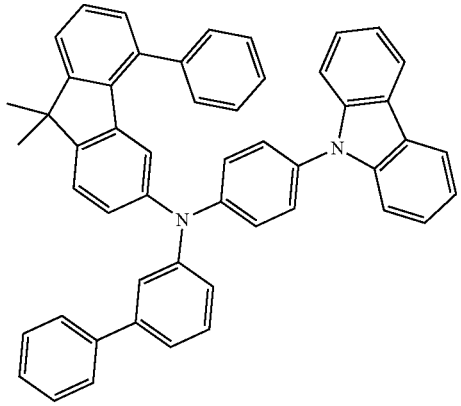

-continued
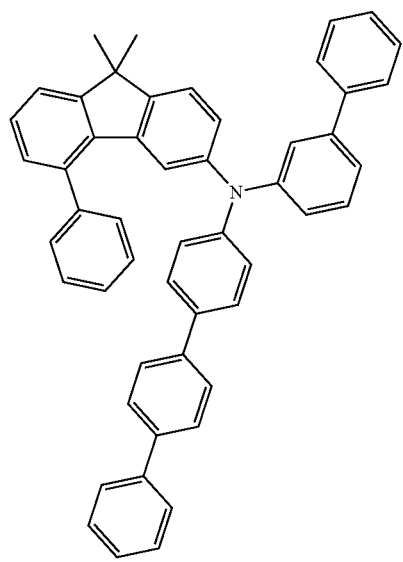
130
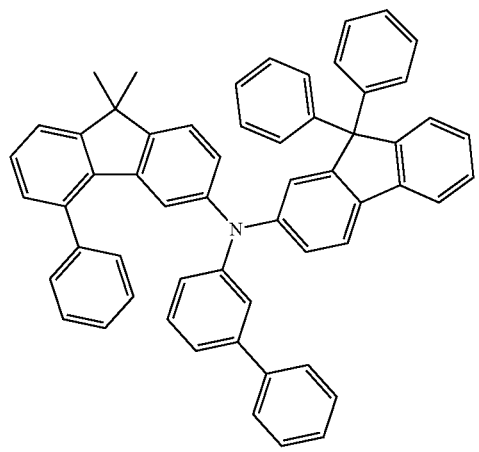
133
131
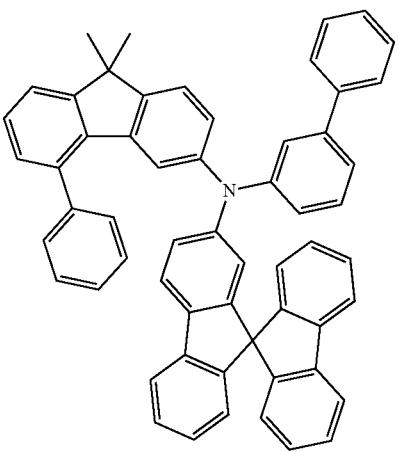
134
132
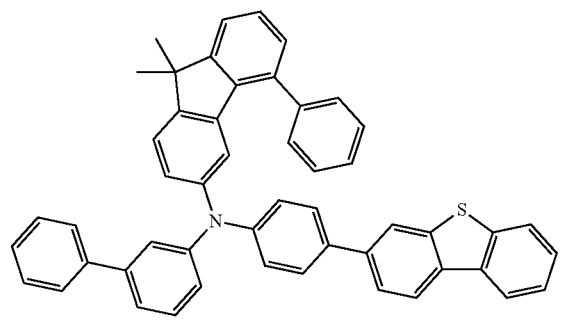
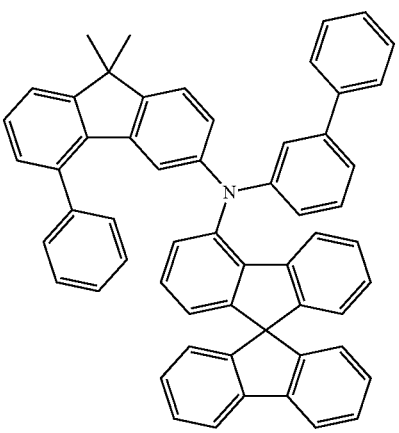
135

136
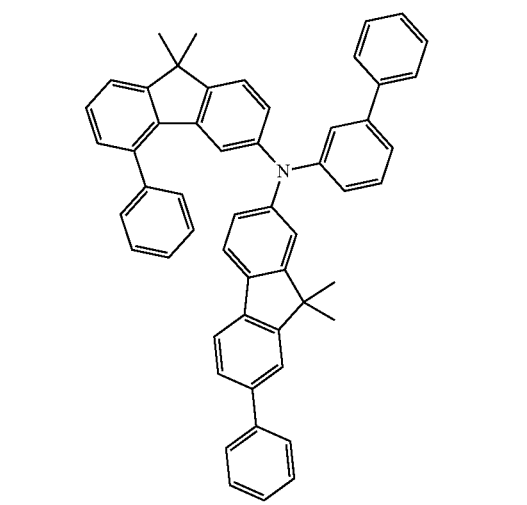
137
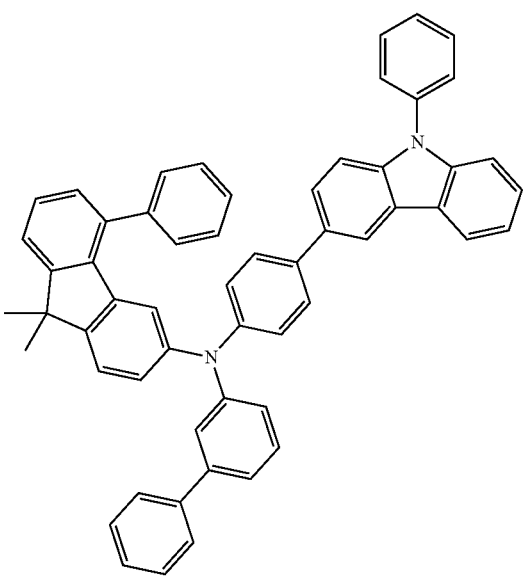
138
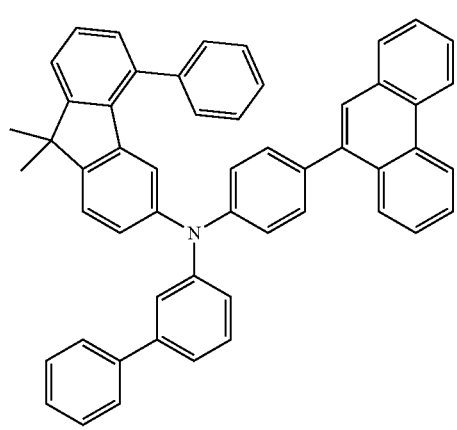
139
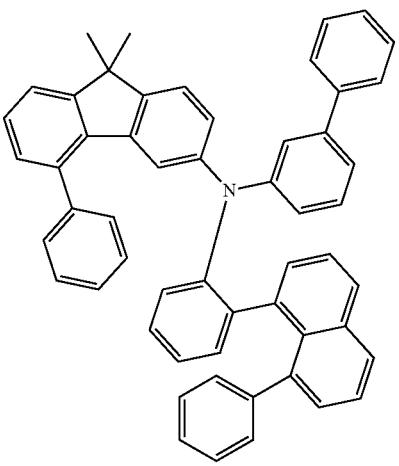
140
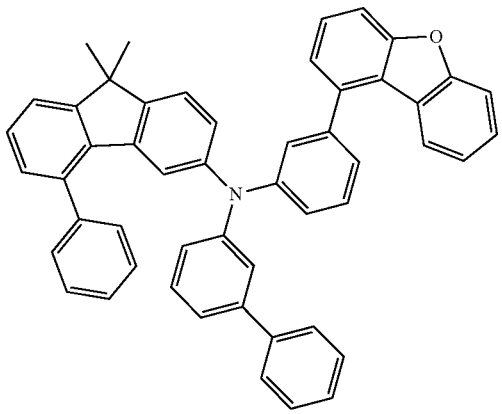
141
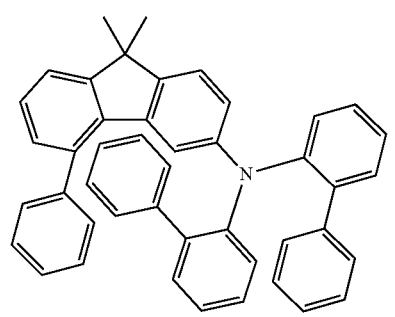
142
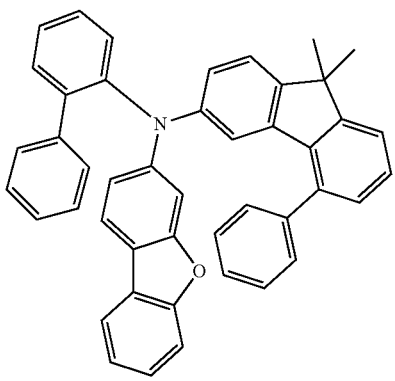

143
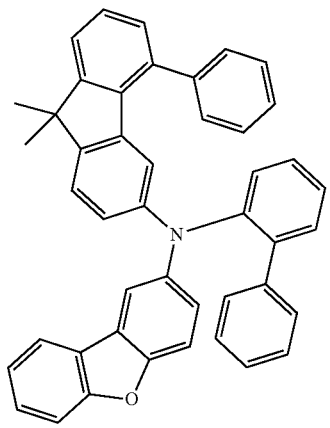
144
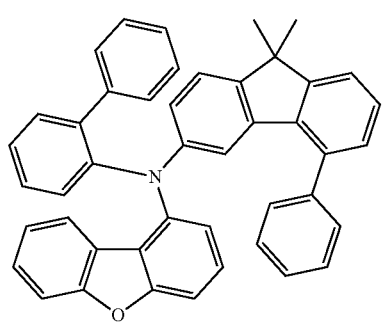
145
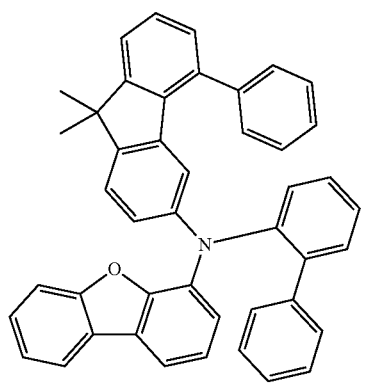
146
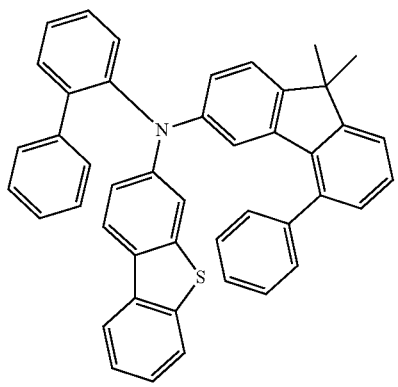
147
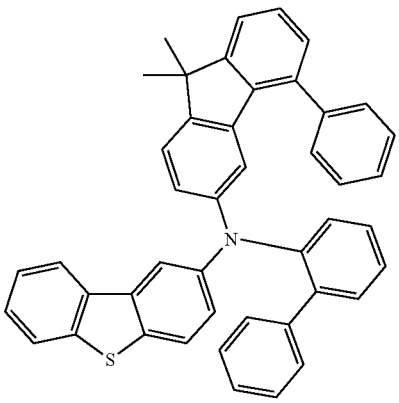
148
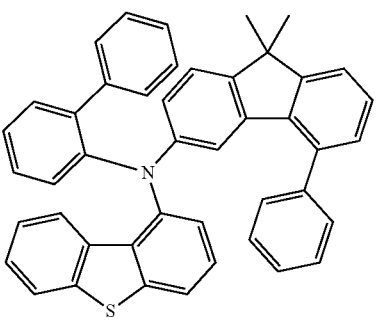
149
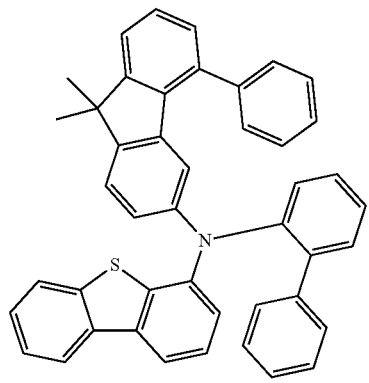
150
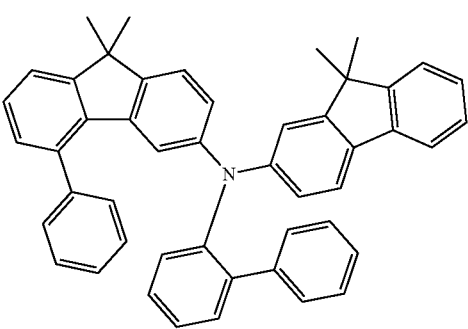

151 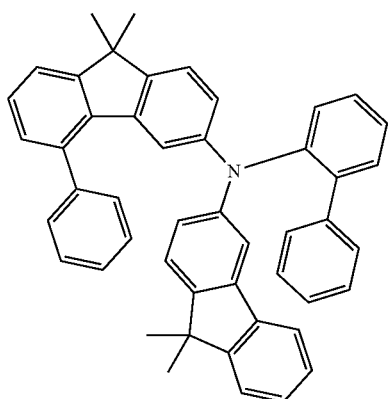
152 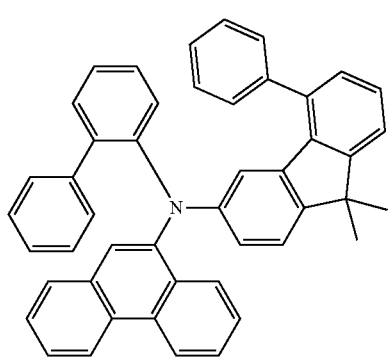
153 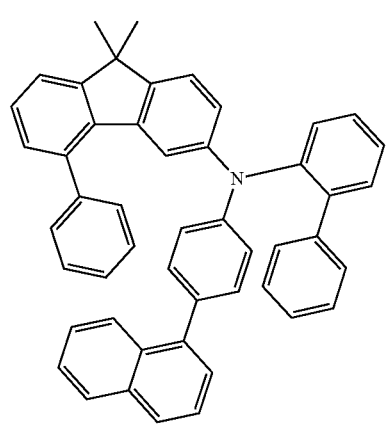
154 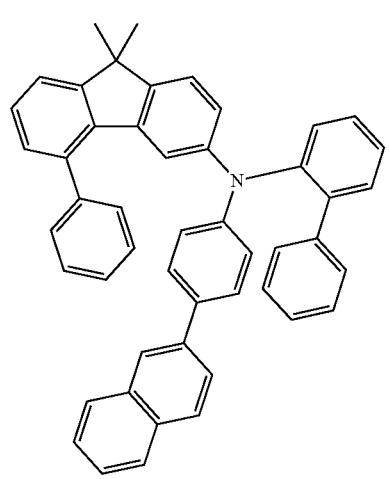
155 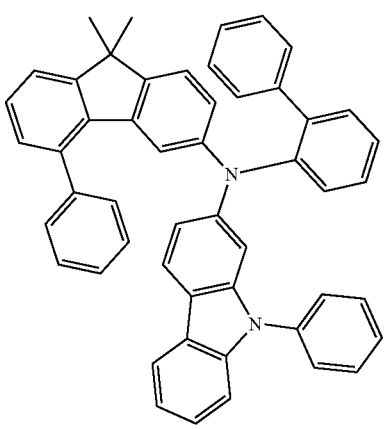
156 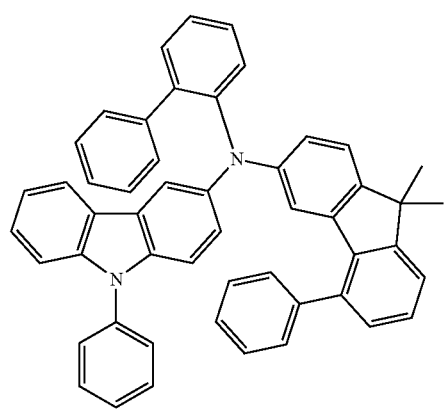
157 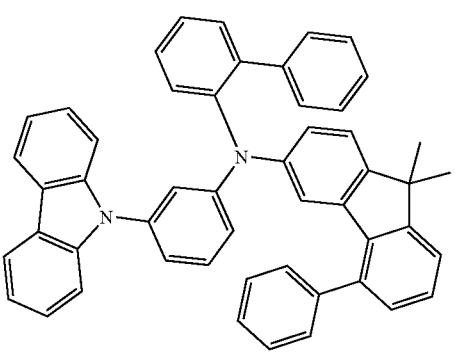

158
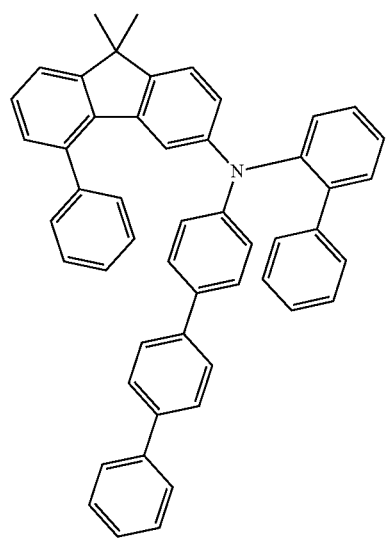
159
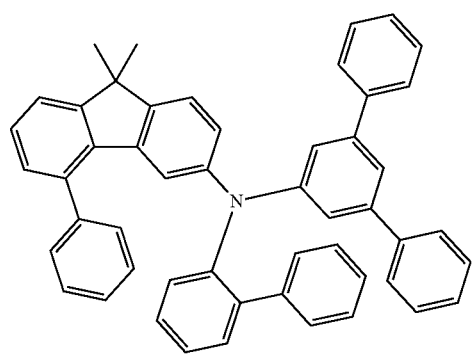
160
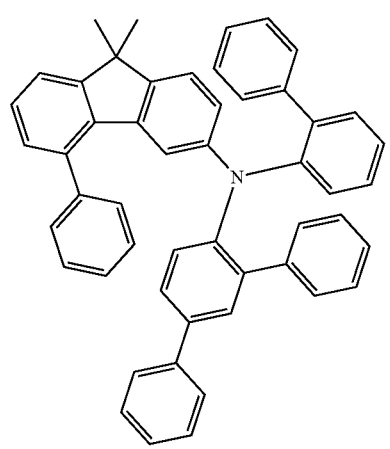
161
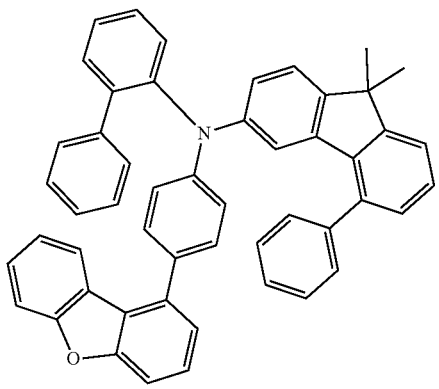
162
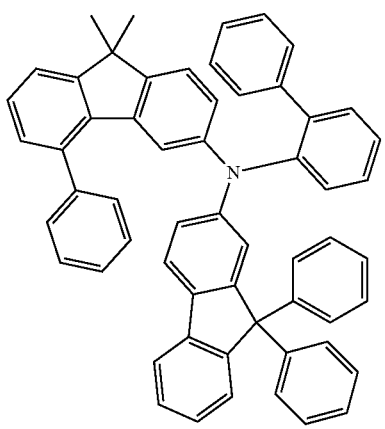
163
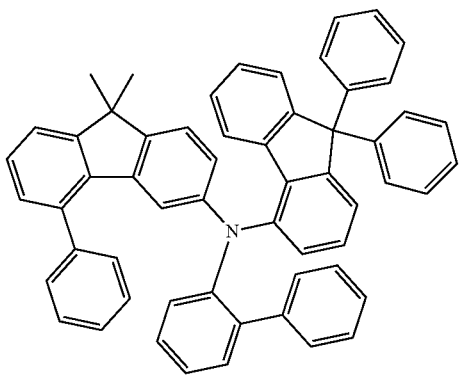
164
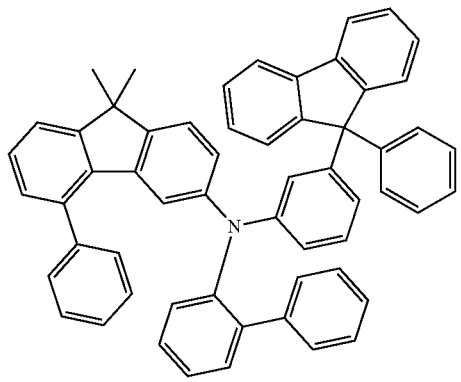

-continued
165
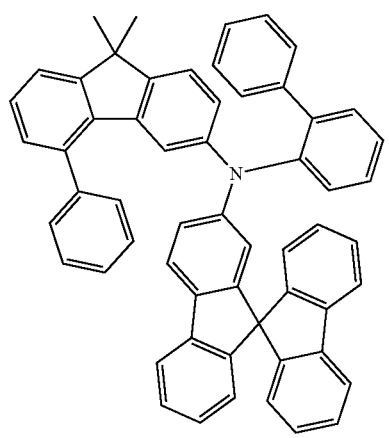
166
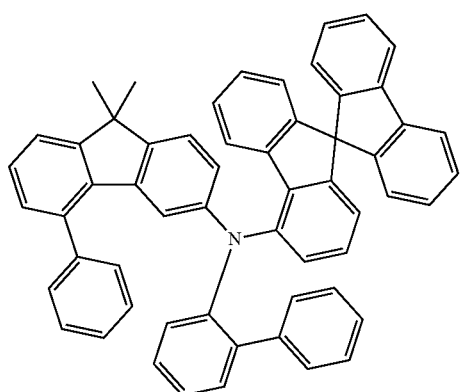
167
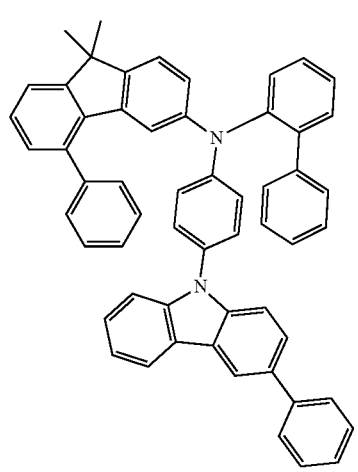
-continued
168
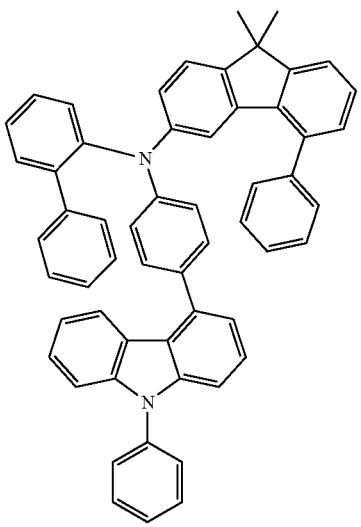
169
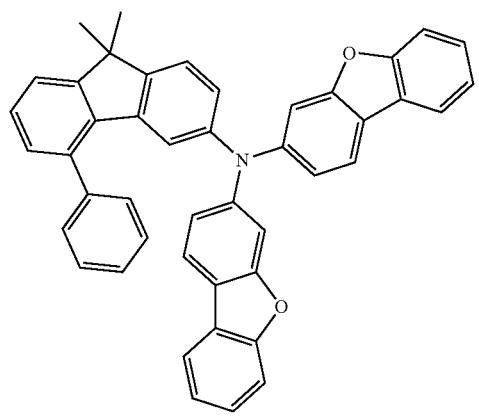
170
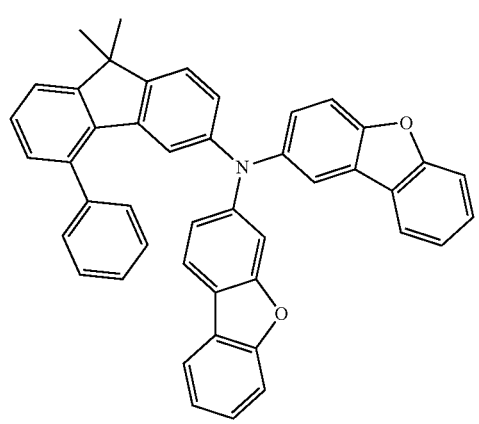

211
-continued
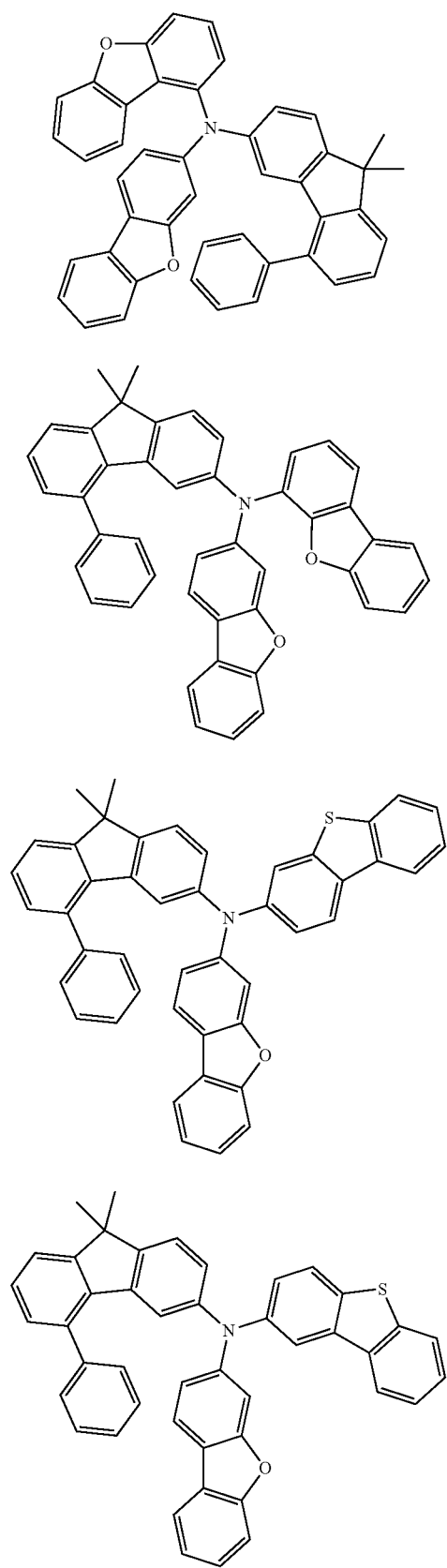
212
-continued
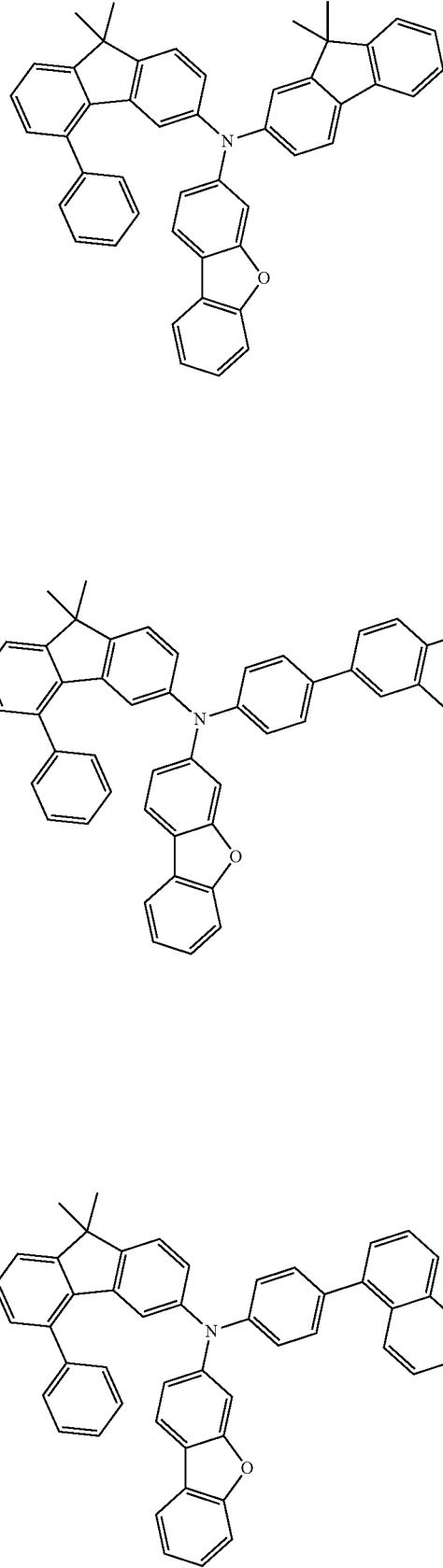

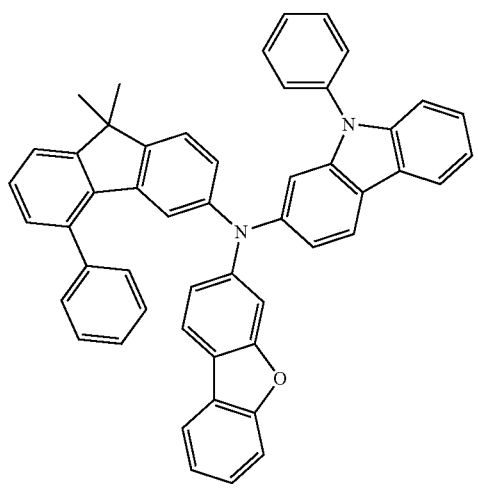
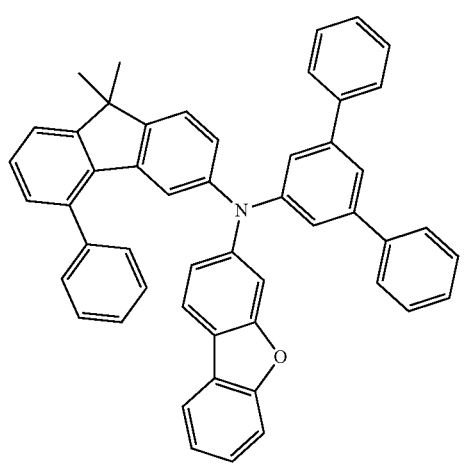
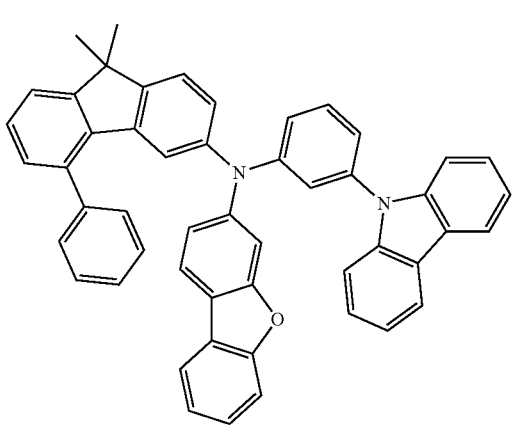
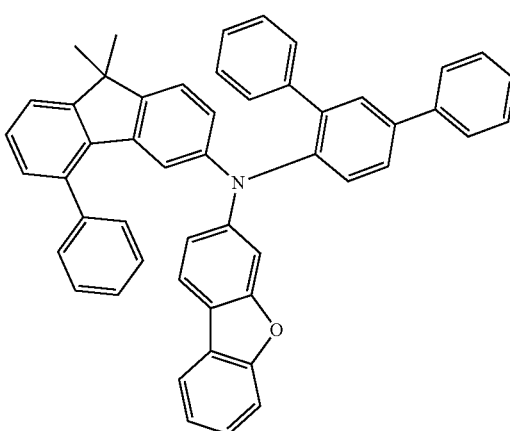
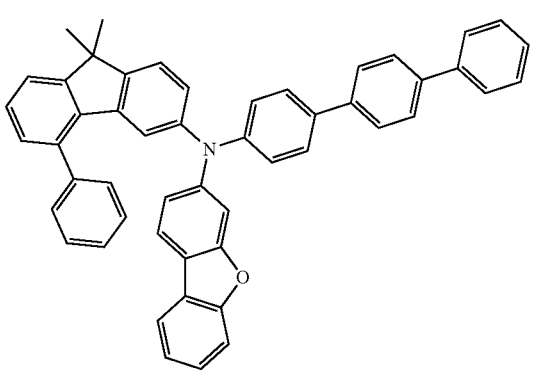
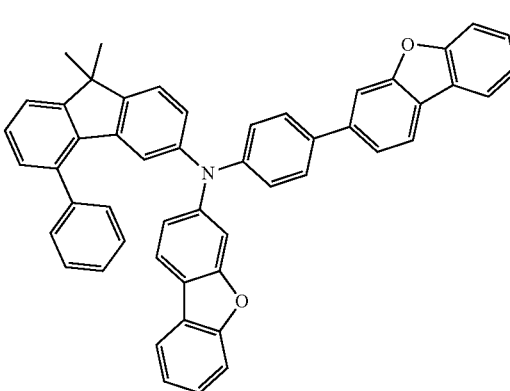

184
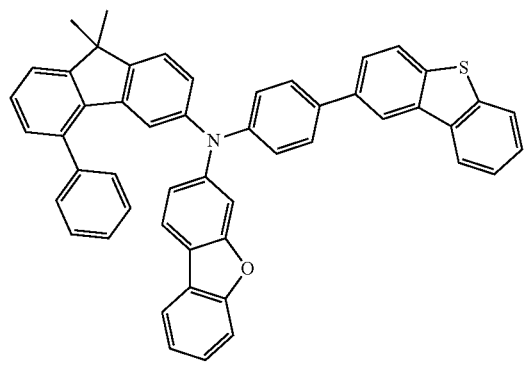
185
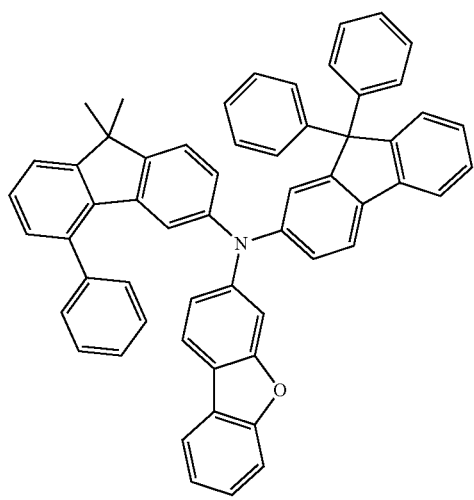
186
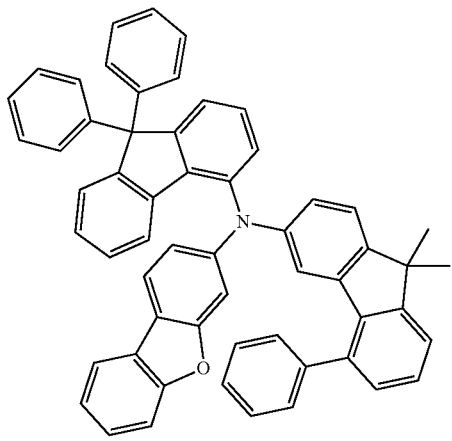
187
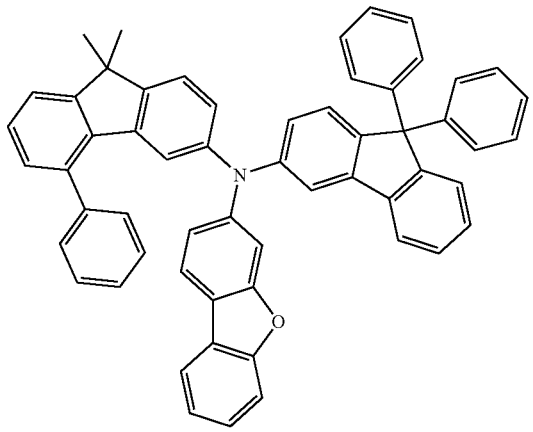
188
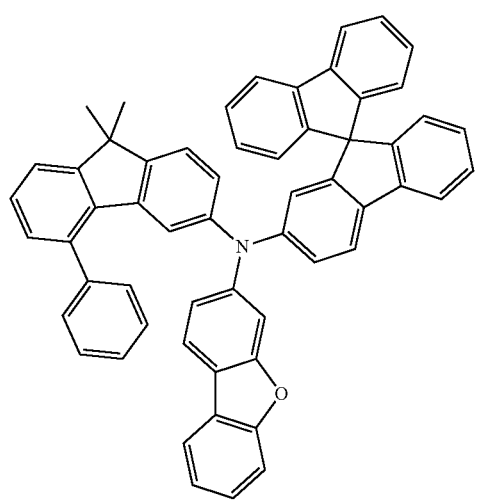
189

190
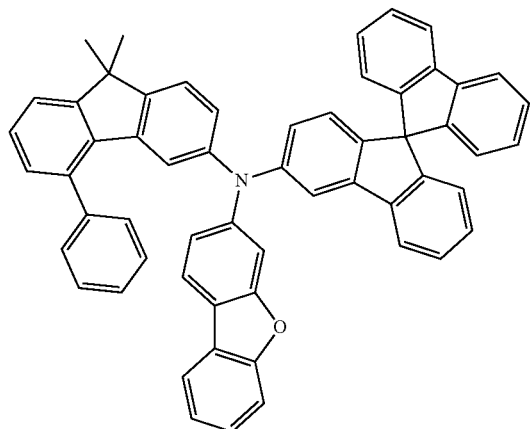
193
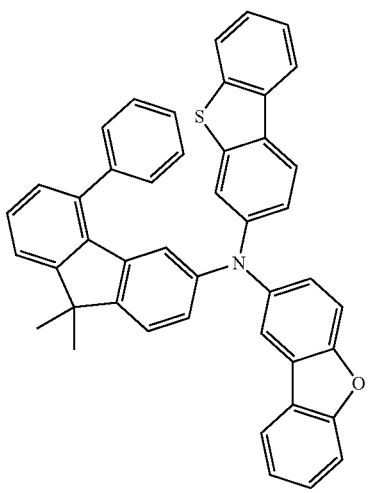
191
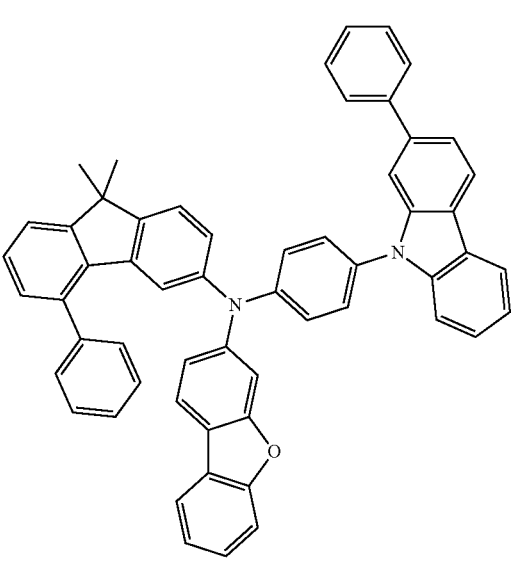
194
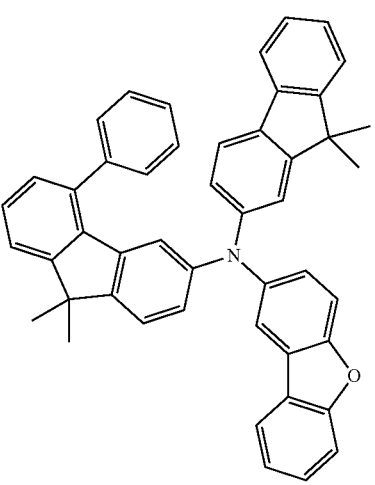
192
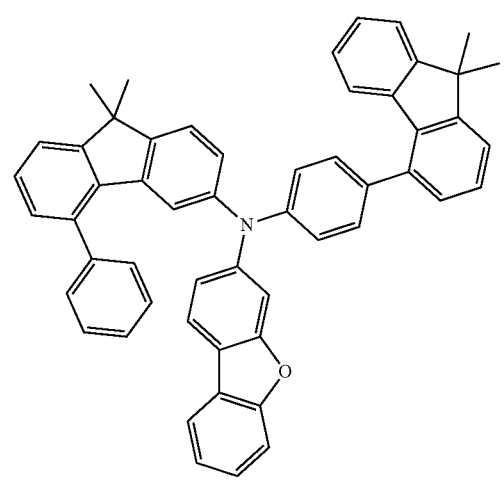
195
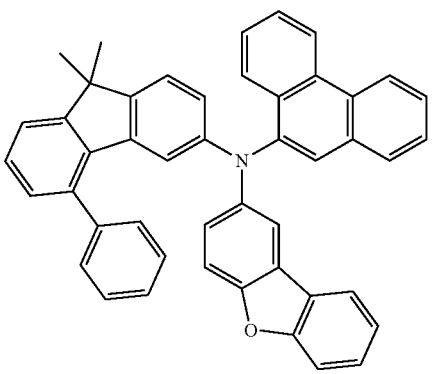

196
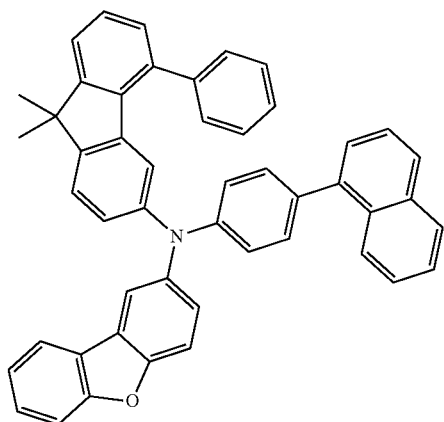
197
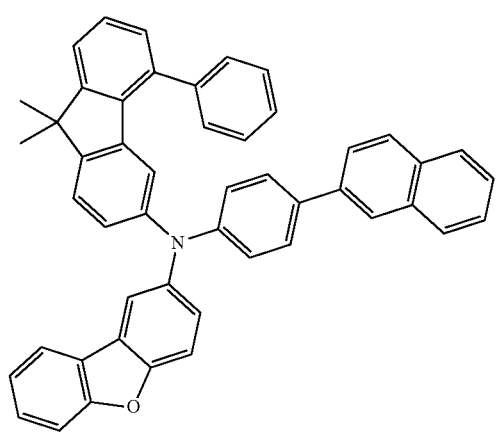
198
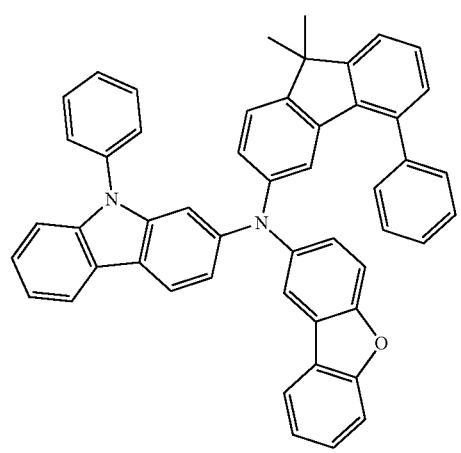
199
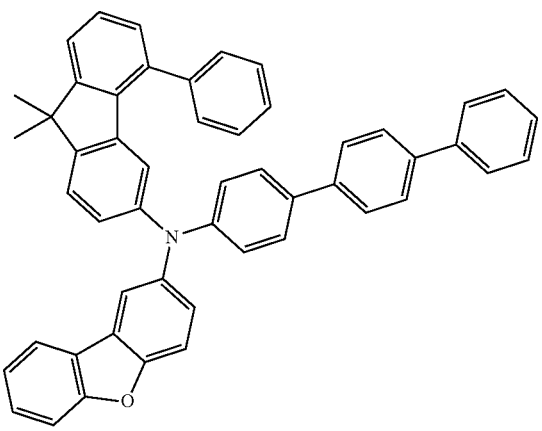
200
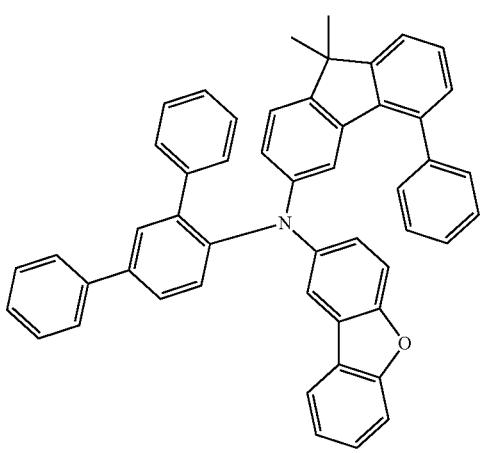
201
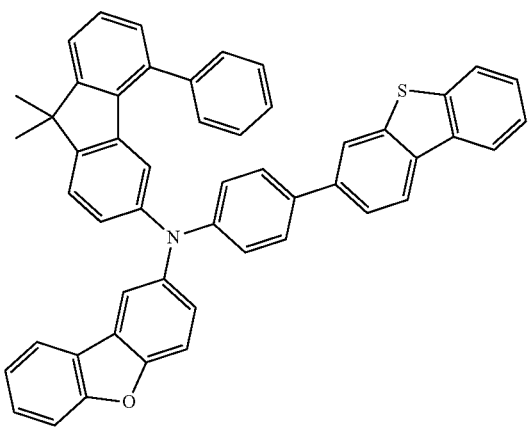

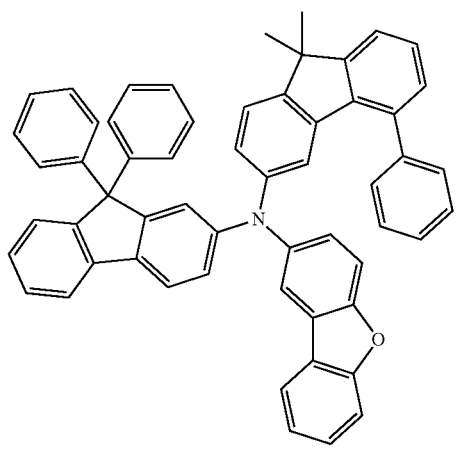
202
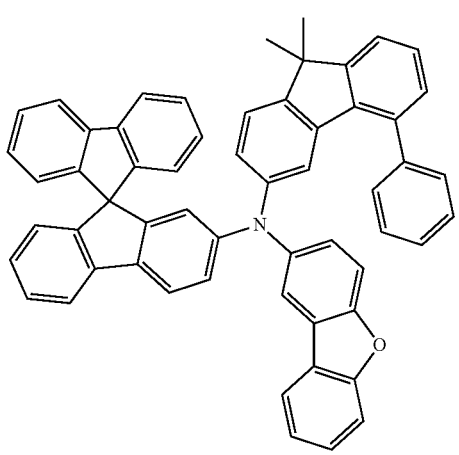
203
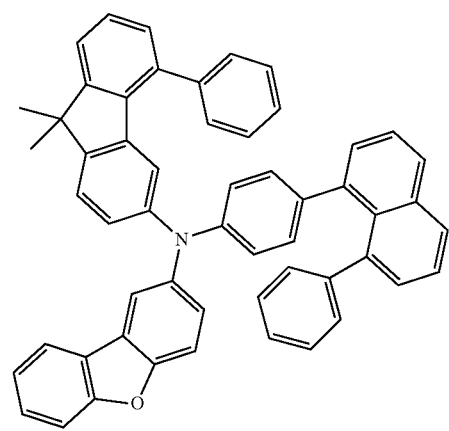
204
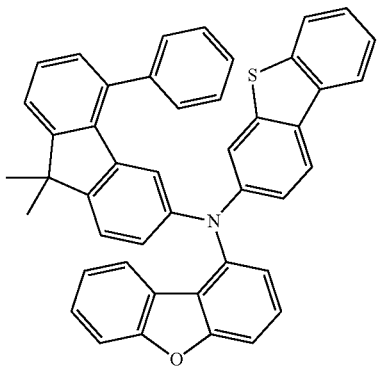
205
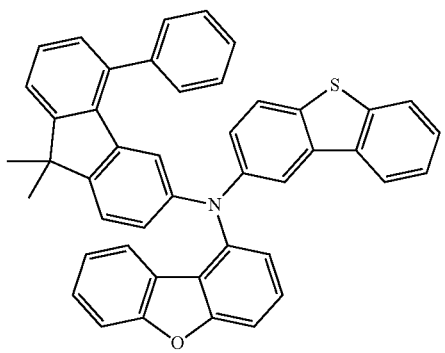
206
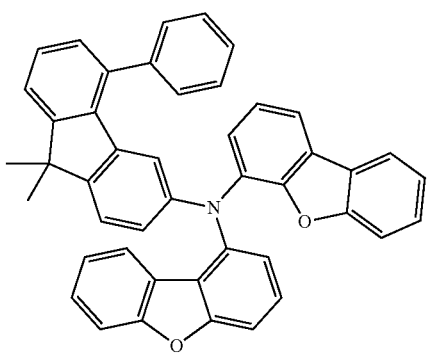
207
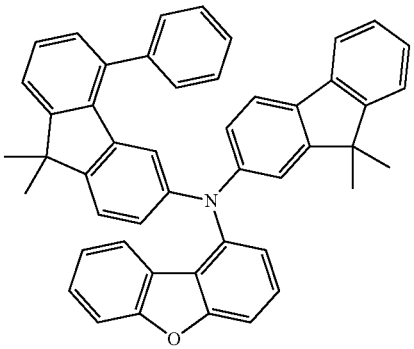
208

209
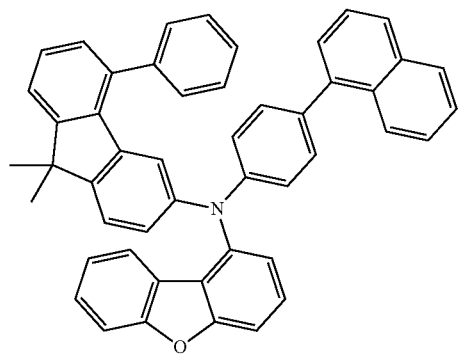
210
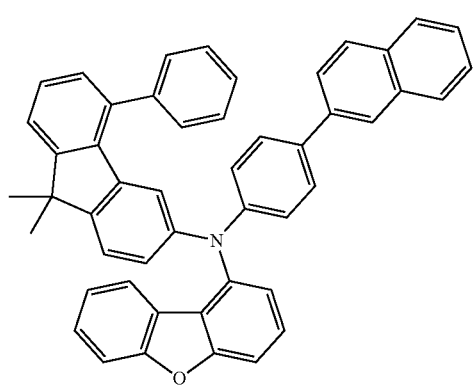
211
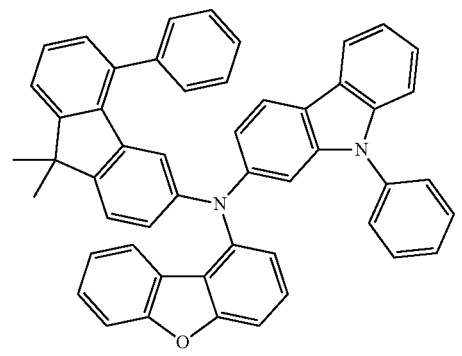
212
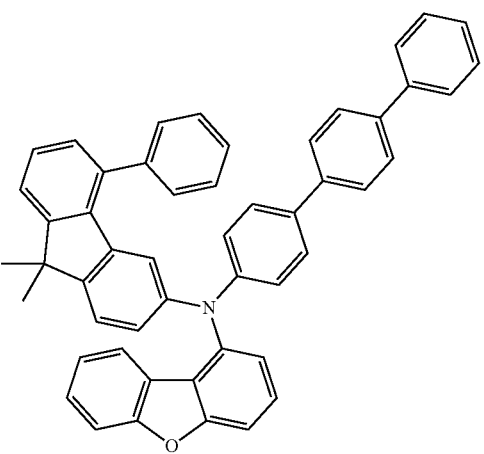
213
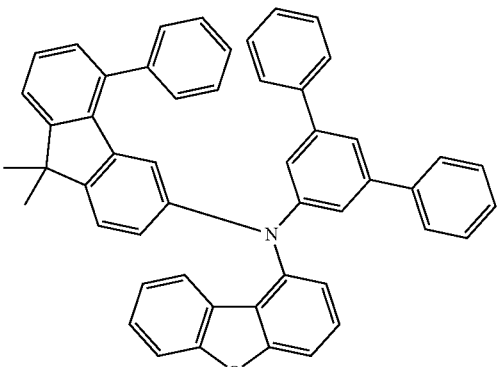
214
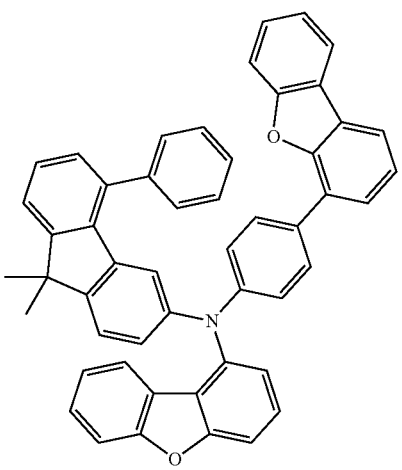
215
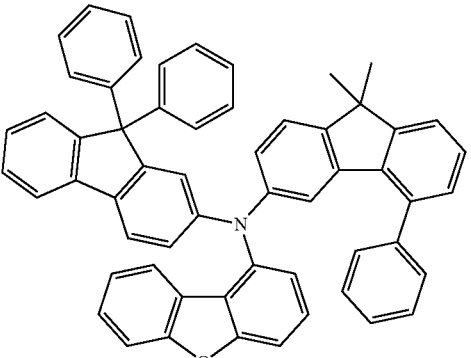
216
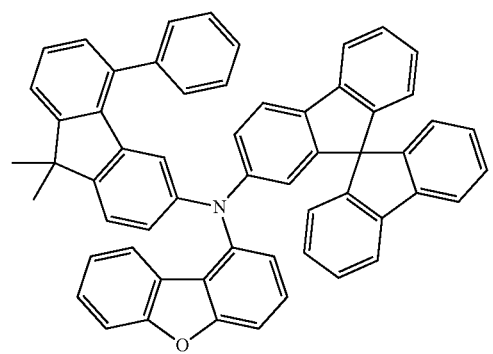

217
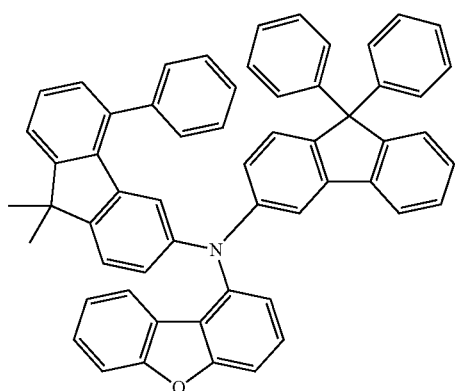
218
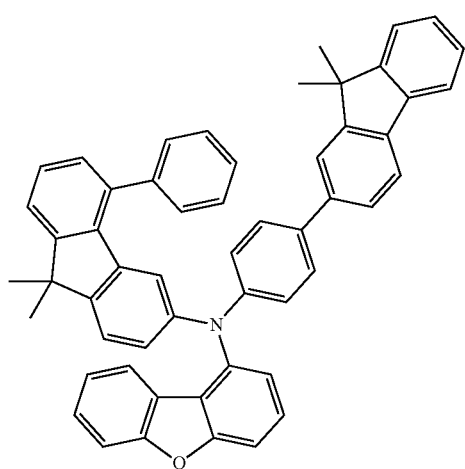
219
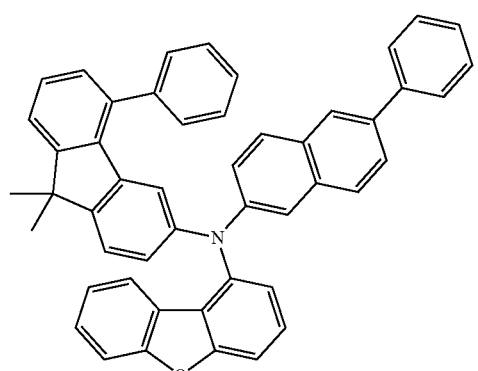
220
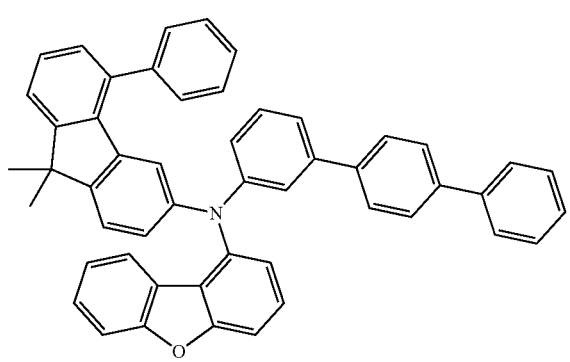
221
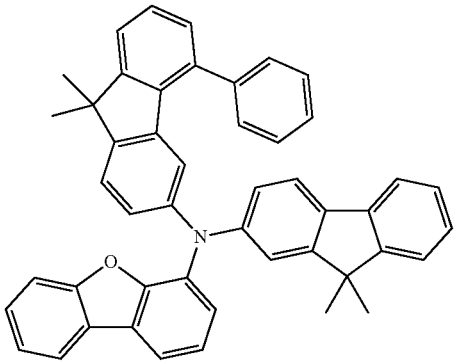
222
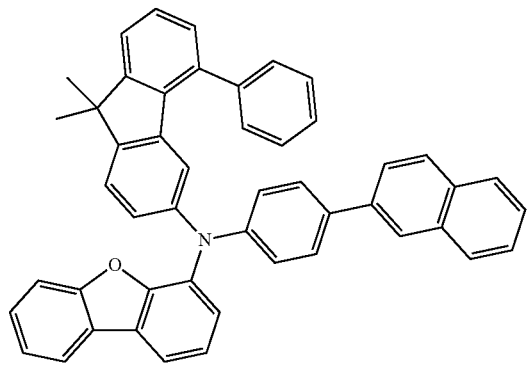
223
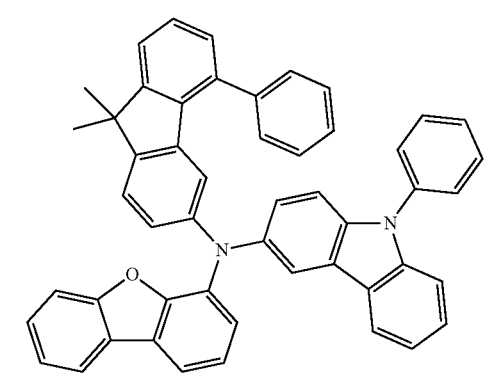
224
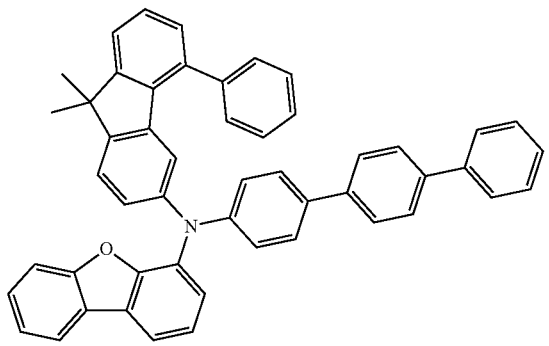

225
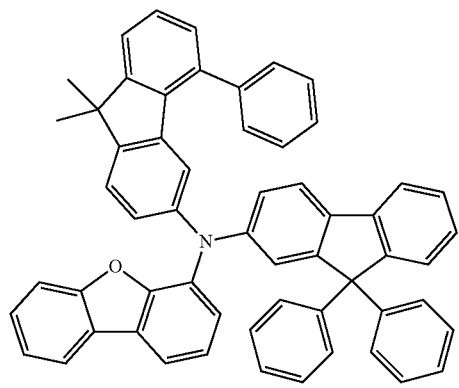
226
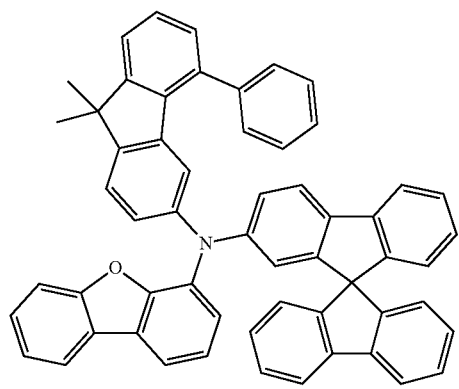
227
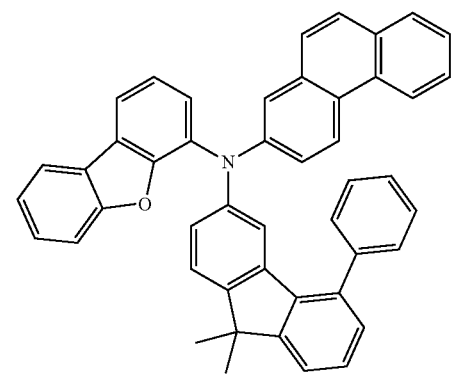
228
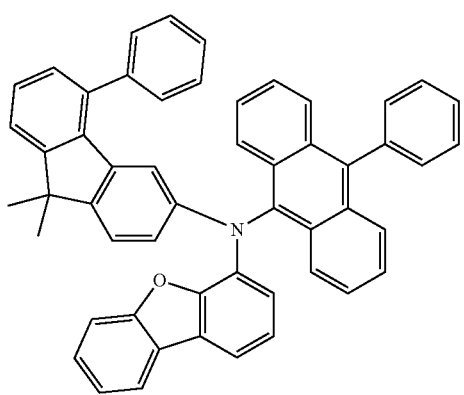
229
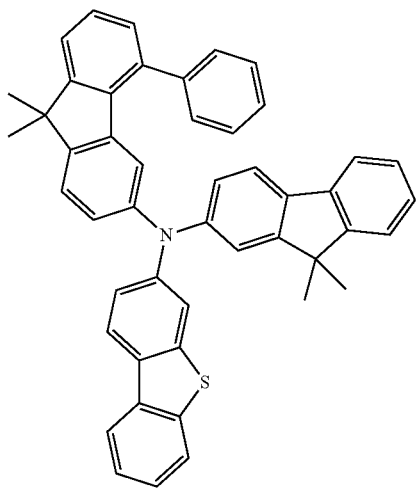
230
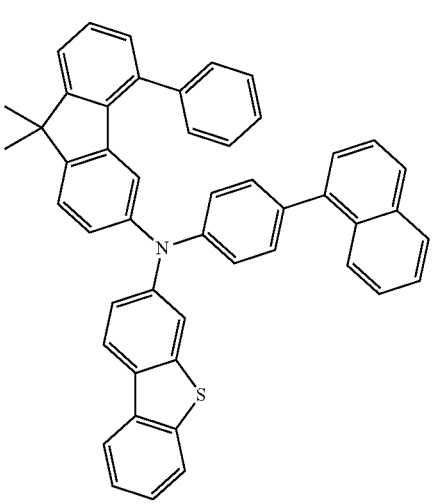
231
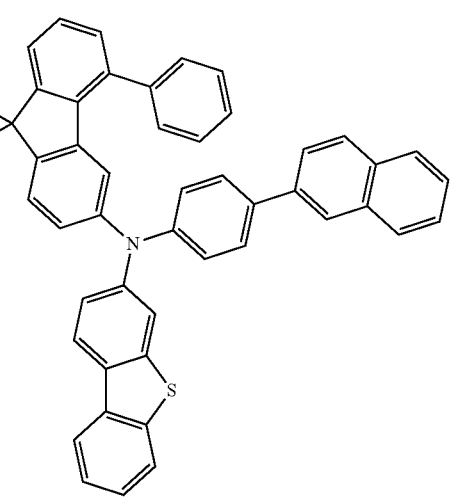

232
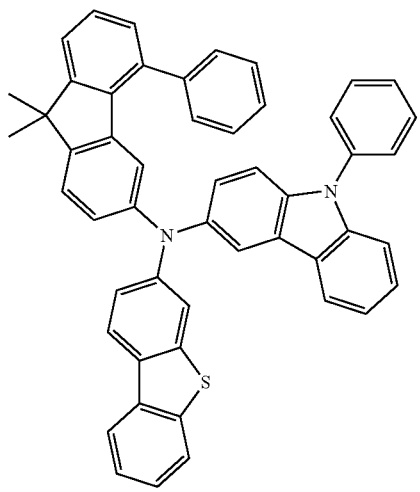
233
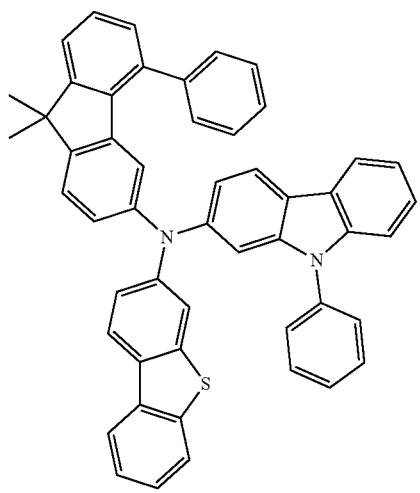
234
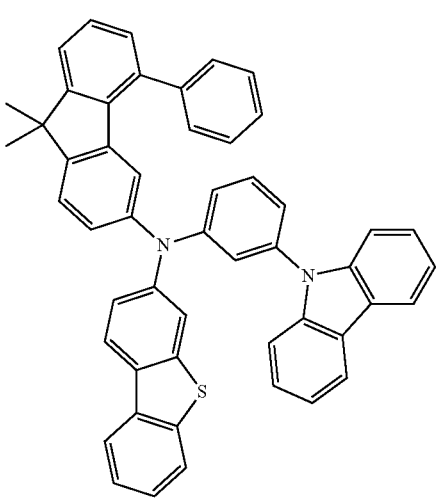
235
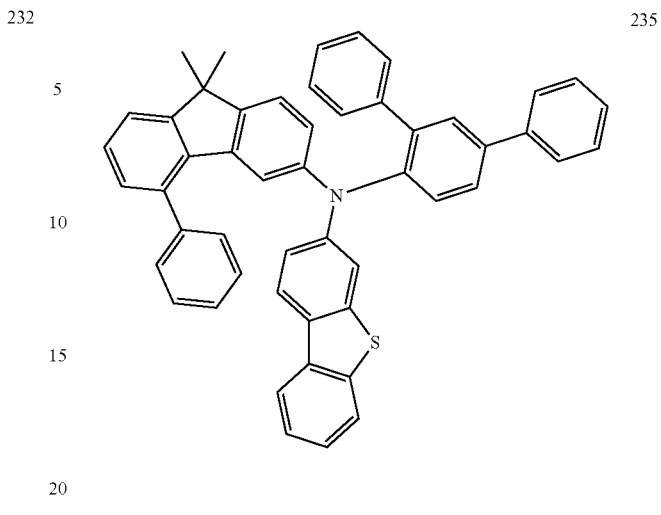
236
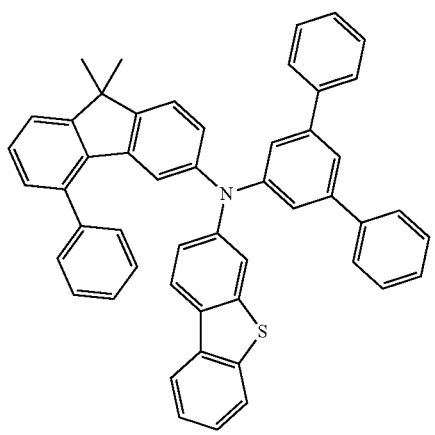
237
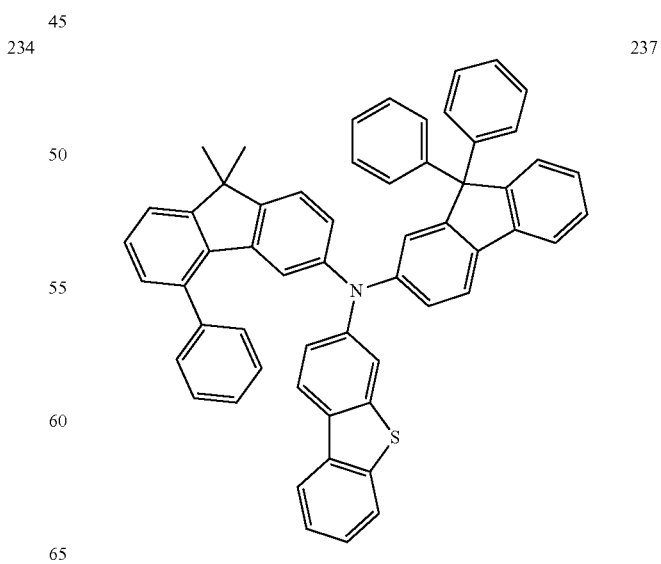

231
-continued
238
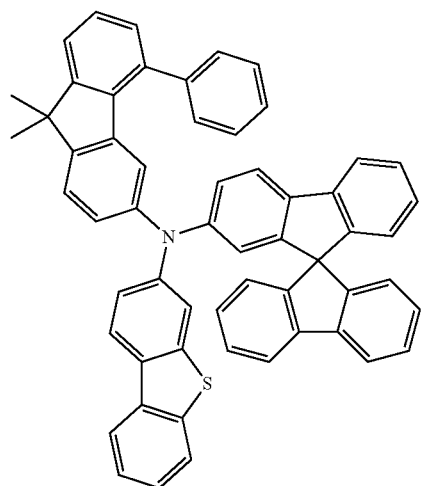
239
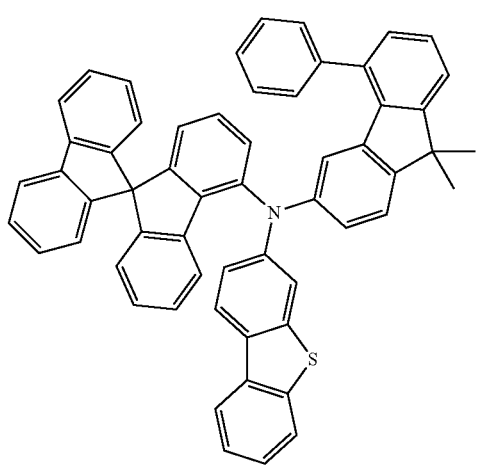
240
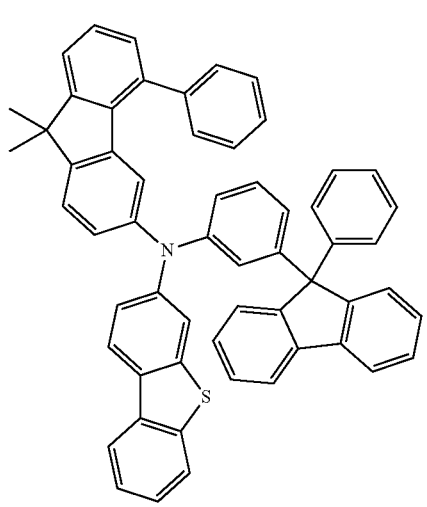
232
-continued
241
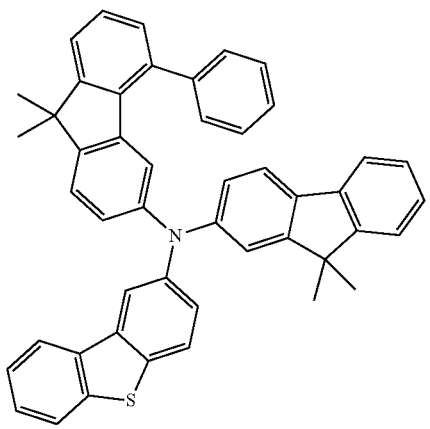
242
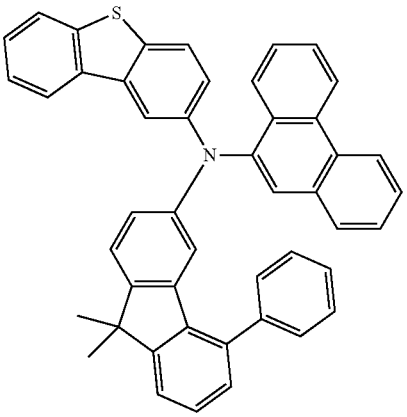
243
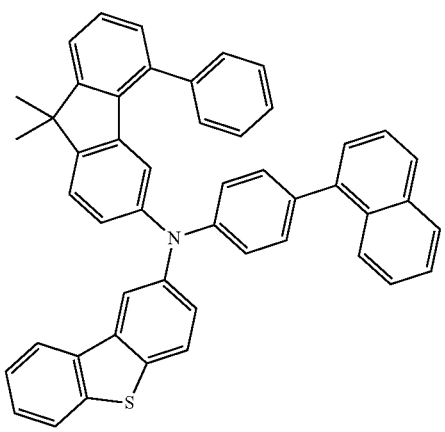

233
-continued
244
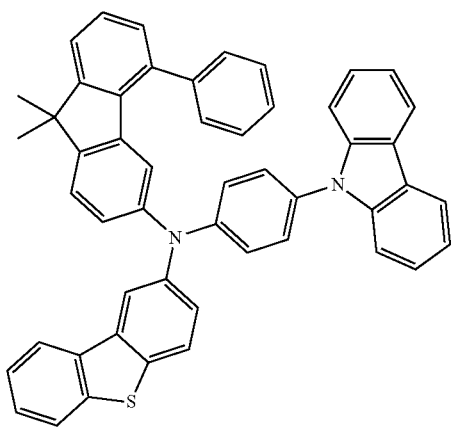
245
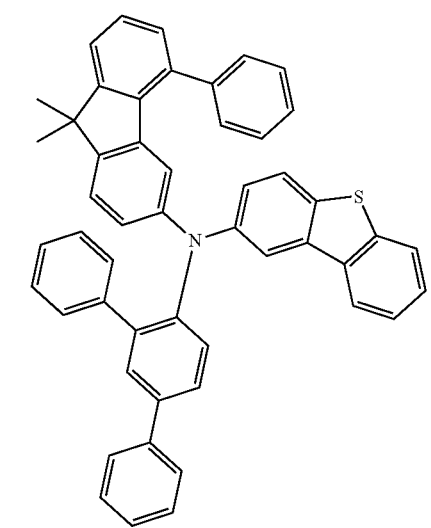
246
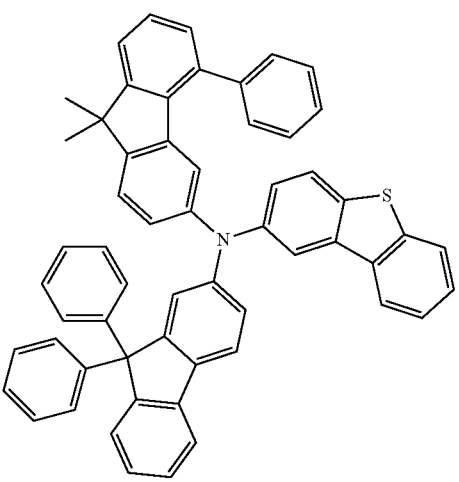
234
-continued
247
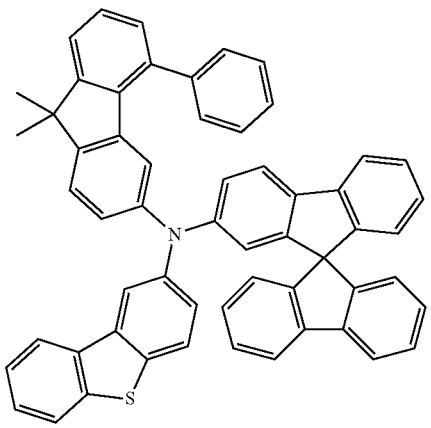
248
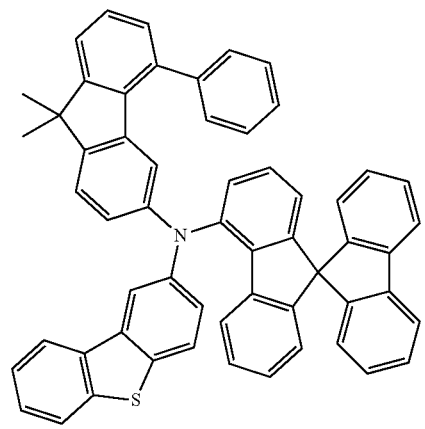
249
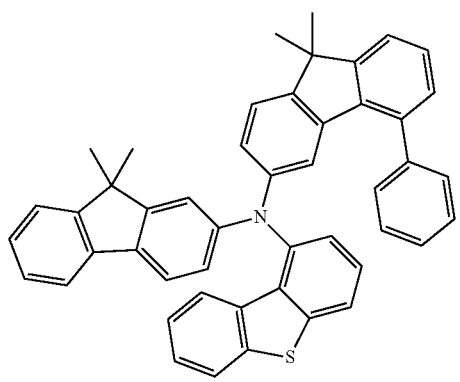
250
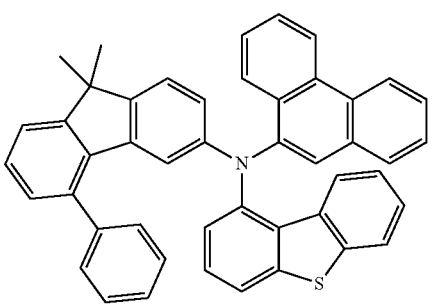

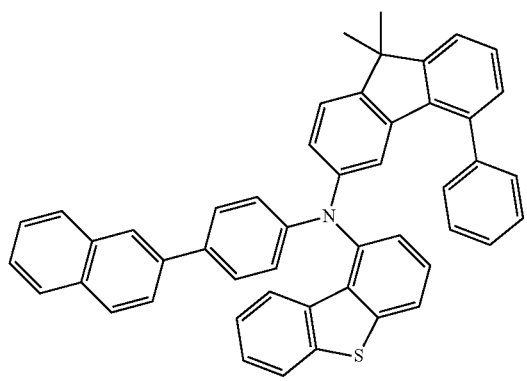
251
252
253
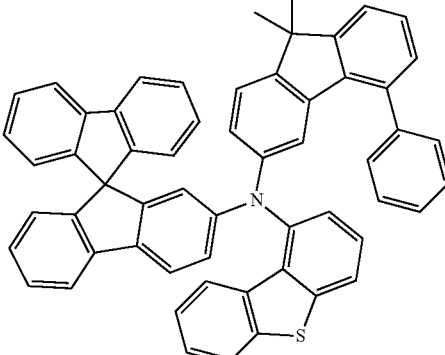
254
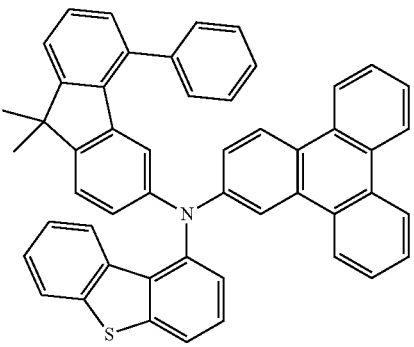
255
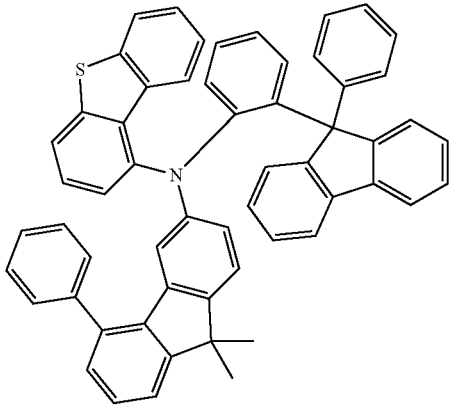
256
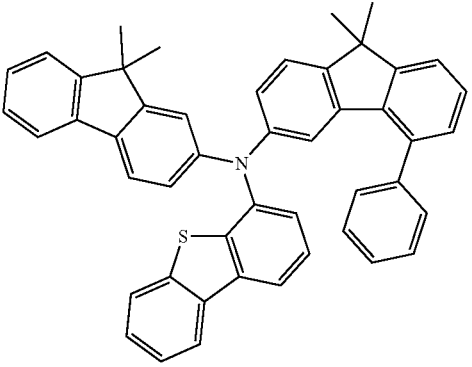
257

-continued
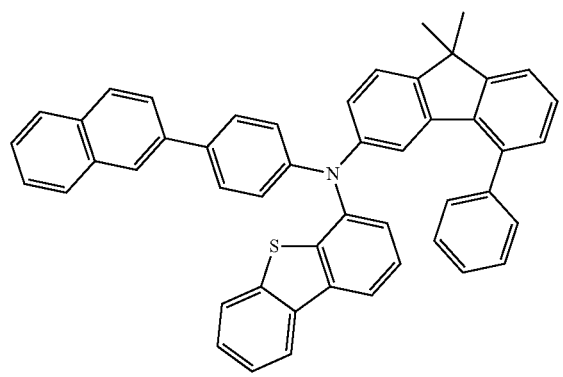
258
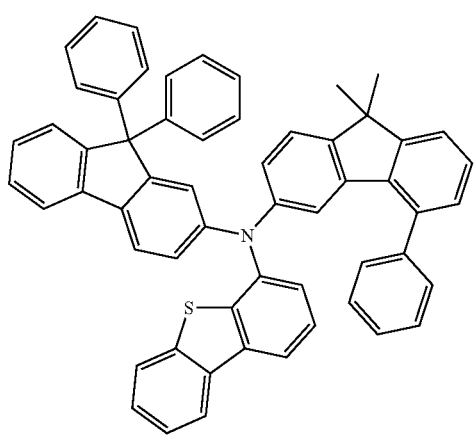
259
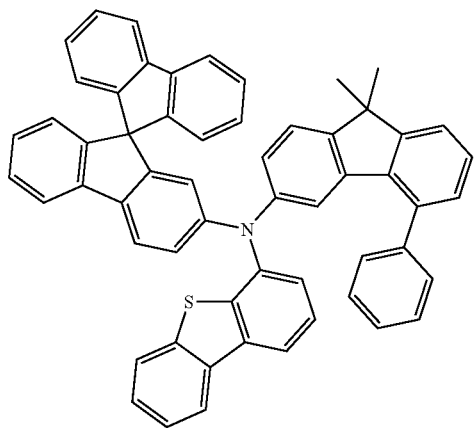
260
-continued
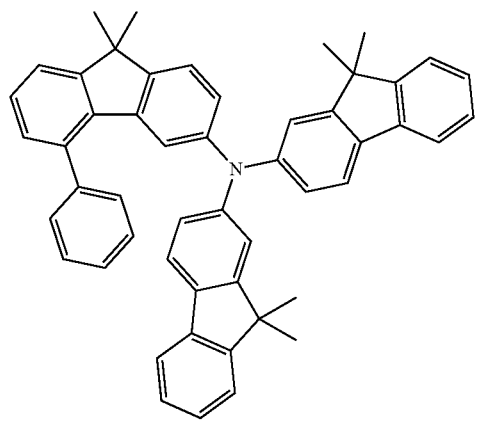
261
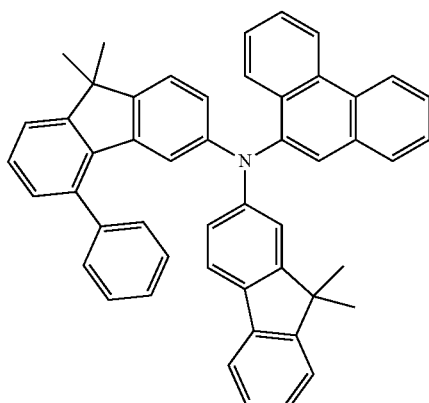
262
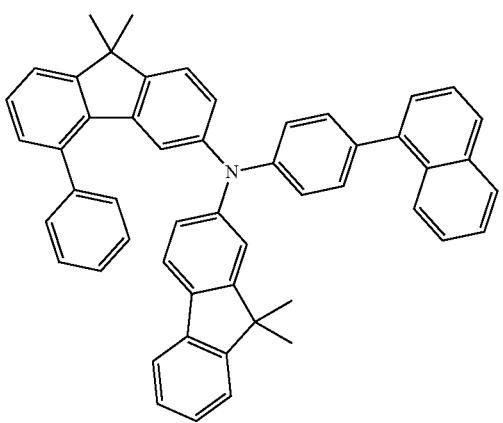
263

264
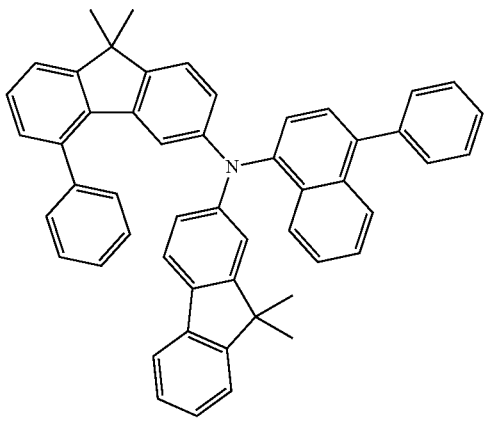
265
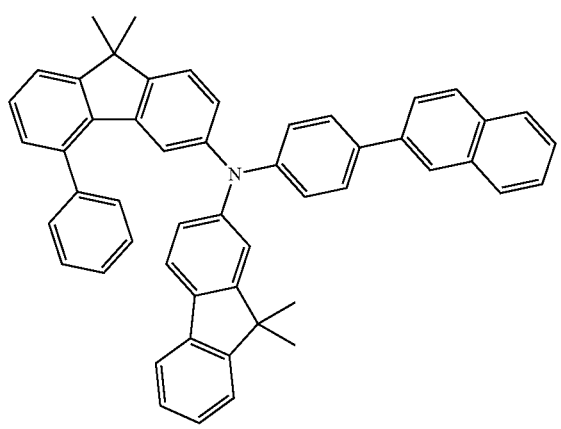
266
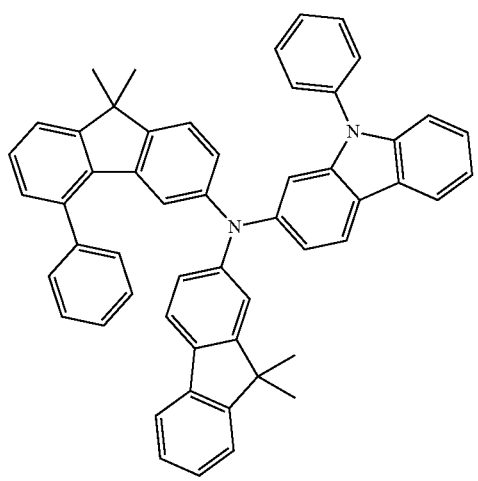
267
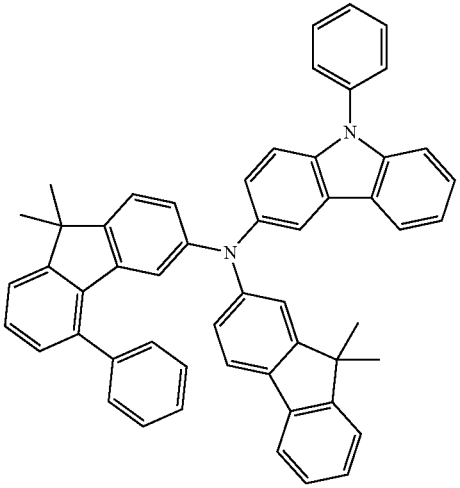
268
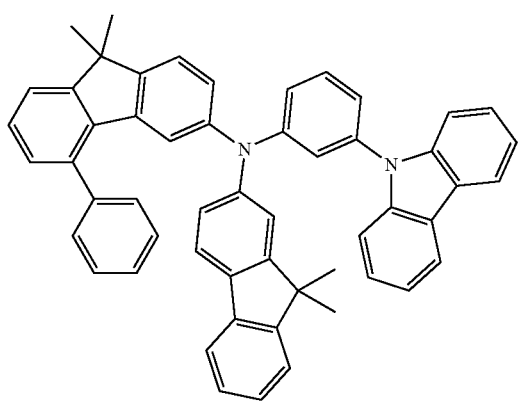
269
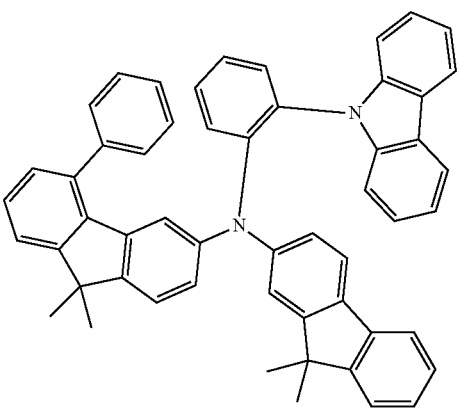

270
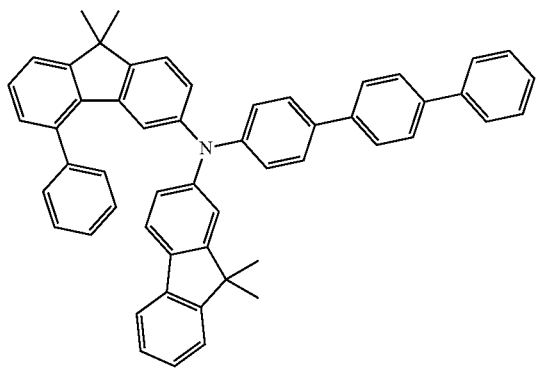
271
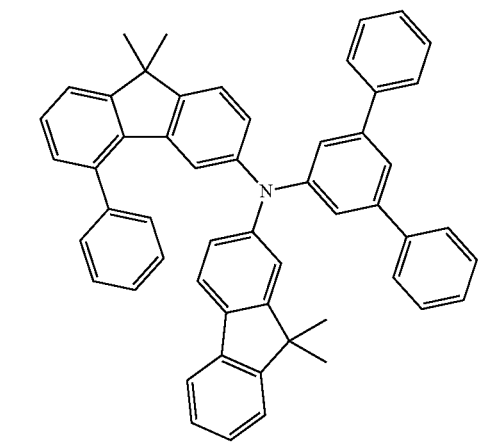
272
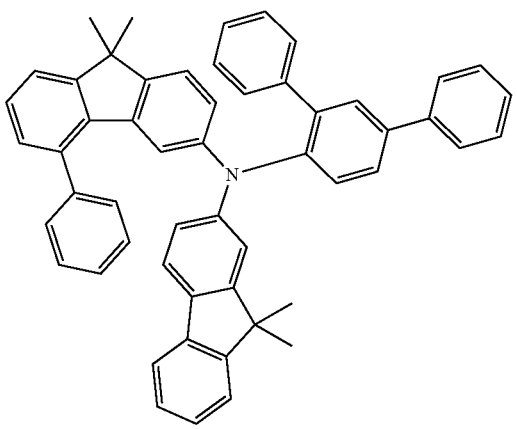
273
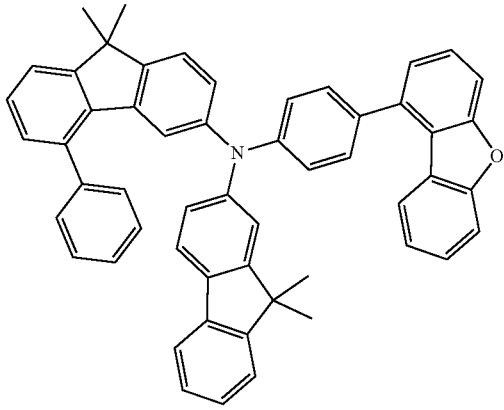
274
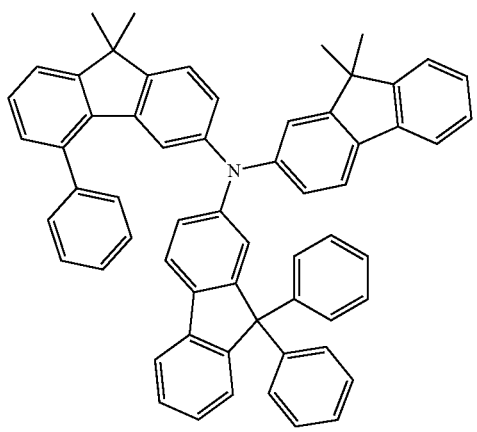
275
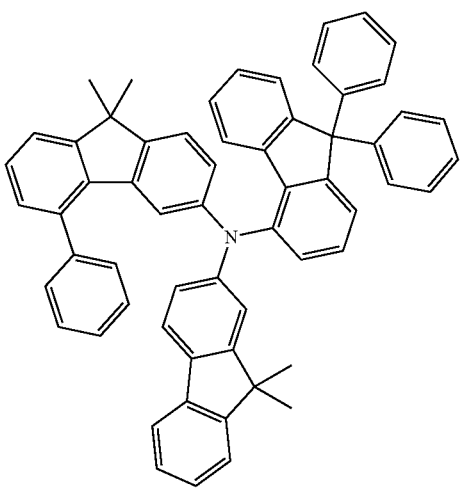

276
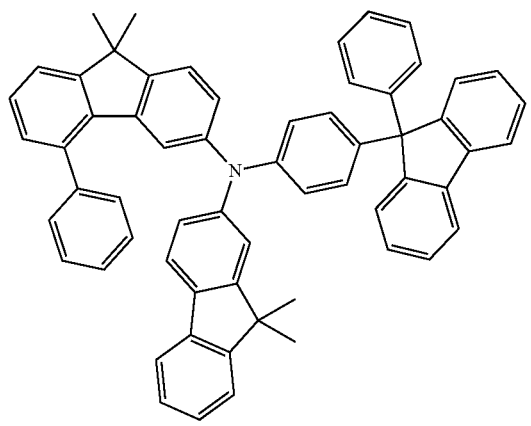
277
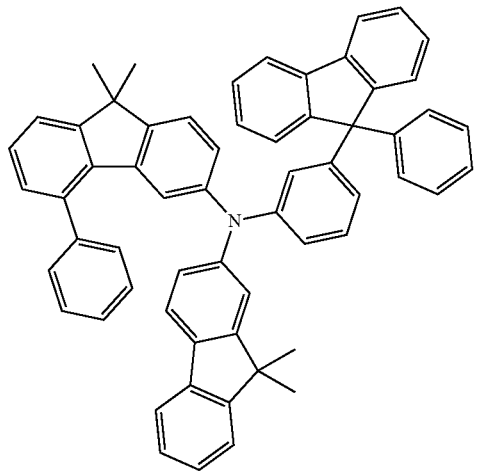
278
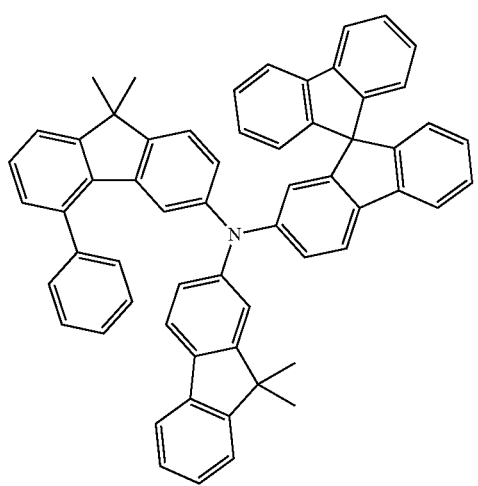
279
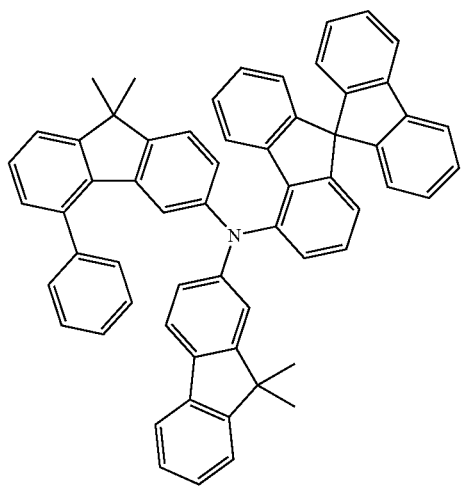
280
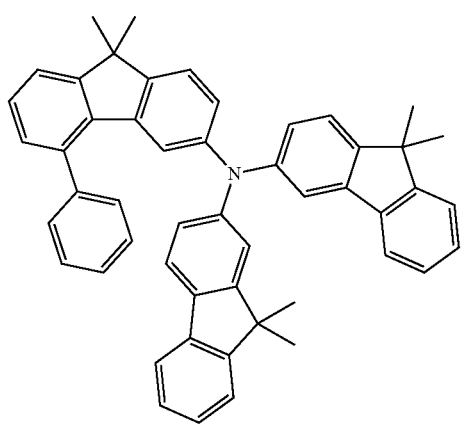
281
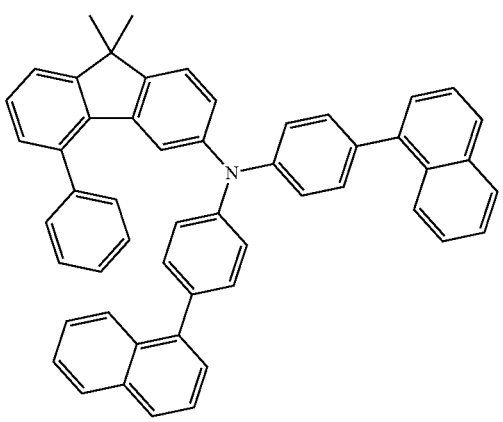

282
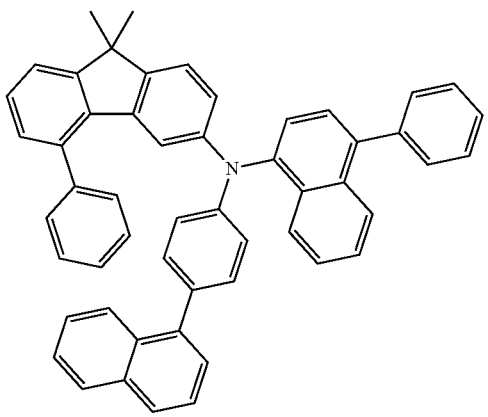
283
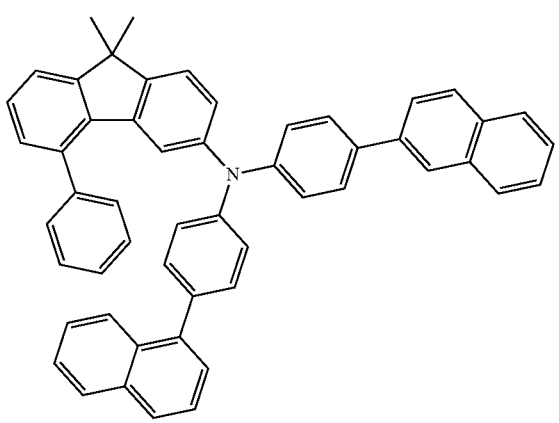
284
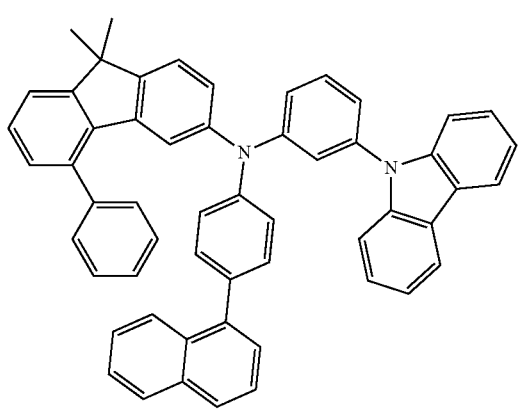
285
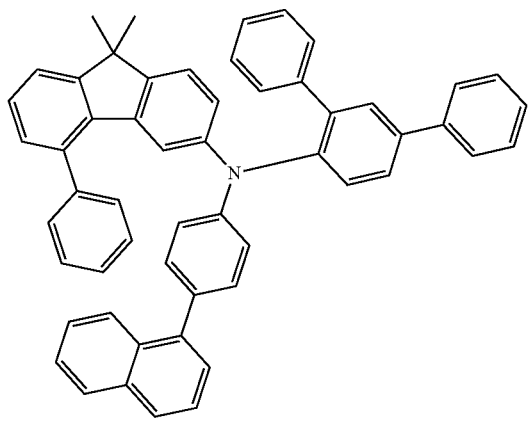
286
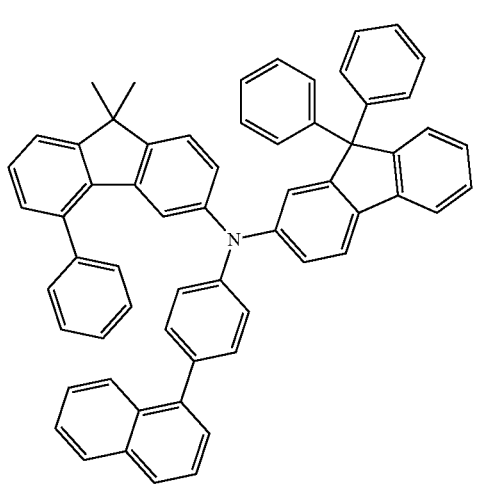
287
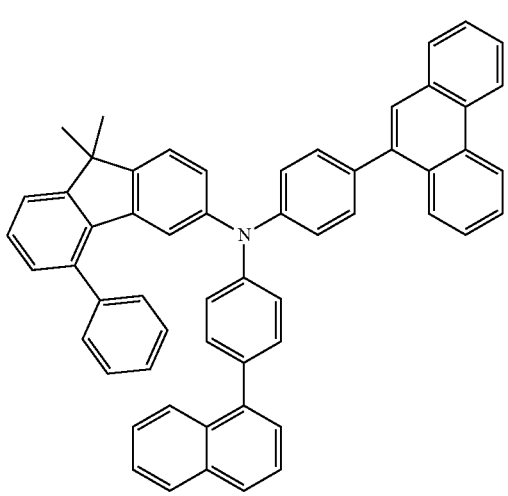

288
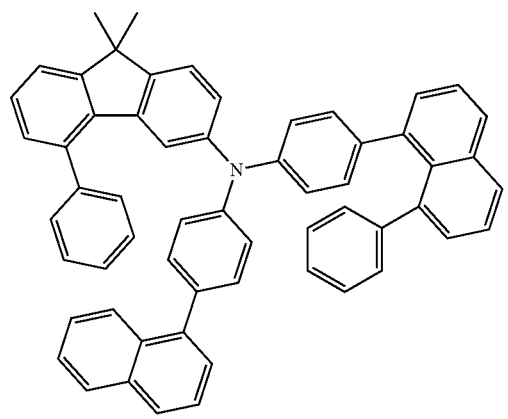
289
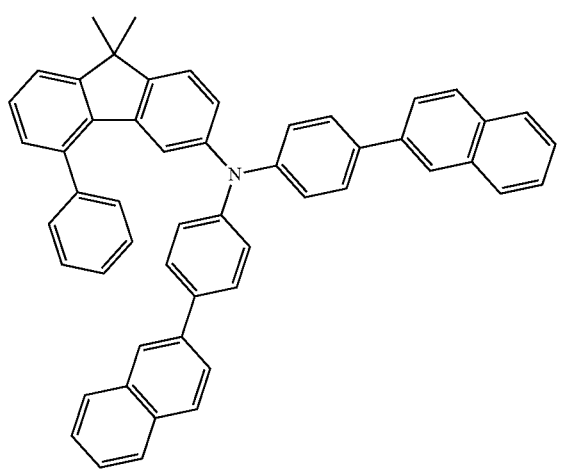
290
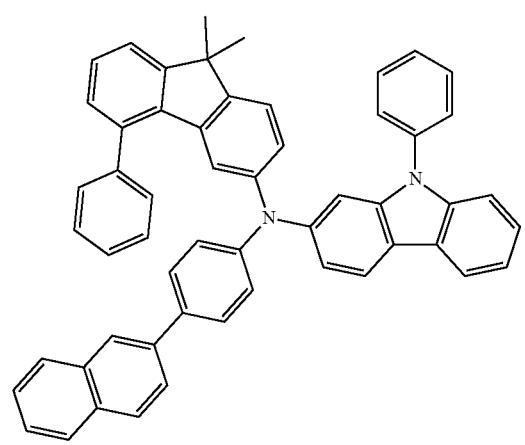
291
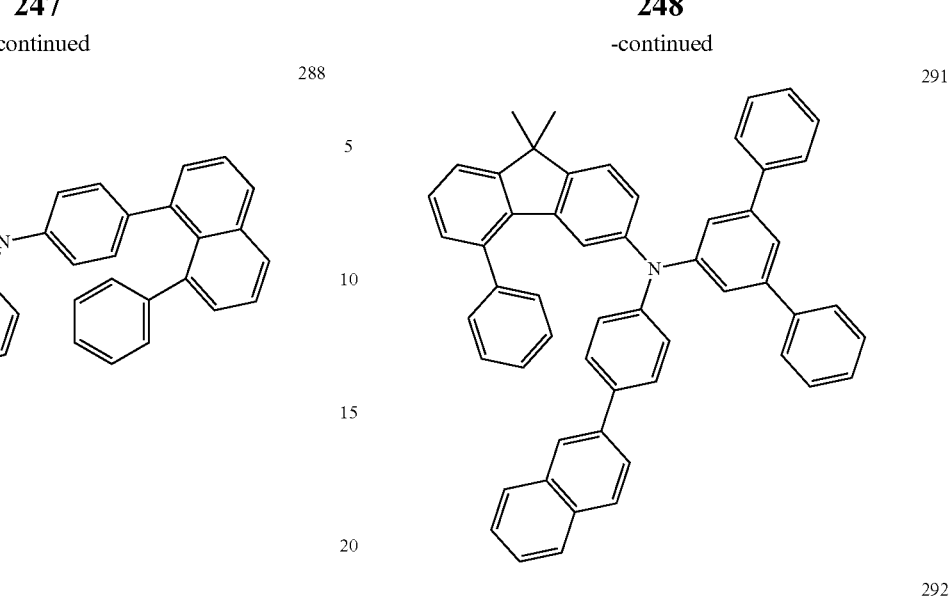
292
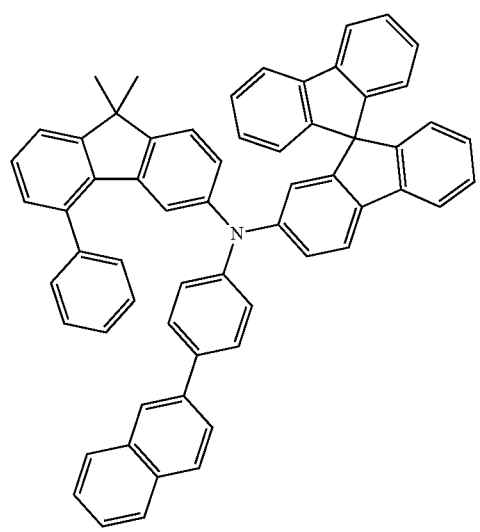
293
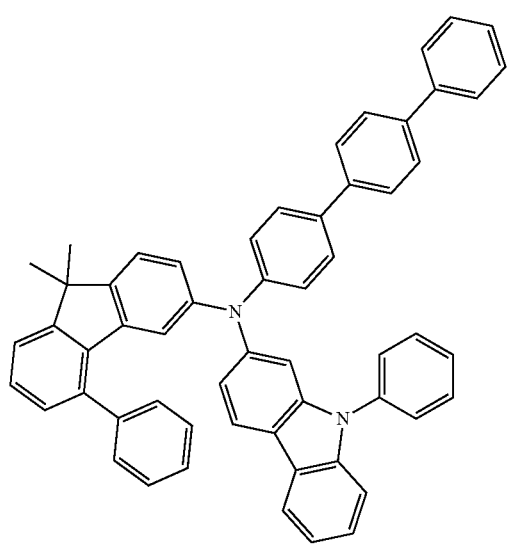

294
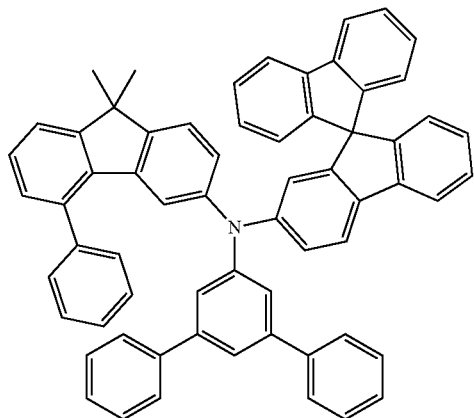
295
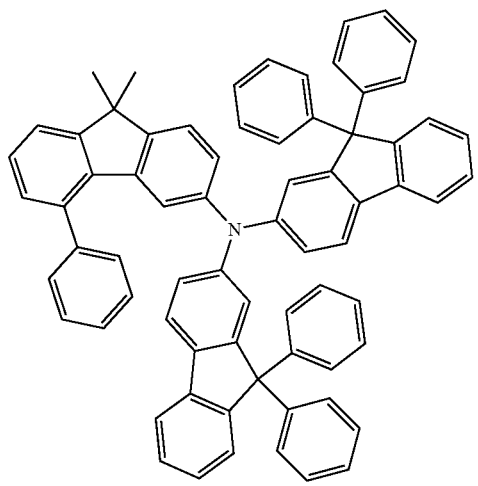
296
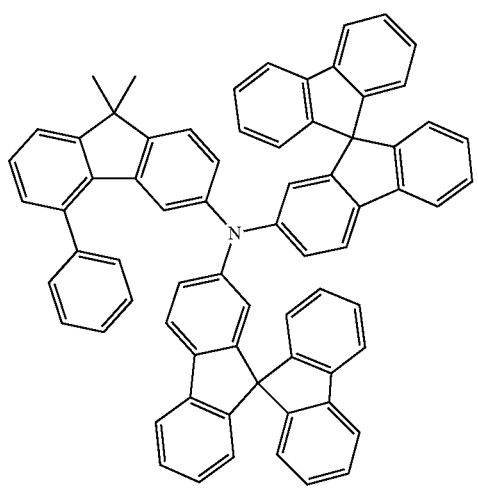
297
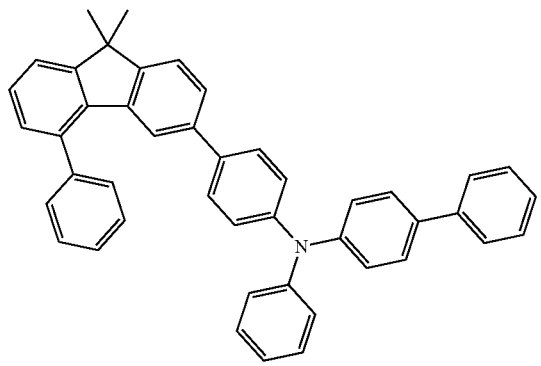
298
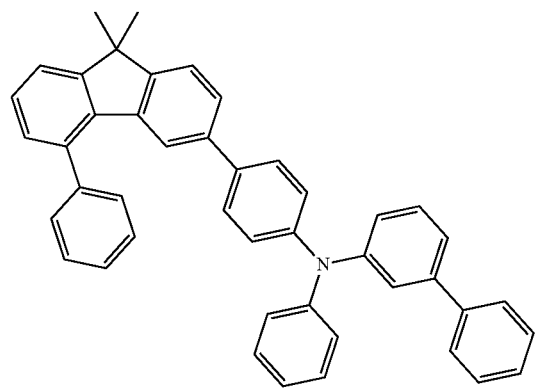
299
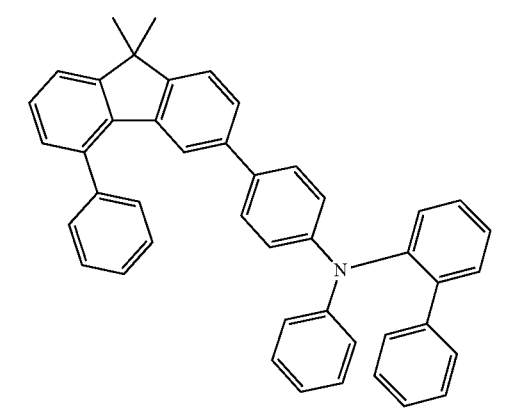
300
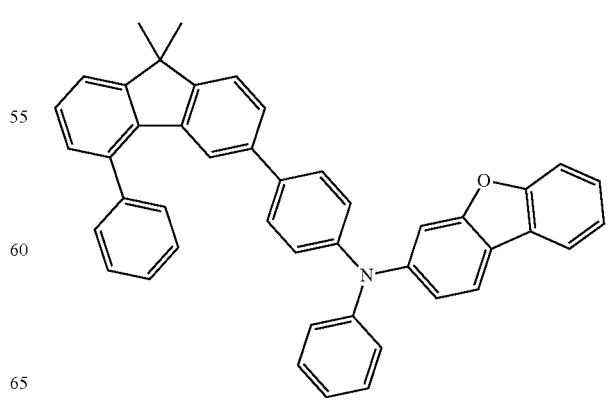

251
-continued
252
-continued
301
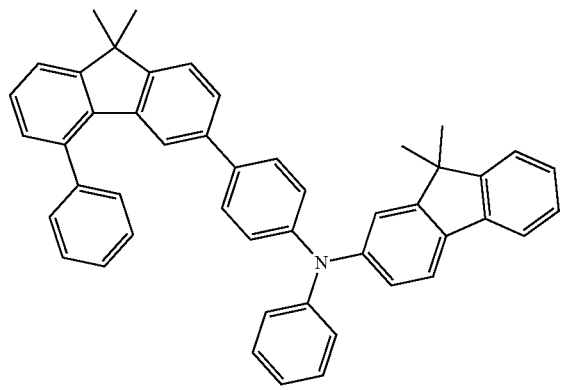
305
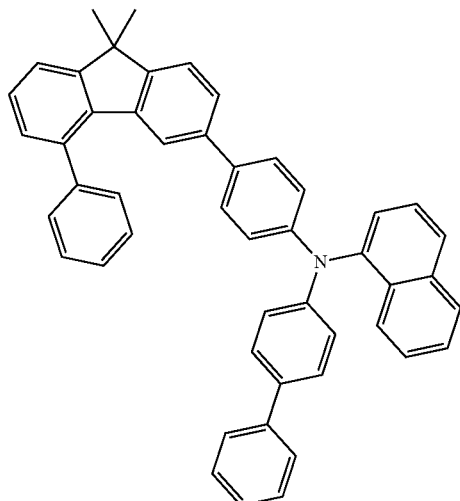
302
306
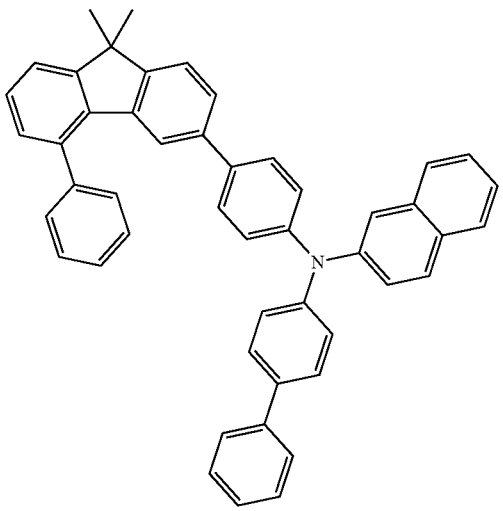
303
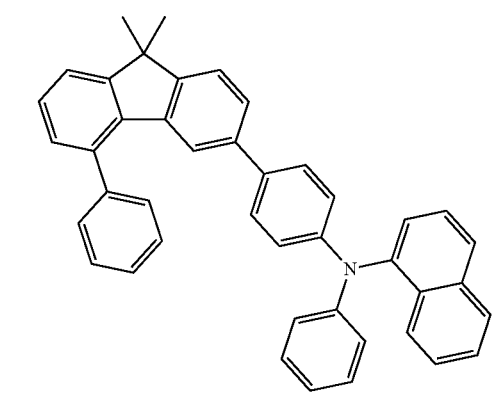
304
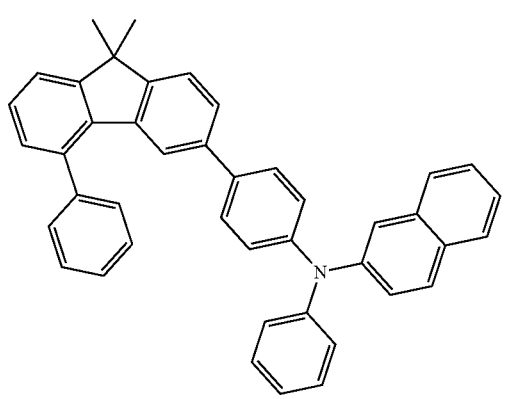
307
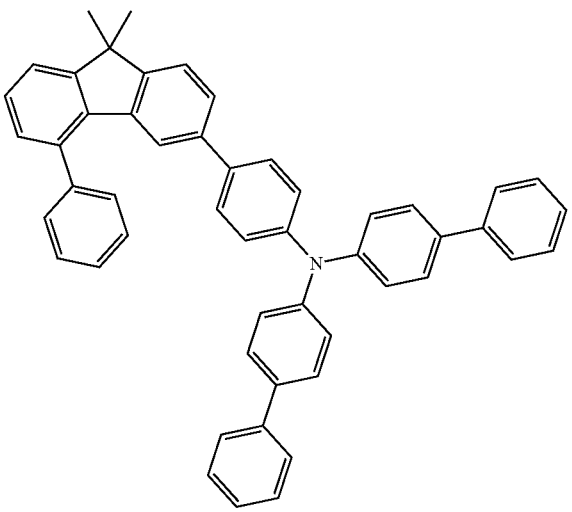

-continued
308
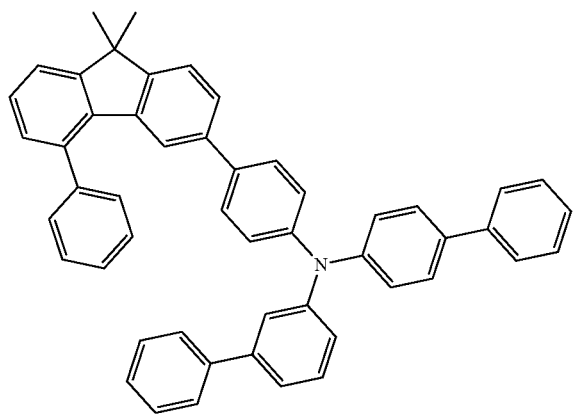
309
341
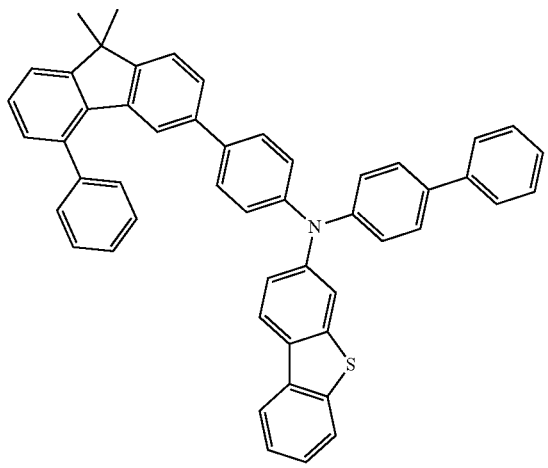
342
340
343
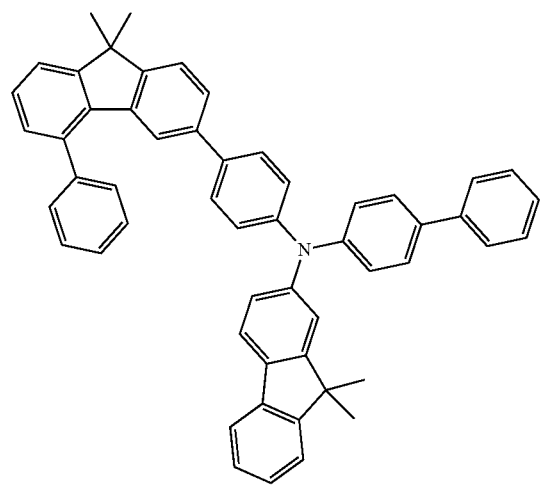
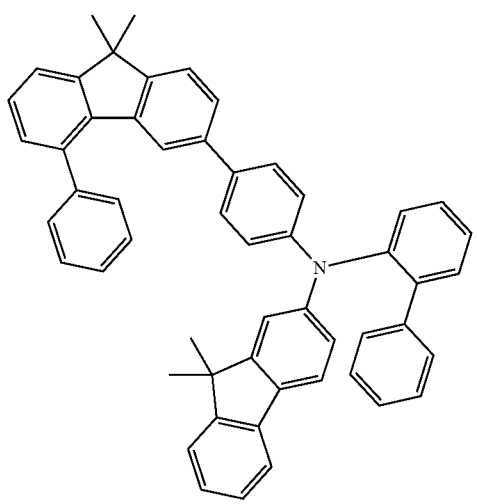

344
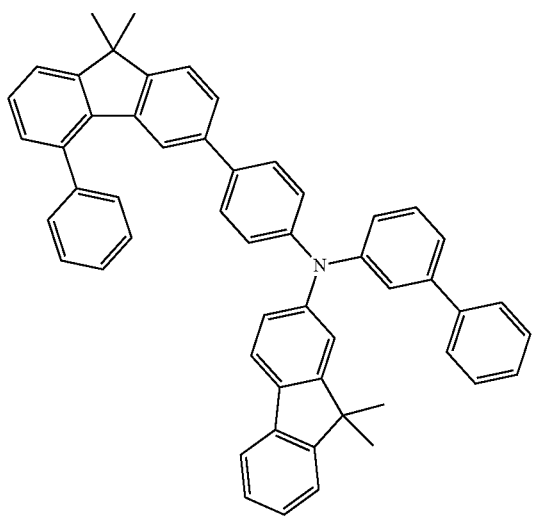
345
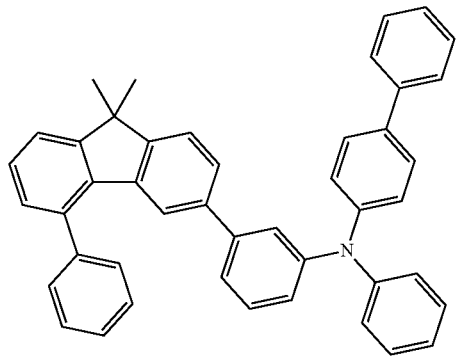
346
347
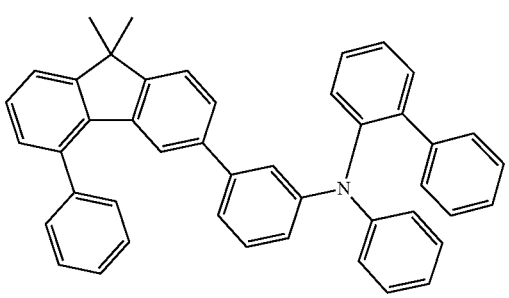
348
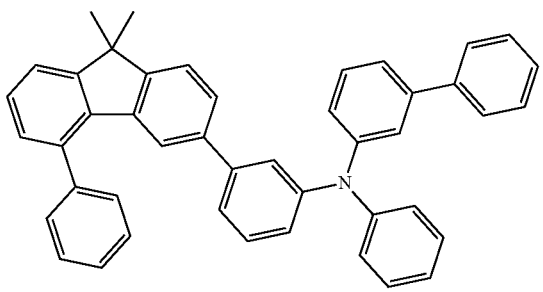
349
350
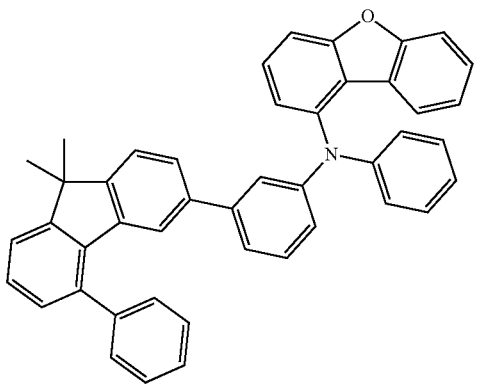

257
| | |
|---|---|
| 351 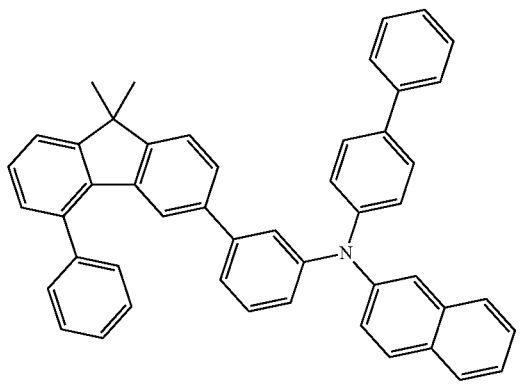 | 354 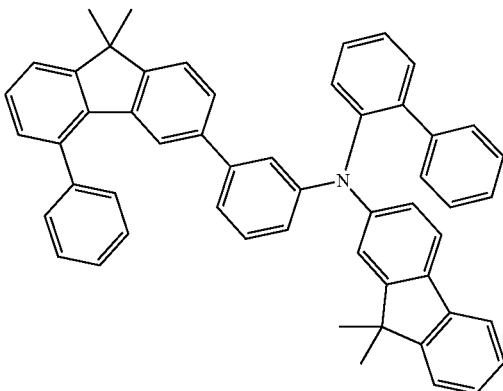 |
| 352 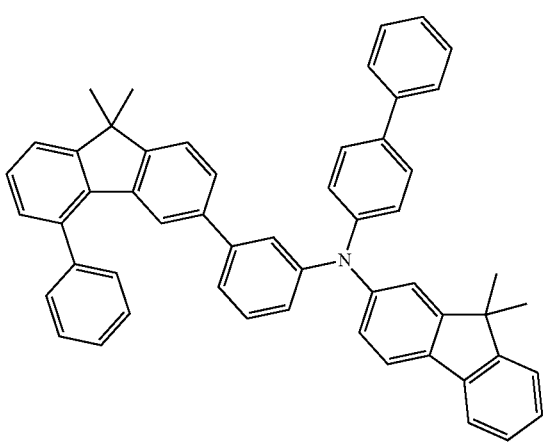 | 355 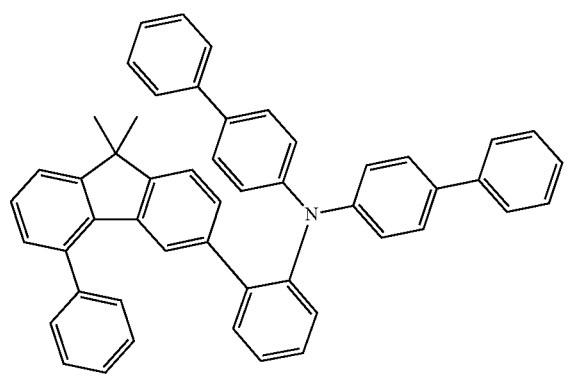 |
| 353 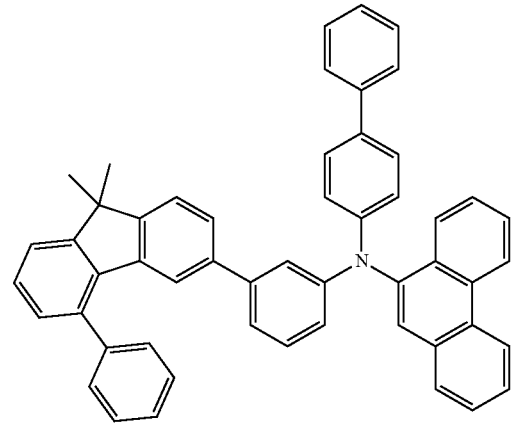 | 356 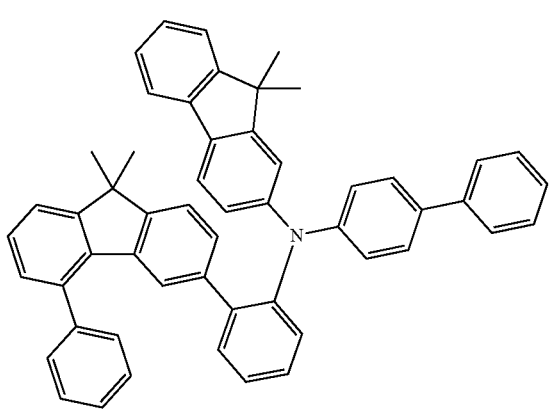 |

259
-continued
357
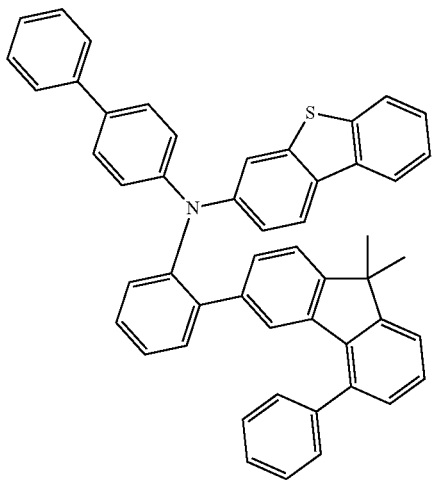
358
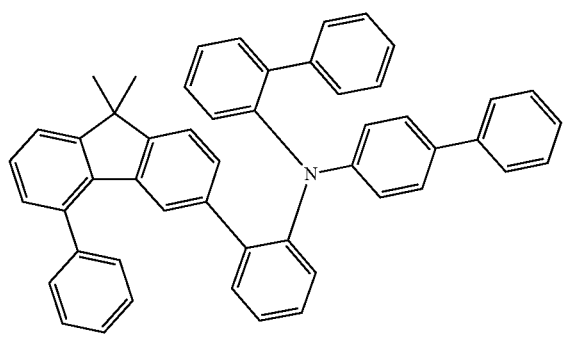
359
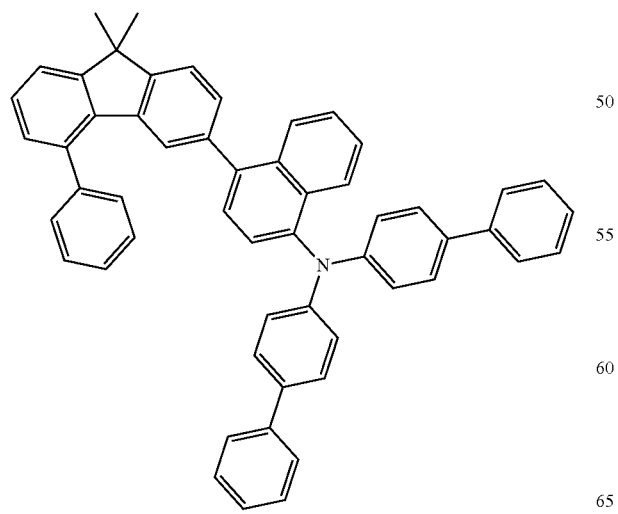
260
-continued
360
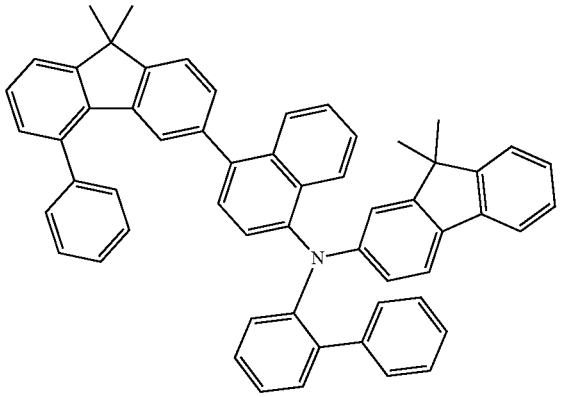
361
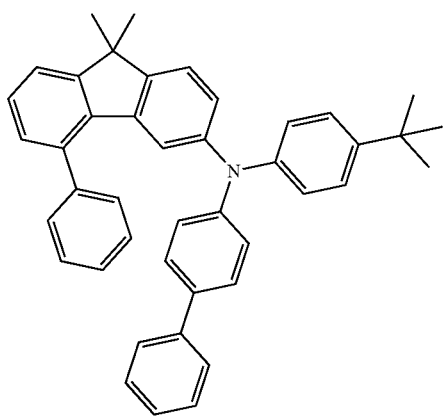
362
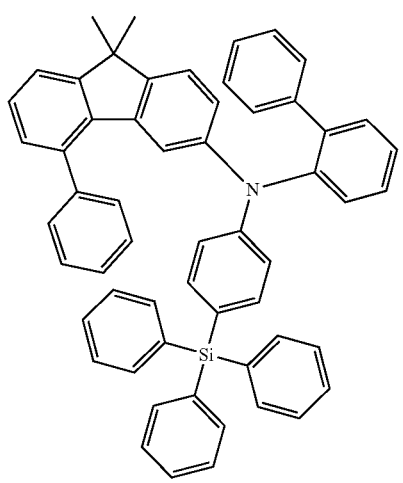

261
-continued
363
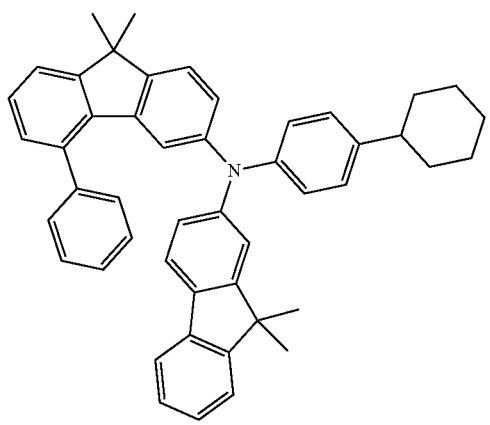
364
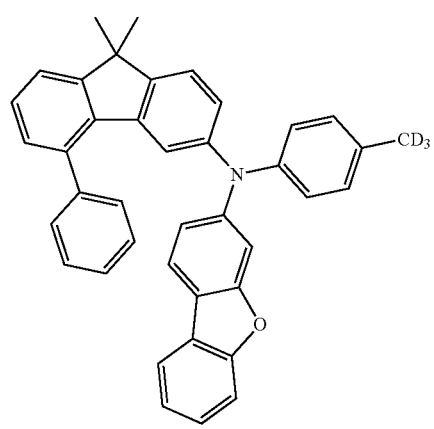
365
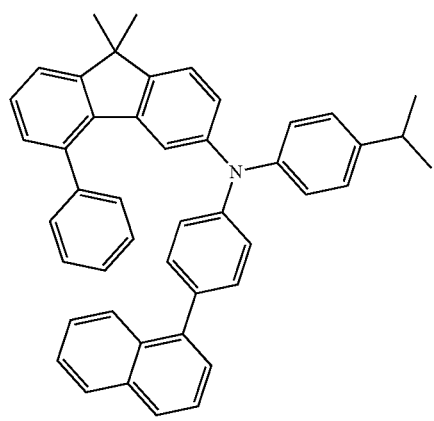
262
-continued
366
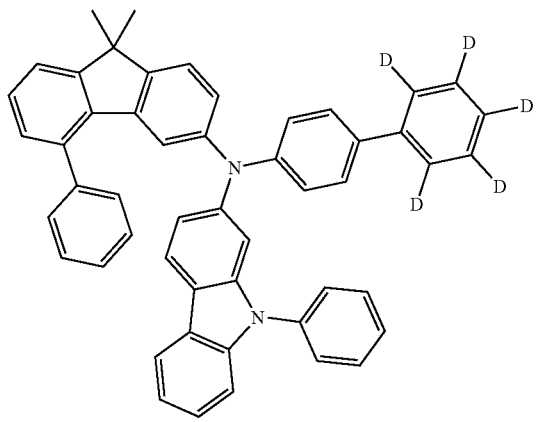
367
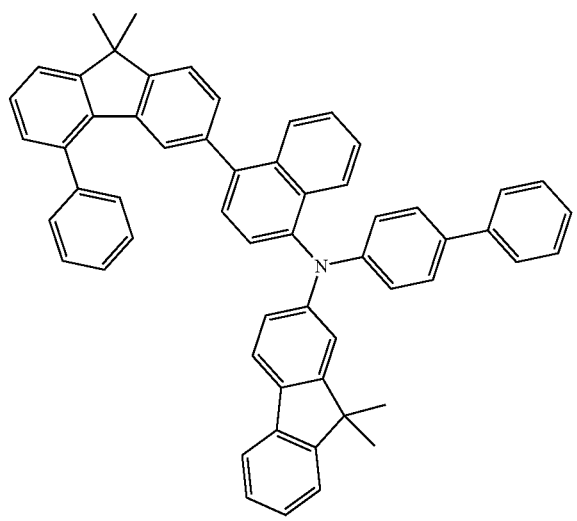
368
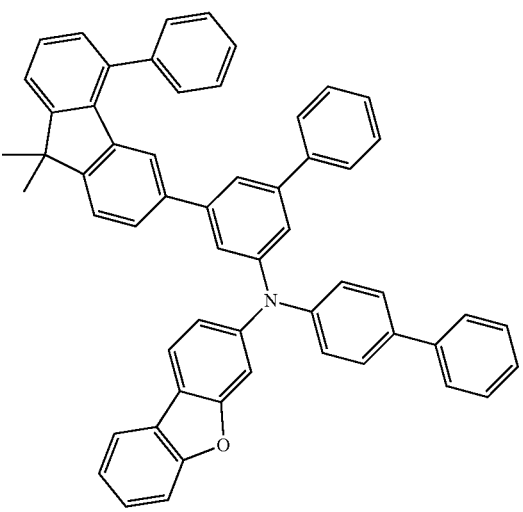

263
-continued
369
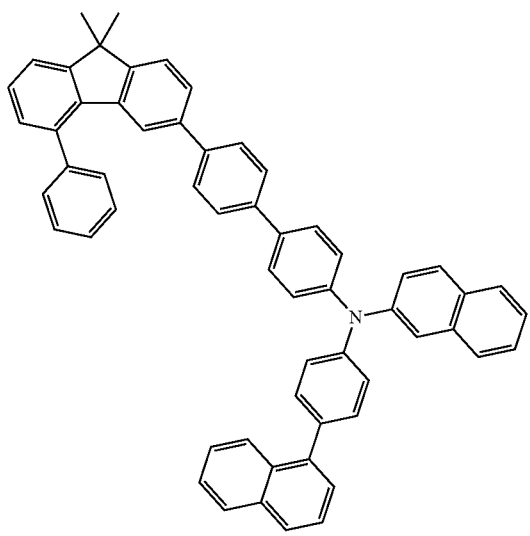
370
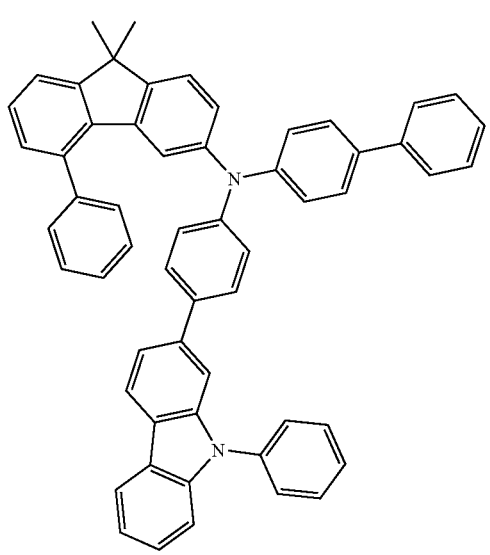
371
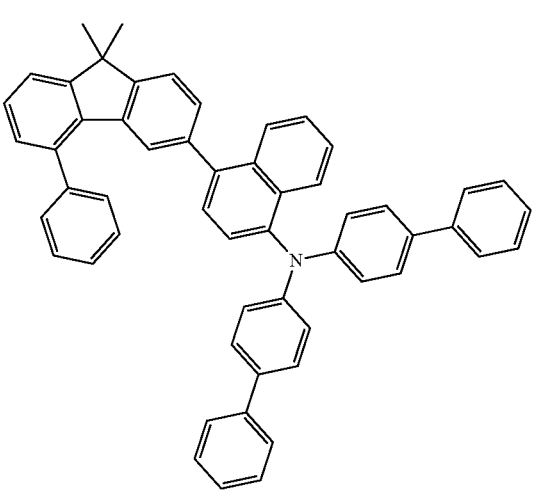
264
-continued
372
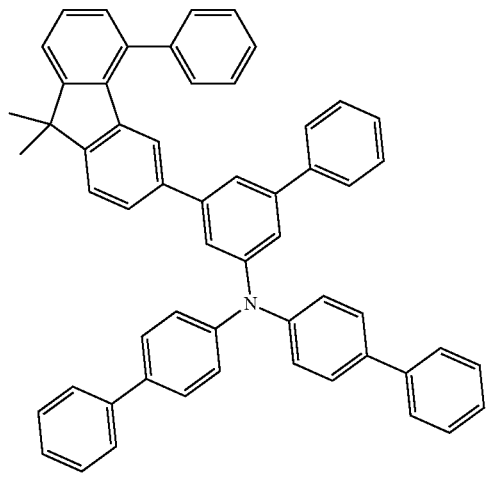
373
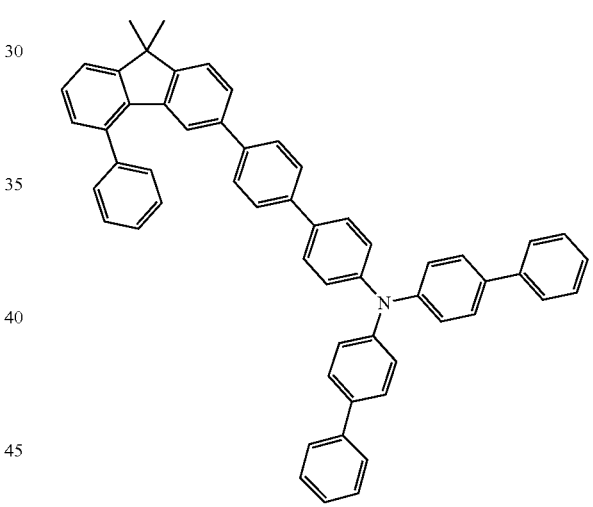
374
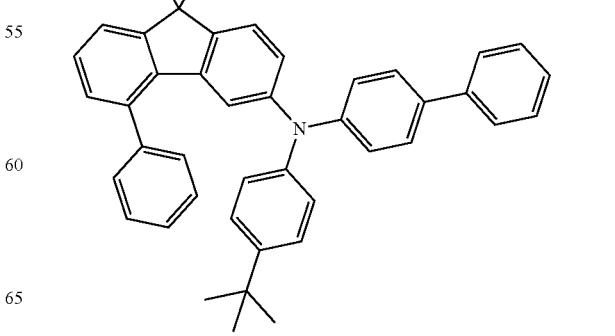

375

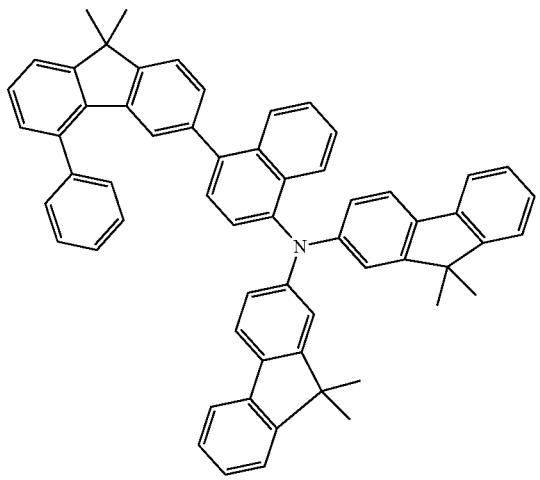

376

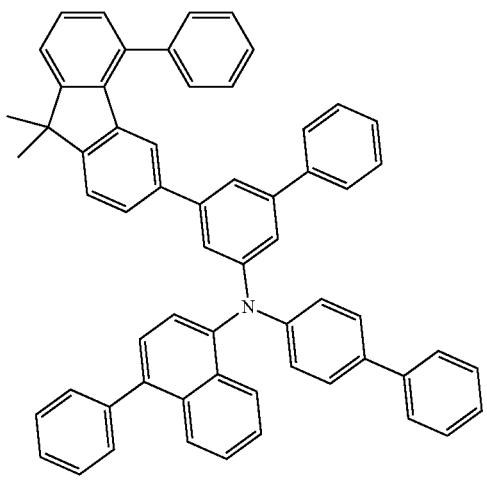

378

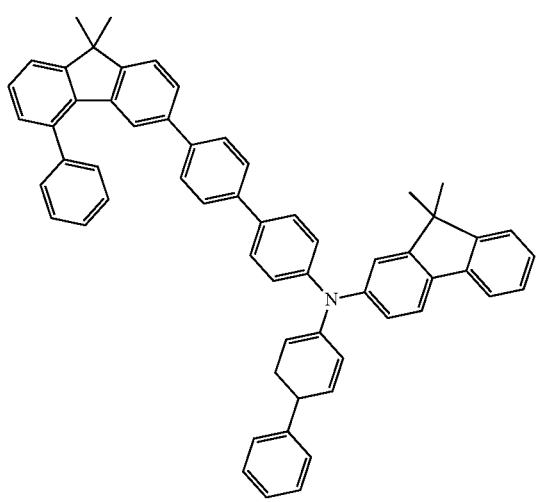

379

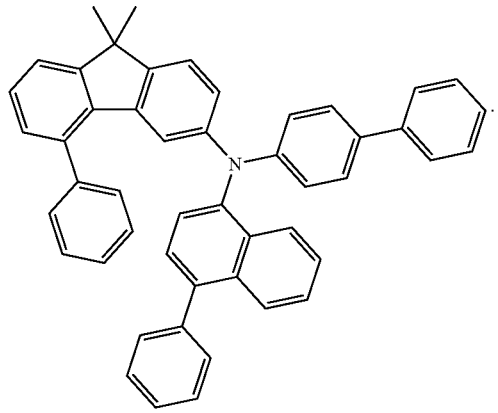

11. An electronic component comprising an anode and a cathode arranged oppositely, and a functional layer arranged between the anode and the cathode,
wherein the functional layer comprises the nitrogen-containing compound according to claim 1.

12. The electronic component according to claim 11, wherein the functional layer comprises an electron blocking layer, and the electron blocking layer comprises the nitrogen-containing compound.

13. The electronic component according to claim 11, wherein the electronic component is an organic electroluminescence device or a photoelectric conversion device.

14. An electronic device comprising the electronic component according to claim 11.

15. The nitrogen-containing compound according to claim 3, wherein a substituent of L is selected from deuterium, a halogen, a cyano, an alkyl with 1 to 5 carbon atoms, or a phenyl.

16. The nitrogen-containing compound according to claim 4, wherein a substituent of L is selected from deuterium, a fluorine, a cyano, a methyl, an ethyl, an n-propyl, an isopropyl, a tert-butyl, or a phenyl.

17. The nitrogen-containing compound according to claim 5, wherein substituents of $L_1$ and $L_2$ are the same or different, and are each independently selected from deuterium, a fluorine, a cyano, a methyl, an ethyl, an n-propyl, an isopropyl, a tert-butyl, a phenyl, a naphthyl, or a biphenyl.

18. The nitrogen-containing compound according to claim 7, wherein substituents of $Ar_1$ and $Ar_2$ are the same or different, and are each independently selected from deuterium, a halogen, a cyano, an alkyl with 1 to 5 carbon atoms, an aryl with 6 to 20 carbon atoms, a deuterated alkyl with 1 to 5 carbon atoms, a cycloalkyl with 5 to 10 carbon atoms, or a triphenylsilyl; and
among the substituents of $Ar_1$ and $Ar_2$, any two adjacent substituents form a saturated or unsaturated ring with 5 to 13 carbon atoms.

19. The nitrogen-containing compound according to claim 8, wherein substituents of $Ar_1$ and $Ar_2$ are the same or different, and are each independently selected from deuterium, a fluorine, a cyano, a methyl, an ethyl, an n-propyl, an isopropyl, a tert-butyl, a phenyl, a naphthyl, a biphenyl, a cyclopentyl, a cyclohexyl, a trideuteromethyl, or a triphenylsilyl; and
any two adjacent substituents of $Ar_1$ and $Ar_2$ form a saturated or unsaturated ring with 5 to 13 carbon atoms.

* * * * *